United States Patent
Iizuka et al.

(10) Patent No.: US 11,120,866 B1
(45) Date of Patent: Sep. 14, 2021

(54) MEMORY DEVICE

(71) Applicant: Kioxia Corporation, Tokyo (JP)

(72) Inventors: Takahiko Iizuka, Yokohama (JP); Daisaburo Takashima, Yokohama (JP); Ryu Ogiwara, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/015,408

(22) Filed: Sep. 9, 2020

(30) Foreign Application Priority Data

Mar. 10, 2020 (JP) .............................. JP2020-041417

(51) Int. Cl.
| | |
|---|---|
| *G11C 11/40* | (2006.01) |
| *G11C 11/4096* | (2006.01) |
| *G11C 11/4094* | (2006.01) |
| *G11C 5/06* | (2006.01) |
| *G11C 11/408* | (2006.01) |
| *G11C 5/02* | (2006.01) |
| *G11C 11/4074* | (2006.01) |

(52) U.S. Cl.
CPC .......... *G11C 11/4096* (2013.01); *G11C 5/025* (2013.01); *G11C 5/06* (2013.01); *G11C 11/4074* (2013.01); *G11C 11/4085* (2013.01); *G11C 11/4094* (2013.01)

(58) Field of Classification Search
CPC ............ G11C 11/4096; G11C 11/4074; G11C 11/4085; G11C 11/4094; G11C 5/025; G11C 5/06; G11C 13/0002; G11C 11/5642; G11C 13/004; G11C 2013/0088
See application file for complete search history.

(56) References Cited

U.S. PATENT DOCUMENTS

| | | | |
|---|---|---|---|
| 5,894,447 | A | 4/1999 | Takashima |
| 9,025,369 | B2 | 5/2015 | Takashima |
| 9,966,136 | B2 | 5/2018 | Ogiwara et al. |
| 2012/0161094 | A1* | 6/2012 | Huo ...................... H01L 27/249 257/4 |
| 2013/0229846 | A1* | 9/2013 | Chien ................ G11C 13/0002 365/51 |

OTHER PUBLICATIONS

Kinoshita, M. et al., "Scalable 3-D vertical chain-cell-type phase-change memory with $4F^2$ poly-Si diodes," 2012 Symposium on VLSI Technology Digest of Technical Papers, 2012, 2 pages.

* cited by examiner

*Primary Examiner* — Ajay Ojha
(74) *Attorney, Agent, or Firm* — Oblon, McClelland, Maier & Neustadt, L.L.P.

(57) ABSTRACT

According to one embodiment, a driver that sequentially supplies a first voltage, a second voltage higher than the first voltage, and the first voltage to the bit line, during the writing operation to the first memory cell. The driver supplies a third voltage to the second word line and a fourth voltage to the second selecting gate line while changing the voltage of the bit line from the second voltage to the first voltage if a data is a first data. The driver supplies a fifth voltage to the second word line and a sixth voltage to the second selecting gate line while changing the voltage of the bit line from the second voltage to the first voltage if the data is a second data. At least the sixth voltage is larger than the fourth voltage or the fifth voltage is larger than the third voltage.

15 Claims, 128 Drawing Sheets selected MB
non-selected SU non-selected MB

FIG. 117
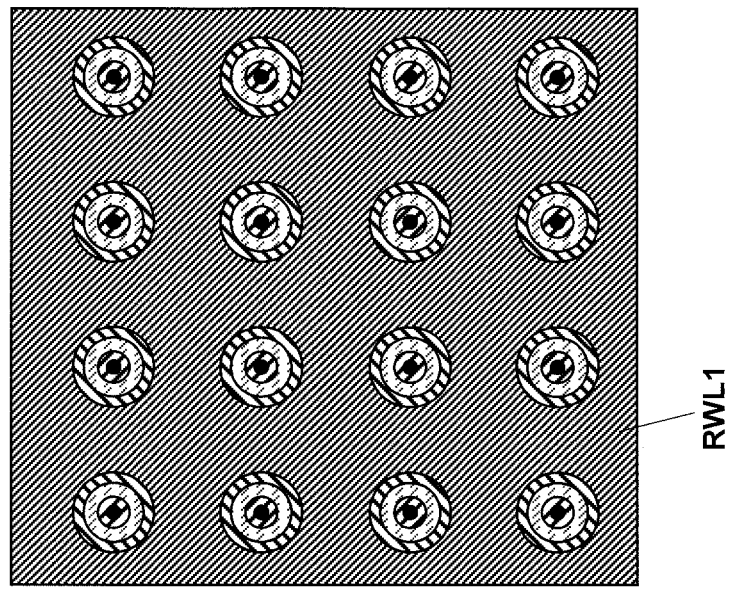
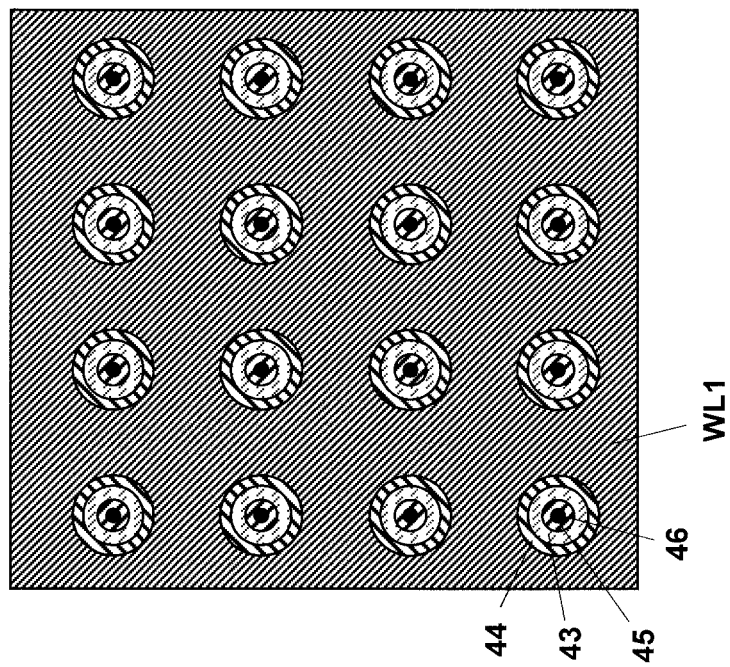
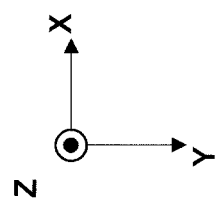

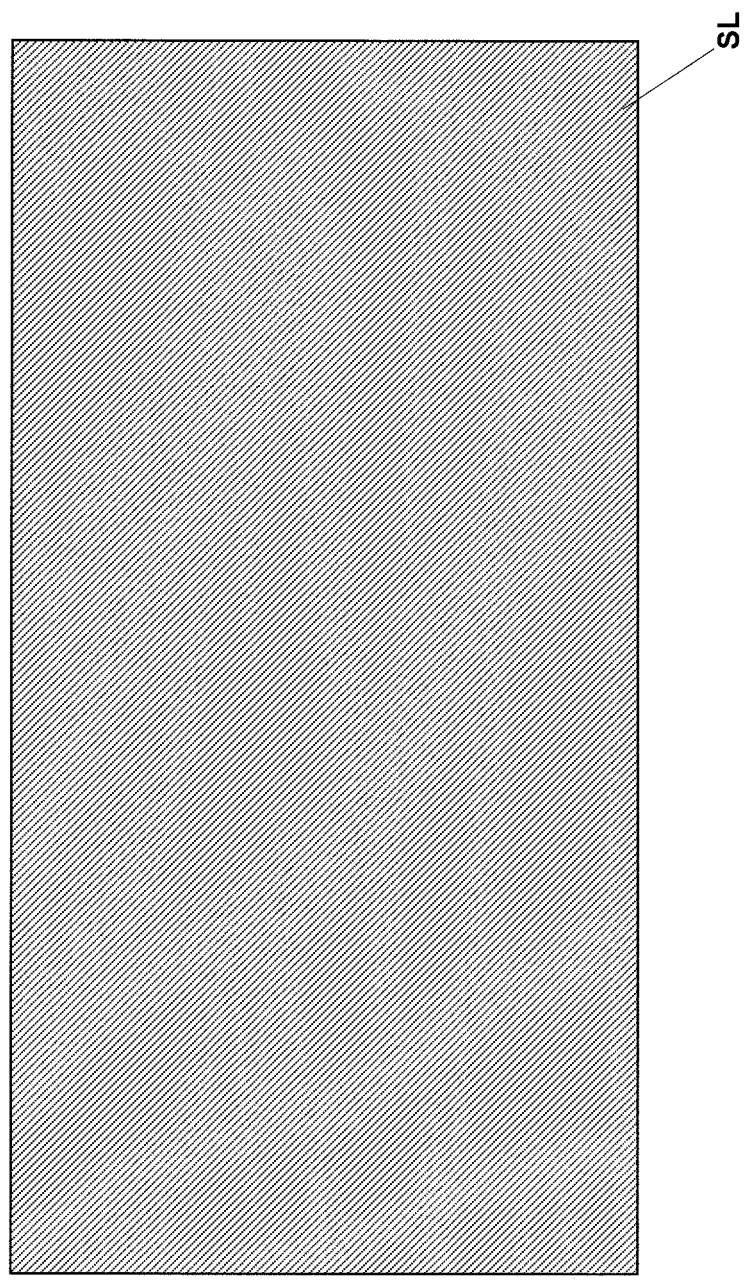
FIG. 118
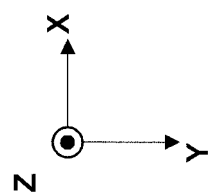

MEMORY DEVICE

CROSS REFERENCES TO RELATED APPLICATIONS

This application is based upon and claims the benefit of priority from the prior Japanese Patent Application 2020-041417, filed on Mar. 10, 2020, the entire contents of which are incorporated herein by reference.

FIELD

Embodiments described herein relate generally to a memory device.

BACKGROUND

A memory device (semiconductor integrated circuit device) in which variable resistance memory elements such as ReRAM (Resistive Random Access Memory) elements, alloy-type PCM (Phase Change Memory) elements, iPCM (Interfacial Phase Change Memory) elements, and CBRAM (Conduction Bridge RAM) elements are integrated on a semiconductor substrate has been proposed. Variable resistance memory elements as described above function as a non-volatile memory element.

As a memory device using the variable resistance memory element, a semiconductor memory device capable of performing appropriate writing is required.

BRIEF DESCRIPTION OF THE DRAWINGS

FIG. 117 is a cross-sectional view along C-C' line of FIG. 113;

FIG. 118 is a cross-sectional view along D-D' line of FIG. 113;

FIG. 120 is a cross-sectional view along α-α' line of FIG. 119;

FIG. 121 is a cross-sectional view along β-β' line of FIG. 119;

FIG. 122 is a circuit diagram showing a modified example including a source side selecting gate transistor ST2;

FIG. 123 is a circuit diagram of a memory block;

FIG. 124 is a diagram showing a modified example of selected state of a memory cell;

FIG. 125 is a diagram showing a modified example of non-selected state of a memory cell;

FIG. 126 is a diagram showing a modified example of non-selected state of a memory cell;

FIG. 127 is a diagram showing a modified example of selected state of a memory cell; and FIG. 128 is a waveform diagram showing a modified example of voltages applied to each line when performing a set operation in a reset memory block RMB.

DETAILED DESCRIPTION

Figure 1:
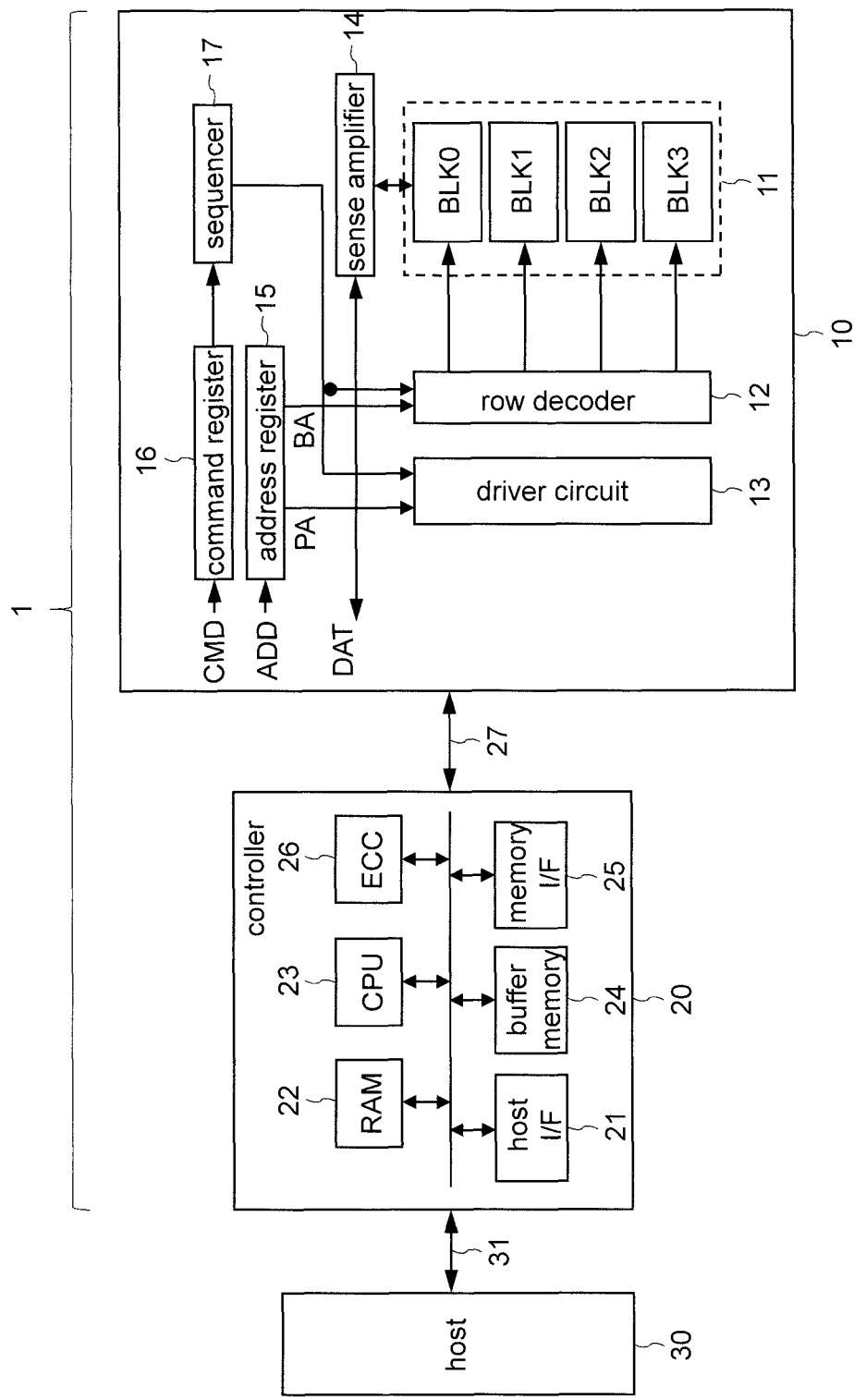
FIG. 1 is a block diagram showing an overall configuration of a memory system.

A memory device according to the present embodiment includes a semiconductor substrate having a main surface, the main surface extending in a first direction and a second direction intersecting the first direction; a first memory pillar; a second memory pillar; a bit line extending in the first direction; a first selecting gate line extending in the second direction; a first word line extending in the second direction; a second selecting gate line extending in the second direction; a second word line extending in the second direction; and a driver. The first memory pillar includes a first variable resistance memory layer extending in a third direction intersecting the first direction and the second direction; a first semiconductor layer extending in the third direction, the first semiconductor layer contacting with the first variable resistance memory layer; and a first insulating layer extending in the third direction, the first insulating layer contacting with the first semiconductor layer. The second memory pillar includes a second variable resistance memory layer extending in the third direction; a second semiconductor layer extending in the third direction, the second semiconductor layer contacting with the second variable resistance memory layer; and a second insulating layer extending in the third direction, the second insulating layer contacting with the second semiconductor layer. The bit line connects to one end of the first memory pillar and one end of the second memory pillar. The first selecting gate line forms a first selecting transistor by being opposite to the first semiconductor layer through the first insulating layer. The first word line forms a first memory cell by being opposite to the first variable resistance memory layer through the first semiconductor layer and the first insulating layer. The second selecting gate line is arranged at a same position as the first selecting gate line in the third direction. The second selecting gate line forms a second selecting transistor by being opposite to the second semiconductor layer through the second insulating layer. The second word line is arranged at a same position as the first word line in the third direction. The second word line forms a second memory cell by being opposite to the second variable resistance memory layer through the second semiconductor layer and the second insulating layer. The driver is configured to supply voltages to each of the bit line, the first selecting gate line, the second selecting gate line, and the second word line at a writing operation. The driver sequentially supplies a first voltage, a second voltage higher than the first voltage, and the first voltage to the bit line, during the writing operation to the first memory cell. The driver supplies a third voltage to the second word line and a fourth voltage to the second selecting gate line while changing the voltage of the bit line from the second voltage to the first voltage if a data written in the first memory cell is a first data. The driver supplies a fifth voltage to the second word line and a sixth voltage to the second selecting gate line while changing the voltage of the bit line from the second voltage to the first voltage if the data written in the first memory cell is a second data different from the first data. At least the sixth voltage is larger than the fourth voltage or the fifth voltage is larger than the third voltage.

Hereinafter, a memory device according to the present embodiment will be described in detail by referring to the drawings. In the following description, components having substantially the same functions and configurations are denoted by the same reference numerals, and duplicate description will be given only when necessary. Each of the embodiments described below exemplifies a device and a method for embodying the technical idea of this embodiment, and the technical idea of the embodiment does not specify the material, shape, structure, arrangement, and the like of the component parts as follows. Various modifications can be made to the technical idea of the embodiment in the claims.

In order to make the description clearer, the drawings may be schematically represented with respect to widths, thicknesses, shapes, and the like of the respective portions in comparison with actual embodiments, but the drawings are only examples and are not intended to limit the interpretation of the present invention. In this specification and each drawing, elements having the same functions as those described with reference to the preceding drawings are denoted by the same reference numerals, and a repetitive description thereof may be omitted.

A plurality of films formed by the same process has the same layer structure and is made of the same material. In this specification, even when the plurality of films plays a different function or role, the plurality of films formed by the same process are treated as films respectively present in the same layer.

<1> First Embodiment

A memory system according to the first embodiment will be described.

<1-1> Configuration

<1-1-1> Overall Configuration of Memory System

First, an overall configuration of a memory system according to the present embodiment will be described with reference to FIG. 1.

As shown in FIG. 1, a memory system 1 is configured by combining a memory chip 10 and a controller 20, for example. The plurality of memory chips 10 may be included in the memory system 1. In this case, for example, one controller 20 controls the plurality of memory chips 10. The memory system 1 functions as, for example, a memory card such as an SD card, an SSD (solid state drive), or the like.

The memory chip 10 includes a plurality of memory cells and stores data in a non-volatile manner. The controller 20 is connected to the memory chip 10 by a memory bus 27 and to a host 30 by a host bus 31. The controller 20 controls the memory chip 10 and accesses the memory chip 10 in response to host commands received from the host 30. The host 30 is, for example, a digital camera, a personal computer, or the like, and the host bus is, for example, a bus according to SD interface. The memory bus transmits and receives signals in accordance with a memory interface.

<1-1-2> Configuration of Controller 20

Next, a configuration of the controller 20 is described in detail with reference to FIG. 1.

As shown in FIG. 1, the controller 20 includes a host interface circuit (host I/F) 21, a built-in memory (RAM: Random Access Memory) 22, a processor (CPU: Central Processing Unit) 23, a buffer memory 24, a memory interface circuit (memory I/F) 25, and an ECC (Error Checking and Correcting) circuit 26.

The host interface circuit 21 is connected to the host 30 via the host bus 31. The host interface circuit 21 transfers the host commands and data received from the host 30 to the processor 23 and the buffer memory 24, respectively. The host interface circuit 21 transfers the data in the buffer memory 24 to the host 30 in response to instructions by the processor 23.

The processor 23 controls the overall operation of the controller 20. For example, when the processor 23 receives the host commands for reading from the host 30, responds to the host commands, and causes the memory interface circuit 25 to issue a read command (memory command) to the memory chip 10. When the processor 23 receives a host command for writing from the host 30, it performs a similar operation. The processor performs various processes (e.g., wear leveling) for managing the memory chip 10.

The memory interface circuit 25 is connected to the memory chip 10 via the memory bus 27 and is in charge of communication with the memory chip 10. The memory interface circuit 25 transmits various signals to the memory chip 10 and receives various signals from the memory chip 10 based on the instructions received from the processor 23.

The buffer memory 24 temporarily holds writing data to the memory chip 10 and reading data from the memory chip 10.

The built-in memory 22 is, for example, a semiconductor memory such as a DRAM or a SRAM, and is used as a working region of the processor 23. The built-in memory 22 holds firmware for managing the memory chip 10, various management tables such as a shift table, a history table, a flag table, and the like to be described later.

The ECC circuit 26 performs an error detecting process and an error correcting process on the data stored in the memory chip 10. In other words, the ECC circuit 26 generates an error correction code, imparts it to the writing data when the data is written, and decodes it when the data is read.

<1-1-3> Configuration of Memory Chip 10

Next, the configuration of the memory chip 10 will be described.

As shown in FIG. 1, the memory chip 10 includes a memory cell array 11, a row decoder 12, a driver circuit 13, a sense amplifier 14, an address register 15, a command register 16, and a sequencer 17.

Figure 2:
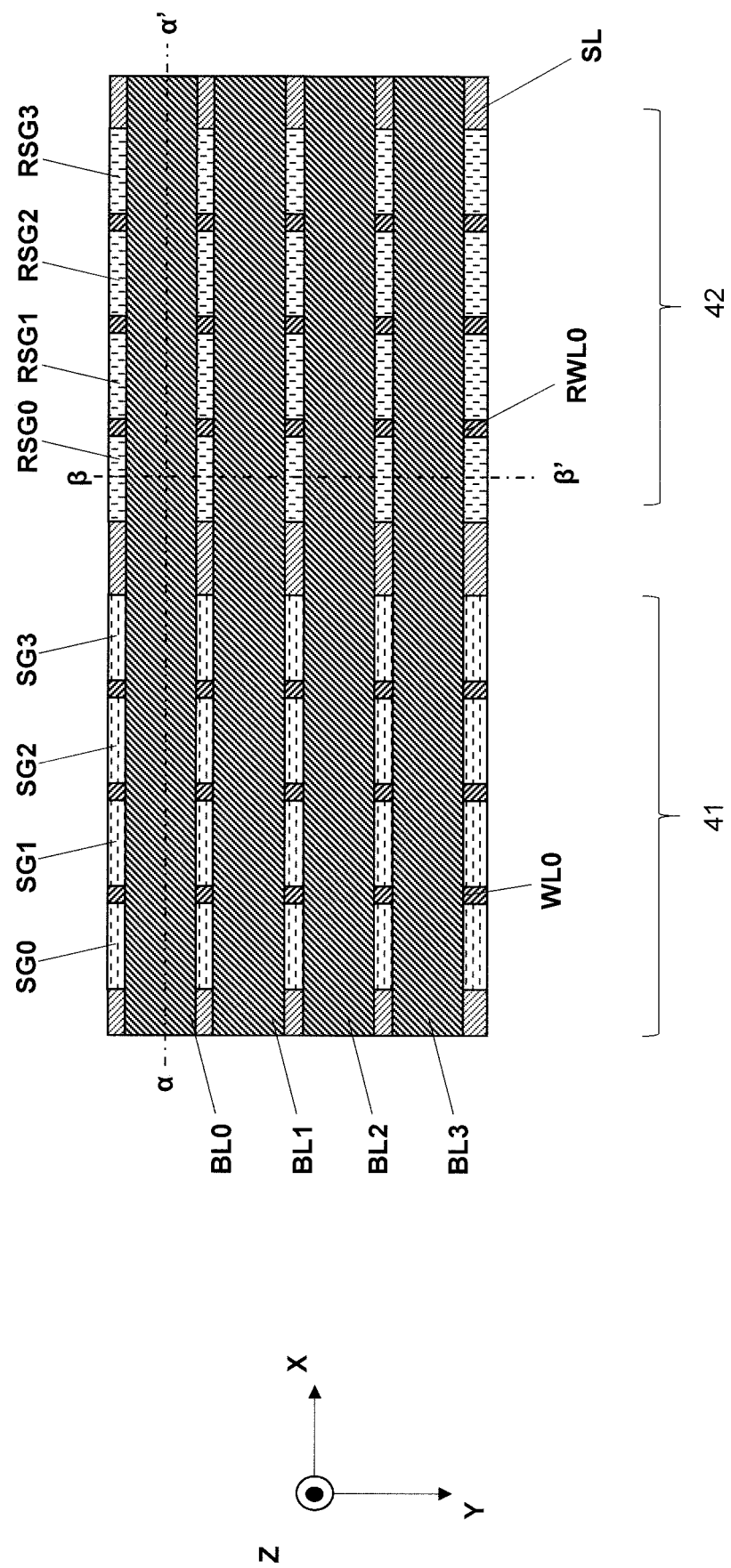
FIG. 2 is a plan view showing an example of a configuration of a memory cell array included in a memory chip according to the first embodiment.
Figure 3:
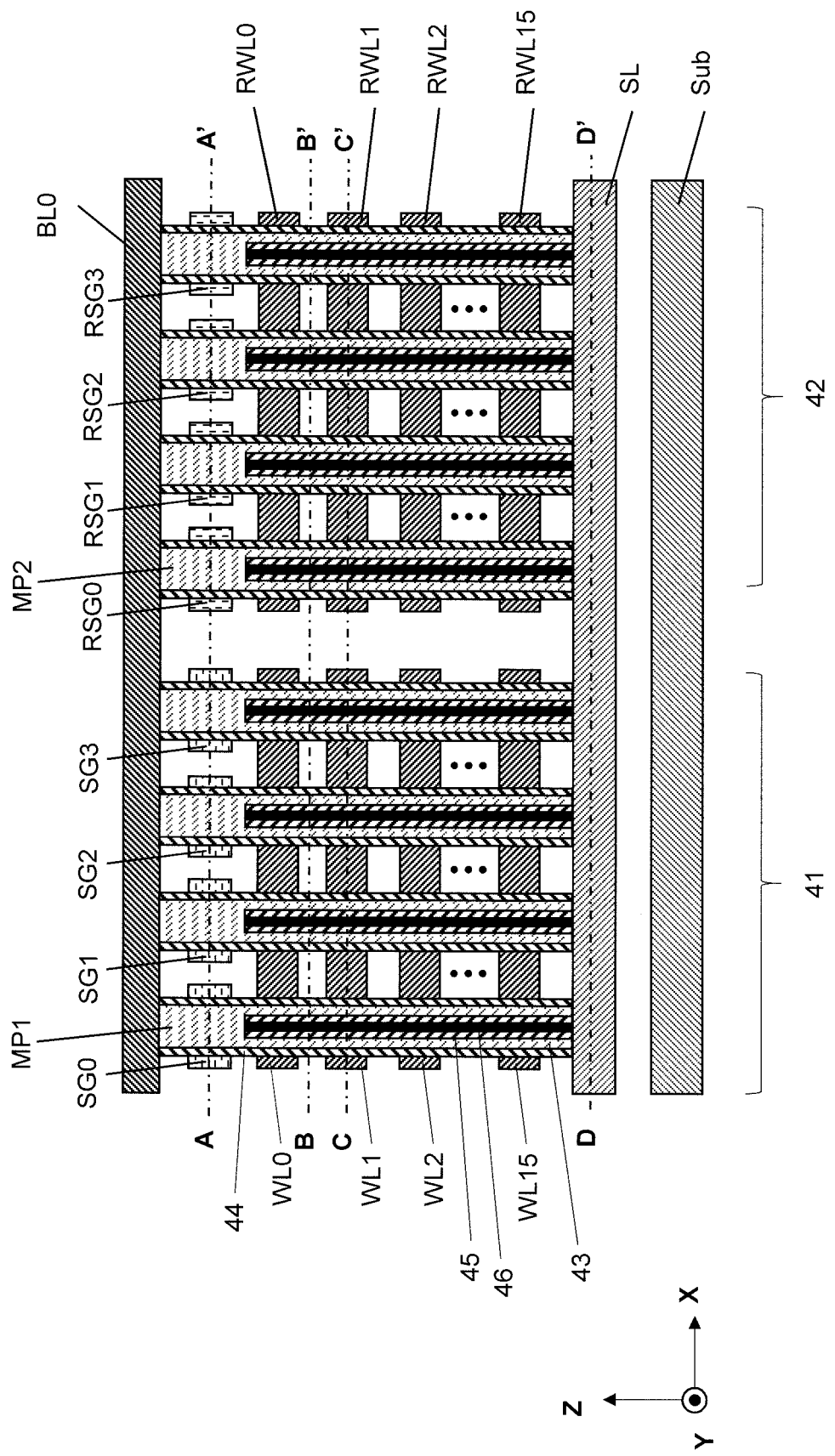
FIG. 3 is a cross-sectional view along the $\alpha$-$\alpha'$ line of FIG. 2.
Figure 4:
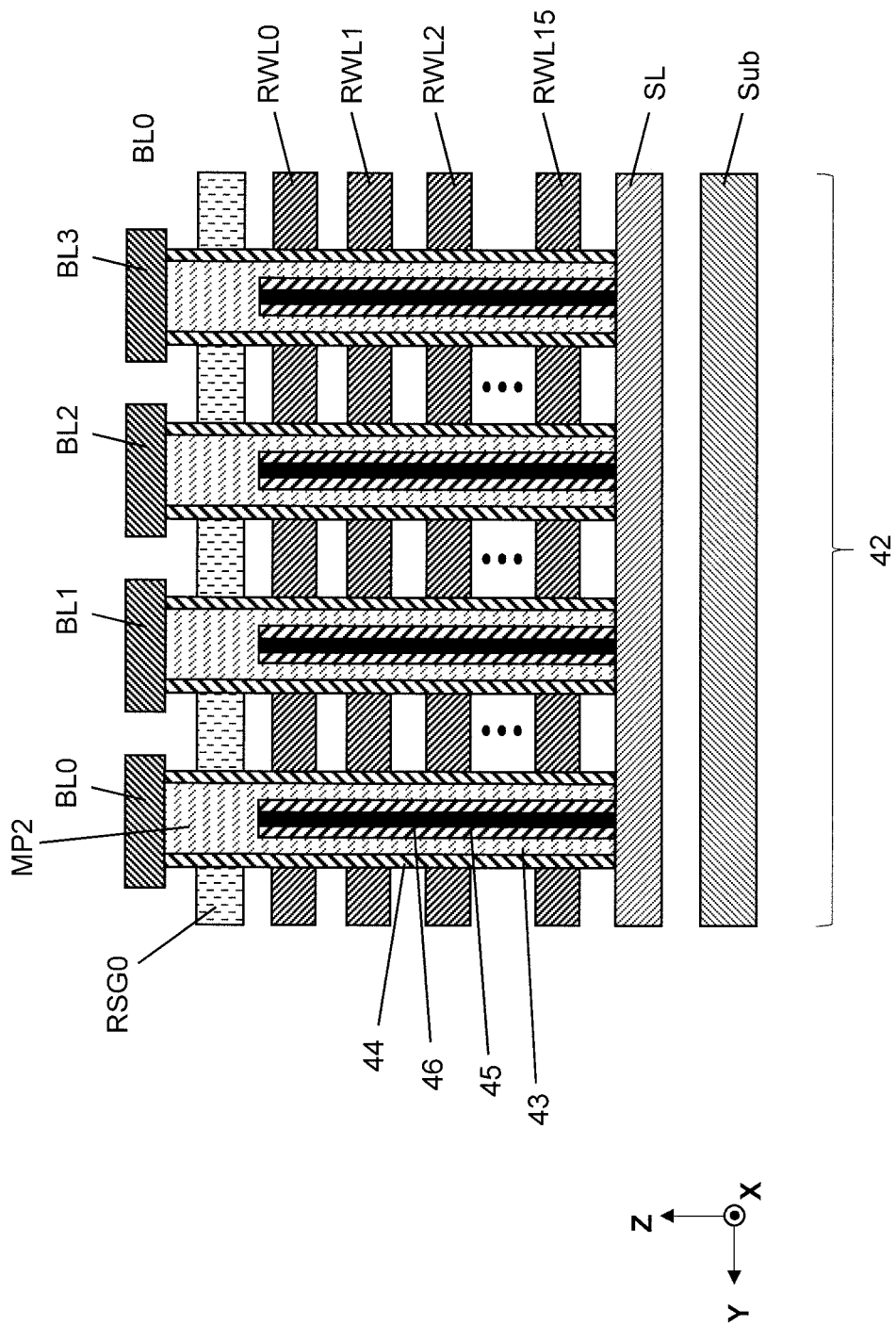
FIG. 4 is a cross-sectional view along the $\beta$-$\beta$ line of FIG. 2.

The memory cell array 11 includes a plurality of blocks BLK including a plurality of non-volatile memory cells corresponding to rows (e.g., word lines WL0 to WL15 shown in FIGS. 2 to 4) and columns (e.g., bit lines BL0 to BL3 shown in FIGS. 2 to 4). In FIG. 1, four blocks BLK0 to BLK3 are shown as an example. Then the memory cell array 11 stores data provided by the controller 20. The memory cells included in the memory cell array 11 use a variable resistance memory element such as a phase change memory (PCM) element.

The row decoder 12 selects one of the blocks BLK0 to BLK3 based on a block address BA in the address register 15 and further selects a word line direction in the selected block BLK.

The driver circuit 13 supplies a voltage to the selected block BLK through the row decoder 12 based on a page address PA in the address register 15. The driver circuit 13 also includes, for example, source line drivers and the like.

The sense amplifier 14 is provided with a sense amplifier module SA corresponding to the bit line BL. The sense amplifier 14 senses the data read from the memory cell array 11 and performs required calculations when reading data. Data DAT is output to the controller 20. The writing data DAT received from the controller 20 is transferred to the memory cell array 11 when writing data.

The address register 15 holds an address ADD received from the controller 20. The address ADD includes the block address BA and the page address PA described above. The command register 16 holds a command CMD received from the controller 20.

The sequencer 17 controls operation of the entire memory chip 10 based on the command CMD held in the command register 16.

<1-1-4> Structure of the Memory Cell Array 11

An example of the structure of the memory cell array 11 according to the first embodiment will be described below. In the drawings referred to below, the X-direction corresponds to the extending direction of the bit line BL, the Y-direction corresponds to the extending direction of the word line WL, and the Z-direction corresponds to the vertical direction with respect to the surface of a semiconductor substrate Sub on which the memory cell array 11 is formed. Hereinafter, in the figures, components such as insulating layer (interlayer insulating film), wiring, and contacts are omitted as appropriate in order to make the figures easier to see.

FIG. 2 shows an example of a plan view seen from above in the Z-direction of the memory cell array 11 included in the memory chip 10 according to the first embodiment. FIG. 3 shows an example of a cross-sectional view (cross-sectional view along α-α' line in FIG. 2) seen from the Y-direction of the memory cell array 11 included in the memory chip 10 according to the first embodiment. FIG. 4 shows an example of a cross-sectional view (cross-sectional view along β-β' line in FIG. 2) seen from the X-direction of the memory cell array 11 included in the memory chip 10 according to the first embodiment.

Figure 5:
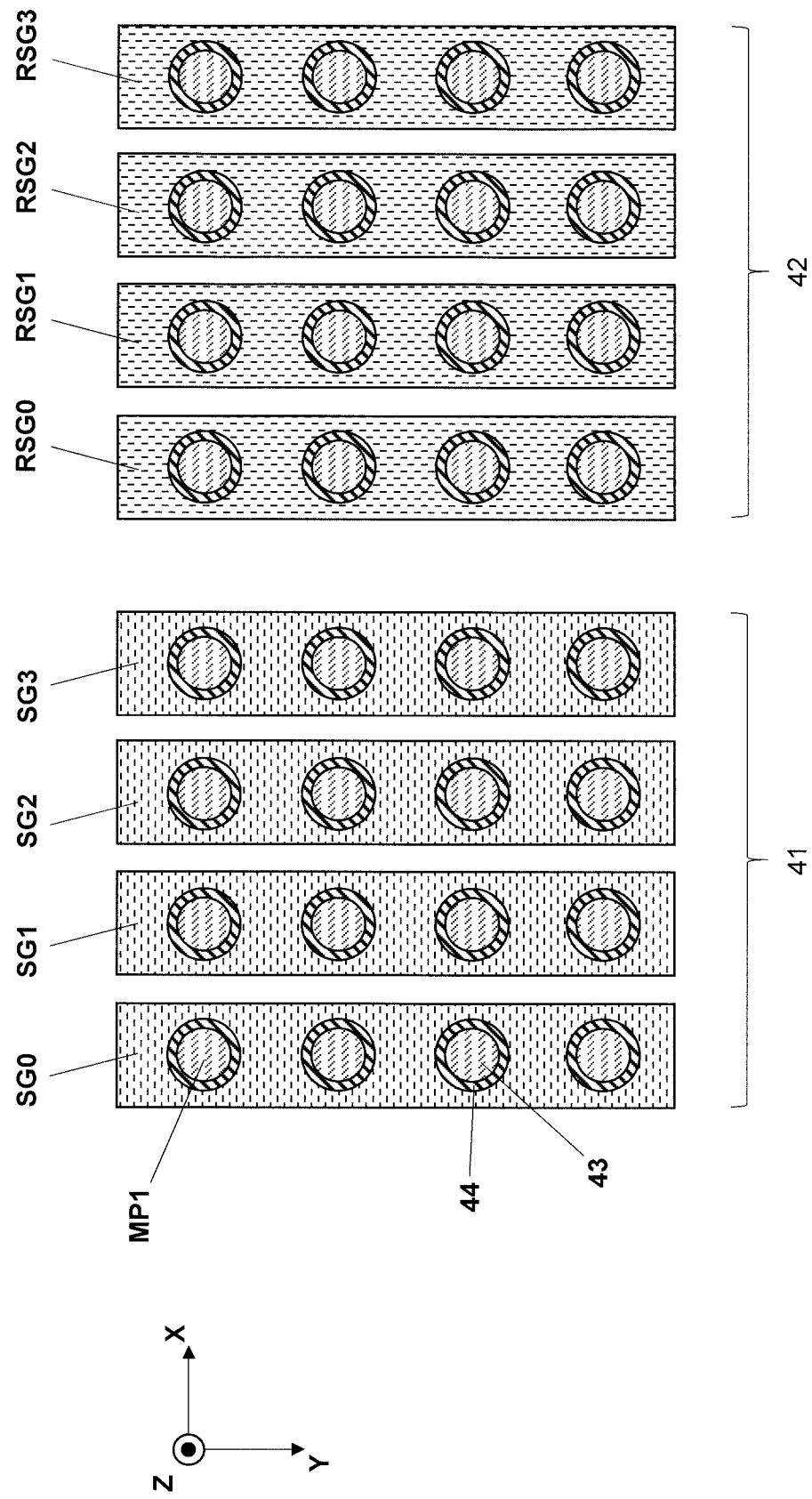
FIG. 5 is a cross-sectional view along A-A' line of FIG. 3.
Figure 6:
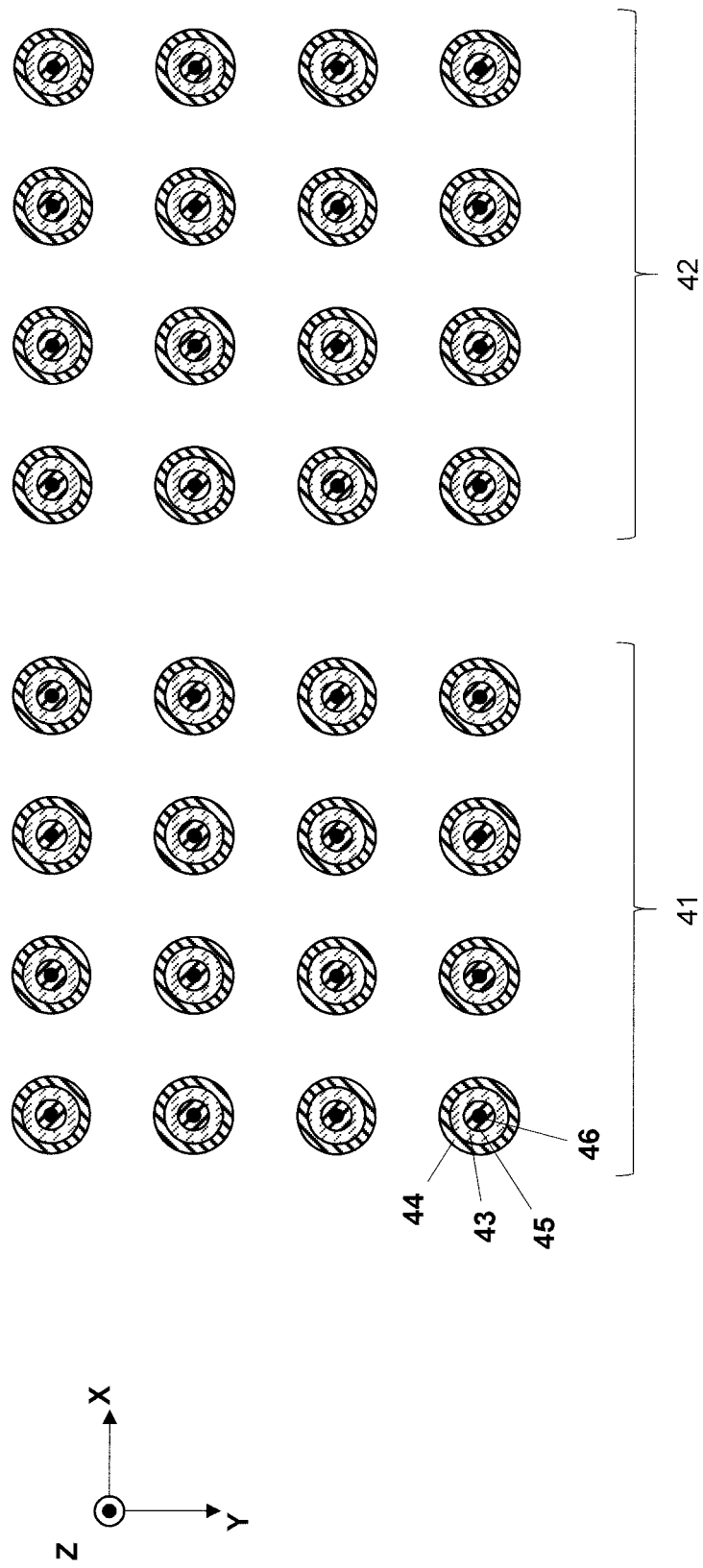
FIG. 6 is a cross-sectional view along B-B' line of FIG. 3.
Figure 7:
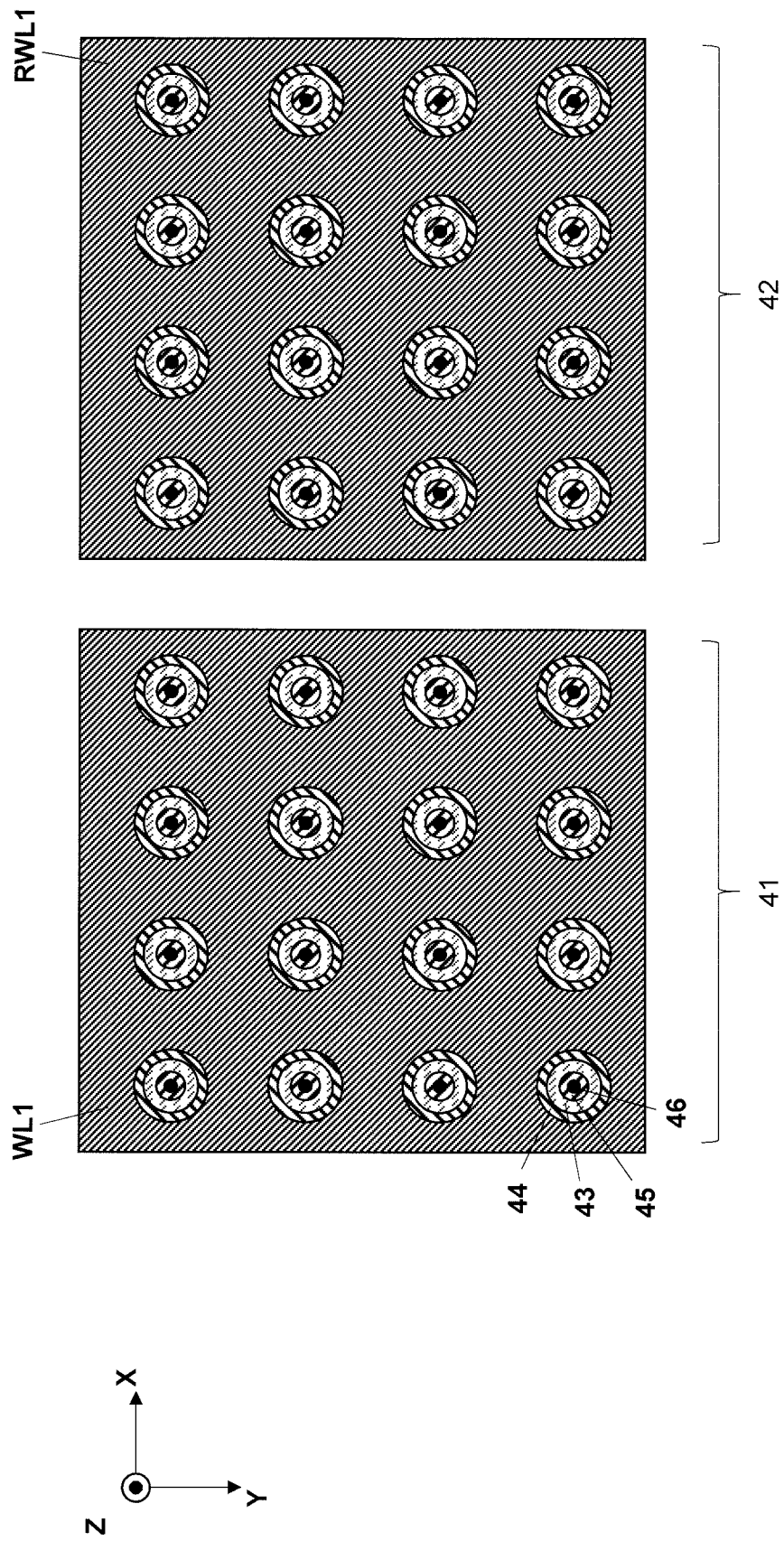
FIG. 7 is a cross-sectional view along C-C' line of FIG. 3.
Figure 8:
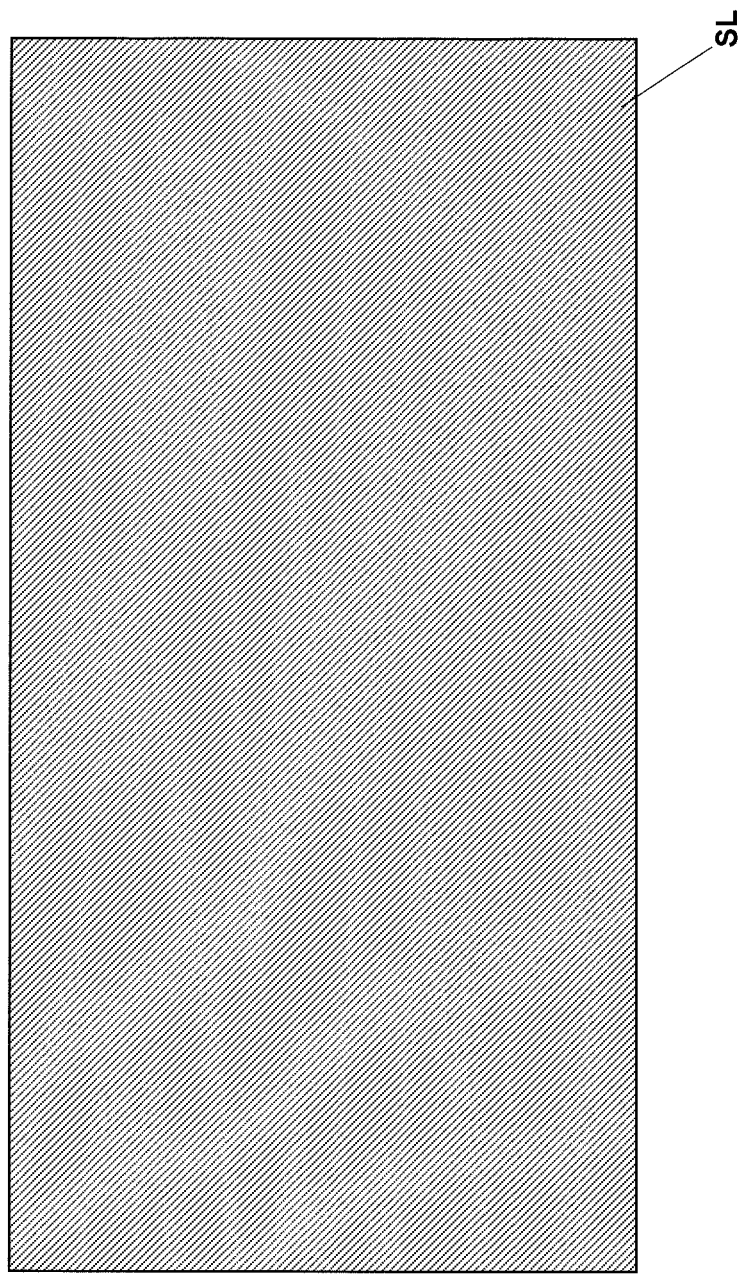
FIG. 8 is a cross-sectional view along D-D' line of FIG. 3.

FIGS. 5 to 8 show examples of cross-sectional view in the X-Y plane seen from the Z-direction of the memory cell array 11 included in the memory chip 10 according to the first embodiment. FIG. 5 is a cross-sectional view along A-A' line in FIG. 3, FIG. 6 is a cross-sectional view along B-B' line in FIG. 3, FIG. 7 is a cross-sectional view along C-C' line in FIG. 3, FIG. 8 is a cross-sectional view along D-D' line in FIG. 3.

As shown in FIGS. 2 to 8, the memory cell array 11 includes a plurality of blocks arranged side by side in the X-direction. FIGS. 2 and 3 show examples in which a normal memory block region 41 and a reset memory block region 42 are arranged side by side in the X-direction.

In the memory cell array 11, the bit lines BL0 to BL3 extending in the X-direction are arranged in parallel at the top portion in the Z-direction. The bit lines BL0 to BL3 are formed of a conductor such as tungsten, for example. Below the bit lines BL0 to BL3, there are selecting gate lines SG0 to SG3 and reset selecting gate lines RSG0 to RSG3 extending in the Y-direction in parallel.

The selecting gate lines SG0 to SG3 are arranged in the normal memory block region 41, and the reset selecting gate lines RSG0 to RSG3 are arranged in the reset memory block region 42, respectively. The selecting gate lines SG0 to SG3 and the reset selecting gate lines RSG0 to RSG3 are also formed of a conductor such as tungsten, for example. The selecting gate lines SG0 to SG3 and the reset selecting gate lines RSG0 to RSG3 are insulated from the bit lines BL0 to BL3.

A word line WL0 is arranged below the selecting gate lines SG0 to SG3 in the Z-direction, and a reset word line RWL0 is arranged below the reset selecting gate lines RSG0 to RSG3 in the Z-direction. The word line WL0 and the reset word line RWL0 are arranged in substantially the same X-Y plane. The word line WL0 is arranged in the normal memory block region 41, and the reset word line RWL0 is arranged in the reset memory block region 42. The word line WL0 and the reset word line RWL0 are also formed of a conductor such as tungsten, for example. The word line WL0 is insulated from the selecting gate lines SG0 to SG3. The reset word line RWL0 is insulated from the reset selecting gate lines RSG0 to RSG3.

Word lines WL1 to WL15 are arranged below the word line WL0, and the reset word lines RWL1 to RWL15 are arranged under the reset word line RWL0. Each of the word lines WL1 to WL15 and the reset word lines RWL1 to RWL15 is arranged in a corresponding X-Y plane. The word lines WL1 to WL15 and the reset word lines RWL1 to RWL15 are formed of a conductor such as tungsten, for example. The word lines WL1 to WL15 and the reset word lines RWL1 to RWL15 are individually insulated. The word lines WL1 to WL15 are insulated from the word line WL0, and the reset word lines RWL1 to RWL15 are insulated from the reset word line RWL0.

Below the word line WL15 and the reset word line RWL15, a source line SL is arranged in the X-Y plane. The source line SL is formed of a conductor such as tungsten, for example, and insulated from the word line WL15 and the reset word line RWL15.

Although FIGS. 2 and 3 show examples in which the normal memory block region 41 and the reset memory block region 42 are arranged side by side in the X-direction, the normal memory block region and the reset memory block region need not be adjacent to each other. For example, there may be another normal memory block region between the normal memory block region and the reset memory block region. If the selecting gate lines SG0 to SG3 of a certain normal memory block region 41 and the reset selecting gate lines RSG0 to RSG3 of a certain reset memory block region 42 are arranged below the same bit lines BL0 to BL3, they function as the normal memory block region 41 and the reset memory block region 42 in the present embodiment.

As shown in FIGS. 3 to 7, a cylindrical memory pillar MP (memory pillar MP in the normal memory block region 41 is the first memory pillar MP1 and memory pillar MP in the reset memory block region 42 is the second memory pillar MP2) extending in the Z-direction is arranged through the openings formed in the selecting word lines SG0 to SG3, the reset selecting gate lines RSG0 to RSG3, the word lines WL0 to WL15, and the reset word line RWL0 to RWL15. The cylindrical memory pillar MP includes a cylindrical hollow gate insulating film 44 and a semiconductor pillar 43 therein from the outside. The gate insulating film 44 may include a silicon dioxide film, a silicon nitride film, or a stacked layer film thereof. The semiconductor pillar 43 may include a semiconductor film such as polycrystalline silicon, amorphous silicon, or the like. The bottom of the memory pillar MP reaches the source line SL and is electrically connected thereto.

In the portion of the memory pillar MP (the first memory pillar MP1, the second memory pillar MP2) surrounded by the word lines WL0 to WL15, the reset word lines RWL0 to RWL15 and the insulating film in the vicinity thereof, the semiconductor pillar 43 has a cylindrical hollow shape. The portion of the memory pillar MP includes a cylindrical hollow variable resistance layer 45 and a cylindrical core member 46 inside the cylindrical shape semiconductor pillar 43.

The variable resistance layer 45 includes, for example, at least 1 or more chalcogen elements selected from the group consisting of Te, Se, and S. Alternatively, a chalcogenide which is a compound containing this chalcogen element may be included. In addition, it may contain at least one element selected from the group consisting of B, Al, Ga, In, C, Si, Ge, Sn, As, P, and Sb. In the following explanation, for example, the phase change memory (PCM) element or the variable resistance memory element having characteristics similar to that of the PCM element is used for the variable resistance layer 45. It is also possible to use the variable resistance memory element other than the PCM element such as the ReRAM element, the operation may be appropriately read according to the characteristics of the element used in that case. As will be described later, to set (writing) the resistance state of the variable resistance layer 45, first, a voltage pulse is applied to the variable resistance layer 45. When setting the high resistance state, it is steeply lowered after the voltage pulse is applied. As a result, the variable resistance layer 45 is rapidly cooled, and its constituent materials become amorphous. When setting a low resistance state, it is slowly lowered after the voltage pulse is applied. As a result, the variable resistance layer 45 is gradually cooled and its constituent materials become crystalline state.

The cylindrical core member 46 includes an insulator such as, for example, silicon nitride (SiN). The cylindrical hollow shaped variable resistance layer 45 covers the side (outer periphery) of the core member 46. The inside of the variable resistance layer 45 is in contact with the core member 46. For example, the bottom of the variable resistance layer 45 contacts the source line SL.

The cylindrical hollow (cylindrical in a portion surrounded by the selecting gate lines SG0 to SG3 and the reset selecting gate lines RSG0 to RSG3) semiconductor pillar 43 covers the side (outer periphery) of the variable resistance layer 45. The inside of the semiconductor pillar 43 is in contact with the variable resistance layer 45. The bottom of the semiconductor pillar 43 contacts the source line SL.

<1-1-5> Circuit Diagram of Memory Block

Figure 9:
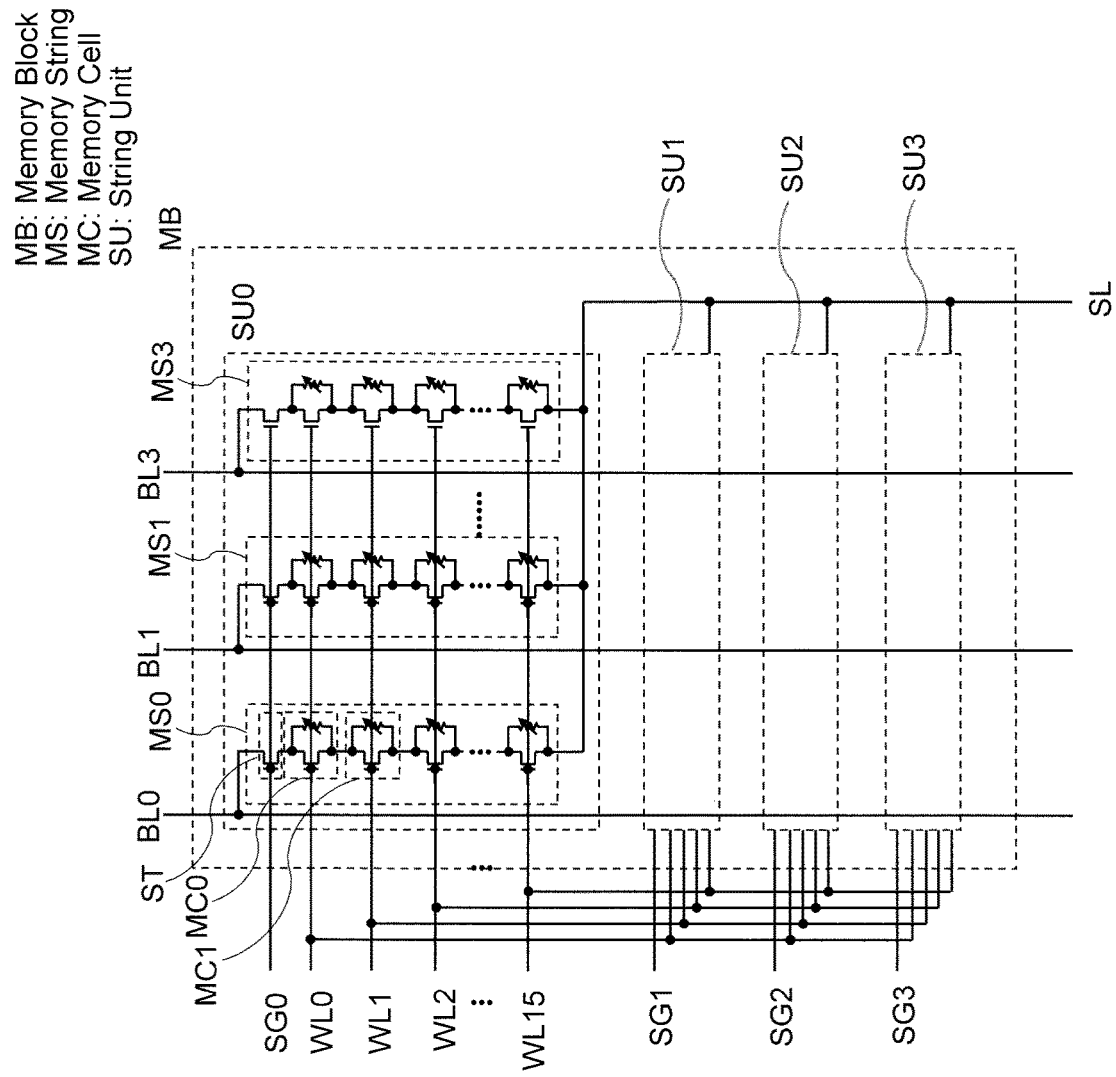
FIG. 9 is a circuit diagram of a normal memory block.

FIG. 9 is a circuit diagram of a normal memory block MB. In FIGS. 2 to 8, the normal memory block MB is formed in the normal memory block region 41. The normal memory block MB includes a string unit SU0 to which the selecting gate line SG0 is connected, a string unit SU1 to which the selecting gate line SG1 is connected, a string unit SU2 to which the selecting gate line SG2 is connected, and a string unit SU3 to which the selecting gate line SG3 is connected.

Each string unit SU (SU0 to SU3) includes a memory string MS0 connected between the bit line BL0 and the source line SL, a memory string MS1 connected between the bit line BL1 and the source line SL, and a memory string MS3 connected between the bit line BL3 and the source line SL.

In the memory string MS (MS0 to MS3), a selecting gate transistor ST, a memory cell MC0, a memory cell MC1, . . . a memory cell MC15 are connected in series from the side near the bit line BL (BL0 to BL3). The number of the memory cells MC included in each of the memory cell strings MS does not have to be 16. For example, the number of memory cells MC included in each of the memory cell strings MS may be 8, 32, 48, 64, 96, 128, or the like, and the number thereof is not limited.

In FIGS. 3 and 5, the portion of the first memory pillar MP1 (including the gate insulating film 44 and the semiconductor pillar 43) surrounded by the selecting gate line SG (SG0 to SG3) corresponds to a selecting gate transistor ST. The selecting gate transistor ST is driven by a voltage applied to the selecting gate line SG (SG0 to SG3). That is, in the selecting gate transistor ST, the conductivity of the part of the semiconductor pillar 43 is changed in accordance with the voltage applied to the selecting gate line SG (SG0 to SG3).

In FIGS. 3 and 7, the portion of the first memory pillar MP1 (including the gate insulating film 44, the semiconductor pillar 43, the variable resistance layer 45 and the core member 46) surrounded by the word line WL (WL0 to WL15) corresponds to the memory cell MC (MC0 to MC15). The memory cell MC is driven by a voltage applied to the word line WL. That is, in the memory cell MC, the conductivity of the part of the semiconductor pillar 43 is changed in accordance with the voltage applied to the word line WL. The memory cell MC can control the conductivity of the variable resistance layer 45. The resistance of the memory cell MC in Z-direction is a combined resistance in which the resistance of the semiconductor pillar 43 and the resistance of the variable resistance layer 45 are connected in parallel.

Figure 10:
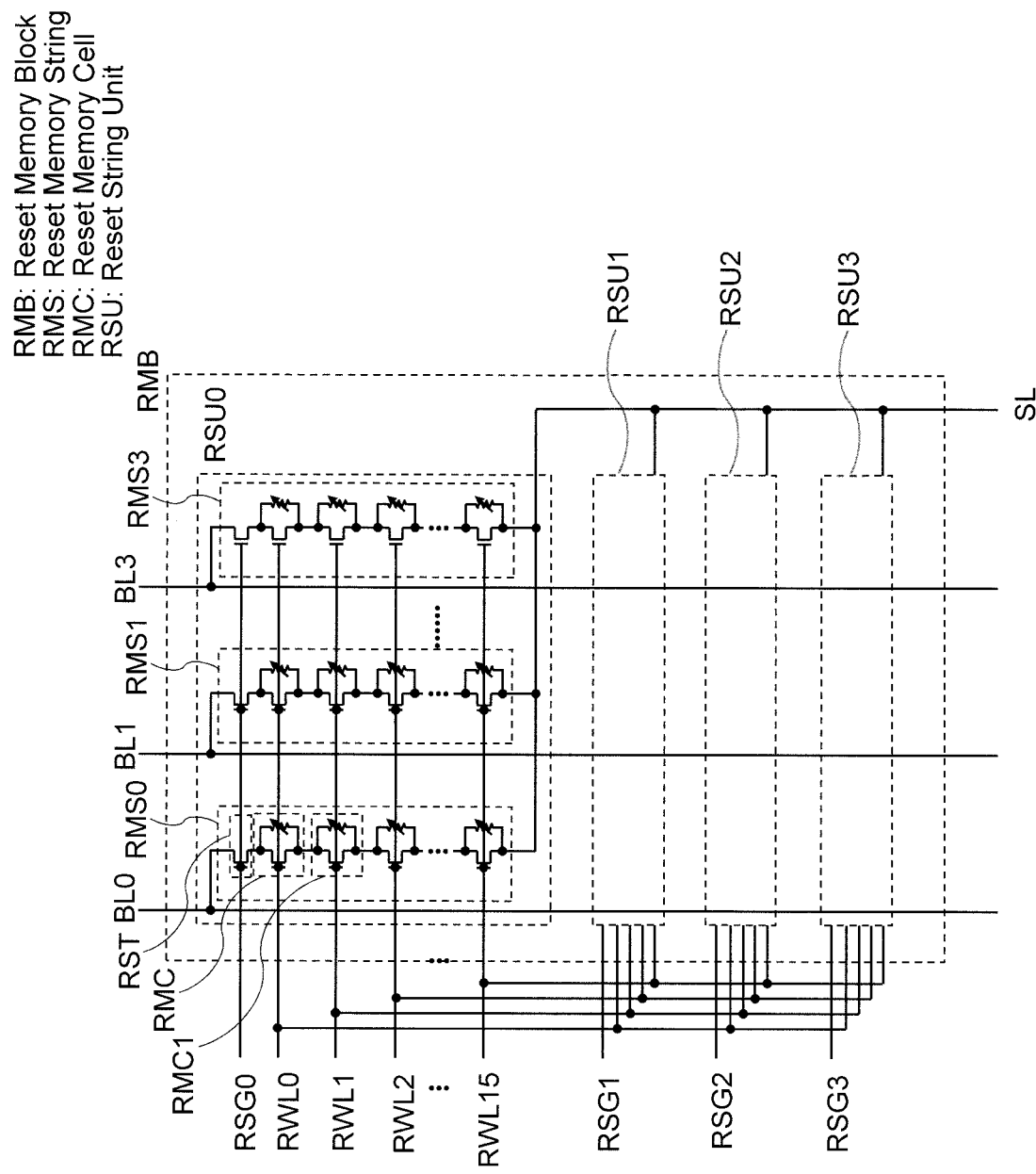
FIG. 10 is a circuit diagram of a reset memory block.

FIG. 10 is a circuit diagram of a reset memory block RMB. In FIGS. 2 to 8, the reset memory block RMB is formed in the reset memory block region 42. The reset memory block RMB includes a reset string unit RSU0 driven by the reset selecting gate line RSG0, a reset string unit RSU1 driven by the reset selecting gate line RSG1, a reset string unit RSU2 driven by the reset selecting gate line RSG2, and a reset string unit RSU3 driven by the reset selecting gate line RSG3.

Each reset string unit RSU (RSU0 to RSU3) includes a reset memory string RMS0 connected between the bit line BL0 and the source line SL, a reset memory string RMS1 connected between the bit line BL1 and the source line SL, and a reset memory string RMS3 connected between the bit line BL3 and the source line SL.

In the reset memory string RMS (RMS0 to RMS3), a reset selecting gate transistor RST, a reset memory cell RMC0, a reset memory cell RMC1, . . . a reset memory cell RMC15 are connected in series from the side close to the bit line BL (BL0 to BL3).

In FIGS. 3, 4 and 5, the portion of the second memory pillar MP2 (including the gate insulating film 44 and the semiconductor pillar 43) surrounded by the reset selecting gate line RSG (RSG0 to RSG3) corresponds to a reset selecting gate transistor RST. The reset selecting gate transistor RST is driven by a voltage applied to the reset selecting gate line RSG (RSG0 to RSG3). That is, in the reset selecting gate transistor RST, the conductivity of the part of the semiconductor pillar 43 is changed in accordance with the voltage applied to the reset selecting gate line RSG (RSG0 to RSG3).

In FIGS. 3, 4 and 7, the portion of the second memory pillar MP2 (including the gate insulating film 44, the semiconductor pillar 43, the variable resistance layer 45 and the core member 46) surrounded by the reset word line RWL (RWL0 to RWL15) corresponds to the reset memory cell RMC (RMC0 to RMC15). The reset memory cell RMC is driven by a voltage applied to the reset word line RWL. That is, in the reset memory cell RMC, the conductivity of the part of the semiconductor pillar 43 is changed in accordance with the voltage applied to the reset word line RWL. The reset memory cell RMC can control the conductivity of the variable resistance layer 45. The resistance of the reset memory cell RMC in Z-direction is a combined resistance in which the resistance of the semiconductor pillar 43 and the resistance of the variable resistance layer 45 are connected in parallel.

Figure 11:
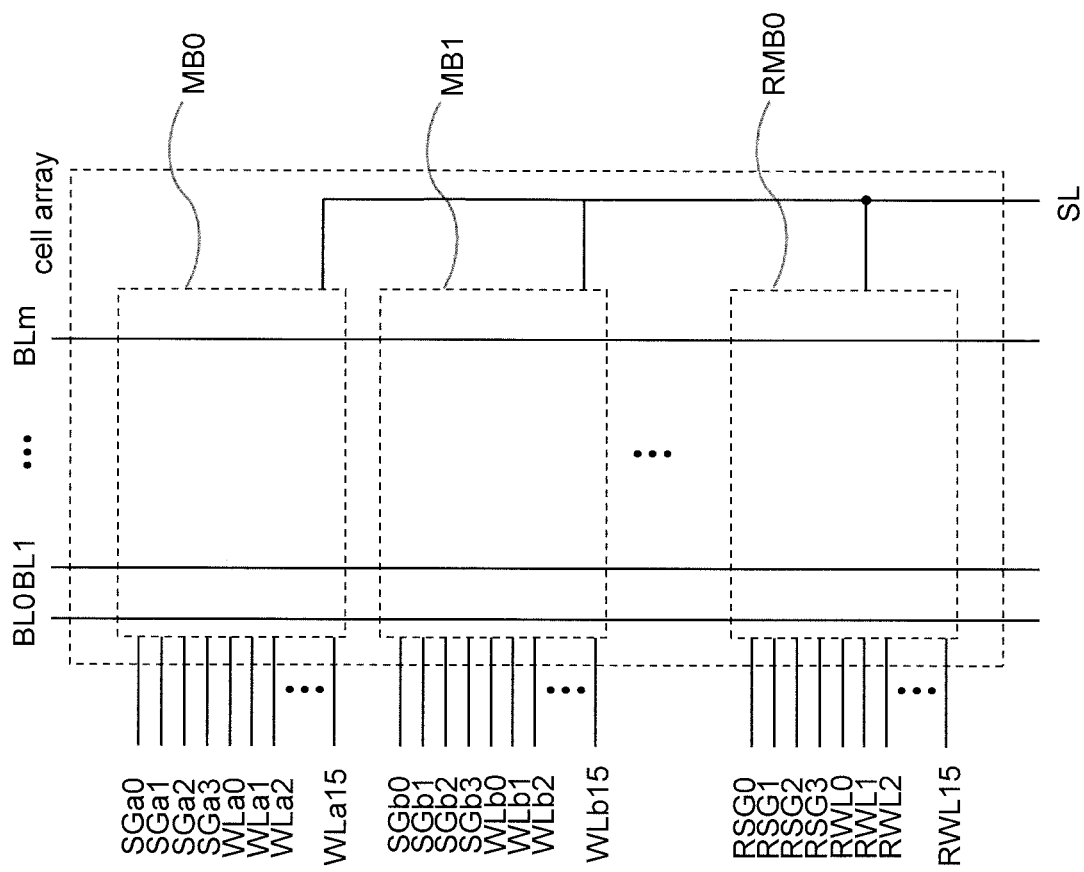
FIG. 11 is a schematic diagram of a normal memory block and a reset memory block are arranged.

FIG. 11 is a schematic diagram showing a state in which the memory block MB (MB0, MB1 . . . ) and the reset memory block RMB0 are arranged in a row. The cell array includes a plurality of normal memory blocks MB (MB0, MB1 . . . ) and one reset memory block RMB0. In this cell array, the bit line BL (BL0 to BLm) are common, and the source line SL is common.

<1-1-6> A Method of Selecting the Memory Cell

Figure 12:
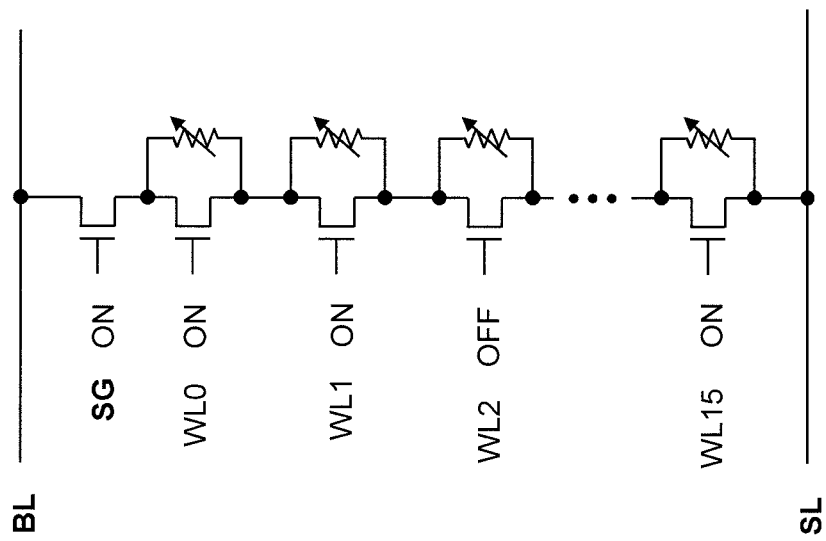
FIG. 12 is a diagram showing selected state of a memory cell.
Figure 13:
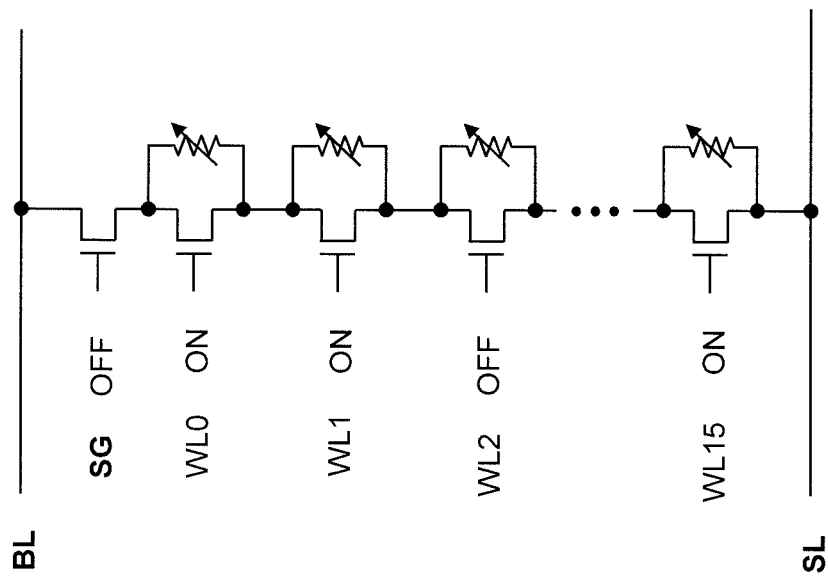
FIG. 13 is a diagram showing non-selected state of a memory cell.
Figure 14:
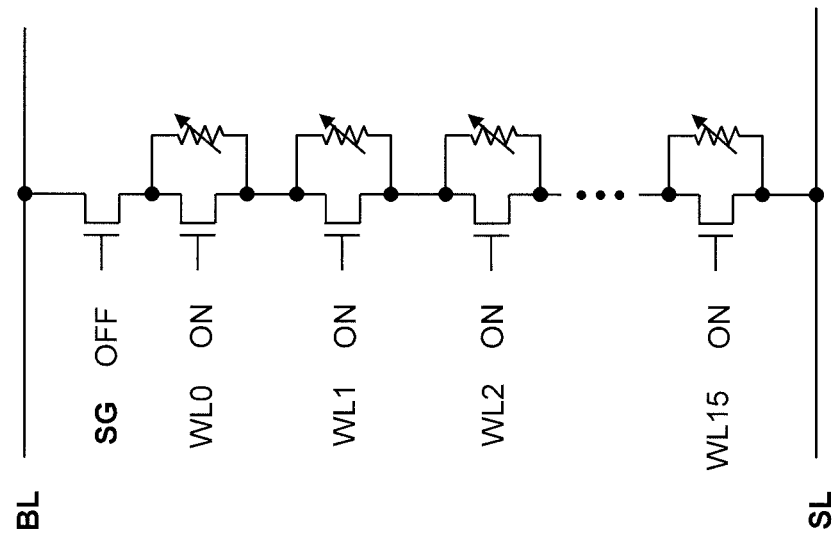
FIG. 14 is a diagram showing non-selected state of a memory cell.

Referring to FIGS. 12 to 14, a method of selecting the memory cell will be described. Reading from a particular memory cell is performed by selecting the memory block MB, selecting the string unit SU within the selected memory block MB, and selecting the memory cell MC within the selected string unit SU. The unselected word line WL is supplied with the ON voltage enough to conduct the memory cell MC.

As shown in FIG. 12, in the selected string unit SU of the selected memory block MB, the selecting gate line SG is supplied with the ON voltage enough to conduct the selecting gate transistor (sufficient carriers are induced in the region of the semiconductor pillar 43 to reduce the resistance). When selecting the memory cell MC connected to a word line WL2, the word lines WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with an OFF voltage that is insufficient to conduct the memory cell MC (the resistance becomes large without inducing sufficient carriers to the region of the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written to the selected memory cell MC can be read.

As shown in FIG. 13, in a non-selected string unit SU of the selected memory block MB, the selecting gate line SG is supplied with the OFF voltage that is insufficient to conduct the selecting gate transistor. As a result, even if the ON voltage is supplied to the word lines WL0, WL1, WL3 to WL15, no current flows through the string unit SU.

Similarly, as shown in FIG. 14, in the non-selected memory block MB, the OFF voltage is supplied to the selecting gate line SG. As a result, no current flows through the string unit SU even if the word lines WL0 to WL15 are supplied with the ON voltage.

<1-1-7> Arrangement of the Sense Amplifier

Figure 15:
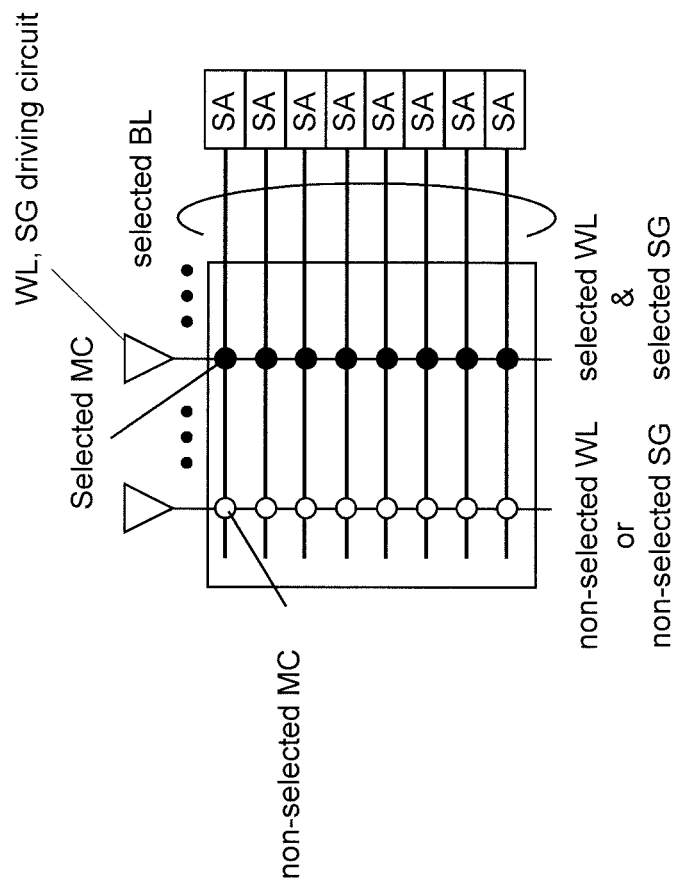
FIG. 15 is a diagram showing an example of a connection structure between a bit line and a sense amplifier.

The arrangement of the sense amplifiers SA and the connecting structure between the bit lines BL and the sense amplifiers SA is shown in FIG. 15. In FIG. 15, the sense amplifiers SA are arranged in a row on one side of the memory cell array 11. The bit lines BL and the sense amplifiers SA correspond to each other in a one-to-one manner. In other words, there is the same number of sense amplifiers SA as the bit lines. The driving circuit for driving the word line WL and the selecting gate line SG is arranged on another side of the memory cell array 11. The ON voltage is supplied to a particular selecting gate line SG by the driving circuit. The OFF voltage is supplied to the selected word line WL of the word line WL. The ON voltage is supplied to the other word line WL. As a result, the data of the selected group of memory cells MC is simultaneously read out to the sense amplifier SA through the bit line BL. In other words, in this configuration, all the bit lines BL can be read simultaneously. In addition, all the bit lines BL can be written at the same time by the writing method described later.

Figure 16:
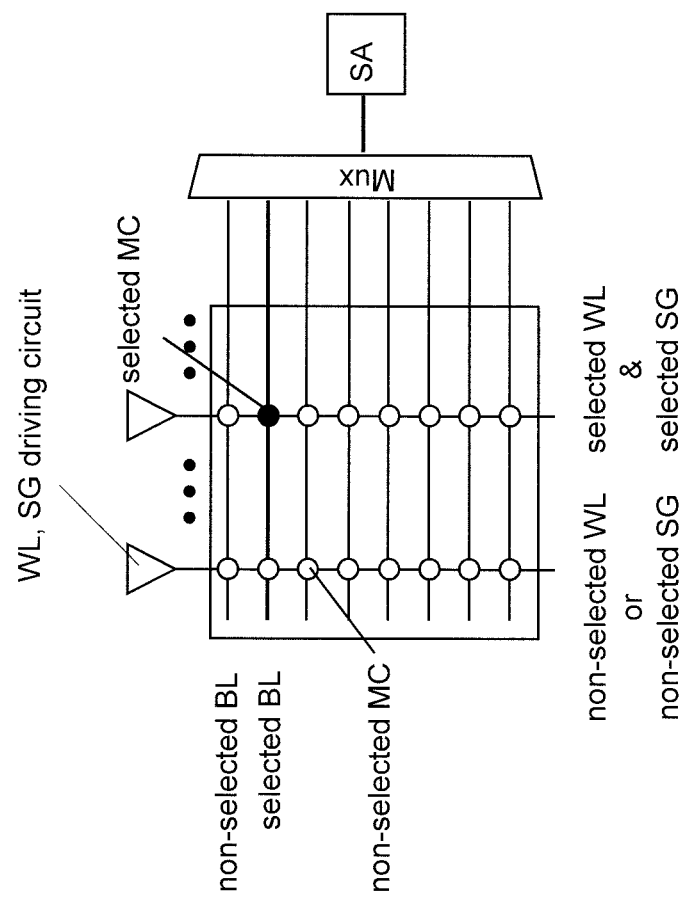
FIG. 16 is a diagram showing an another example of a connection structure between a bit line and a sense amplifier.

FIG. 16 shows another example of the arrangement of the sense amplifier SA and the connection structure between the bit lines BL and the sense amplifier SA. In FIG. 16, a single sense amplifier SA is arranged on one side of the memory cell array 11. The bit lines BL and the sense amplifier SA are multi-to-one compatible through the multiplexer circuit MUX. The driving circuit for driving the word line WL and the selecting gate line SG is arranged on another side of the memory cell array 11. The ON voltage is supplied to a particular selecting gate line SG by the driving circuit. The OFF voltage is supplied to the selected word line WL of the word line WL. The ON voltage is supplied to the other word line WL. As a result, the data is read to the sense amplifier SA only through the bit line BL selected by the multiplexer MUX among the data of the selected group of the memory cells MC. That is, in this configuration, it is possible to read from 1-bit line BL for each 1 memory cell array 11. Writing to 1-bit line BL can be performed by the writing method described later.

Figure 17:
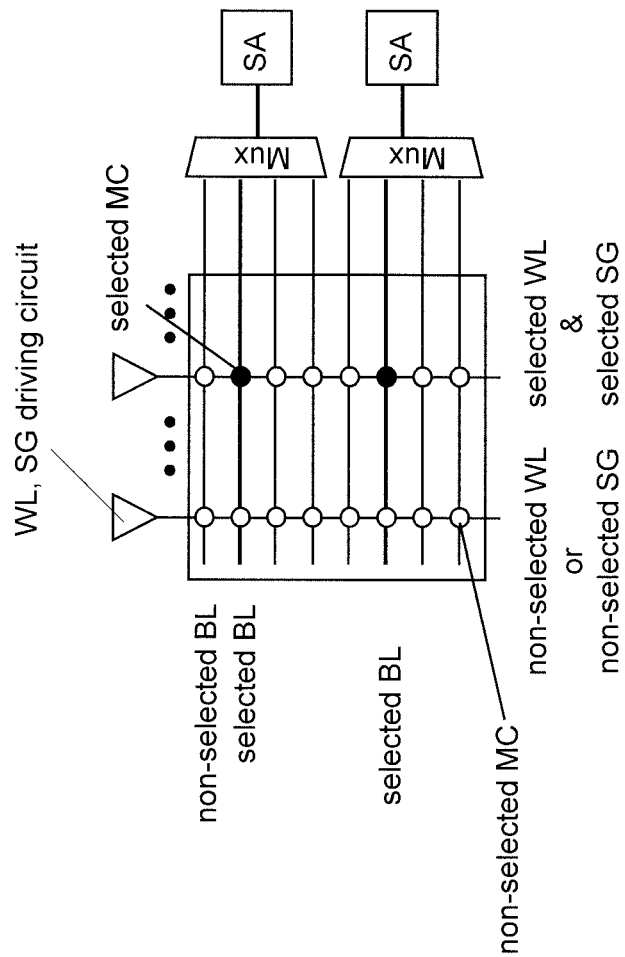
FIG. 17 is a diagram showing an another example of a connection structure between a bit line and a sense amplifier.

FIG. 17 shows still another example of an arrangement of the sense amplifier SA and the connection structure between the bit lines BL and the sense amplifiers SA. In FIG. 17, a plurality of sense amplifiers SA is arranged on one side of the memory cell array 11. Each bit lines BL are grouped into a plurality of groups, and the bit lines BL and the sense amplifier SA belonging to the same group correspond to each other in many-to-one correspondence through the multiplexer circuit MUX. The driving circuit for driving the word line WL and the selecting gate line SG is arranged on another side of the memory cell array 11. The ON voltage is supplied to a particular selecting gate line SG by the driving circuit. The OFF voltage is supplied to the selected word line WL of the word line WL. The ON voltage is supplied to the other word line WL. As a result, the data is read to the plurality of sense amplifiers SA via only the plurality of the bit lines BL (two in FIG. 17) selected by the multiplexers MUX among the data of the selected group of the memory cells MC. That is, in this configuration, it is possible to read from a plurality of bit lines BL for each one memory cell array 11. Writing to the plurality of bit lines BL can be performed by the writing method described later.

<1-2> Explanation of Operation

<1-2-1> Explanation of Reset Operation

Figure 18:
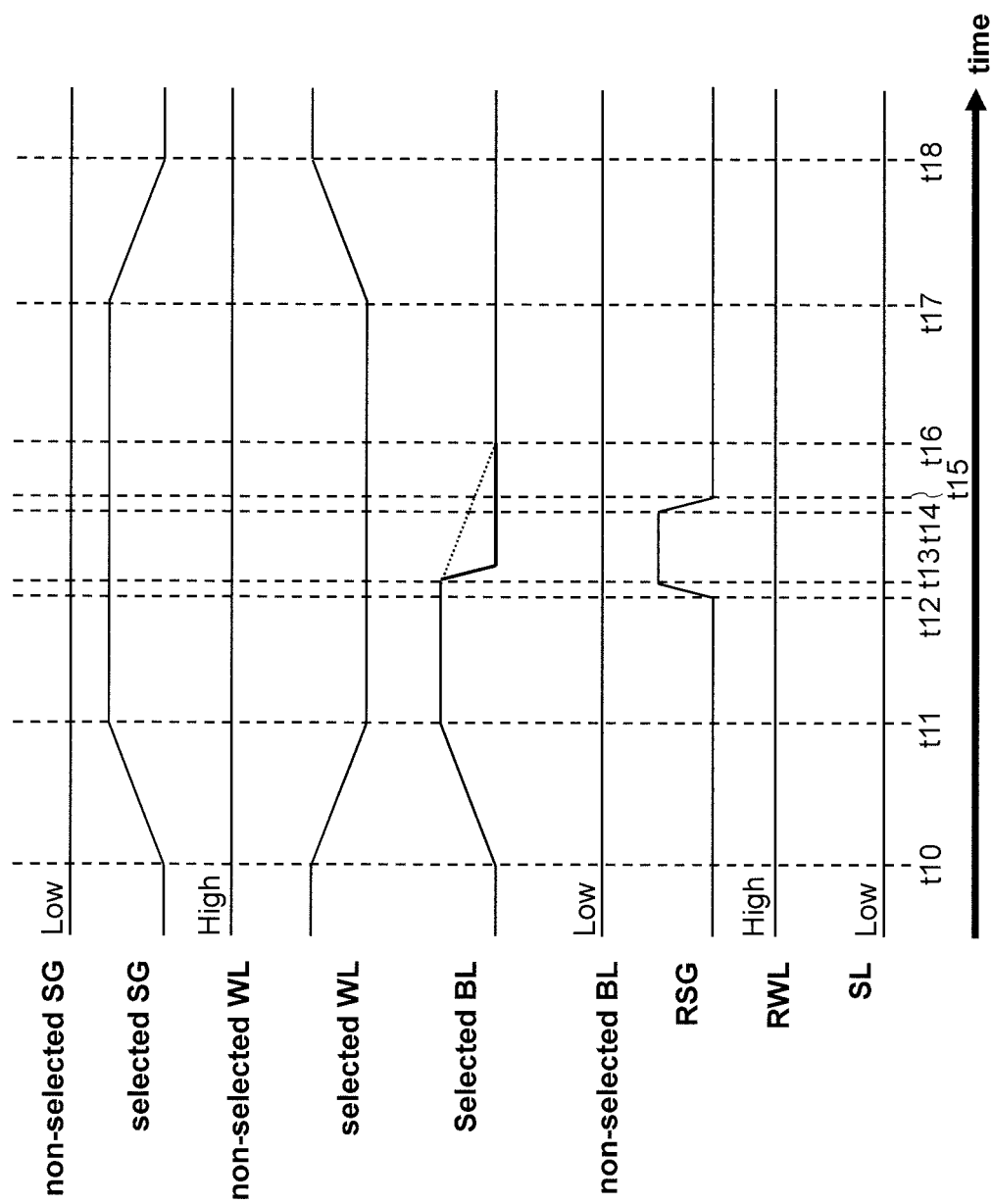
FIG. 18 is a waveform diagram showing voltages applied to each line at a reset operation.

FIG. 18 is a waveform diagram showing voltages applied to the selecting gate line SG, the reset selecting gate line RSG, the word line WL, the reset word line RWL, the bit line BL, and the source line SL in the reset operation (operation for increasing the resistance of the variable resistance layer 45 of the selected memory cell in the write operation).

The unselected selecting gate line SG is constant at Low. The unselected word line WL is constant at High. The unselected bit line BL is constant at Low. The reset word line RWL is constant at High. The source line SL is constant at Low.

Figure 25:
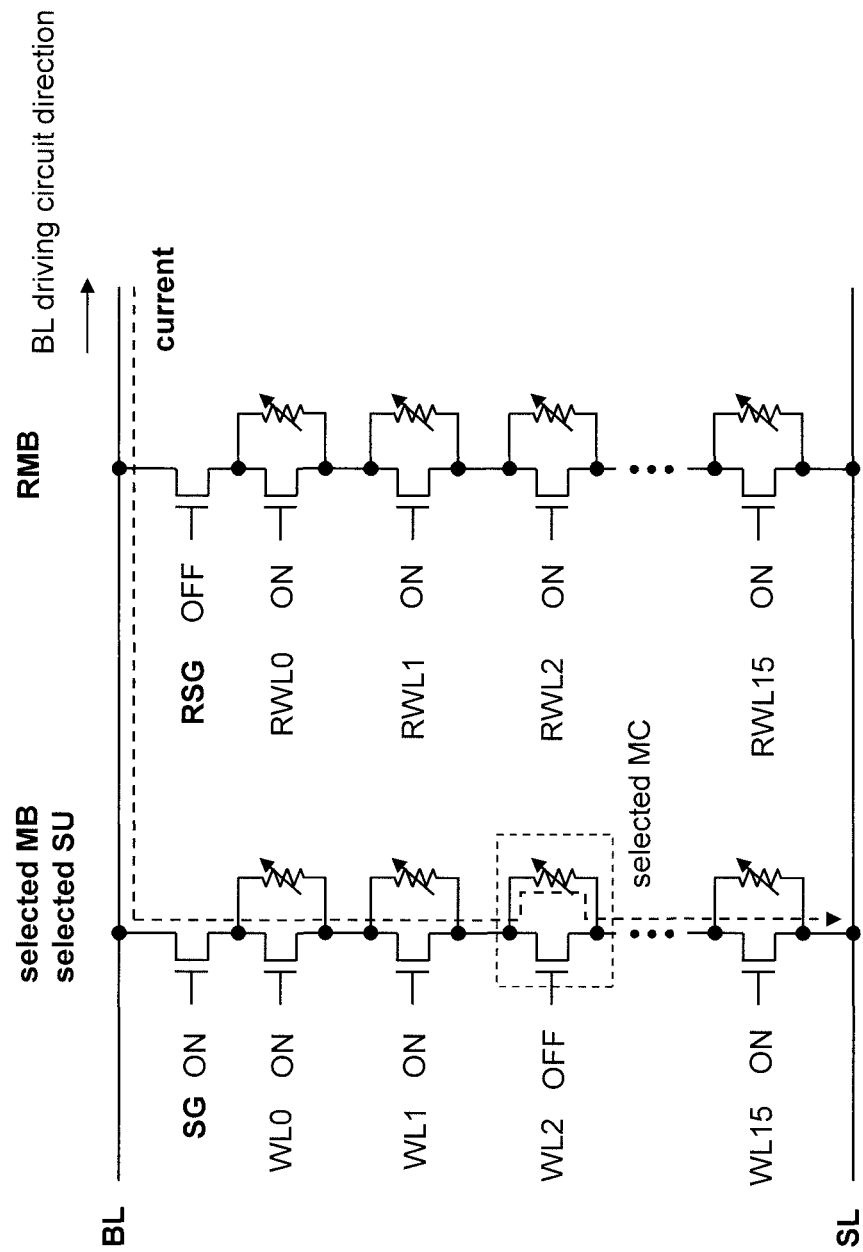
FIG. 25 is a circuit diagram showing a path of current flowing in a selected memory cell.

At time t10, the selected selecting gate line SG starts to rise from Low to High, the selected word line WL starts to fall from High to Low, and the selected bit line BL starts to rise from Low to High. Since the selecting gate line SG, the word line WL, and the bit line BL have constant parasitic capacitances, the rising edge and the falling edge may not be steep in some cases. By time t11, the selected selecting gate line reaches High, the selected word line WL reaches Low, and the selected bit line BL reaches High. During a period from around time t11 to around time t13, current flows to the region of the semiconductor pillar 43 in the non-selected memory cell MC, and current flows to the variable resistance layer 45 in the selected memory cell MC. The variable resistance layer 45 undergoes a phase change due to the heat generated by the current flowing therethrough. This state is shown in FIG. 25.

Figure 26:
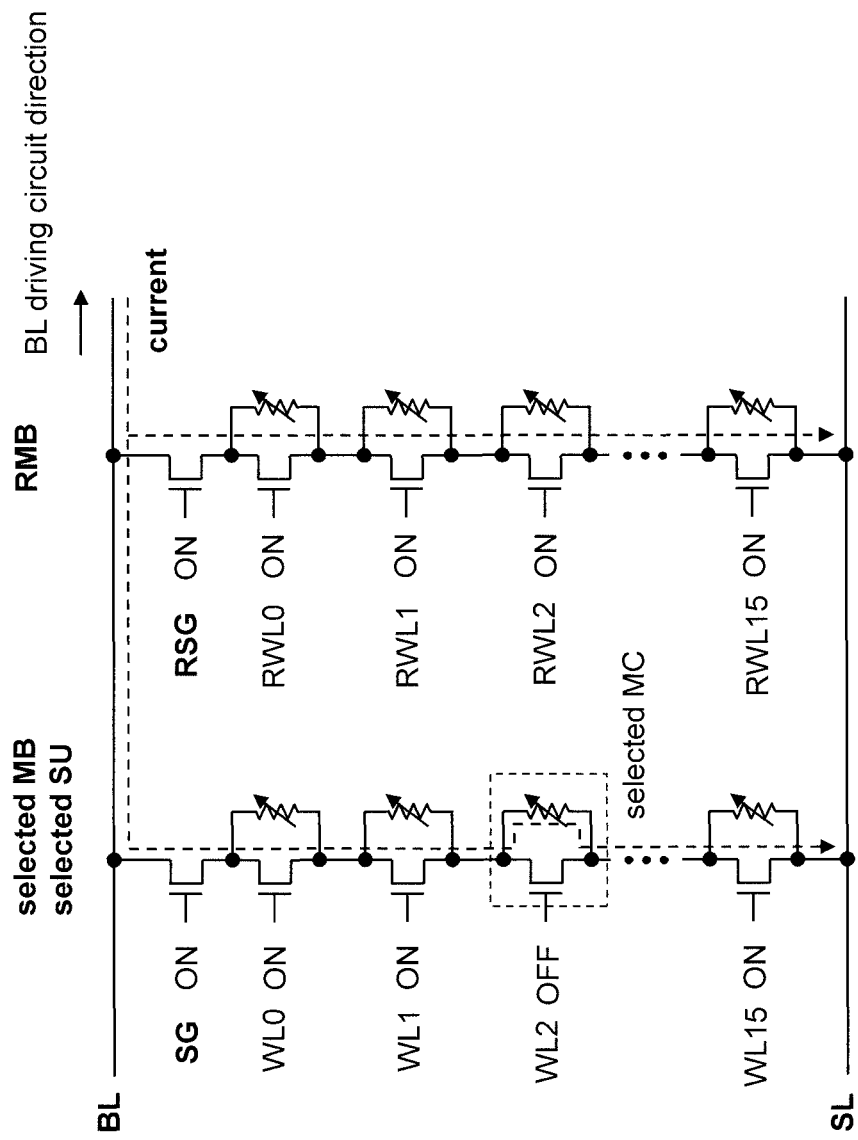
FIG. 26 is a circuit diagram showing a path of current flowing through a reset memory string.

At time t12, the reset selecting gate line RSG is raised from Low to High. Here, the rising edge of the reset selecting gate line RSG is steeper than the rising edge of the selecting gate line SG. Since the reset selecting gate line RSG is arranged only in the reset memory block, it can be realized by, for example, devising the configuration of the reset selecting gate line RSG or the reset memory block and reducing the effective capacitance or resistance. The reset selecting gate line RSG reach High at time t13. At time t13, the sense amplifier SA located outside the memory cell array 11 starts driving the selected bit line BL from High to low. At the same time, since current flows from the bit line BL to the source line SL in the reset memory string RMS of the reset memory block RMB, the voltage of the selected bit line BL steeply falls from High voltage to the low voltage. FIG. 18 shows a dotted line showing the voltage-waveform of the selected bit line BL when the bit line BL was only driven from High to Low by the sense amplifier SA located outside the memory cell array 11. In this case, it takes until time t16 for the selected bit line BL to fall to Low. In this way, the selected bit line BL falls steeply due to the presence of the reset memory block RMB. Due to this steep fall, the variable resistance layer 45 of the memory cell MC connected to the selected word line WL is rapidly cooled to become an amorphous phase, resulting in a high resistance. This state is shown in FIG. 26.

Subsequently, at time t14, the falling of the reset selecting gate line RSG from High to Low is started, and by time t15, the reset selecting gate line RSG reaches the Low. Further, at time t17, the selecting gate line SG starts to fall from High to Low, and the selected word line WL starts to rise from Low to High. By time t18, the selecting gate line SG reaches Low and the selected word line WL reaches High. In this manner, the reset operation is completed through a series of processes.

<1-2-2> Explanation of Set Operation

Figure 19:
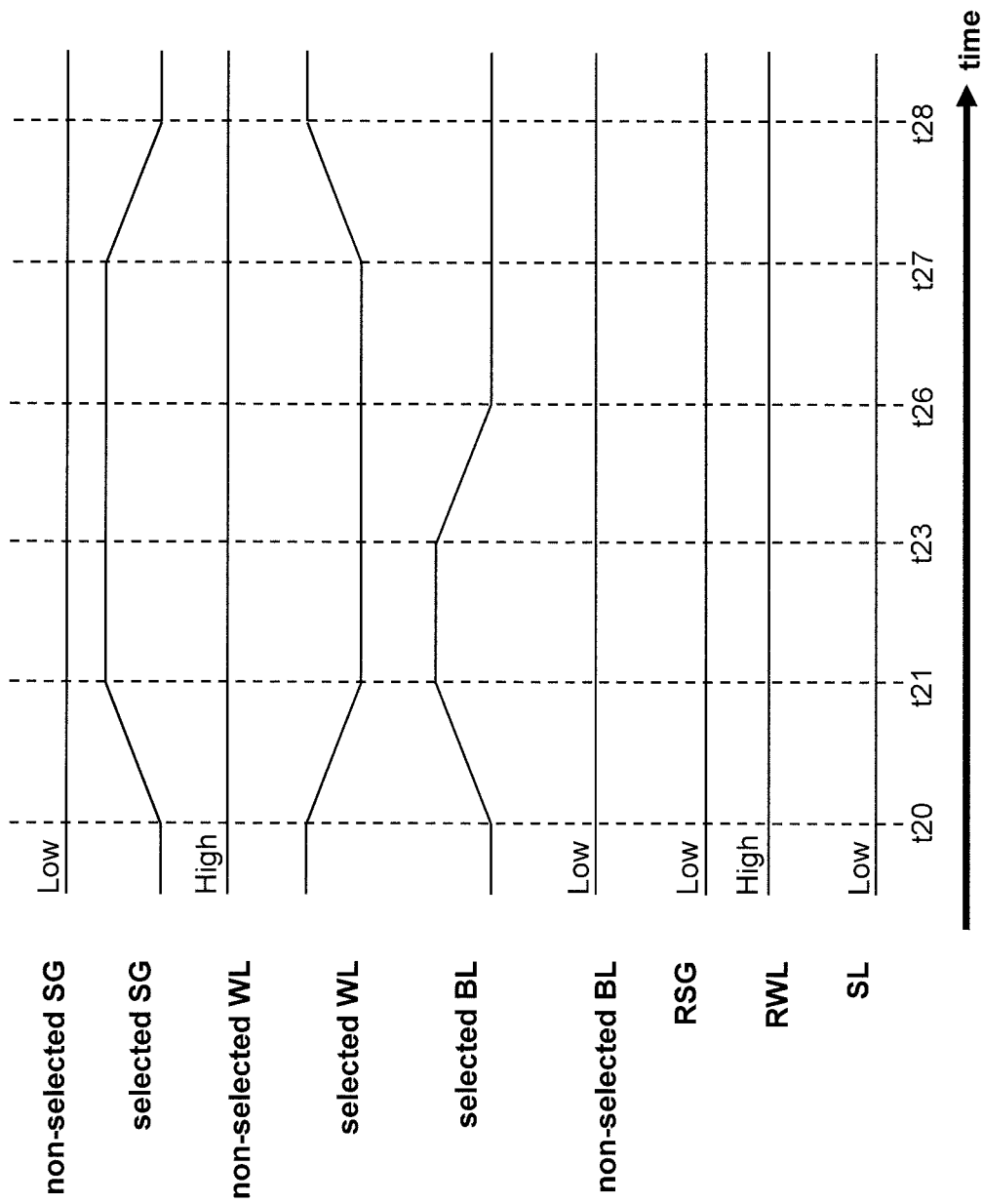
FIG. 19 is a waveform diagram showing voltages applied to each line in a set operation.

FIG. 19 is a waveform diagram showing voltages applied to the selecting gate line SG, the reset selecting gate line RSG, the word line WL, the reset word line RWL, the bit line BL, and the source line SL in a set operation (operation for decreasing the resistance of the variable resistance layer 45 of the selected memory cell in the write operation).

The unselected selecting gate line SG is constant at Low. The unselected word line WL is constant at High. The unselected bit line BL is constant at Low. The reset selecting gate line RSG is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. By time t21, the selected selecting gate line SG reaches High, the selected word line WL reaches Low, and the selected bit line BL reaches High. Current flows to the region of the semiconductor pillar 43 in the non-selected memory cell MC from around time t21 until time t26, and current flows to the variable resistance layer 45 in the selected memory cell MC. The variable resistance layer 45 undergoes a phase change due to the heat generated by the current flowing therethrough.

At time t23, the sense amplifier SA located outside the memory cell array 11 starts driving the selected bit line BL from High to Low. Here, since no current flows from the bit line BL to the source line SL in the reset memory string RMS of the reset memory block RMB, the voltage of the selected bit line BL does not fall steeply from High to Low. It takes until time t26 for the bit line BL to fall Low. Due to this slow fall, the variable resistance layer of the memory cell MC connected to the selected word line WL is gradually cooled down to a crystalline phase, resulting in a low resistance. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<1-2-3> Explanation of Read Operation

Figure 20:
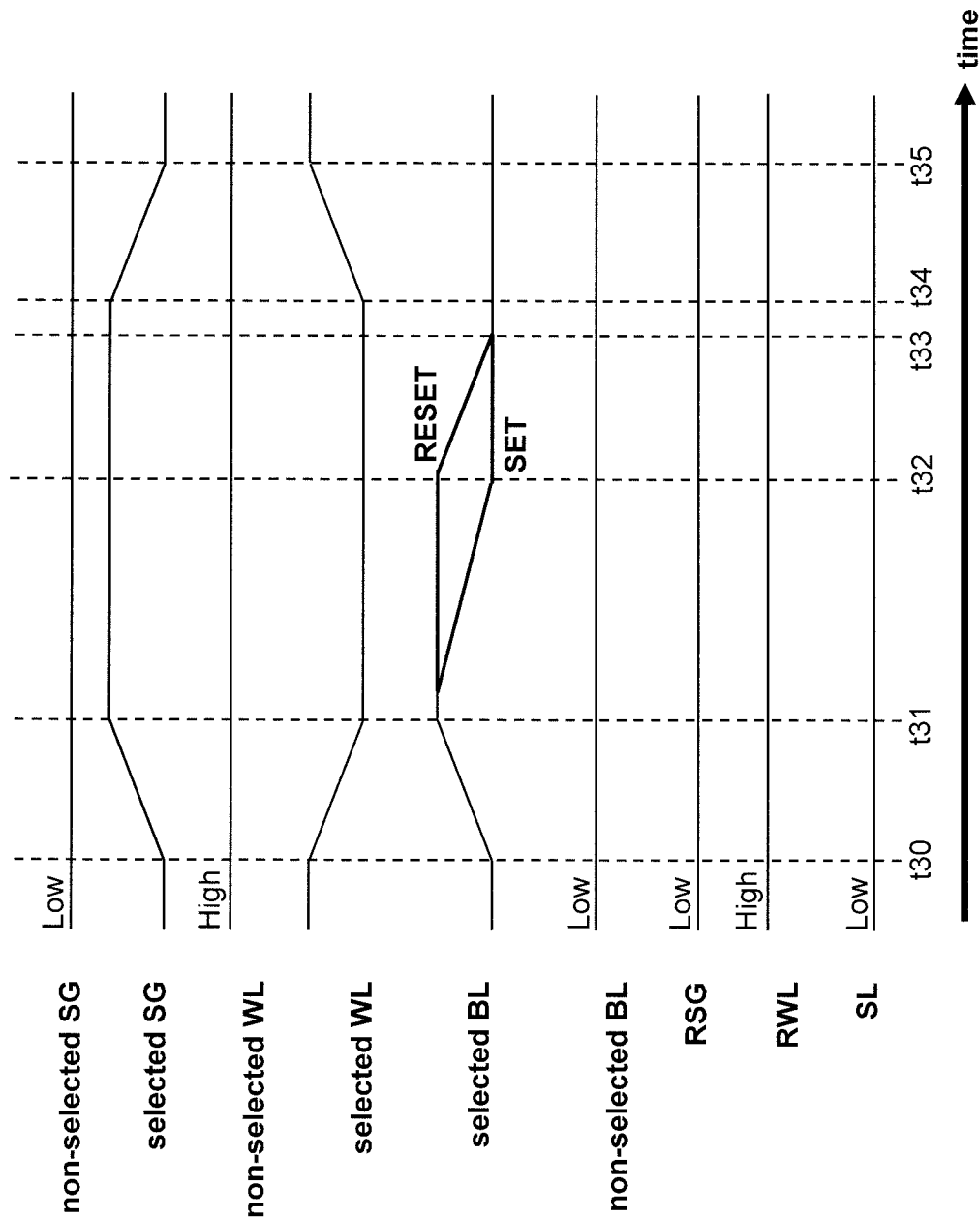
FIG. 20 is a waveform diagram showing voltages applied to each line in a read operation.

FIG. 20 is a waveform diagram showing voltages applied to the selecting gate line SG, the reset selecting gate line RSG, the word line WL, the reset word line RWL, the bit line BL, and the source line SL in a read operation.

The unselected selecting gate line SG is constant at Low. The unselected word line WL is constant at High. The unselected bit line BL is constant at Low. The reset selecting gate line RSG is constant at Low. The reset word line RWL is constant at High. The source line SL is constant at Low.

At time t30, the selected selecting gate line SG starts to rise from Low to High, the selected word line WL starts to fall from High to Low, and the selected bit line BL starts to rise from Low to High. By time t31, the selected selecting gate line reaches High, the selected word line WL reaches Low, and the selected bit line BL reaches High. After time t31, the selected bit line BL is kept floating until time t32. If the selected memory cell MC has been reset, the variable resistance layer 45 is in a high resistance amorphous state. Therefore, no discharge is performed through the cell string SU including the memory cell MC, so that the voltage of the selected bit line BL remains High. On the other hand, if the selected memory cell MC is set, the variable resistance layer 45 is in a low resistance crystalline state. Therefore, discharge is performed through the cell string SU including the memory cell MC, and the selected bit line BL falls from High to Low. By time t32, the potential of the selected bit line BL reaches Low. Between time t31 and time t32, the sense amplifier SA senses the potential of bit line BL and outputs the data. From time t32 to time t33, the potential of the bit line BL is forced to fall from the outside of the memory cell array to Low. Further, at time t34, the selecting gate line SG starts to fall from High to Low, and the selected word line WL starts to rise from Low to High. By time t35, the selecting gate line SG reaches Low and the selected word line WL reaches High. In this manner, the read operation is completed through a series of processes.

<1-2-4> Explanation of Setting Operation (Modified Example 1)

Figure 21:
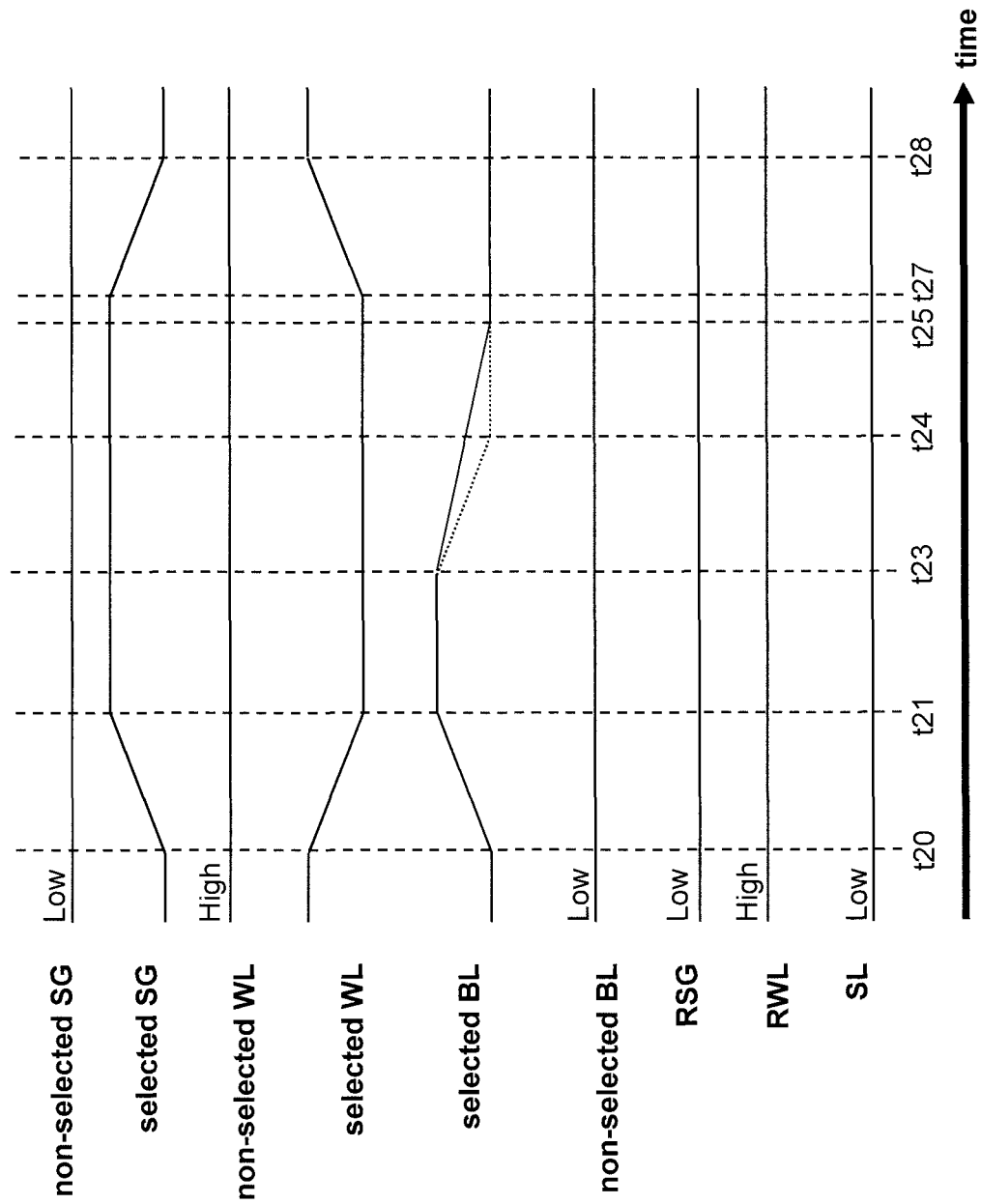
FIG. 21 is a waveform diagram showing a modified example of voltages applied to each line in a set operation.

FIG. 21 is a waveform diagram showing the voltages applied to the selecting gate line SG, the reset selecting gate line RSG, the word line WL, the reset word line RWL, the bit line BL, and the source line SL in the set operation (Modified example 1).

The unselected selecting gate line SG is constant at Low. The unselected word line WL is constant at High. The unselected bit line BL is constant at Low. The reset selecting gate line RSG is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. By time t21, the selected selecting gate line SG reaches High, the selected word line WL reaches Low, and the selected bit line BL reaches High. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to the Low. The time for which the selected bit line BL falls from High to Low is up to time t24 as shown by the dotted line if it is about the same as the time for which the bit line BL rises. The control is performed so that the bit line BL falls more gently, and the time for which the bit line BL falls to Low is multiplied by time t25. This slow fall causes the variable resistance layer of the memory cell MC connected to the selected word line WL is gradually cooled down to form a larger grain-size crystalline phase, resulting in a lower resistance. Even when the variable resistance layer becomes amorphized due to a steep fall at the original falling, it is possible to crystallize. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<1-2-5> Explanation of Setting Operation (Modified Example 2)

Figure 22:
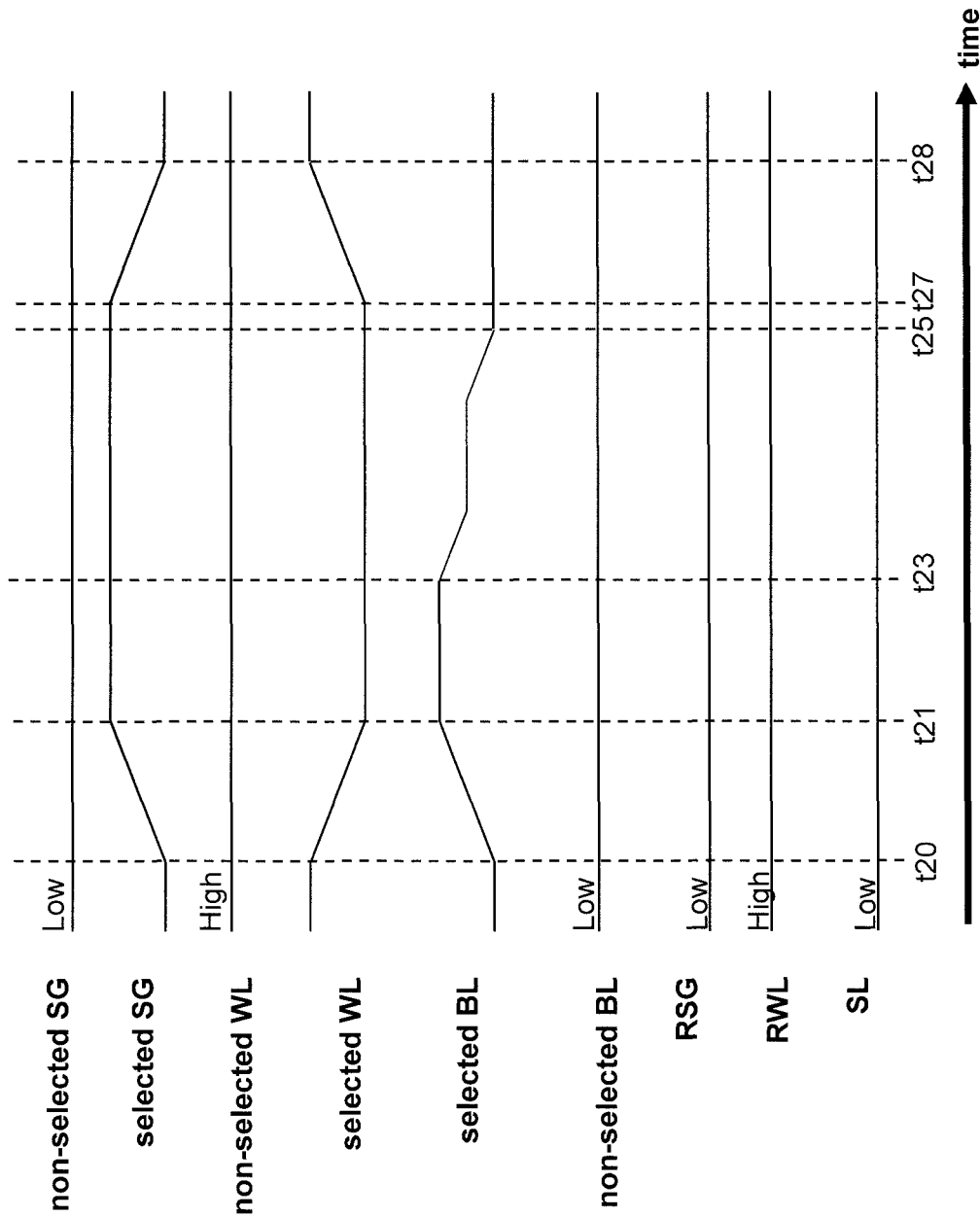
FIG. 22 is a waveform diagram showing a modified example of the voltages applied to each line in a set operation.

FIG. 22 is a waveform diagram showing the voltages applied to selecting gate line SG, the reset selecting gate line RSG, the word line WL, the reset word line RWL, the bit line BL, and the source line SL in the set operation (Modified Example 2).

The unselected selecting gate line SG is constant at Low. The unselected word line WL is constant at High. The unselected bit line BL is constant at Low. The reset selecting gate line RSG is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. By time t21, the selected selecting gate line SG reaches High, the selected word line WL reaches Low, and the selected bit line BL reaches High. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to Low. The waveform profile of this falling edge is a falling edge of two stages. For example, it drops to just the middle voltage of High and Low, and subsequently falls from this middle voltage to Low. Due to the fall of these two stages, the variable resistance layer of the memory cell MC connected to the selected word line WL is gradually cooled down to form a larger grain-size crystalline phase, resulting in a lower resistance. Further, at time t27, the selecting gate line SG starts to fall from High to Low, and the selected word line WL starts to rise from Low to High. By time t28, selecting gate line SG reaches Low and the selected word line WL reaches High. In this manner, the set operation is completed through a series of processes.

<1-2-6> Explanation of Setting Operation (Modified Example 3)

Figure 23:
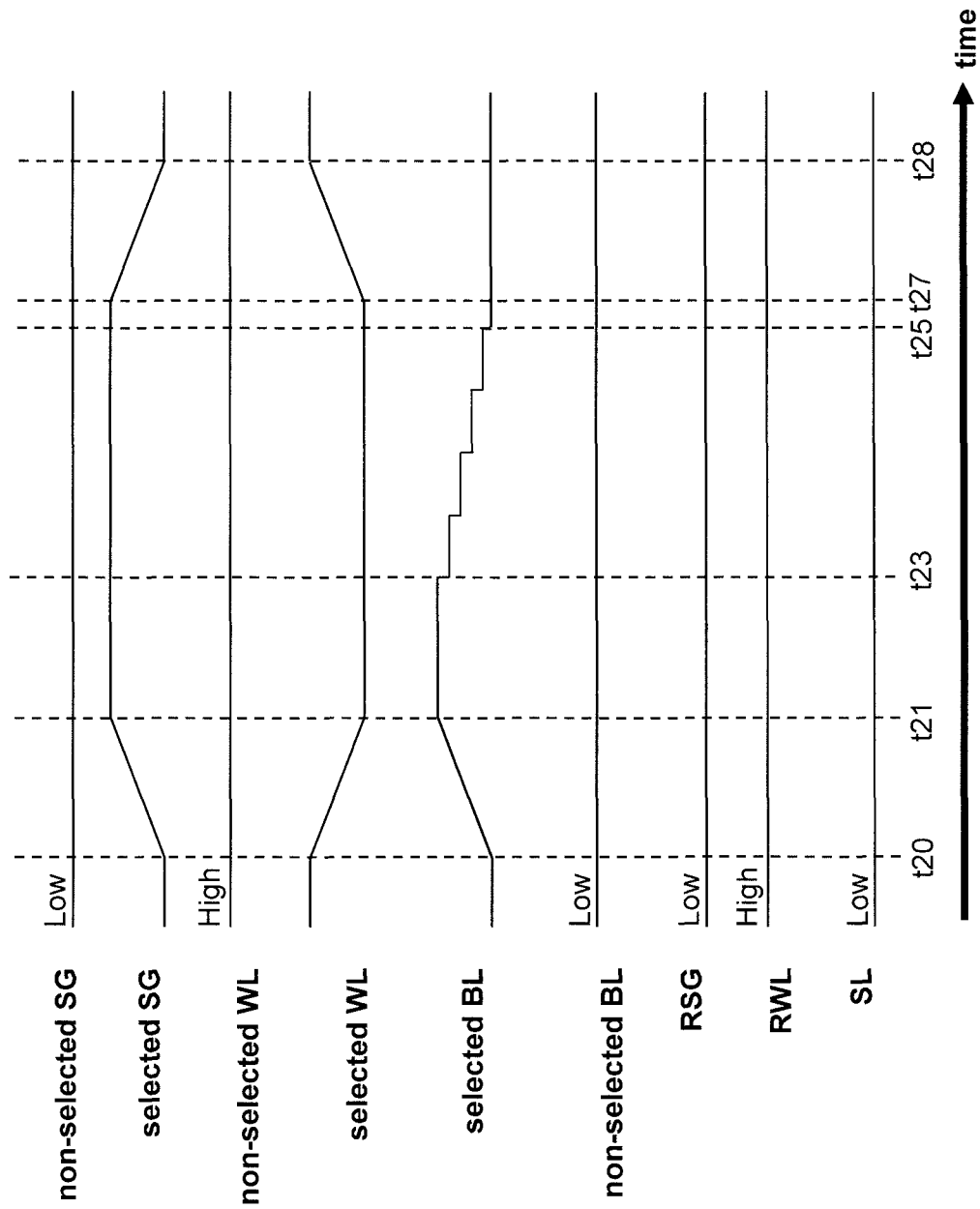
FIG. 23 is a waveform diagram showing a modified example of voltages applied to each line in a set operation.

FIG. 23 is a waveform diagram showing voltages applied to the selecting gate line SG, the reset selecting gate line RSG, the word line WL, the reset word line RWL, the bit line BL, and the source line SL in the set operation (Modified example 3).

The unselected selecting gate line SG is constant at Low. The unselected word line WL is constant at High. The unselected bit line BL is constant at Low. The reset selecting gate line RSG is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. By time t21, the selected selecting gate line SG reaches High, the selected word line WL reaches Low, and the selected bit line BL reaches High. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to Low. The waveform profile of the falling edge is a multistage falling edge in a staircase shape. For example, the voltages V1, V2, V3, and V4 between High and Low are stepwise lowered through intermediate voltages (High>V1>V2>V3>V4>Low). Due to the falling edge of the multiple stages, the variable resistance layer of the memory cell MC connected to the selected word line WL is gradually cooled down to form a larger grain-size crystalline phase, resulting in a lower resistance. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<1-2-7> Explanation of Set/Reset Operation (Simultaneous Writing)

Figure 24:
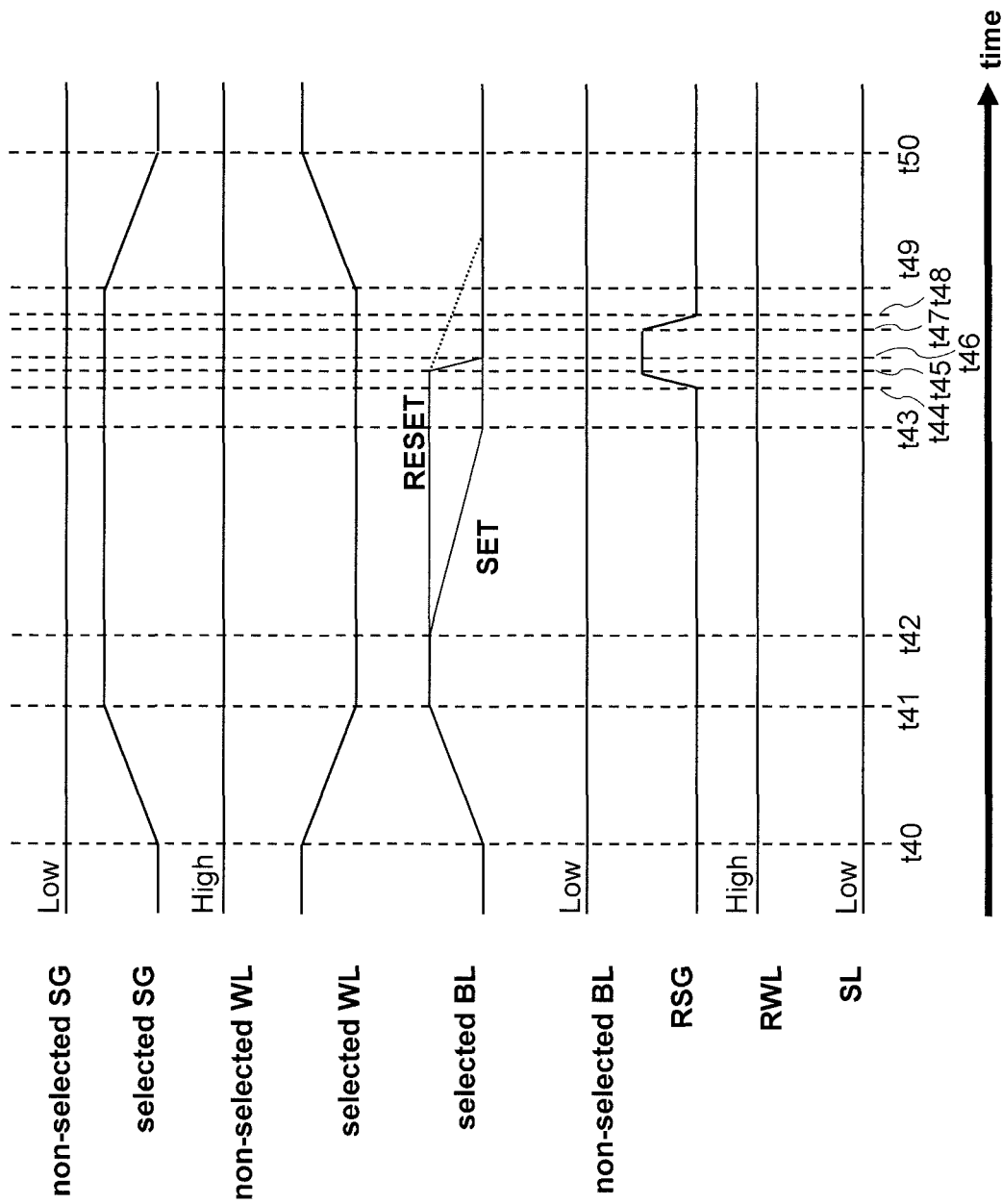
FIG. 24 is a waveform diagram showing a modified example of the voltages applied to each line when performing a reset operation and a set operation simultaneously.

FIG. 24 is a waveform diagram showing voltages applied to the selecting gate line SG, the reset selecting gate line RSG, the word line WL, the reset word line RWL, the bit line BL, and the source line SL when the reset operation and the set operation are performed simultaneously in accordance with the writing data.

The unselected selecting gate line SG is constant at Low. The unselected word line WL is constant at High. The unselected bit line BL is constant at Low. The reset word line RWL is constant at High. The source line SL is constant at Low.

At time t40, the selected selecting gate line SG starts to rise from Low to High, the selected word line WL starts to fall from High to Low, and the selected bit line BL starts to rise from Low to High. By time t41, the selected selecting gate line SG reaches High, the selected word line WL reaches Low, and the selected bit line BL reaches High. A current flows to the region of the semiconductor pillar 43 in the non-selected memory cell MC and flows to the variable resistance layer 45 in the selected memory cell MC from the vicinity of the time t41 to the time t46 for the reset operation and from the vicinity of the time t41 to the time t43 for the set operation. The variable resistance layer 45 undergoes a phase change due to the heat generated by the current flowing therethrough. This is shown in FIG. 25.

At time t42, the voltage of the bit line BL connected to the memory cell MC performing the set operation is gradually lowered from High to Low. By time t43, the voltage of the bit line BL connected to the memory cell MC performing the set operation is Low. The variable resistance layer of the memory cell MC connected to the selected word line WL is gradually cooled down to become a crystalline phase, resulting in a low resistance. Subsequently, at time t44, the reset selecting gate line RSG is raised from Low to High. The reset selecting gate line RSG reaches High at time t45. At time t45, the sense amplifier SA located outside the memory cell array 11 starts driving the bit line BL connected to the memory cell MC performing the reset operation from High to Low. At the same time, since a current flows from the bit line BL to the source line SL in the reset memory string RMS of the reset memory block RMB, the voltage of the selected bit line BL steeply falls from High to Low (the voltage of the selected bit line BL for which the set operation has been performed is already Low). In this way, the selected bit line BL falls steeply due to the presence of the reset memory block RMB. Due to this steep fall, the variable resistance layer of the memory cell MC connected to the selected word line WL is rapidly cooled to become an amorphous phase, resulting in a high resistance. This is shown in FIG. 26. FIG. 24 shows a dotted line showing the voltage-waveform of the selected bit line BL when the bit line BL was only driven from High to Low by the sense amplifier SA located outside the memory cell array 11.

At time t46, all the selected bit line BL is Low. Subsequently, at time t47, the falling of the reset selecting gate line RSG from High to the Low is started, and by time t48, the reset selecting gate line RSG reaches the Low. Further, at time t49, selecting gate line SG starts to fall from High to Low, and the selected word line WL starts to rise from Low to High. By time t50, selecting gate line SG reaches Low and the selected word line WL reaches High. In this manner, the set/reset operation is completed through a series of processes.

<1-3> Modified Examples

In the following description, parts different from those of the first embodiment will be described, and descriptions of common parts will be omitted.

<1-3-1> Modified Example of Configuration of Reset Selecting Gate Line RSG

Figure 27:
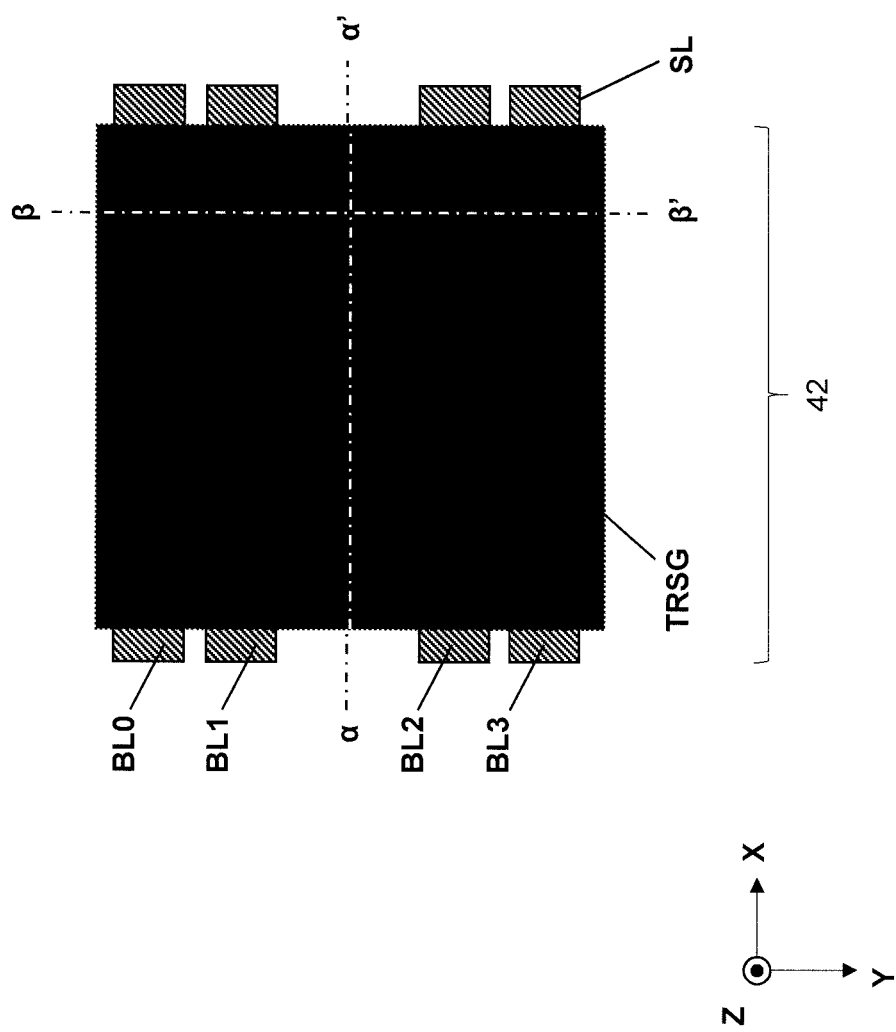
FIG. 27 is a plan view showing a modified example of a configuration of a resetting selecting gate line.
Figure 28:
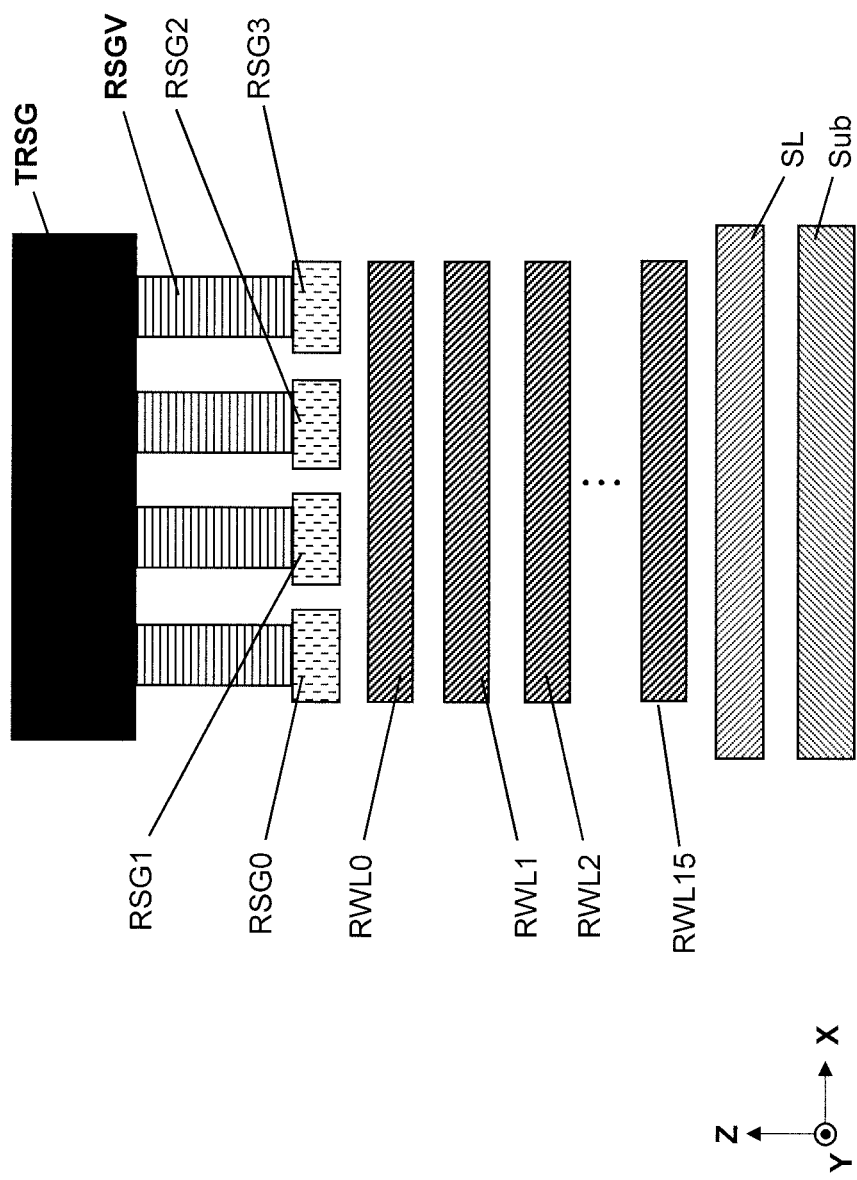
FIG. 28 is a cross-sectional view along $\alpha$-$\alpha'$ line of FIG. 27.
Figure 29:
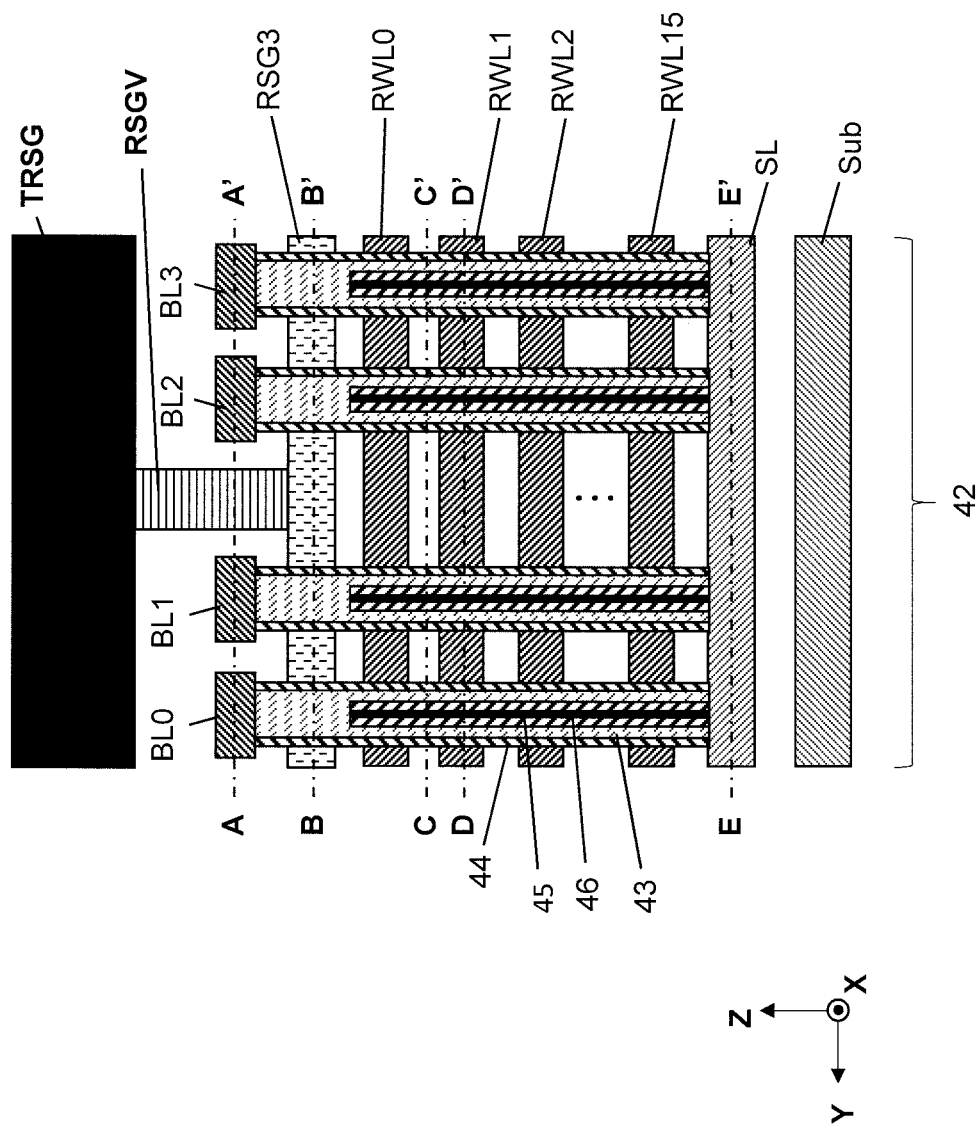
FIG. 29 is a cross-sectional view along $\beta$-$\beta'$ line of FIG. 27.

A modified example of the configuration of the reset selecting gate line RSG will be described with reference to FIGS. 27 to 34. The reset selecting gate lines RSG0 to RSG3 according to this variation is periodically connected to a reset selecting gate line (backing wiring) TRSG via a reset selecting gate line (perpendicular) RSGV. FIG. 27 shows an example of a plan view seen from above in the Z-direction of the reset memory block region 42 of the memory cell array 11 according to the modified example. FIG. 28 shows an example of a cross-sectional view (cross-sectional view along line α-α' in FIG. 27) seen from the Y-direction of the reset memory block region 42 of the memory cell array 11. FIG. 29 shows an example of a cross-sectional view (cross-sectional view along β-β' line in FIG. 27) seen from the X-direction of the reset memory block region 42 of the memory cell array 11.

Figure 30:
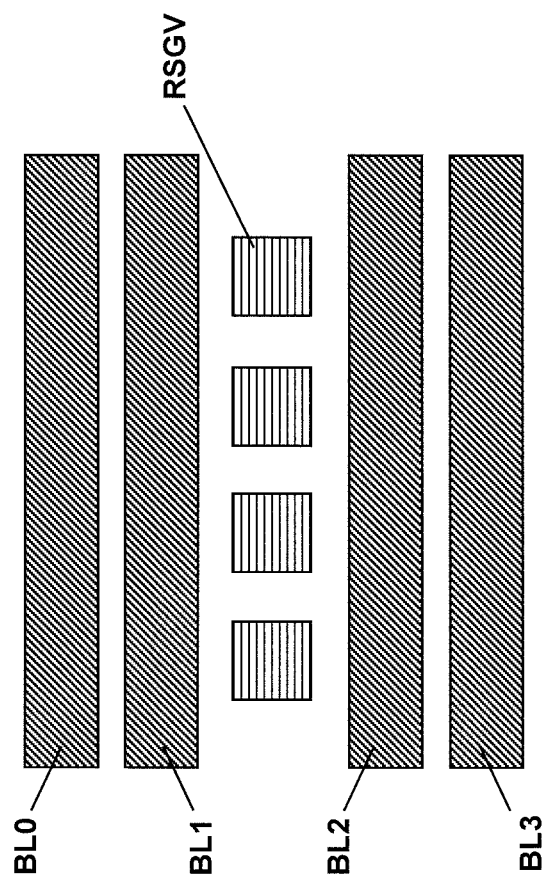
FIG. 30 is a cross-sectional view along A-A' line of FIG. 29.
Figure 31:
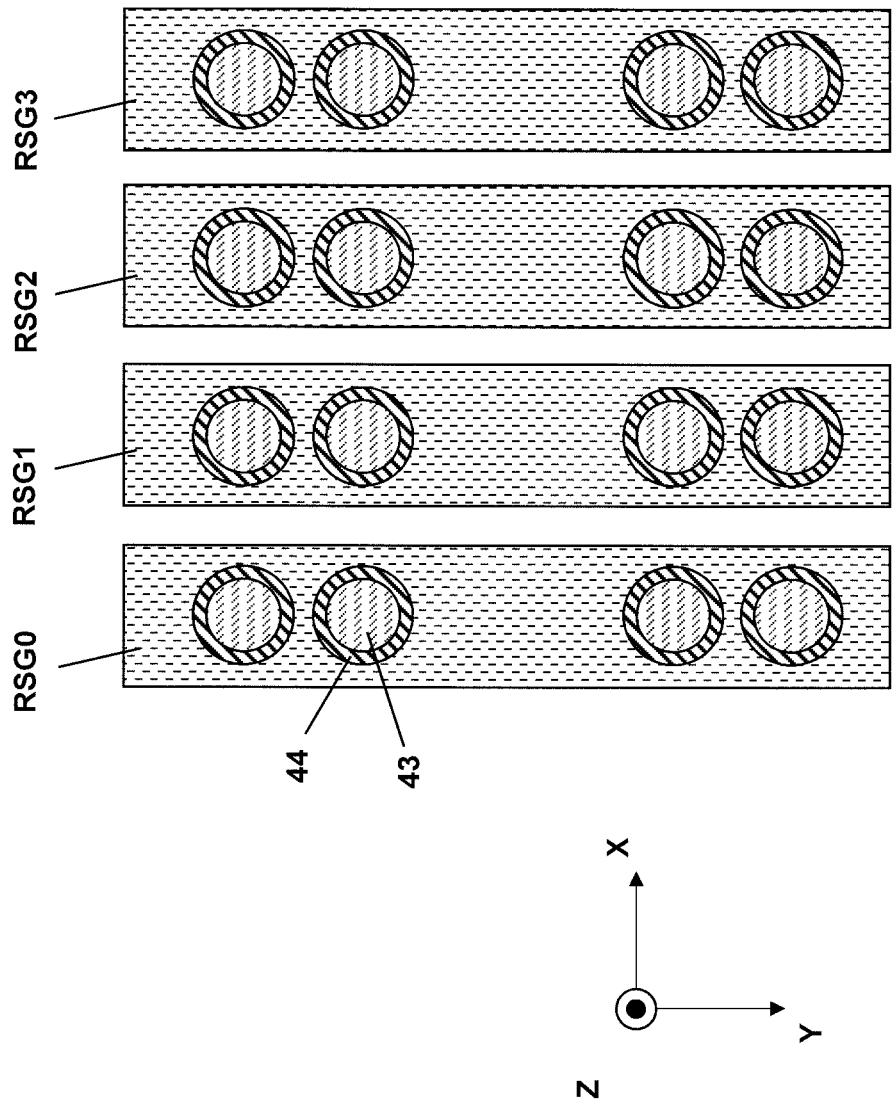
FIG. 31 is a cross-sectional view along B-B' line of FIG. 29.
Figure 32:
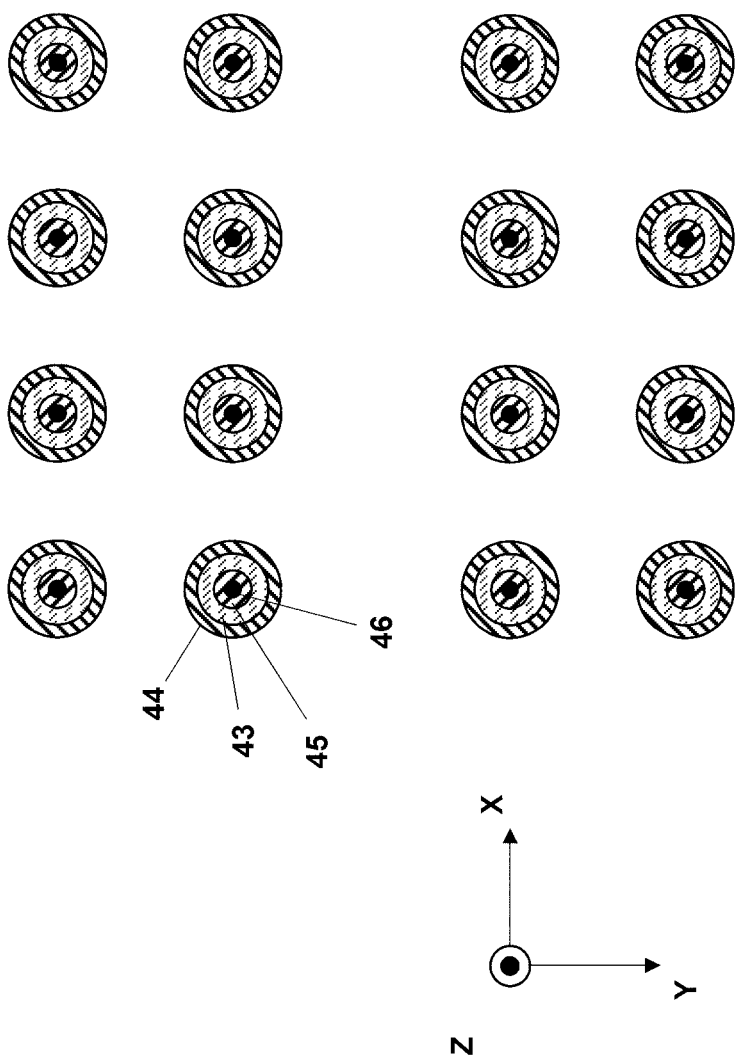
FIG. 32 is a cross-sectional view along C-C' line of FIG. 29.
Figure 33:
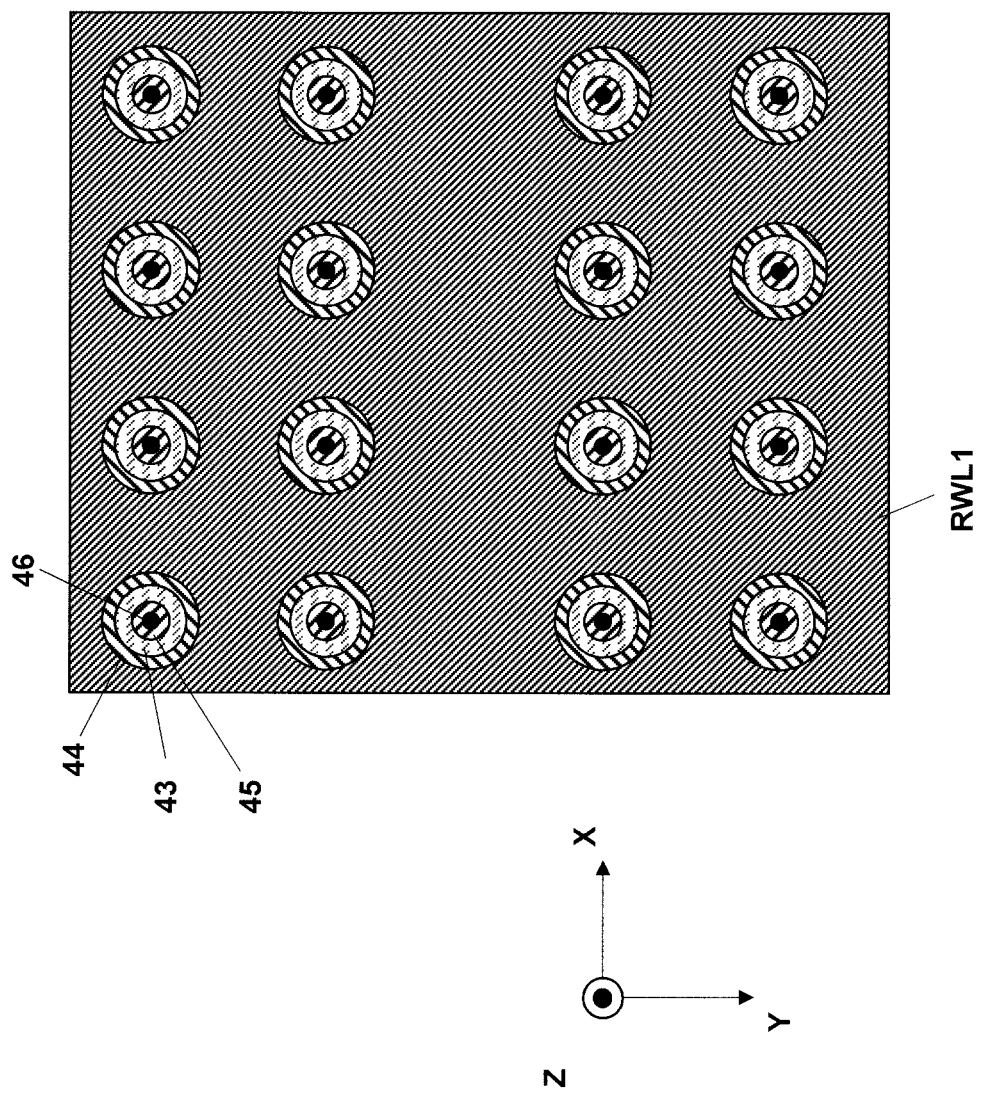
FIG. 33 is a cross-sectional view along D-D' line of FIG. 29.
Figure 34:
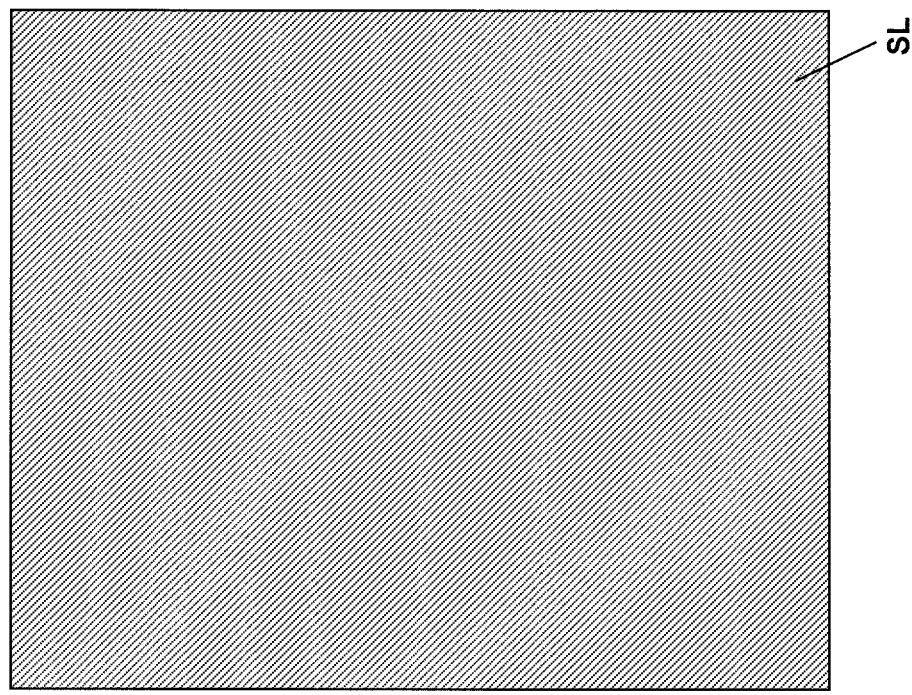
FIG. 34 is a cross-sectional view along E-E' line of FIG. 29.

FIGS. 30 to 34 show examples of cross-sectional view in the X-Y plane seen from the Z-direction of the reset memory block region 42 of the memory cell array 11. FIG. 30 is a cross-sectional view along A-A' line in FIG. 29, FIG. 31 is a cross-sectional view along B-B' line in FIG. 29, FIG. 32 is a cross-sectional view along C-C' line in FIG. 29, FIG. 33 is a cross-sectional view along D-D' line in FIG. 29, FIG. 34 is a cross-sectional view along E-E' line in FIG. 29.

As shown in FIGS. 27 to 34, the reset selecting gate line (backing wiring) TRSG is arranged in the X-Y plane direction at the uppermost portion in the Z-direction in the reset memory block region 42 of the memory cell array 11. The reset selecting gate line (backing wiring) TRSG is formed by a low-conductor resistance such as copper, for example. Below the reset selecting gate line (backing wiring) TRSG, there are the bit lines BL0 to BL3 extending in the X-direction in parallel. The bit lines BL0 to BL3 are insulated from the reset selecting gate line (backing wiring) TRSG. Below the bit lines BL0 to BL3, there are the reset selecting gate lines RSG0 to RSG3 extending in the Y-direction in parallel. The reset selecting gate lines RSG0 to RSG3 are connected to the reset selecting gate line (backing wiring) TRSG via the reset selecting gate line (perpendicular) RSGV extending in parallel in the Z-direction. The reset selecting gate lines RSG0 to RSG3 and the reset selecting gate line (perpendicular) RSGV are also insulated from the bit line BL0 to BL3. Below the reset selecting gate lines RSG0 to RSG3, the reset word lines RWL0 to RWL15 are arranged in the X-Y plane, respectively. The reset word lines RWL0 to RWL15 are insulated from each other and also insulated from the reset selecting gate lines RSG0 to RSG3. Below the reset word line RWL15, the source line SL is arranged in the X-Y plane. The source line SL is insulated from the reset word line RWL15. The reset selecting gate lines RSG0 to RSG3 are periodically connected to the reset selecting gate line (backing wiring) TRSG via the reset selecting gate line (vertical) RSGV to reduce the resistance and to make the rising edge steeper at the reset operation. The configuration of the memory pillar MP is the same as that of the first embodiment, and will not be described here.

<1-3-2> Example of Memory Block Arrangement

Figure 35:
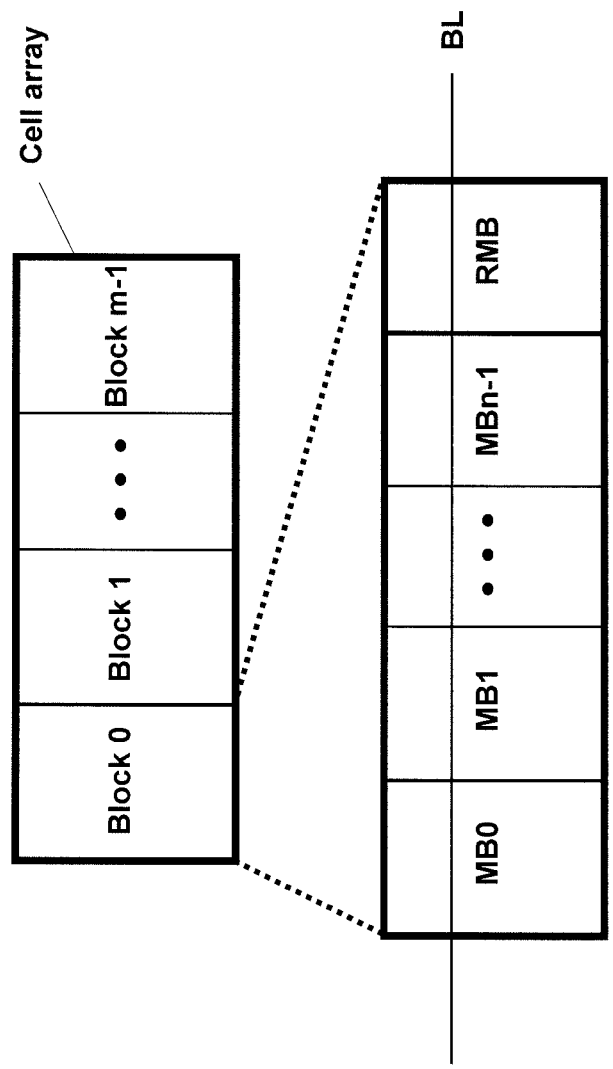
FIG. 35 is a diagram showing an example in which normal memory blocks and reset memory blocks are arranged in a periodic manner.

FIG. 35 is a schematic diagram showing arrangement patterns when a plurality of reset memory blocks RMB (RMB0, RMB1 . . . RMBm−1) is arranged. The cell array includes a plurality of blocks (block 0, block 1 . . . block m−1). Each block (block 0, block 1 . . . block m−1) includes a plurality of normal memory blocks MB (MB0, MB1 . . . MBn−1) and one reset memory block RMB. The reset memory block RMB is arranged at one end of each block (block 0, block 1 . . . block m−1). In the cell array, the plurality of blocks (block 0, block 1 . . . block m−1) are arranged side by side, so that the plurality of reset memory blocks RMB (RMB0, RMB1 . . . RMBm−1) are periodically arranged. By arranging the plurality of reset memory blocks RMB in a distributed manner, it is possible to efficiently reduce the effect of the delay time of the bit line BL. In this cell array, the bit lines BL (BL0 to BLl) are common, and the source line SL is also common. (l, m, n are integers greater than or equal to 1)

Figure 36:
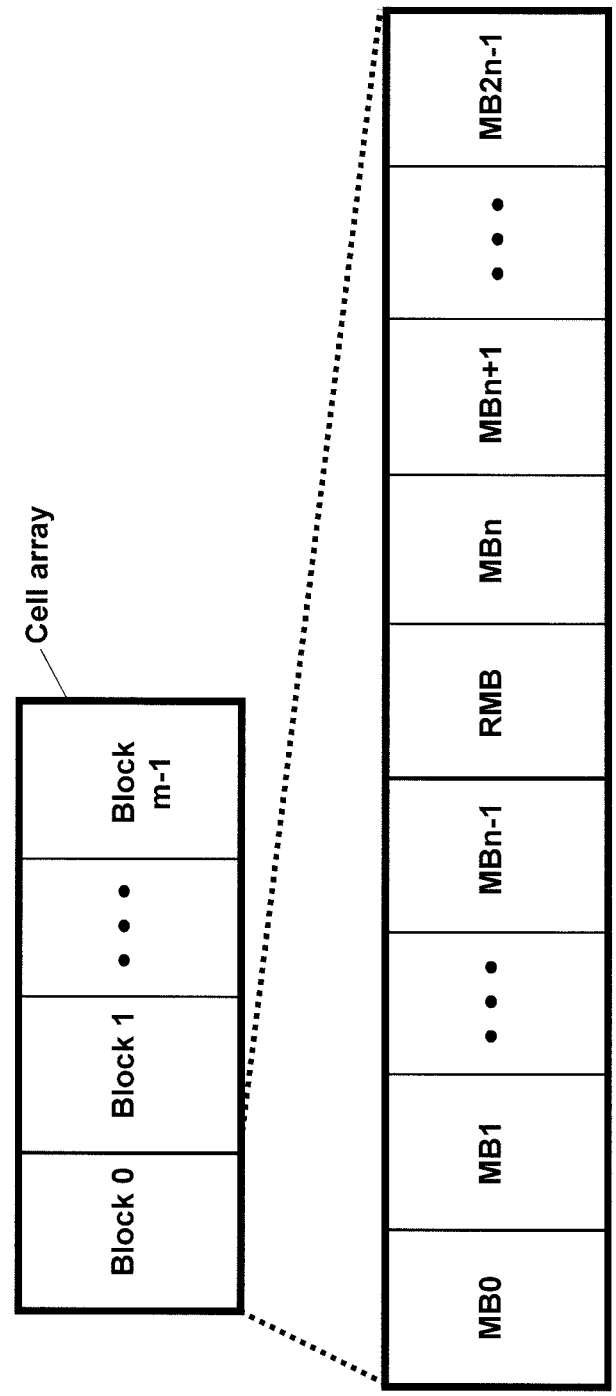
FIG. 36 is a diagram showing an another example in which normal memory blocks and reset memory blocks are arranged in a periodic manner.

FIG. 36 is a schematic diagram showing another examples of the arrangement patterns when the plurality of reset memory blocks RMB (RMB0, RMB1 . . . RMBm−1) is arranged. The cell array includes the plurality of blocks (block 0, block 1 . . . block m−1). Each block (block 0, block 1 . . . block m−1) includes a plurality of normal memory blocks MB (MB0, MB1 . . . MB2n-1) and one reset memory block RMB. The reset memory block RMB is arranged at the center of each block (block 0, block 1 . . . block m−1). The reset memory block RMB is arranged between n normal memory blocks MB (MB0, MB1 . . . MBn−1 and MBn, MBn+1 . . . MB2n-1). In the cell array, the plurality of blocks (block 0, block 1 . . . block m−1) is arranged side by side, so that the plurality of reset memory blocks RMB (RMB0, RMB1 . . . RMBm−1) is periodically arranged. By arranging the plurality of reset memory blocks RMB in a distributed manner, it is possible to efficiently reduce the effect of the delay time of the bit line BL. In this cell array, the bit lines BL (BL0 to BLl) are common, and the source line SL is also common. (l, m, n are integers greater than or equal to 1)

Figure 37:
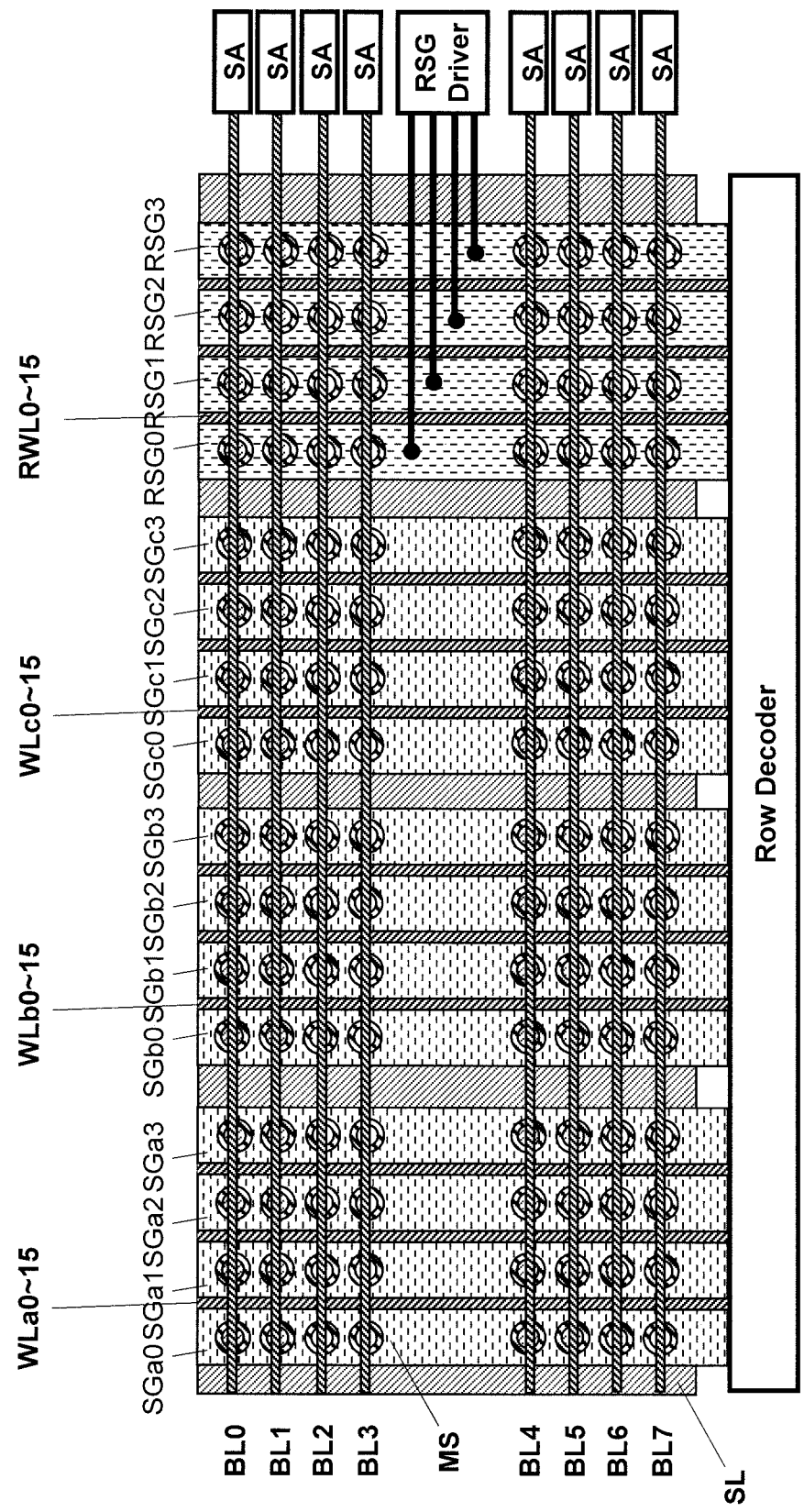
FIG. 37 is a diagram showing the arrangement of a reset selecting gate line and its driving circuit.

<1-3-3> Arrangement Example of Reset Selecting Gate Line and its Driving Circuit FIG. 37 is a schematic diagram showing the arrangement patterns of the reset selecting gate lines RSG0 to RSG3 and its driving circuit RSG Driver. In FIG. 37, the reset selecting gate lines RSG0 to RSG3 are arranged at one end of the memory cell array 11. The reset selecting gate lines RSG0 to RSG3 are arranged at one end side by side with a plurality of selecting gate lines SGaO to SGa3, SGbO to SGb3, SGcO to SGc3. The driving circuit RSG Driver for driving the reset selecting gate line RSG is arranged on one side of the memory cell array 11 on which the reset selecting gate lines RSG0 to RSG3 are arranged. The sense amplifiers SA are also arranged in a row on one side of the memory cell array 11, which is the same as the driving circuit RSG Driver. A driving circuit for driving the word line WL and the selecting gate line SG is arranged on another side of the memory cell array 11. The driving circuit RSG Driver is connected to each of the reset selecting gate lines RSG0 to RSG3. For this reason, it is possible to provide the ON voltage to a particular reset selecting gate line RSG by the driving circuit RSG Driver. By arranging the driving circuit RSG Driver in the same side as the sense amplifiers SA or the like, the reduction of the circuit area by optimizing the layout and speedup of the operation by driving the reset selecting gate lines RSG0 to RSG3 from other than the wiring end part (for example, the center of wiring) can be realized.

<1-3-4> Modified Example of a Method of Selecting the Memory Cell

Figure 38:
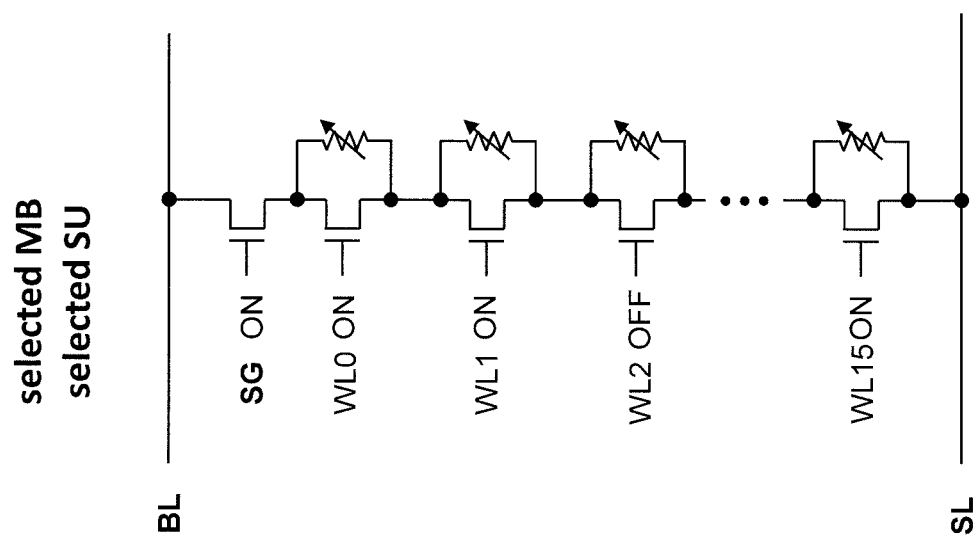
FIG. 38 is a diagram showing a modified example of selected state of a memory cell.
Figure 39:
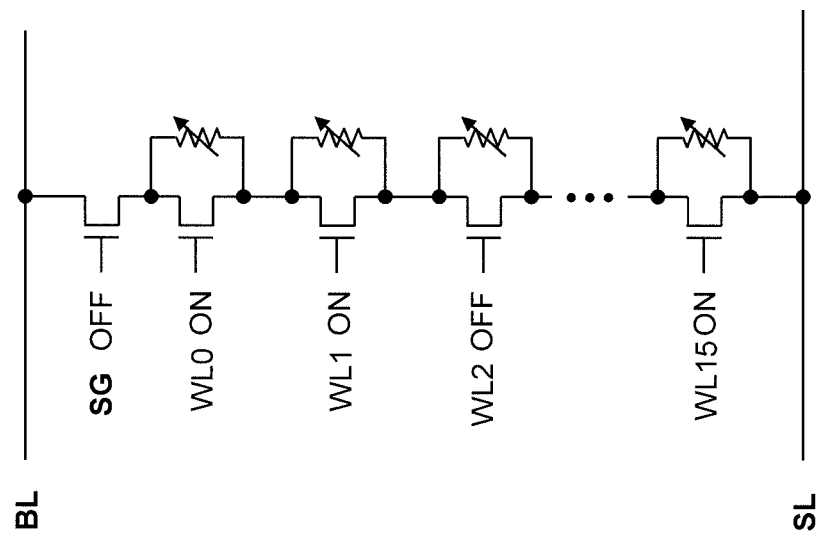
FIG. 39 is a diagram showing a modified example of non-selected state of a memory cell.
Figure 40:
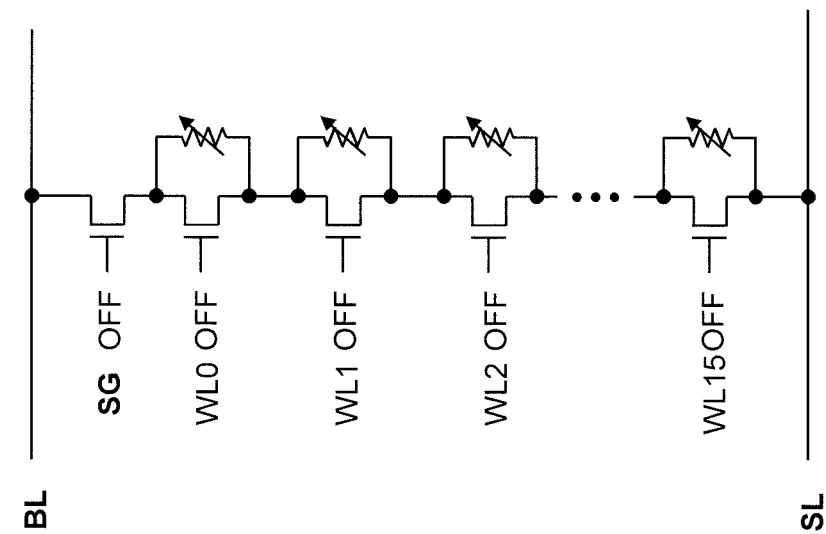
FIG. 40 is a diagram showing a modified example of non-selected state of a memory cell.

Referring to FIGS. 38 to 40, a modified example of a method of selecting the memory cell will be described. In the present modified example, the word line WL in the non-selected memory block MB is supplied with the OFF voltage that is insufficient to conduct the memory cell MC.

As shown in FIG. 38, in the selected string unit SU of the selected memory block MB, the selecting gate line SG is supplied with the ON voltage enough to conduct the selecting gate transistor (sufficient carriers are induced in the region of the semiconductor pillar 43 to reduce the resistance). When selecting the memory cell MC connected to the word line WL2, the word line WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (the resistance becomes large without inducing sufficient carriers to the region the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read.

As shown in FIG. 39, in the non-selected string unit SU of the selected memory block MB, the selecting gate line SG is supplied with the OFF voltage that is insufficient to conduct the selecting gate transistor. As a result, even if the ON voltage is supplied to the word lines WL0, WL1, WL3 to WL15, no current flows through the string unit SU.

As shown in FIG. 40, in the non-selected memory block MB, the OFF voltage is supplied to both the selecting gate line SG and the word lines WL0 to WL15. As a result, no current flows through the string unit SU.

<2> Second Embodiment

The memory cell array 11 according to the second embodiment will be described below. The present embodiment shows a memory cell array having the reset word line RWL below the memory string MS in contrast to the memory cell array 11 shown in the first embodiment. In the following description, parts different from those of the first embodiment will be described, and descriptions of common parts will be omitted.

<2-1> Configuration

<2-1-1> Structure of the Memory Cell Array 11

Figure 41:
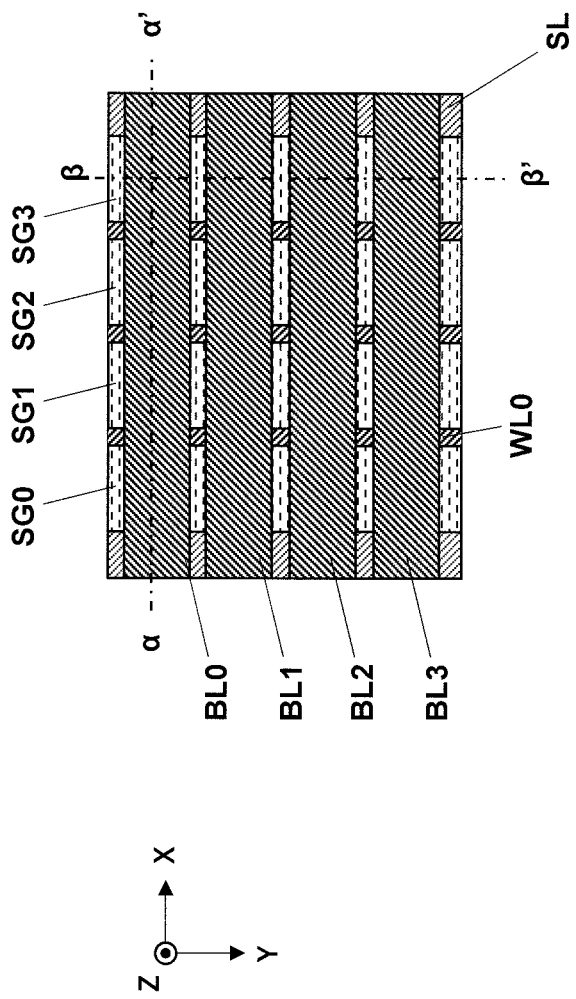
FIG. 41 is a plan view showing an example of a configuration of a memory cell array included in a memory chip according to a second embodiment.
Figure 42:
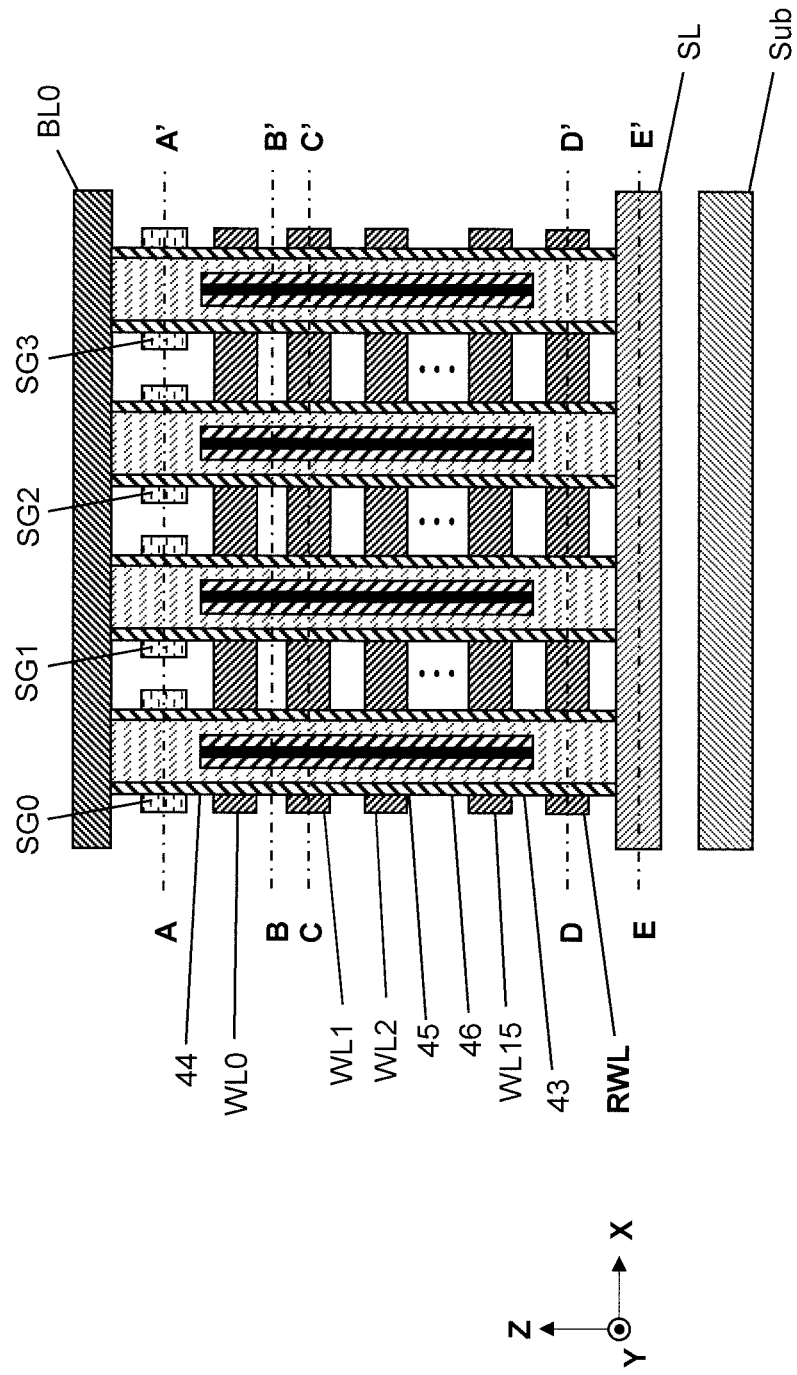
FIG. 42 is a cross-sectional view along $\alpha$-$\alpha'$ line of FIG. 41.
Figure 43:
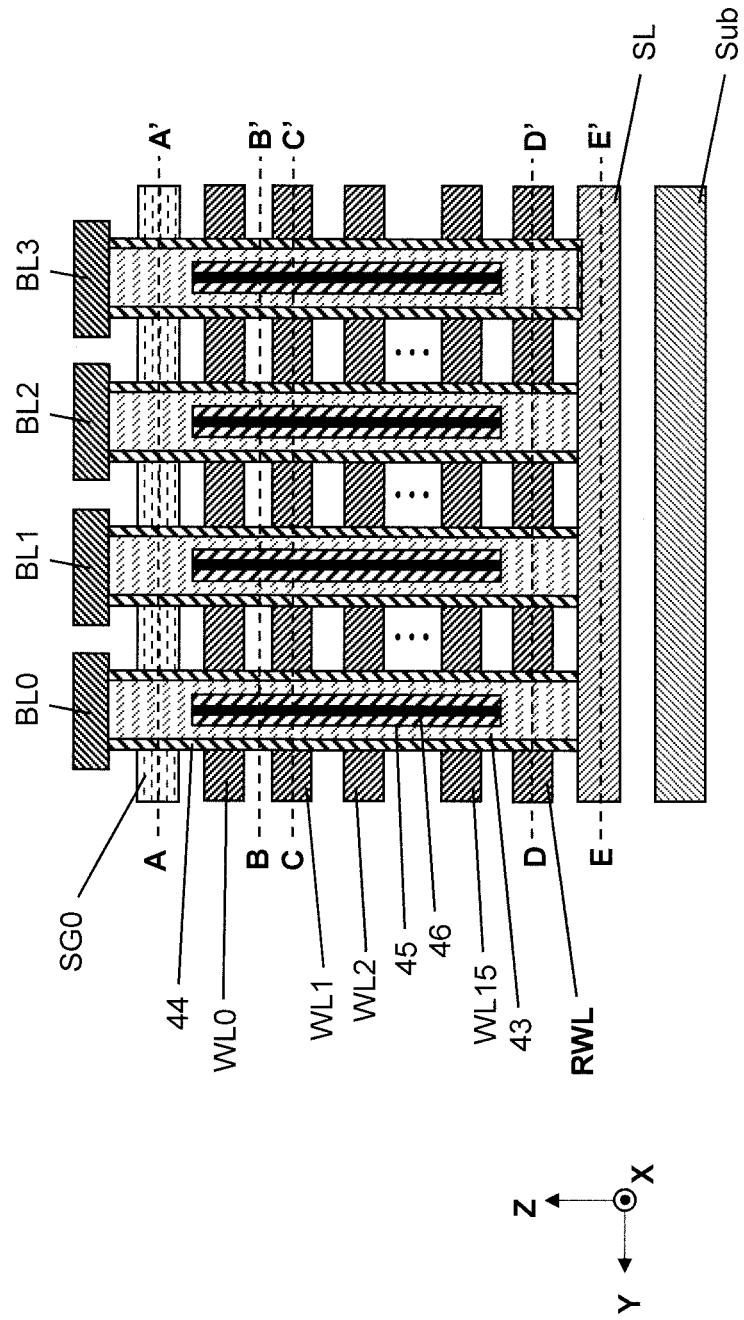
FIG. 43 is a cross-sectional view along $\beta$-$\beta'$ line of FIG. 41.

FIG. 41 shows an example of a plan view seen from above in the Z-direction of the memory cell array 11 included in the memory chip 10 according to the second embodiment. FIG. 42 shows an example of a cross-sectional view (cross-sectional view along α-α' line in FIG. 41) seen from the Y-direction of the memory cell array 11 included in the memory chip 10 according to the second embodiment. FIG. 43 shows an example of a cross-sectional view (cross-sectional view along β-β' line in FIG. 41) seen from the X-direction of the memory cell array 11 included in the memory chip 10 according to the second embodiment.

Figure 44:
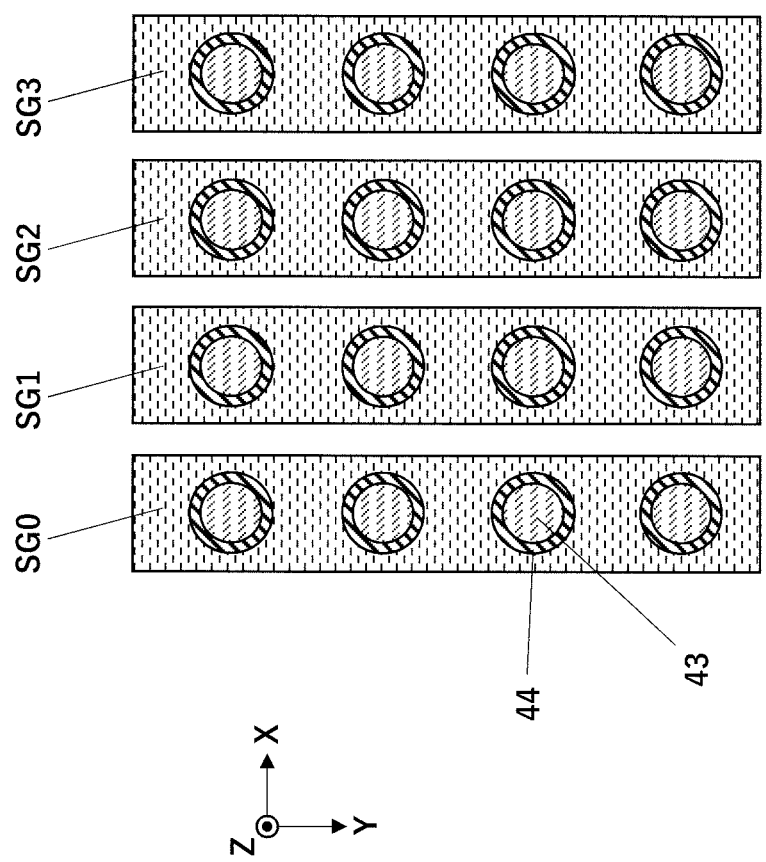
FIG. 44 is a cross-sectional view along A-A' line of FIG. 42.
Figure 45:
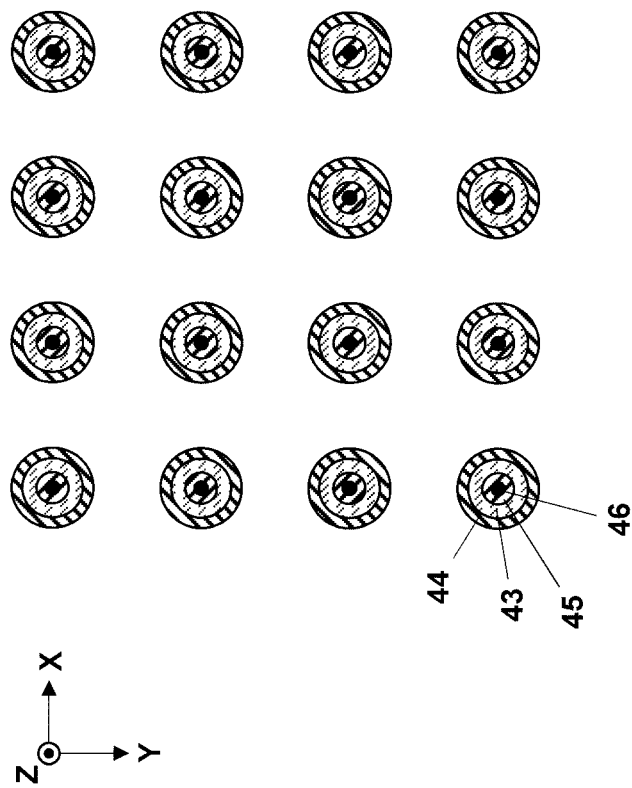
FIG. 45 is a cross-sectional view along B-B' line of FIG. 42.
Figure 46:
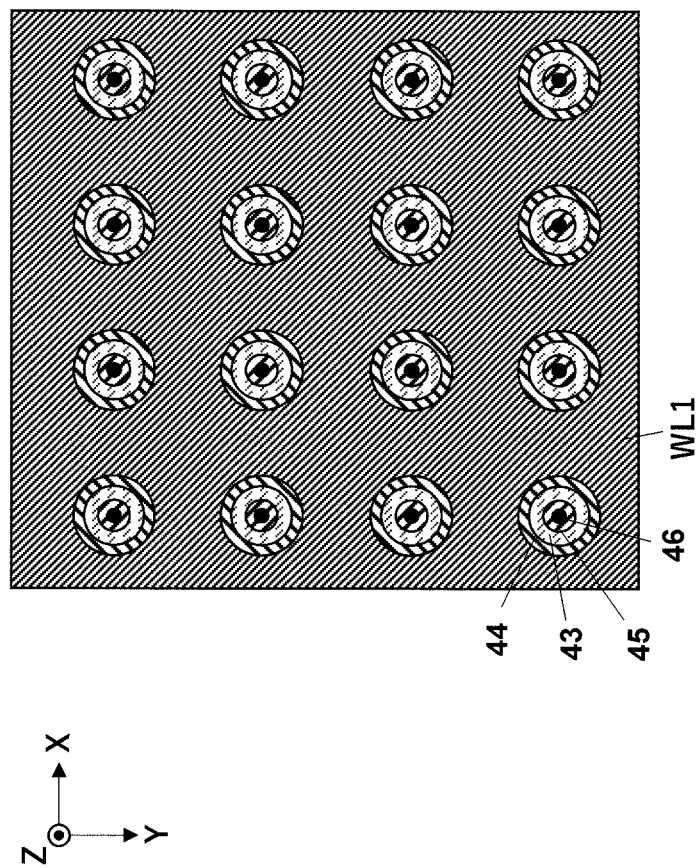
FIG. 46 is a cross-sectional view along C-C' line of FIG. 42.
Figure 47:
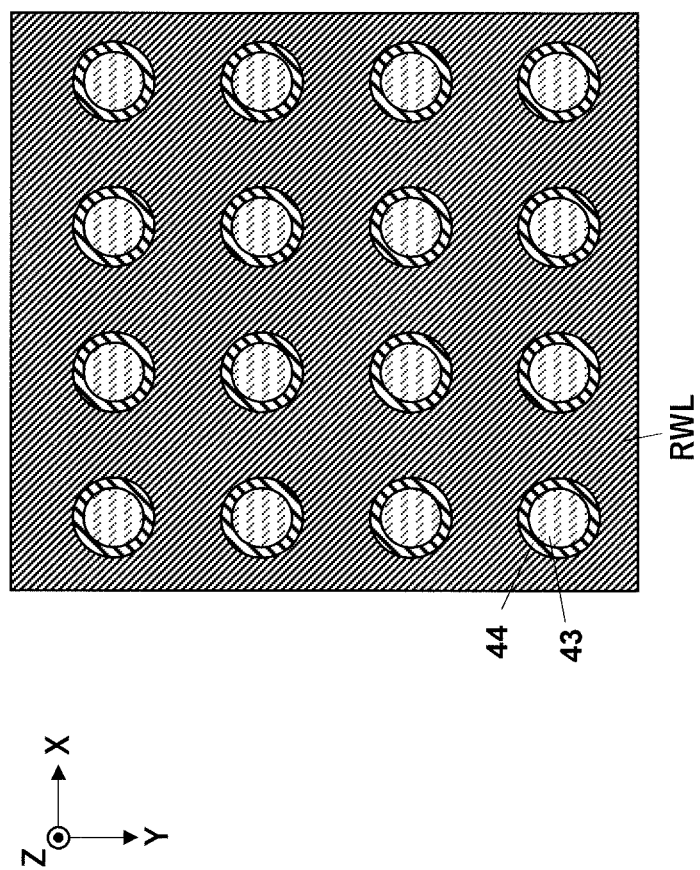
FIG. 47 is a cross-sectional view along D-D' line of FIG. 42.
Figure 48:
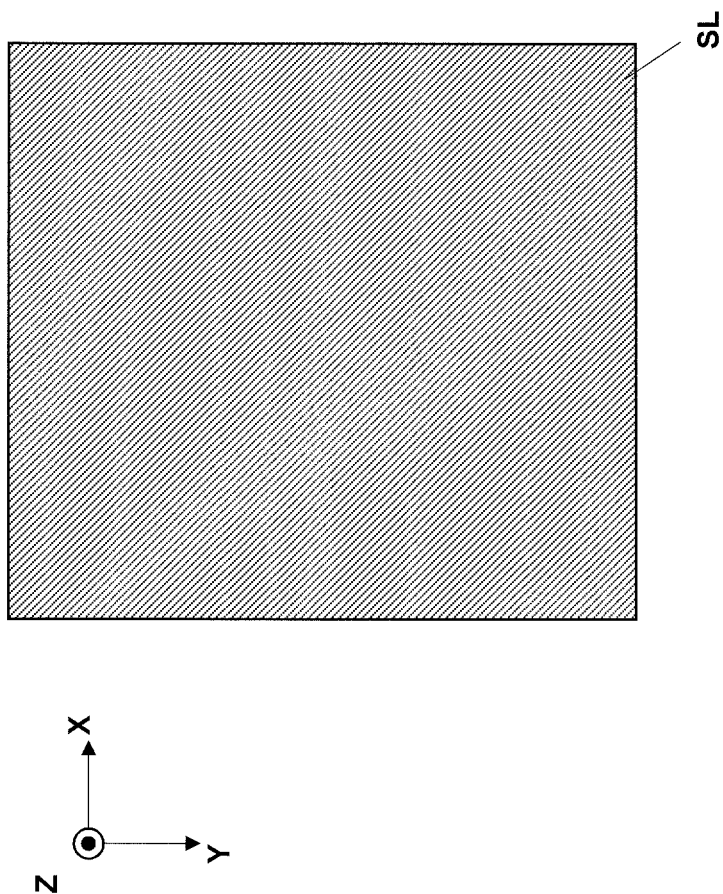
FIG. 48 is a cross-sectional view along E-E' line of FIG. 42.

FIGS. 44 to 48 show examples of cross-sectional view in the X-Y plane seen from the Z-direction of the memory cell array included in the memory chip 10 according to the second embodiment. FIG. 44 is a cross-sectional view along A-A' line in FIG. 43, FIG. 45 is a cross-sectional view along B-B' line in FIG. 43, FIG. 46 is a cross-sectional view along C-C' line in FIG. 43, FIG. 47 is a cross-sectional view along D-D' line in FIG. 43, FIG. 48 is a cross-sectional view along E-E' line in FIG. 43.

As shown in FIGS. 41 to 48, in the memory cell array 11, the bit lines BL0 to BL3 extending in the X-direction are arranged in parallel at the top portion in the Z-direction. The bit lines BL0 to BL3 are formed of a conductor such as tungsten, for example. Below the bit lines BL0 to BL3, there are the selecting gate lines SG0 to SG3 extending in the Y-direction in parallel. The selecting gate lines SG0 to SG3 are also formed of a conductor such as tungsten and are insulated from the bit lines BL0 to BL3. Below the selecting gate lines SG0 to SG3, the word lines WL0 to WL15 are arranged in the X-Y plane, respectively. The word lines WL0 to WL15 are also formed of a conductor such as tungsten, insulated from each other, and insulated from the selecting gate lines SG0 to SG3. Below the word line WL15, the reset word line RWL is arranged in the X-Y plane. The reset word line RWL is also formed of a conductor such as tungsten, for example, and is insulated from the word line WL15. Below the reset word line RWL, the source line SL is arranged in the X-Y plane. The source line SL is formed of a conductor such as tungsten, for example, is insulated from the reset word line RWL.

As shown in FIGS. 42 to 47, the cylindrical memory pillar MP is arranged to extend in the Z-direction through openings formed in the selecting gate lines SG0 to SG3, the word lines WL0 to WL15, and the reset word line RWL. The cylindrical memory pillar MP includes the cylindrical hollow gate insulating film 44 and the semiconductor pillar 43 therein from the outside. The bottom of the memory pillar MP reaches the source line SL and is electrically connected thereto.

In the portion of the memory pillar MP surrounded by the word lines WL0 to WL15 and the insulating film in the vicinity of the word lines WL0 to WL15, the semiconductor pillar 43 has a cylindrical hollow shape. The portion of the memory pillar MP includes the cylindrical hollow variable resistance layer 45 and the cylindrical core member 46 inside the cylindrical hollow shape semiconductor pillar 43. The cylindrical hollow variable resistance layer 45 covers the side (outer periphery) of the core member 46. The inside of the variable resistance layer 45 is in contact with the core member 46. The bottom of the variable resistance layer 45 is located between the word line WL15 and the reset word line RWL, and the memory pillar MP surrounded by the reset word line RWL does not include the variable resistance layer 45.

The cylindrical hollow (cylindrical in a portion surrounded by the selecting gate lines SG0 to SG3 and the reset word line RWL) semiconductor pillar 43 covers side (outer periphery) of the variable resistance layer 45. The inside of the semiconductor pillar 43 is in contact with the variable resistance layer 45. The bottom of the semiconductor pillar 43 contacts the source line SL.

<2-1-2> Circuit Diagram of Memory Block

Figure 49:
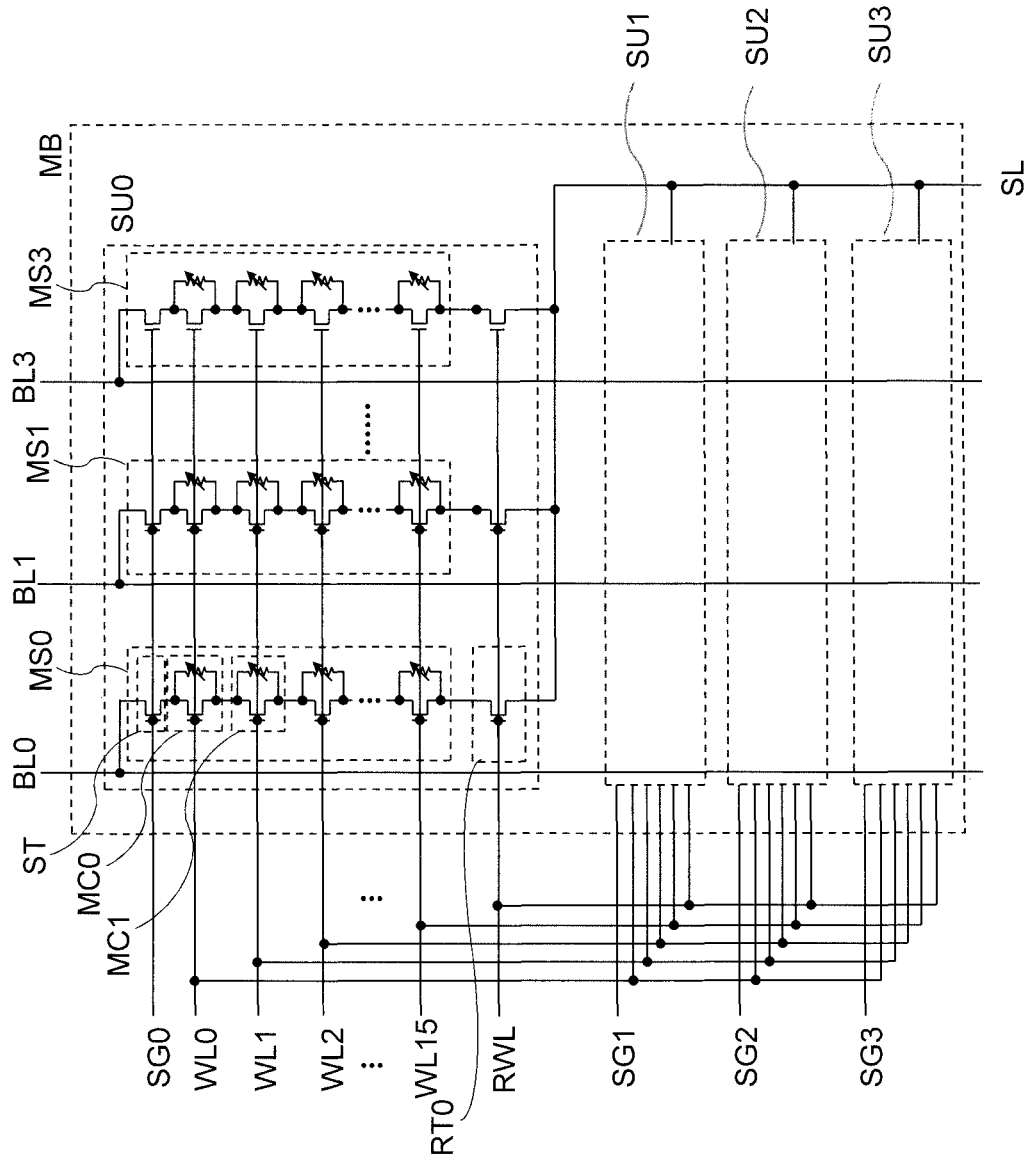
FIG. 49 is a circuit diagram of a memory block.

FIG. 49 is a circuit diagram of the memory block MB. In FIGS. 41 to 48, the memory cell array 11 does not include a reset memory block RMA. The memory block MB includes the string unit SU0 to which the selecting gate line SG0 is connected, the string unit SU1 to which the selecting gate line SG1 is connected, the string unit SU2 to which the selecting gate line SG2 is connected, and the string unit SU3 to which the selecting gate line SG3 is connected.

The string units SU (SU0 to SU3) includes the memory string MS0 and a reset transistor RT0 connected between the bit line BL0 and the source line SL, the memory string MS1 and a reset transistor RT1 connected between the bit line BL1 and the source line SL, and the memory string MS3 and a reset transistor RT3 connected between the bit line BL3 and the source line SL, respectively.

In the memory string MS (MS0 to MS3), the selecting gate transistor ST, the memory cell MC0, the memory cell MC1, . . . the memory cell MC15 are connected in series from the side near the bit line BL (BL0 to BL3). The number of the memory cell MC included in each of the memory cell string MS need not be 16, and may be 8, 32, 48, 64, 96, 128, or the like, and the number thereof is not limited.

Figure 50:
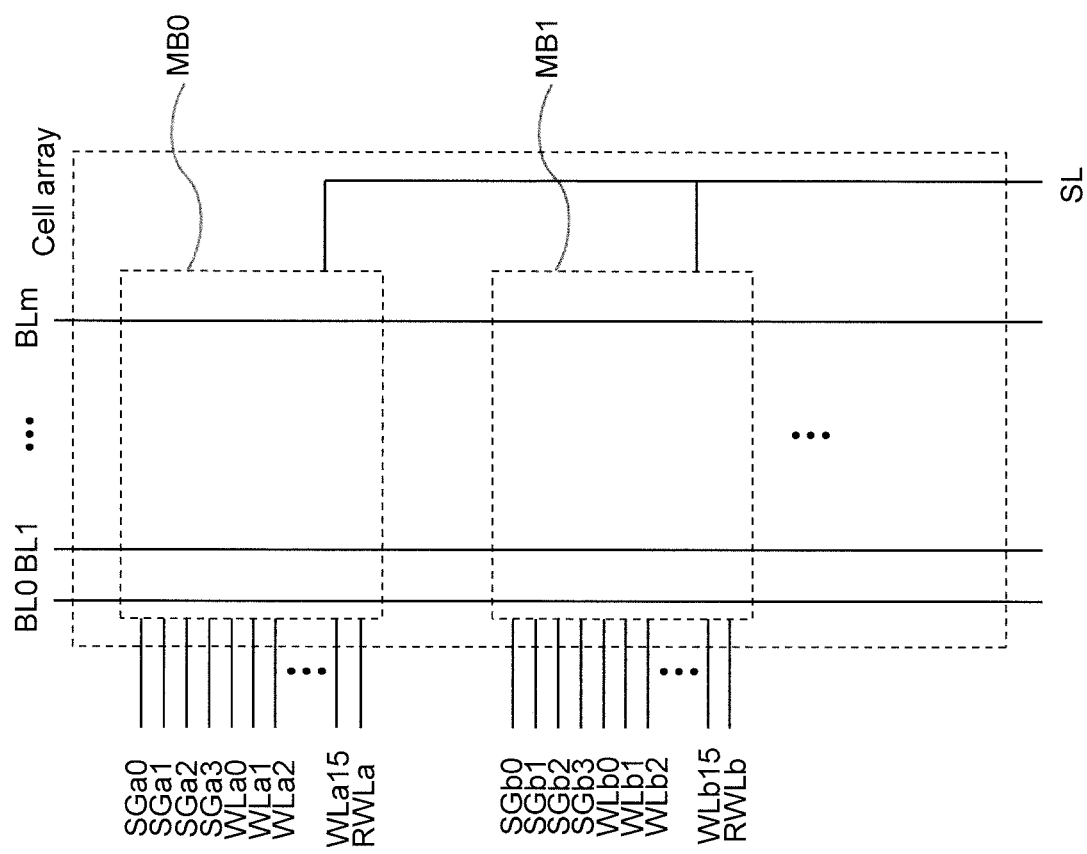
FIG. 50 is a circuit diagram of the entire array.

FIG. 50 is a schematic diagram showing a state in which the memory block MB (MB0, MB1 . . . ) is arranged. A cell array includes the plurality of normal memory block MB (MB0, MB1 . . . ). In this cell array, the bit lines BL (BL0 to BLm) are common, and the source line SL is also common.

<2-1-3> A Method of Selecting the Memory Cell

Figure 51:
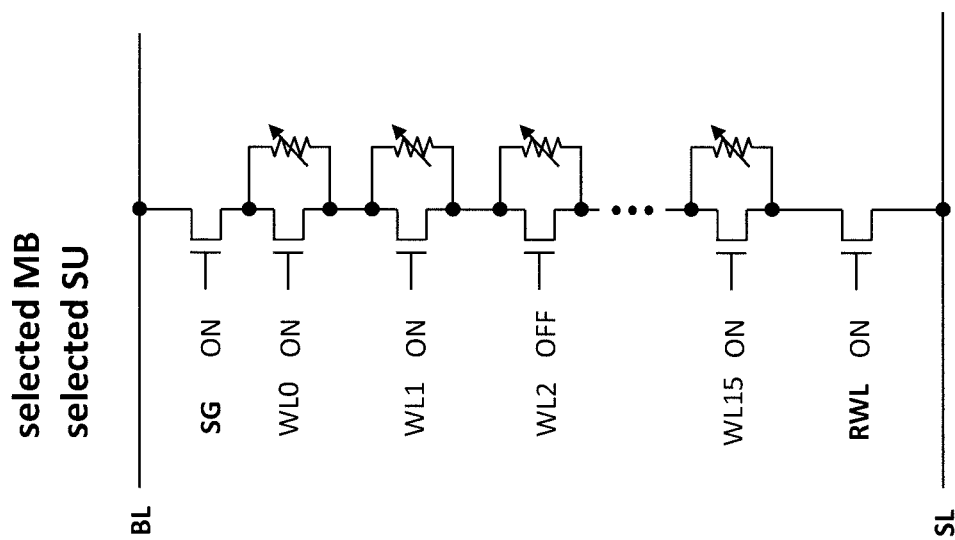
FIG. 51 is a diagram showing selected state of a memory cell.
Figure 52:
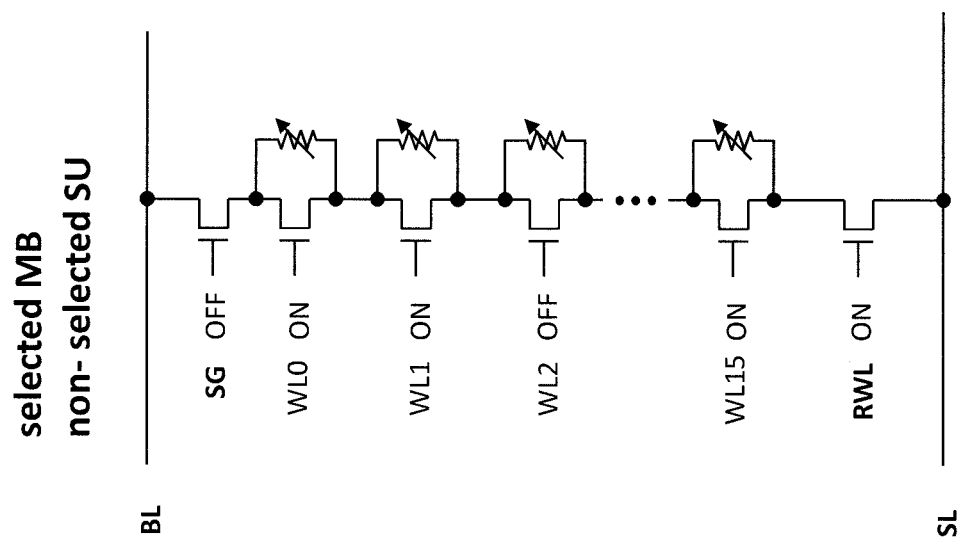
FIG. 52 is a diagram showing non-selected state of a memory cell.
Figure 53:
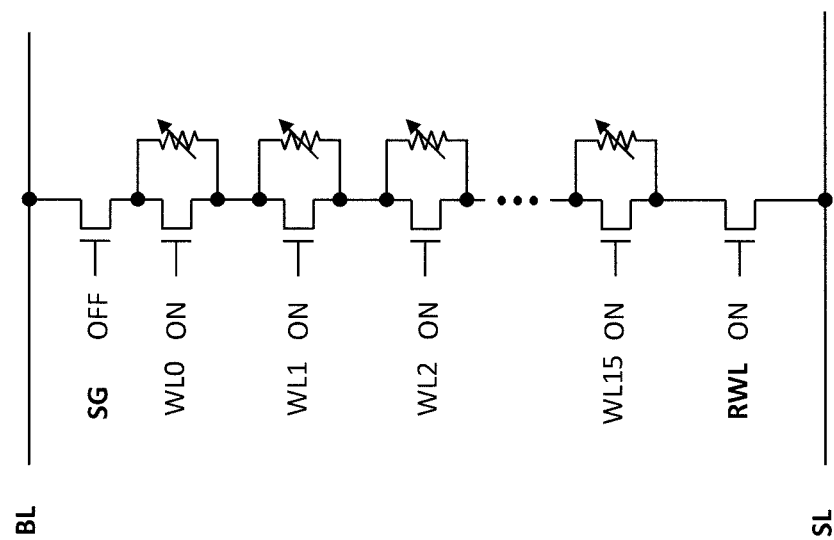
FIG. 53 is a diagram showing non-selected state of a memory cell.

Referring to FIGS. 51-53, a method of selecting the memory cell will be described. The unselected word line WL and the reset word line RWL are constantly supplied with the ON voltage.

As shown in FIG. 51, in the selected string unit SU of the selected memory block MB, the selecting gate line SG is supplied with the ON voltage enough to conduct the selected gate transistor (sufficient carriers are induced in the region of the semiconductor pillar 43 to reduce the resistance). When selecting the memory cell MC connected to the word line WL2, the word lines WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (resistance becomes large without inducing sufficient carriers to the region the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written to the selected memory cell MC can be read. The reset word line RWL is supplied with the ON voltage enough to conduct the reset transistor (sufficient carriers are induced in the region of the semiconductor pillar 43 to reduce resistance). The reset word line RWL is supplied with the OFF voltage only in the reset operation.

As shown in FIG. 52, in the non-selected string unit SU of the selected memory block MB, the selecting gate line SG is supplied with the OFF voltage that is insufficient to conduct the selecting gate transistor. As a result, no current flows through the string unit SU even if the word lines WL0, WL1, WL3 to WL15 and the reset word line RWL are supplied with the ON voltage.

Similarly, as shown in FIG. 53, in the non-selected memory block MB, the OFF voltage is supplied to the selecting gate line SG. As a result, no current flows through the string unit SU even if the word lines WL0 to WL15 and the reset word line RWL are supplied with the ON voltage.

<2-2> Explanation of Operation

<2-2-1> Explanation of Reset Operation

Figure 54:
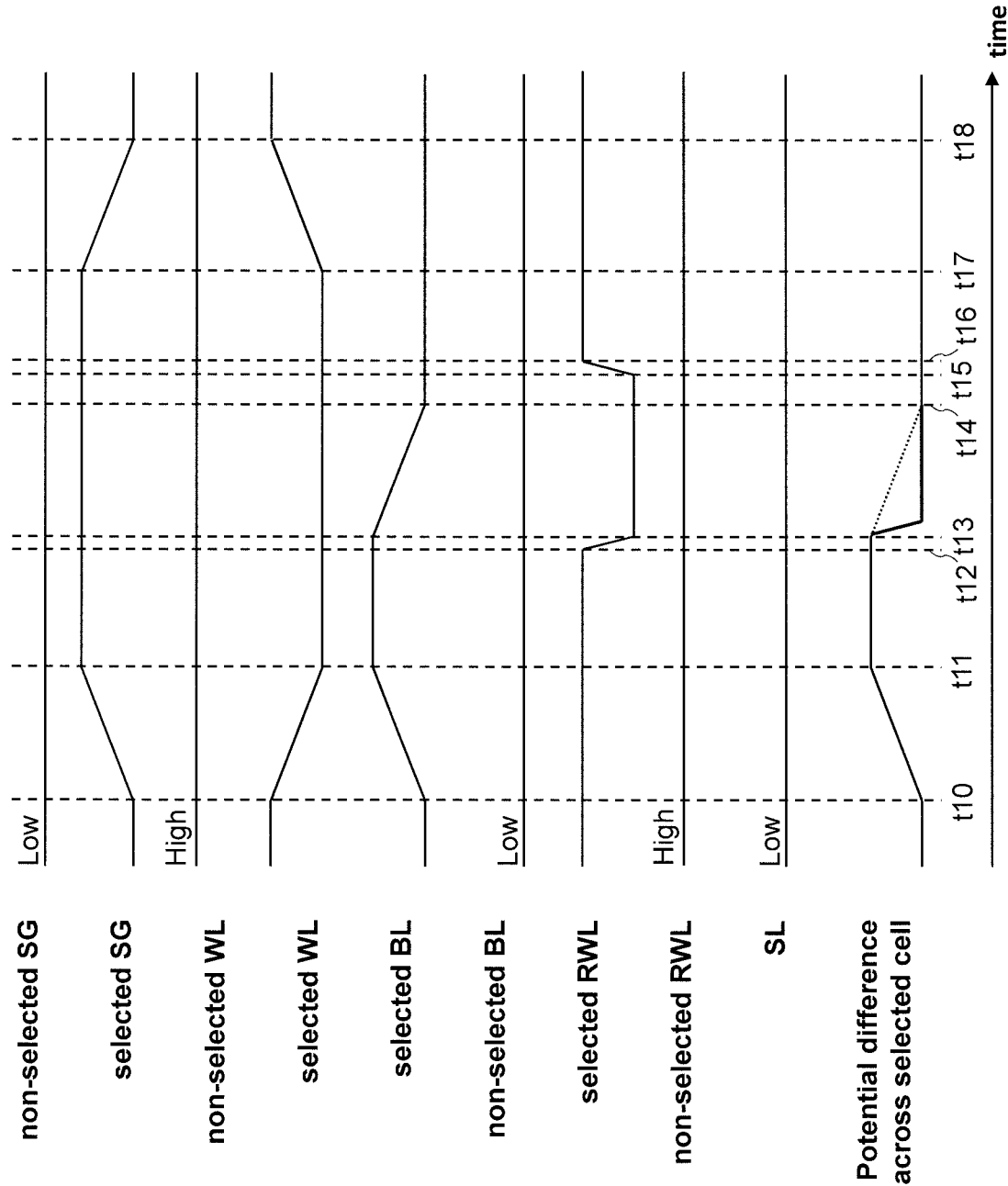
FIG. 54 is a waveform diagram showing voltages applied to each line at a reset operation.

FIG. 54 is a waveform diagram showing voltages applied to the selecting gate line SG, the word line WL, the reset word line RWL, the bit line BL, and the source line SL in the reset operation (operation for increasing resistance of the variable resistance layer 45 of the selected memory cell in the write operation).

The unselected selecting gate line SG is constant at Low. The unselected word line WL is constant at High. The unselected bit line BL is constant at Low. The unselected reset word line RWL is constant at High. The source line SL is constant at Low.

Figure 64:
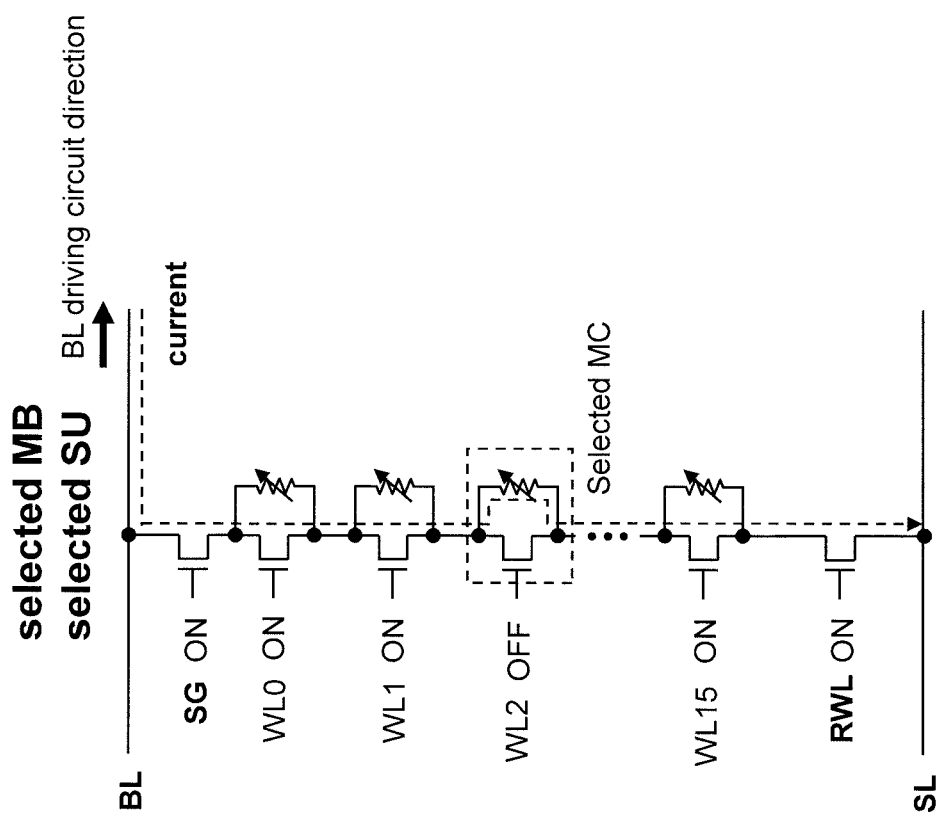
FIG. 64 is a circuit diagram showing a path of current flowing in a selected memory cell.

At time t10, the selected selecting gate line SG starts to rise from Low to High, the selected word line WL starts to fall from High to Low, and the selected bit line BL starts to rise from Low to High. The potential difference across the selected cell begins to spread. Since the selecting gate line SG, the word line WL, and the bit line BL have constant parasitic capacitances, the rising edge and the falling edge may not be steep in some cases. By time t11, the selected selecting gate line reaches High, the selected word line WL reaches Low, the selected bit line BL reaches High, and the potential difference between both ends of the selected cell reaches the maximum. During a period from around time t11 to around time t13, current flows to the region of the semiconductor pillar 43 in the non-selected memory cell MC, and current flows to the variable resistance layer 45 in the selected memory cell MC. The variable resistance layer 45 undergoes a phase change due to the heat generated by the current flowing therethrough. This state is shown in FIG. 64.

Figure 65:
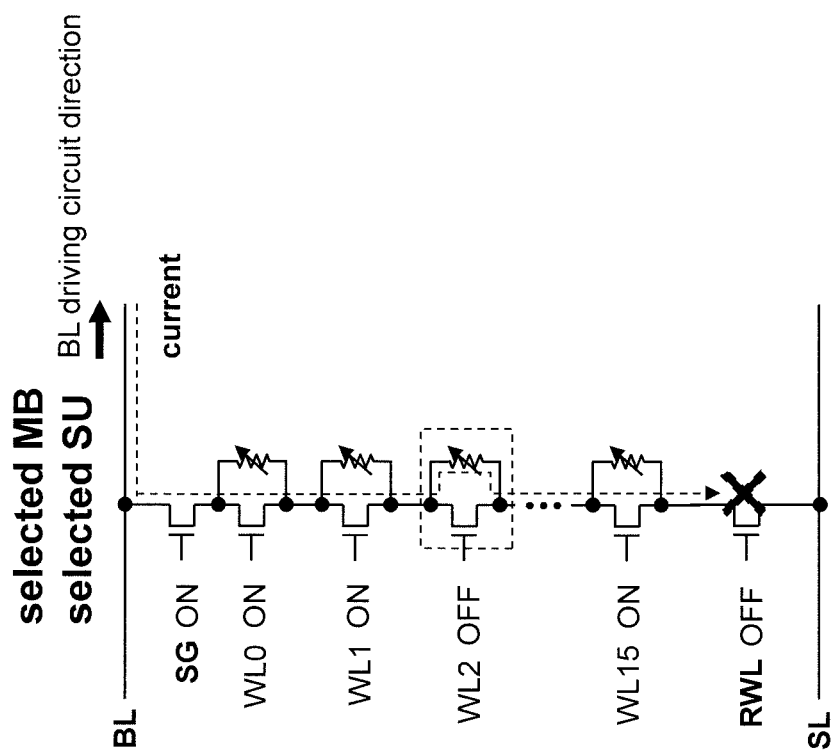
FIG. 65 is a circuit diagram showing a path through which no current flows in a memory string.

At time t12, the reset word line RWL falls from High to Low. The reset word line RWL is configured to be able to drop the applied voltage steeply, for example, by being connected to a dedicated reset word line driving circuit. In particular, in the case where the memory cell array 11 is arranged above the peripheral circuits, the effect of the delay time can be reduced and the falling can be steepened because a plurality of the reset word line driving circuits can be arranged adjacent to the reset word line RWL arranged at the lowest layer and distributed with respect to the individual wiring. At time t13, the reset word line RWL reaches Low. At time t13, the sense amplifier SA located outside the memory cell array 11 starts driving the selected bit line BL from High to Low. Since the reset word line RWL falls, no current flows from the bit line BL to the source line SL in the memory string MS, so that the potential difference between both ends of the selected cell steeply approaches 0. It takes until time t14 for the bit line BL to fall Low. In FIG. 54, the potential difference between both ends of the selected cell when the bit line BL was only driven from High to Low by the sense amplifier SA located outside the memory cell array 11 is shown by a dotted line. In this case, it takes time t14 until the potential difference between both ends of the selected cell also becomes 0. Therefore, the potential difference between both ends of the selected cell become steeply close to 0 due to the presence of the reset word line RWL. This steep elimination of the potential difference, the variable resistance layer 45 of the memory cell MC connected to the selected word line WL is rapidly cooled to become an amorphous phase, resulting in a high resistance. This state is shown in FIG. 65.

Subsequently, at time t15, the reset word line RWL starts to rise from Low to High, and by time t16, the reset word line RWL reaches High. Further, at time t17, the selecting gate line SG starts to fall from High to Low, and the selected word line WL starts to rise from Low to High. By time t18, the selecting gate line SG has reached Low and the selected word line WL has reached High. In this manner, the reset operation is completed through a series of processes.

<2-2-2> Explanation of Set Operation

Figure 55:
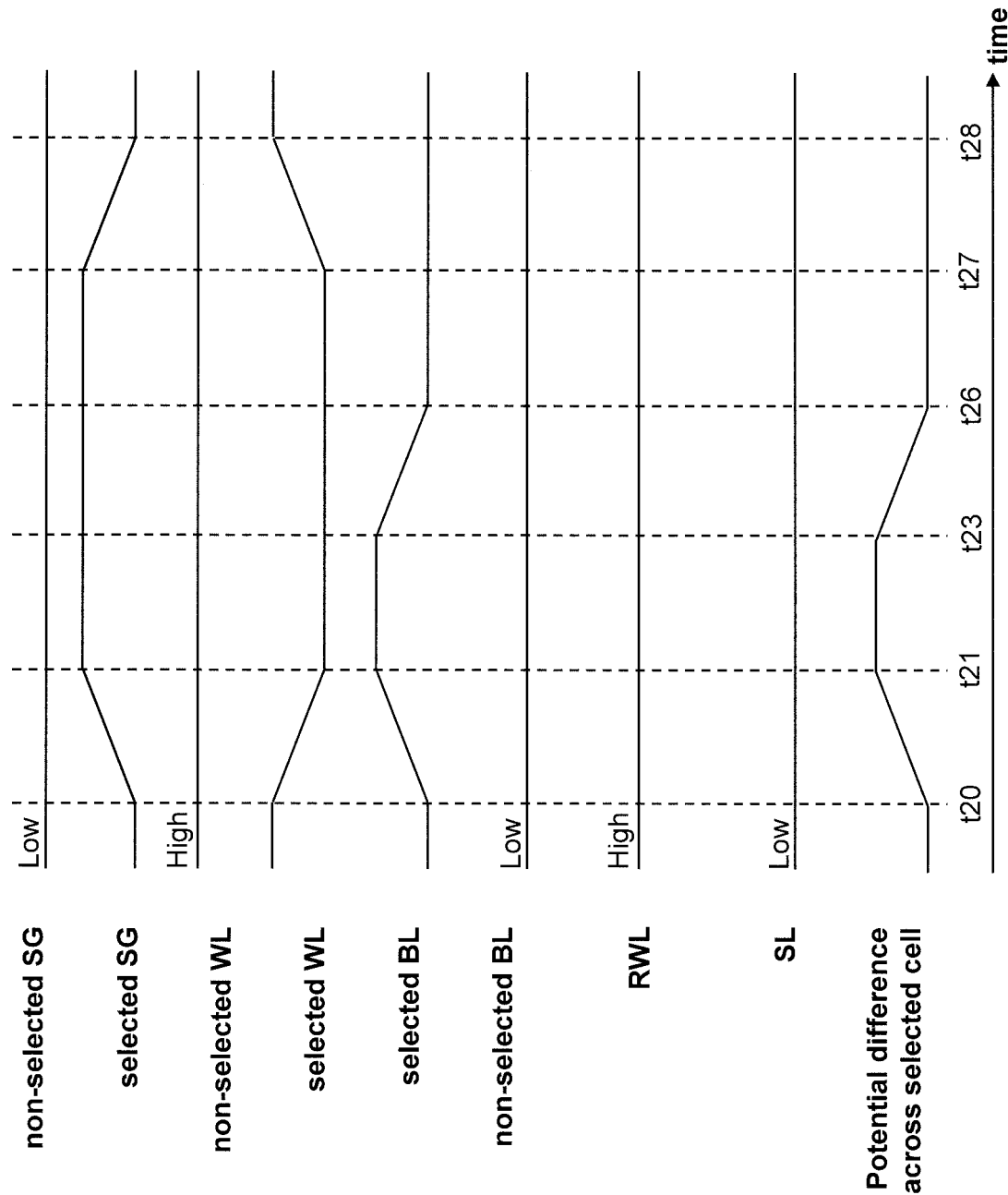
FIG. 55 is a waveform diagram showing voltages applied to each line at a set operation.

FIG. 55 is a waveform diagram showing voltages applied to the selecting gate line SG, the word line WL, the reset word line RWL, the bit line BL, and the source line SL in the set operation (operation for decreasing the resistance of the variable resistance layer 45 of the selected memory cell in the write operation).

The unselected selecting gate line SG is constant at Low. The unselected word line WL is constant at High. The unselected bit line BL is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. The potential difference between both ends of the selected cell starts to spread. By time t21, the selected selecting gate line SG reaches High, the selected word line WL reaches Low, the selected bit line BL reaches High, and the potential difference between both ends of the selected cell reaches the maximum. Current flows to the region of the semiconductor pillar 43 in the non-selected memory cell MC, and current flows to the variable resistance layer 45 in the selected memory cell MC from around time t21 until time t26. The variable resistance layer 45 undergoes a phase change due to the heat generated by the current flowing therethrough.

At time t23, the sense amplifier SA located outside the memory cell array 11 starts driving the selected bit line BL from High to Low. Here, since the reset word line RWL is not lowered, neither the potential difference between both ends of the selected cell nor the voltage of the selected bit line BL changes steeply. It takes time t26 until the potential difference between both ends of the selected cell to be close to 0 and the selected bit line BL to fall to Low. Due to this slow fall, the variable resistance layer of the memory cell MC connected to the selected word line WL is gradually cooled down to a crystalline phase, resulting in a low resistance. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<2-2-3> Explanation of Read Operation

Figure 56:
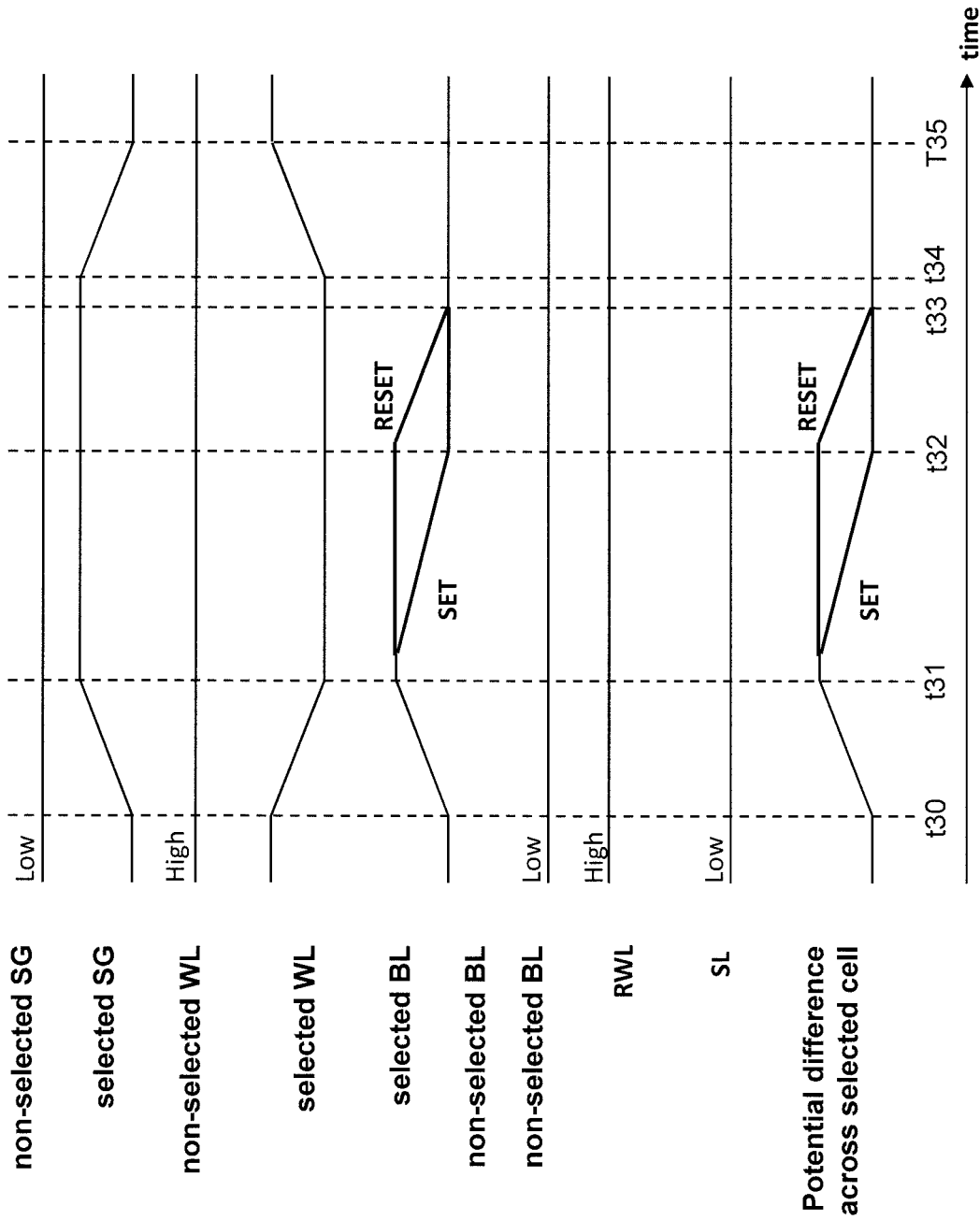
FIG. 56 is a waveform diagram showing voltages applied to each line at a read operation.

FIG. 56 is a waveform diagram showing voltages applied to the selecting gate line SG, the word line WL, the reset word line RWL, the bit line BL, and the source line SL in the read operation.

The unselected selecting gate line SG is constant at Low. The unselected word line WL is constant at High. The unselected bit line BL is constant at Low. The reset word line RWL is constant at High. The source line SL is constant at Low.

At time t30, the selected selecting gate line SG starts to rise from Low to High, the selected word line WL starts to fall from High to Low, and the selected bit line BL starts to rise from Low to High. The potential difference across the selected cell starts to spread. Then, by the time t31, the selected selecting gate line is High, the selected word line WL is Low, the selected bit line BL is High, the potential difference across the selected cell reaches the maximum value. From time t31 to time t32, the selected bit line BL is kept floating. If the selected memory cell MC has been reset, the variable resistance layer 45 is in a high resistance amorphous state. Therefore, no discharge is performed through the cell string SU including the memory cell MC, and the voltage of the selected bit line BL remains High while the potential difference between both ends of the selected cell remains large. On the other hand, if the selected memory cell MC is set, the variable resistance layer 45 is in a low resistance crystalline state. Therefore, discharge is performed through the cell string SU including the memory cell MC, so that the selected bit line BL fall from High to Low and the potential difference between both ends of the selected cell is also close to 0. The potential of the selected bit line BL reaches Low, and the potential difference between both ends of the selected cell also reaches 0 by time t32. Between time t31 and time t32, the sense amplifier SA senses the potential of the bit line BL and outputs the data. From time t32 to time t33, the potential of the bit line BL is forced to fall from the outside of the memory cell array to Low. Further, at time t34, the selecting gate line SG starts to fall from High to Low, and the selected word line WL starts to rise from Low to High. By time t35, the selecting gate line SG reaches Low and the selected word line WL reaches High. In this manner, the read operation is completed through a series of processes.

<2-2-4> Explanation of Set Operation (Modified Example 1)

Figure 57:
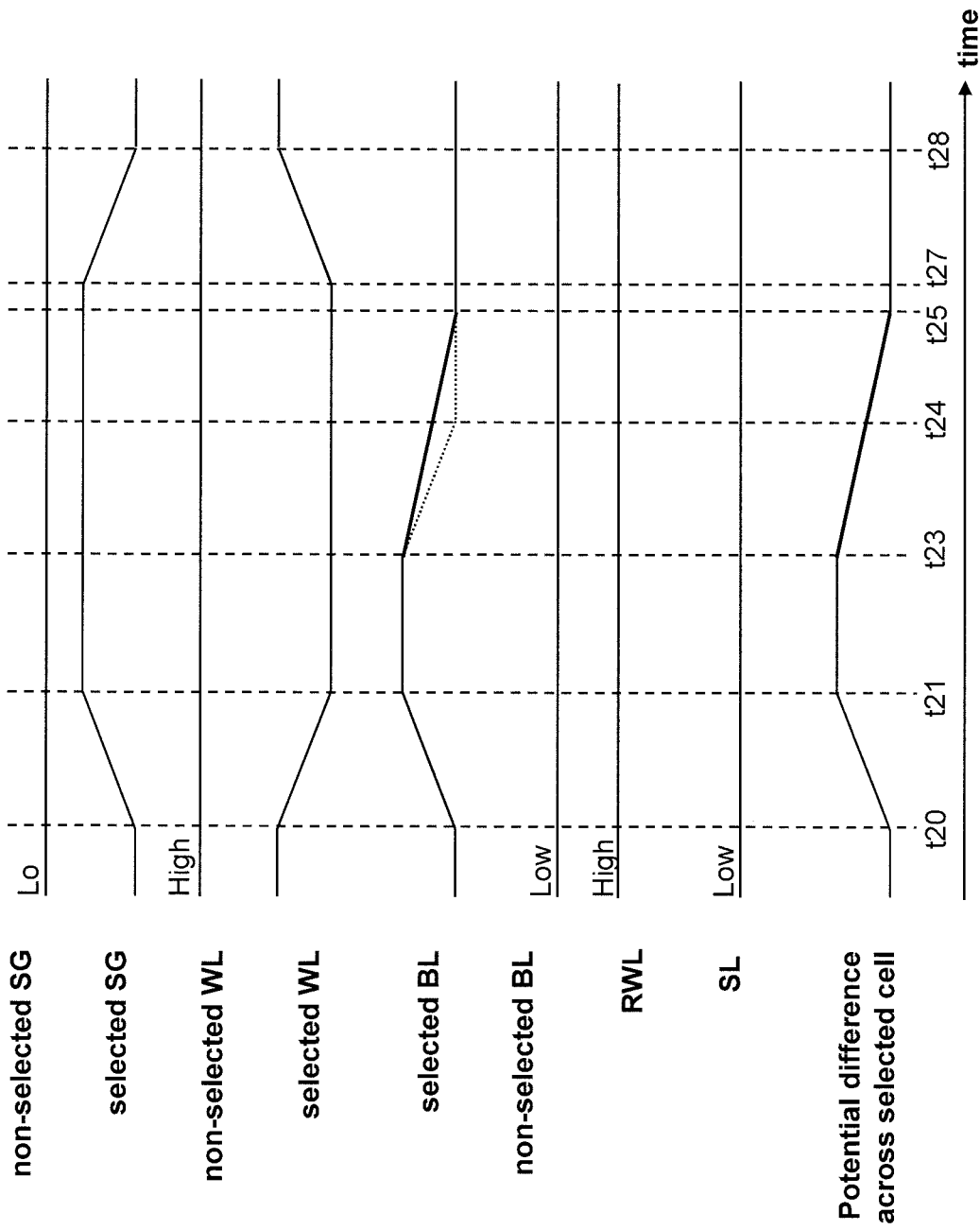
FIG. 57 is a waveform diagram showing a modified example of voltages applied to each line at a set operation.

FIG. 57 is a waveform diagram showing voltages applied to the selecting gate line SG, the word line WL, the reset word line RWL, the bit line BL, and the source line SL in the set operation (modified example 1).

The unselected selecting gate line SG is constant at Low. The unselected word line WL is constant at High. The unselected bit line BL is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. The potential difference across the selected cell starts to spread. By time t21, the selected selecting gate line SG reaches High, the selected word line WL reaches the Low, the selected bit line BL reaches High, and the potential difference between both ends of the selected cell reaches the maximum. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to the Low. The time for which the selected bit line BL falls from High to Low is up to time t24 as shown by the dotted line if it is about the same as the time for which the bit line BL rises. The control is performed so that the bit line BL falls more gently, and the time for which the bit line BL falls to Low is multiplied by time t25. This slow fall causes the variable resistance layer of the memory cell MC connected to the selected word line WL is gradually cooled down to form a larger grain-size crystalline phase, resulting in a lower resistance. The potential difference between both ends of the selected cell also slowly reaches 0 until time t25. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<2-2-5> Explanation of Set Operation (Modified Example 2)

Figure 58:
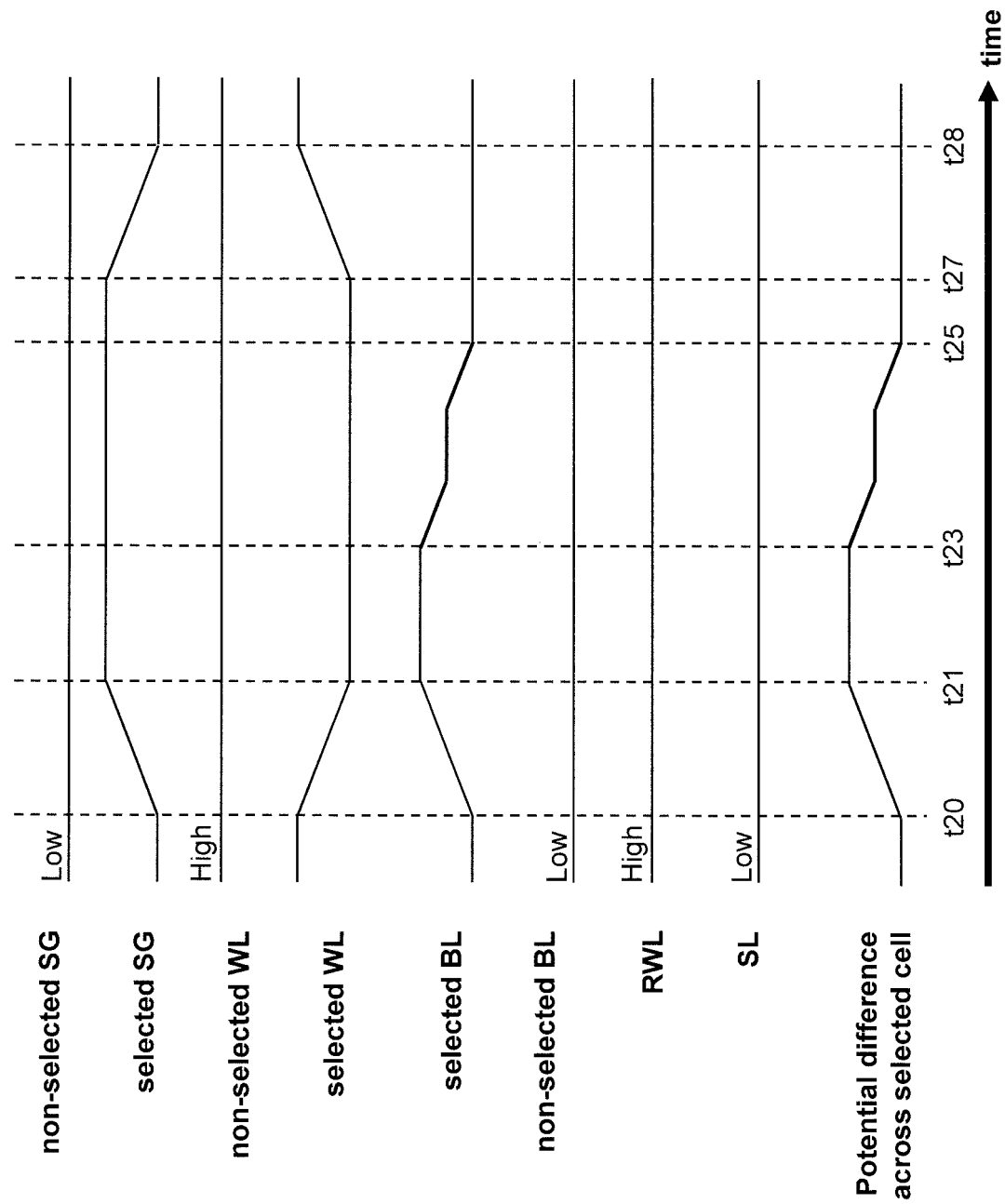
FIG. 58 is a waveform diagram showing a modified example of voltages applied to each line at a set operation.

FIG. 58 is a waveform diagram showing voltages applied to the selecting gate line SG, the word line WL, the reset word line RWL, the bit line BL, and the source line SL in the set operation (Modified example 2).

The unselected selecting gate line SG is constant at Low. The unselected word line WL is constant at High. The unselected bit line BL is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. The potential difference across the selected cell starts to spread. By time t21, the selected selecting gate line SG reaches High, the selected word line WL reaches Low, the selected bit line BL reaches High, and the potential difference between both ends of the selected cell reaches the maximum. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to the Low. The waveform profile of this falling edge is a falling edge of two stages. For example, it drops to just the middle voltage of High and Low, and subsequently falls from this middle voltage to Low. Due to the fall of these two stages, the variable resistance layer of the memory cell MC connected to the selected word line WL is gradually cooled down to form a larger grain-size crystalline phase, resulting in a lower resistance. The potential difference between both ends of the selected cell also reaches 0 by being eliminated in two steps until time t25. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<2-2-6> Explanation of Set Operation (Modified Example 3)

Figure 59:
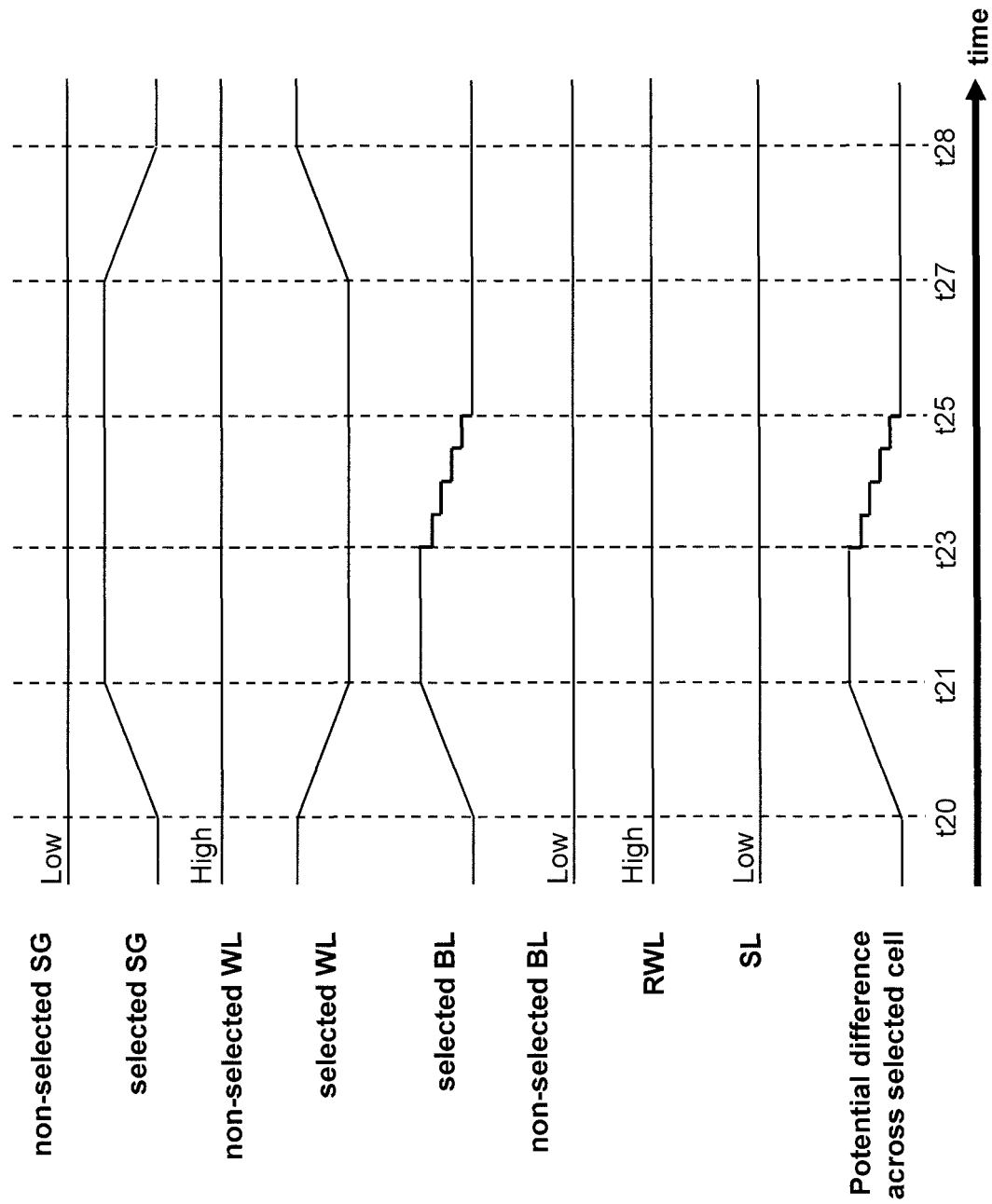
FIG. 59 is a waveform diagram showing a modified example of voltages applied to each line at a set operation.

FIG. 59 is a waveform diagram showing the voltages applied to the selecting gate line SG, the word line WL, the reset word line RWL, the bit line BL, and the source line SL in the set operation (Modified example 3).

The unselected selecting gate line SG is constant at Low. The unselected word line WL is constant at High. The unselected bit line BL is constant at Low. The reset word line RWL is constant at High. The source line SL is constant at Low.

At time t20, the selected selecting gate line SG starts to rise from Low to High, the selected word line WL starts to fall from High to Low, and the selected bit line BL starts to rise from Low to High. The potential difference between both ends of the selected cell starts to spread. By time t21, the selected selecting gate line SG reaches High, the selected word line WL reaches Low, and the selected bit line BL reaches High. Current flows to the region of the semiconductor pillar 43 in the non-selected memory cell MC, and current flows to the variable resistance layer 45 in the selected memory cell MC from around time t21 until time t25. The variable resistance layer 45 undergoes a phase change due to the heat generated by the current flowing therethrough.

At time t23, the sense amplifier SA located outside the memory cell array 11 starts driving the selected bit line BL from High to Low. In this case, the selected bit line BL is controlled so as to gently fall to the Low. The waveform profile of the falling edge is a multistage falling edge in a staircase shape. For example, it falls in a stepped manner through the intermediate voltages (High>V1>V2>V3>V4>Low) of V1, V2, V3, and V4 between High and Low. Due to the falling edge of the multiple stages, the variable resistance layer of the memory cell MC connected to the selected word line WL is gradually cooled down to form a larger grain-size crystalline phase, resulting in a lower resistance. Even when the variable resistance layer becomes amorphized due to a steep fall at the original falling, it is possible to crystallize. The potential difference at both ends of the selected cell also reaches 0 by being eliminated in stepwise manner until time t25. Further, at time t27, the selecting gate line SG starts to fall from High to Low, and the selected word line WL starts to rise from Low to High. By time t28, the selecting gate line SG reaches Low and the selected word line WL reaches High. In this manner, the set operation is completed through a series of processes.

<2-2-7> Explanation of Set/Reset Operation (Simultaneous Writing)

Figure 60:
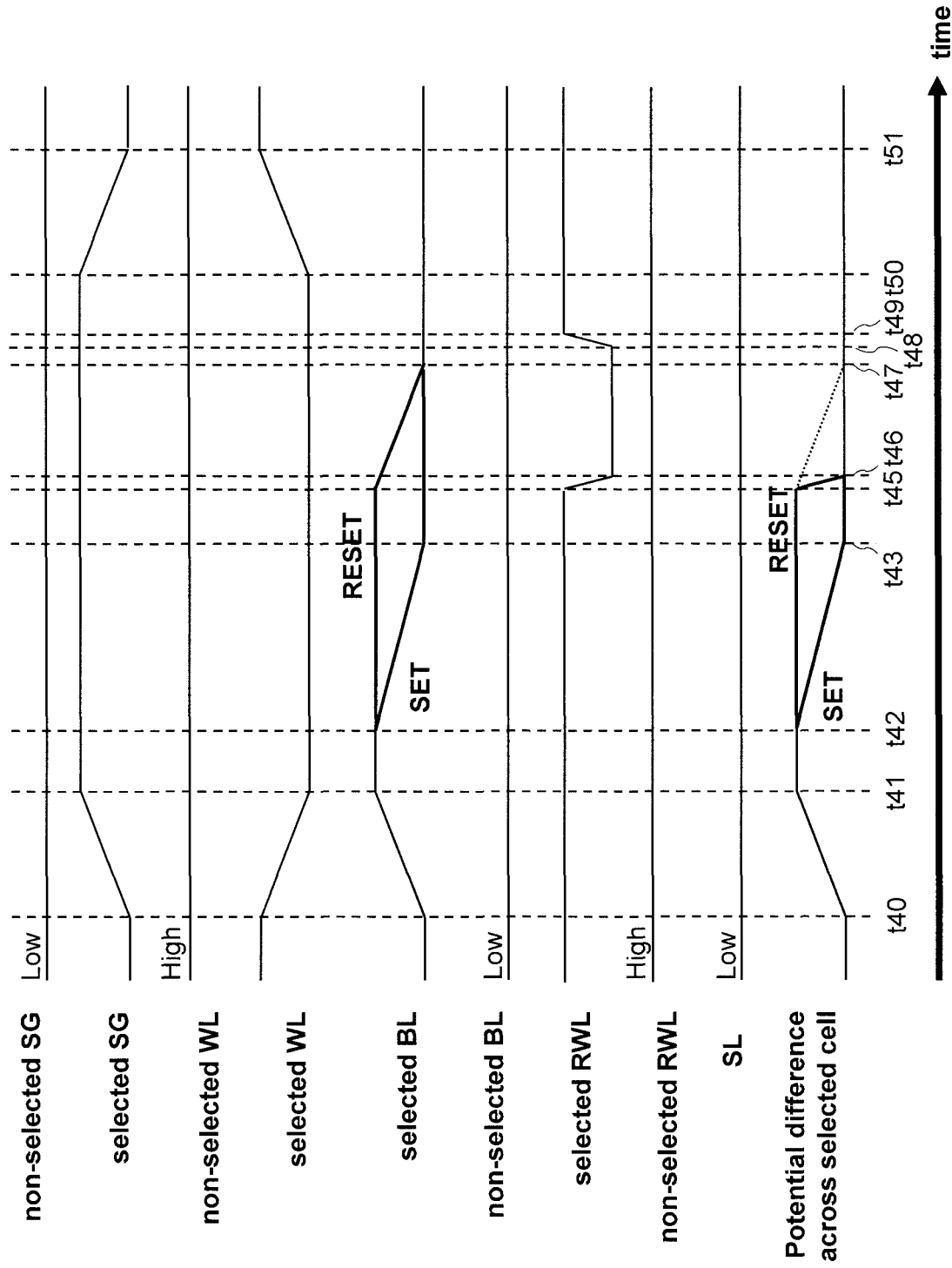
FIG. 60 is a waveform diagram showing a modified example of voltages applied to each line when performing a reset operation and a set operation simultaneously.

FIG. 60 is a waveform diagram showing voltages applied to the selecting gate line SG, the word line WL, the reset word line RWL, the bit line BL, and the source line SL when the reset operation and the set operation are performed simultaneously in accordance with the writing data.

The unselected selecting gate line SG is constant at Low. The unselected word line WL is constant at High. The unselected bit line BL is constant at Low. The unselected reset word line RWL is constant at High. The source line SL is constant at Low.

At time t40, the selected selecting gate line SG starts to rise from Low to High, the selected word line WL starts to fall from High to Low, and the selected bit line BL starts to rise from Low to High. The potential difference between both ends of the selected cell starts to spread. By time t41, the selected selecting gate line SG reaches High, the selected word line WL reaches Low, and the selected bit line BL reaches High. A current flows to the region of the semiconductor pillar 43 in the non-selected memory cell MC and flows to the variable resistance layer 45 in the selected memory cell MC from the vicinity of the time t41 to the time t46 for the reset operation and from the vicinity of the time t41 to the time t43 for the set operation. The variable resistance layer 45 undergoes a phase change due to the heat generated by the current flowing therethrough. This state is shown in FIG. 64.

At time t42, the voltage of the bit line BL connected to the memory cell MC performing the set operation is gradually lowered from High to Low. By time t43, the voltage of the bit line BL connected to the memory cell MC performing the set operation is Low. The potential difference between both ends of the memory cell MC performing the set operation also reaches 0 until time t43. The variable resistance layer of the memory cell MC connected to the selected word line WL is gradually cooled down to become a crystalline phase, resulting in a low resistance. Subsequently, at time t45, the reset word line RWL is lowered from High to Low. At time t46, the reset word line RWL reaches Low. At time t45, the sense amplifier SA located outside the memory cell array 11 starts driving the bit line BL connected to the memory cell MC performing the reset operation from High to Low. As the reset word line RWL falls, no current flows from the bit line BL to the source line SL in the memory string MS, so that the potential difference between both ends of the memory cell MC performing the reset operation steeply approaches 0 (the potential difference between both ends of the memory cell MC for which the set operation has been performed is already 0). It takes until time t47 for the selected bit line BL to fall Low. FIG. 60 shows a dotted line showing the potential difference across the selected cell when the bit line BL was only driven from High to Low by the sense amplifier SA located outside the memory cell array 11. In this case, it takes time t47 for the potential difference between both ends of the selected cell to be also close to 0. Therefore, the potential difference across the selected cell becomes steeply close to 0 due to the presence of the reset word line RWL. This steep elimination of the potential difference, the variable resistance layer of the memory cell MC connected to the selected word line WL is rapidly cooled to become an amorphous phase, resulting in a high resistance. This state is shown in FIG. 65.

At time t47, all the selected bit line BL is Low. Subsequently, the reset word line RWL starts rising from Low to High at time t48, and the reset word line RWL reaches High by time t49. Further, at time t50, the selecting gate line SG starts to fall from High to Low, and the selected word line WL starts to rise from Low to High. By time t51, the selecting gate line SG reaches Low and the selected word line WL reaches High. In this manner, the set/reset operation is completed through a series of processes.

<2-3> Modified Examples

In the following description, parts different from those of the second embodiment will be described, and descriptions of common parts will be omitted.

<2-3-1> Modified Example of a Method of Selecting the Memory Cell

A modified example of the method of selecting the memory cell will be described with reference to FIGS. 61 to 63. In this modified example, the OFF voltage is supplied to all of the word line WL, the selecting gate line SG, and the reset word line RWL in the non-selected memory block MB.

Figure 61:
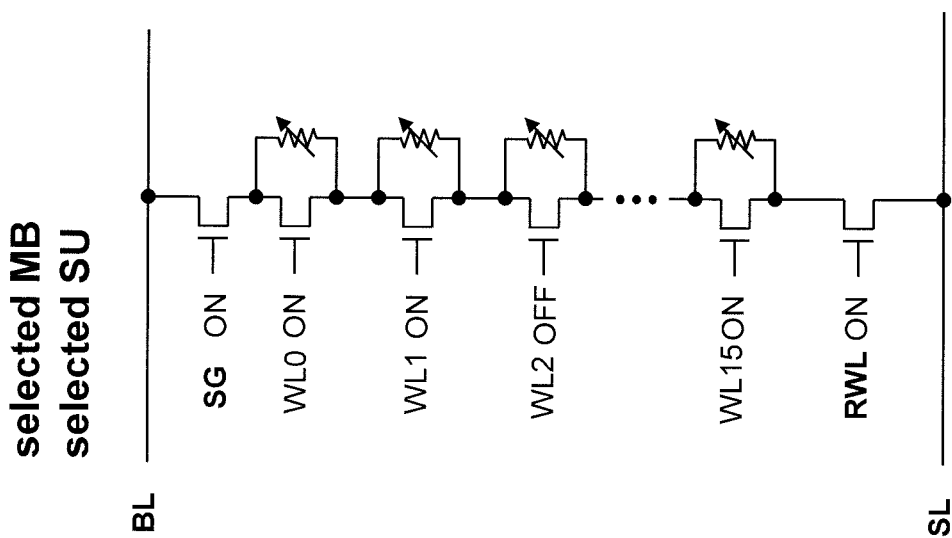
FIG. 61 is a diagram showing a modified example of selected state of a memory cell.

As shown in FIG. 61, in the selected string unit SU of the selected memory block MB, the selecting gate line SG is supplied with the ON voltage enough to conduct the selected gate transistor (sufficient carriers are induced in region of the semiconductor pillar 43 to reduce the resistance). When selecting the memory cell MC connected to the word line WL2, the word line WL0, WL1, WL3 to WL15 are supplied with the ON voltage enough to conduct the memory cell MC (sufficient carriers are induced in the region of the semiconductor pillar 43 to reduce resistance). In addition, the word line WL2 is supplied with the OFF voltage that is insufficient to conduct the memory cell MC (the resistance becomes large without inducing the sufficient carriers to the region of the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read. The reset word line RWL is supplied with the ON voltage enough to conduct the reset transistor (sufficient carriers are induced in the region of the semiconductor pillar 43 to reduce resistance).

Figure 62:
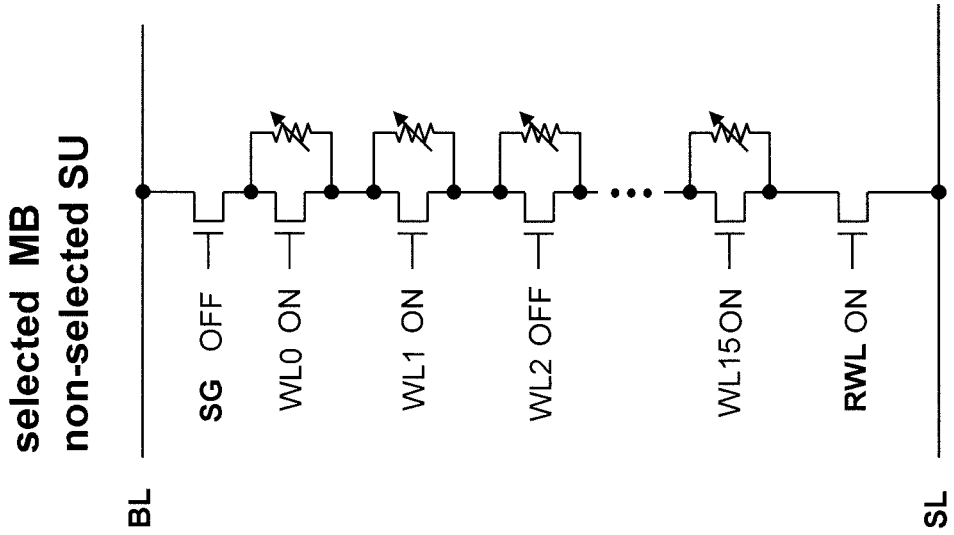
FIG. 62 is a diagram showing a modified example of non-selected state of a memory cell.

As shown in FIG. 62, in the non-selected string unit SU of the selected memory block MB, the selecting gate line SG is supplied with the OFF voltage that is insufficient to conduct the selecting gate transistor. As a result, no current flows through the string unit SU even if the word line WL0, WL1, WL3 to WL15, and the reset word line RWL are supplied with the ON voltage.

Figure 63:
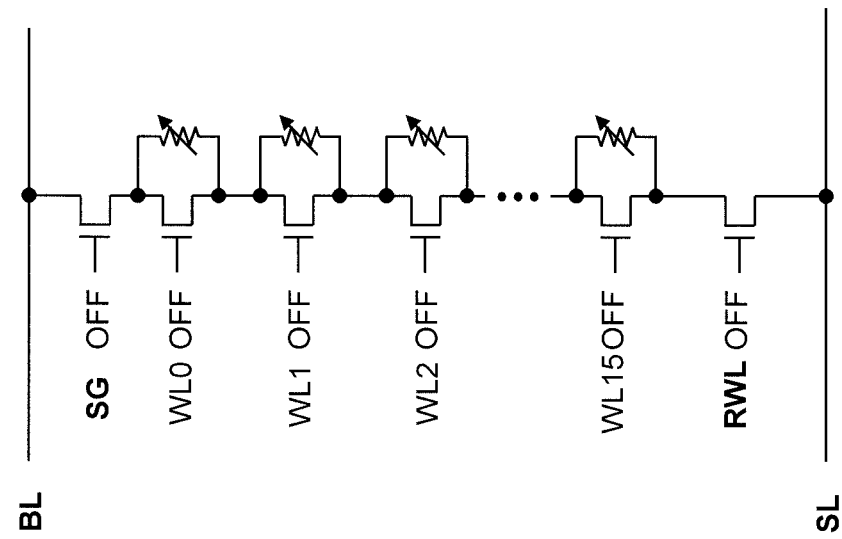
FIG. 63 is a diagram showing a modified example of non-selected state of a memory cell.

As shown in FIG. 63, in the non-selected memory block MB, the OFF voltage is supplied to the selecting gate line SG, the word lines WL0 to WL15, and the OFF voltage is supplied to the reset word line RWL. As a result, no current flows through the string unit SU.

<2-3-2> Modified Example with RWL Driving Circuit

Figure 66:
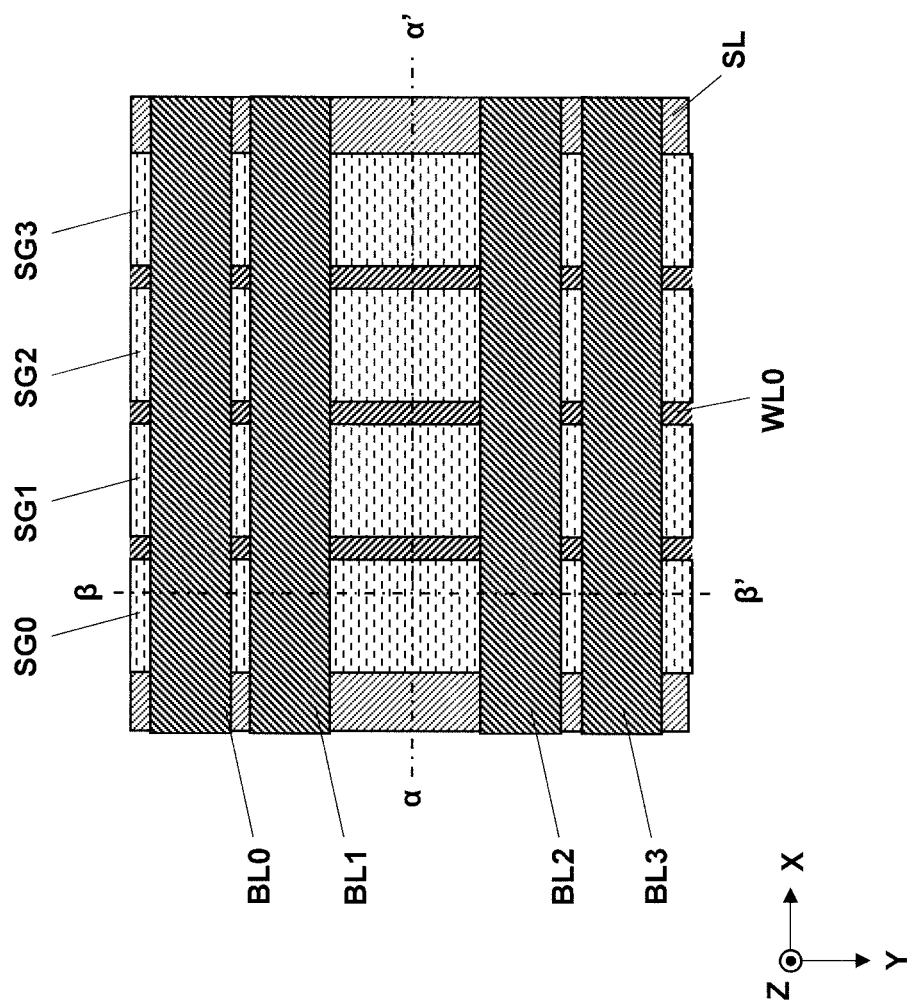
FIG. 66 is a plan view showing a modified example including an RWL driving circuit.
Figure 67:
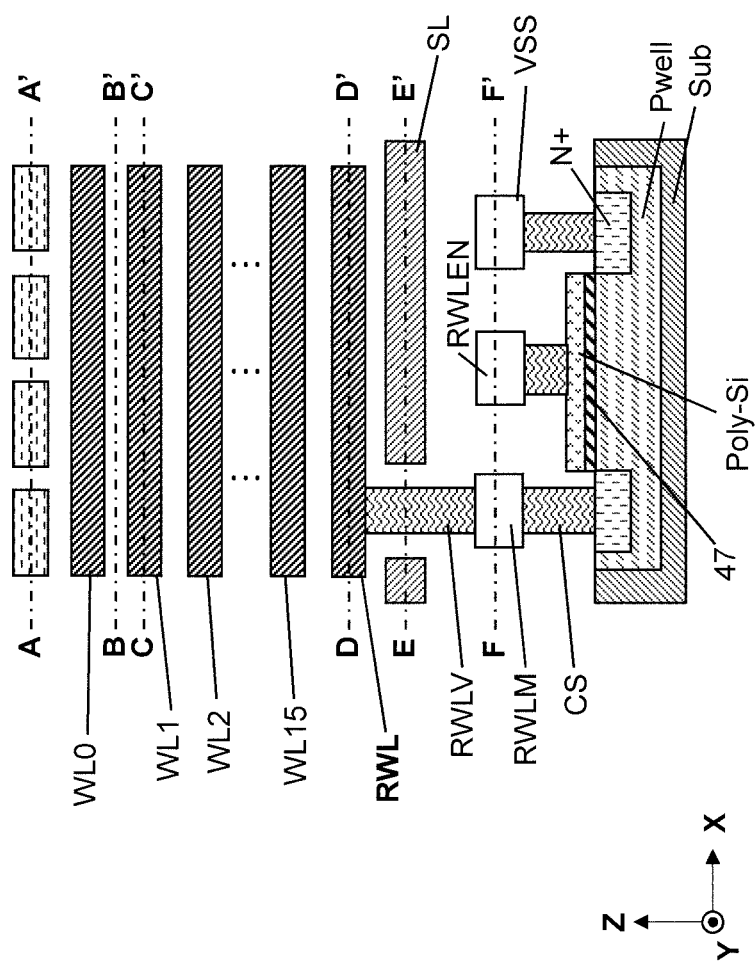
FIG. 67 is a cross-sectional view along α-α' line of FIG. 66.
Figure 68:
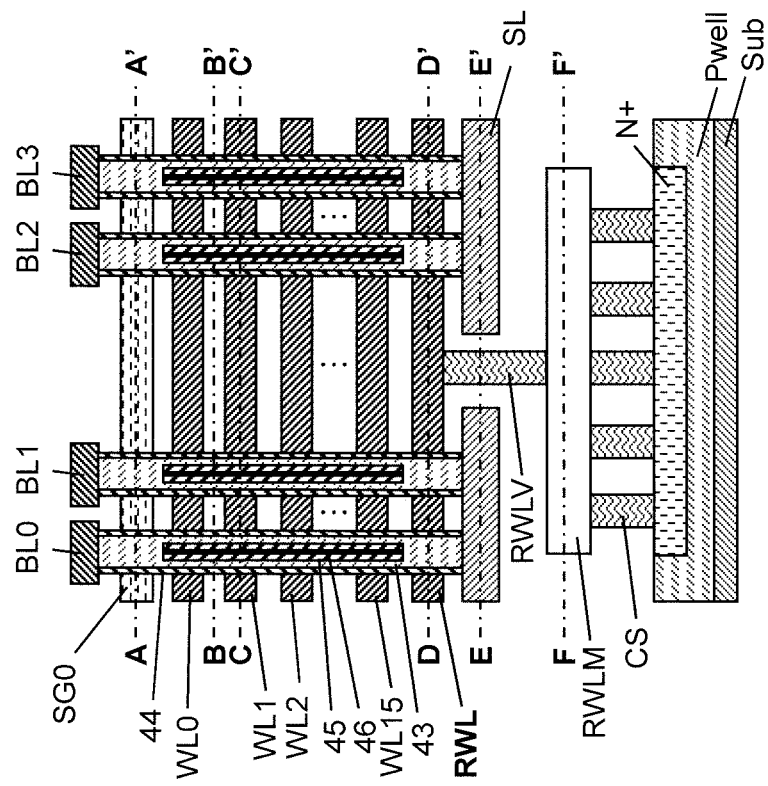
FIG. 68 is a cross-sectional view along β-β' line of FIG. 66.

The configuration of the reset word line driving circuit (RWL driving circuit) for driving the reset word line RWL will be described with reference to FIGS. 66 to 74. The RWL driving circuit according to the present modified example is arranged in a lower layer of the memory cell array 11. FIG. 66 shows an example of a plan view seen from above in the Z-direction of the memory cell array 11 according to the modified example. FIG. 67 shows an example of a cross-sectional view (cross-sectional view along α-α' line in FIG. 66) seen from the Y-direction of the memory cell array 11. FIG. 68 shows an example of a cross-sectional view (cross-sectional view along β-β' line in FIG. 66) seen from the X-direction of the memory cell array 11.

Figure 69:
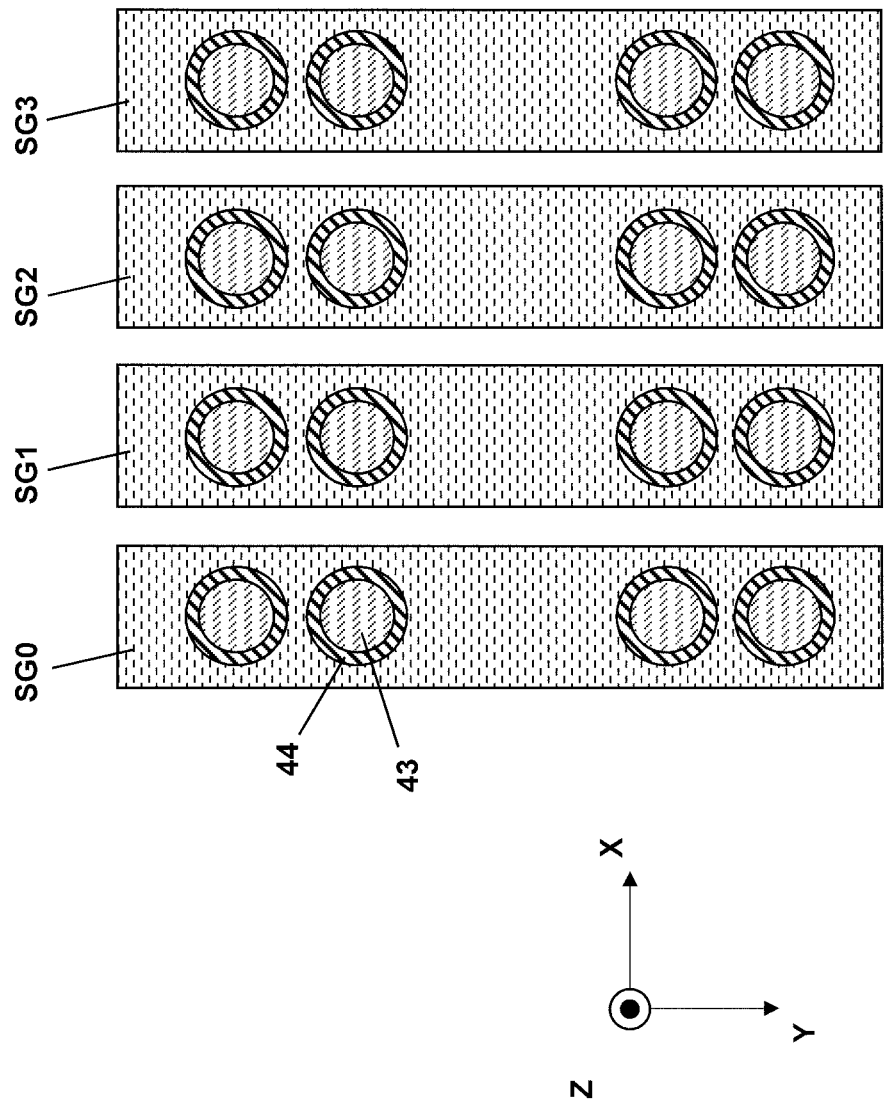
FIG. 69 is a cross-sectional view along A-A' line of FIG. 67.
Figure 70:
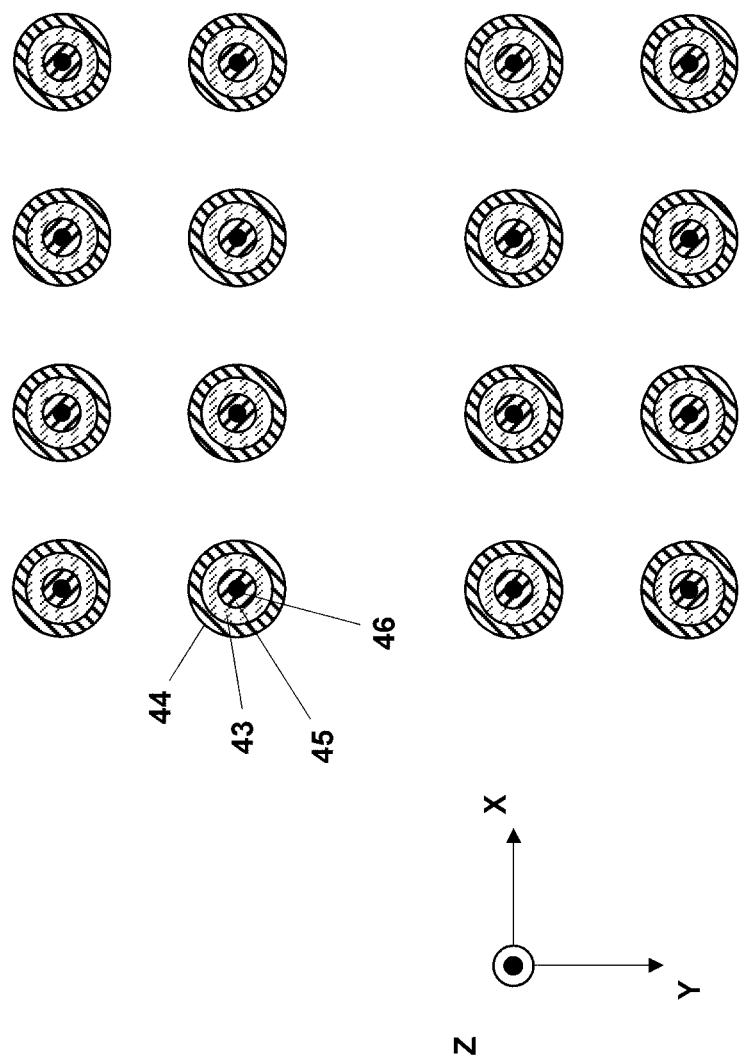
FIG. 70 is a cross-sectional view along B-B' line of FIG. 67.
Figure 71:
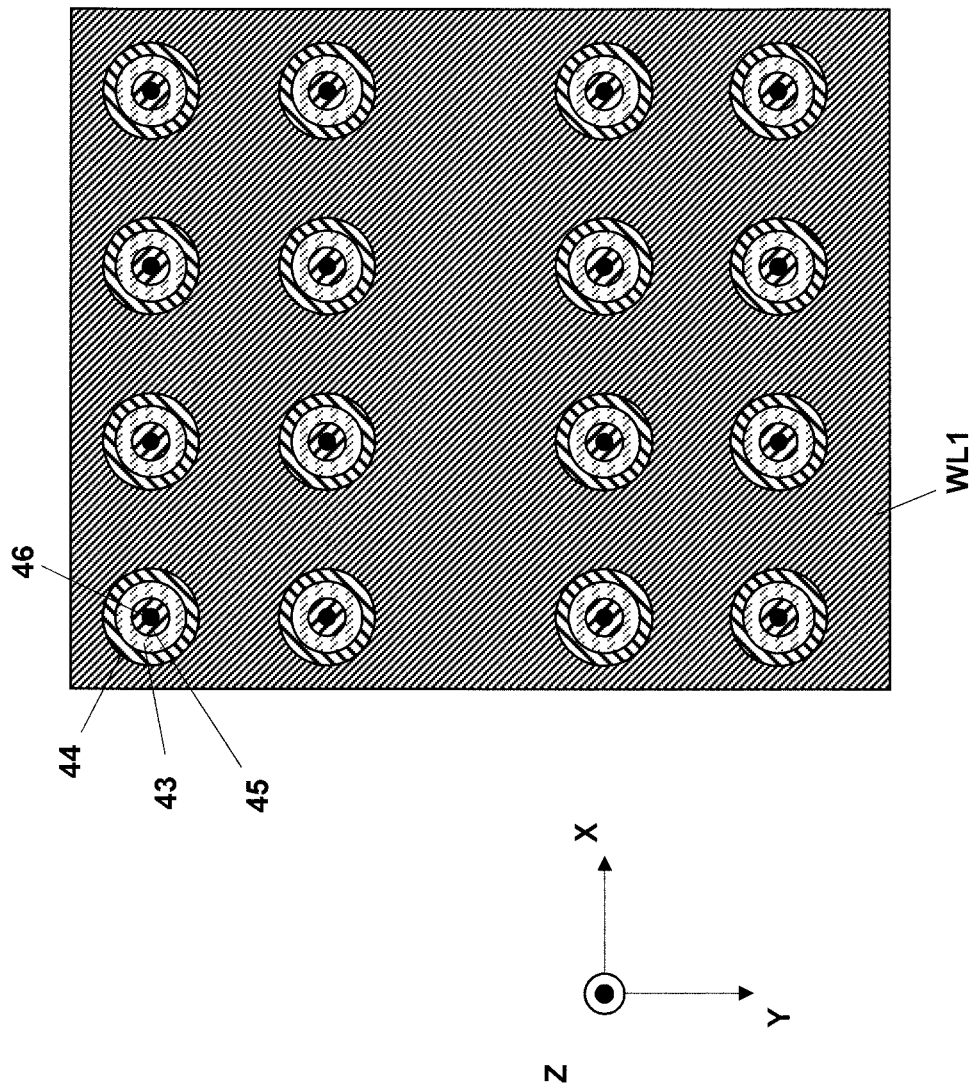
FIG. 71 is a cross-sectional view along C-C' line of FIG. 67.
Figure 72:
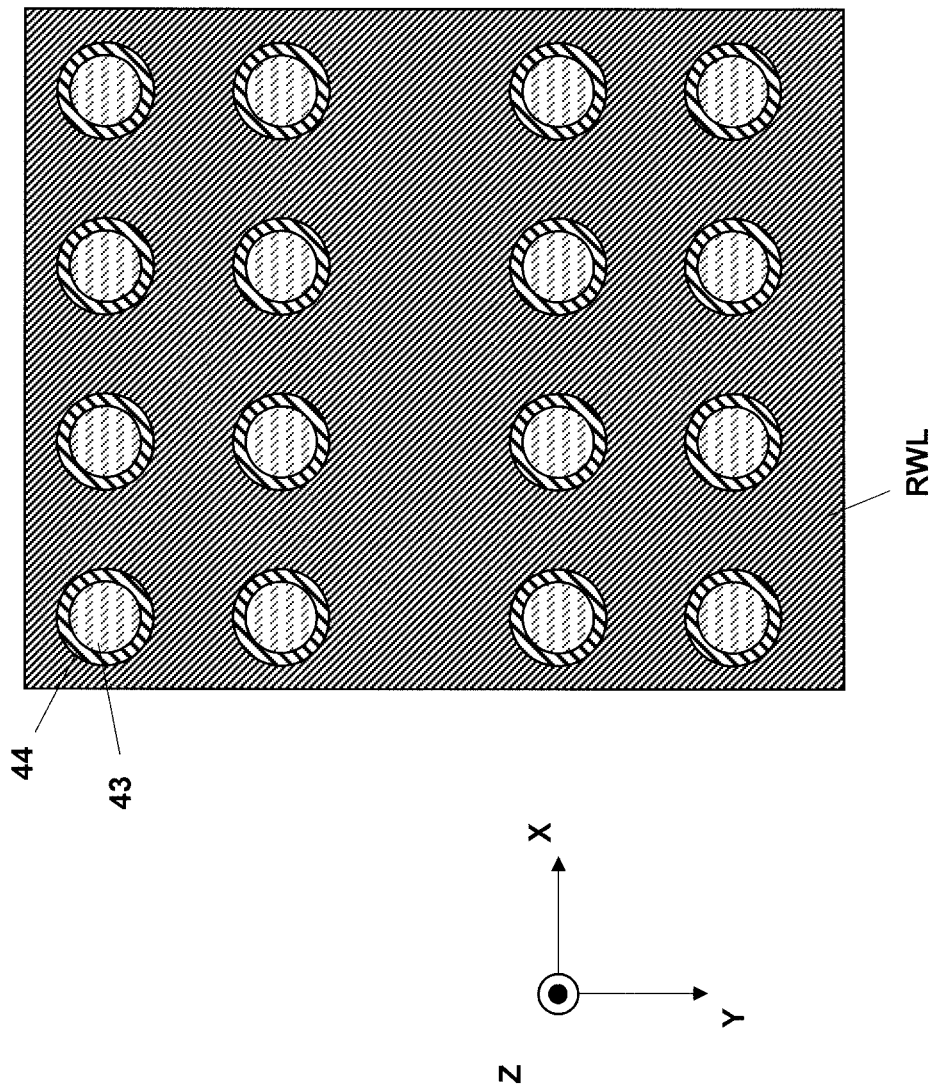
FIG. 72 is a cross-sectional view along D-D' line of FIG. 67.
Figure 73:
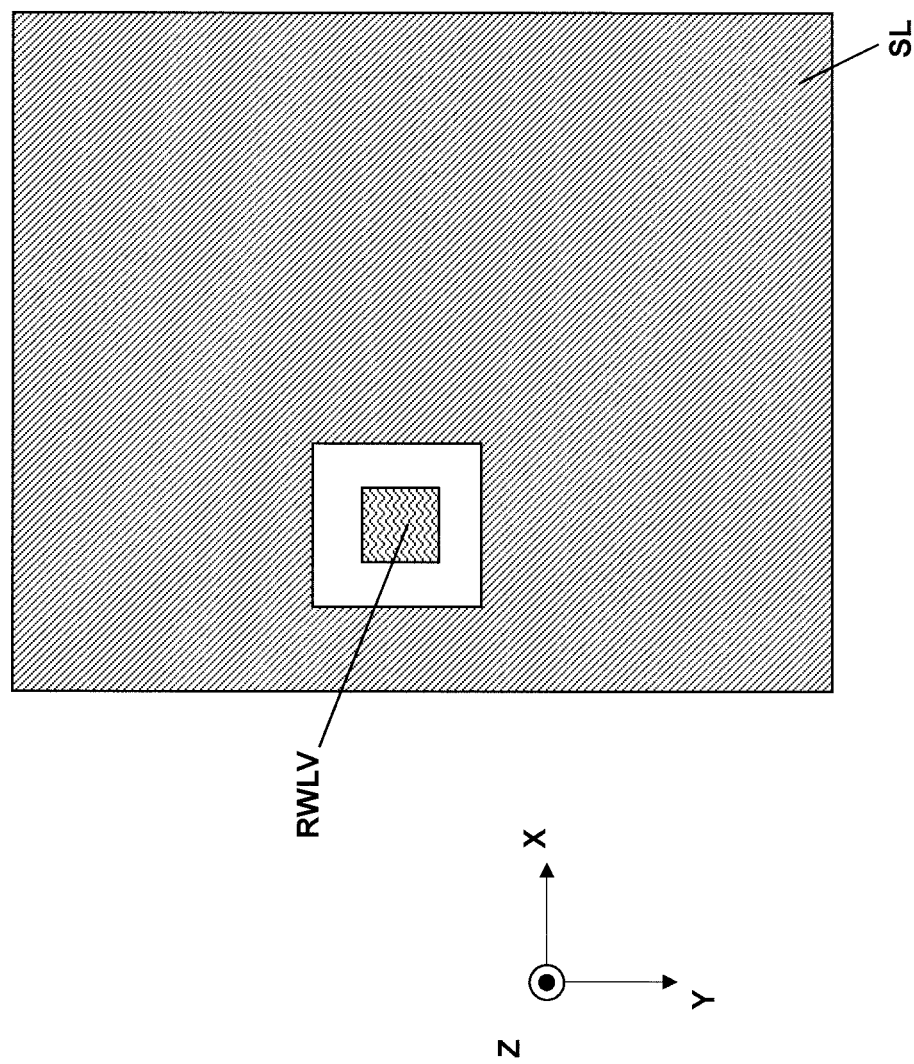
FIG. 73 is a cross-sectional view along E-E' line of FIG. 67.
Figure 74:
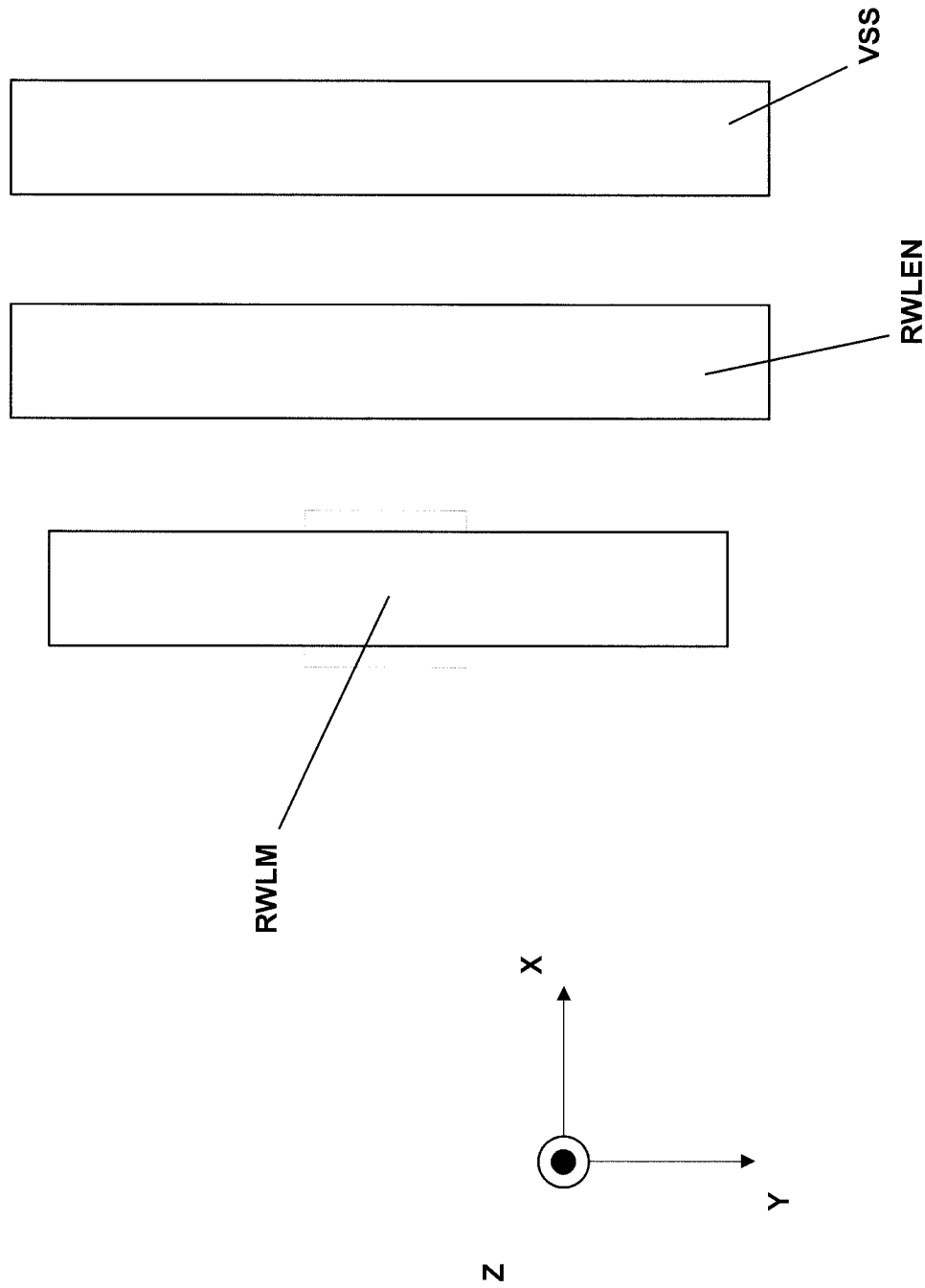
FIG. 74 is a cross-sectional view along F-F' line of FIG. 67.

FIGS. 69 to 74 show examples of cross-sectional view in the X-Y plane seen from the Z-direction of the memory cell array 11. FIG. 69 is a cross-sectional view along A-A' line in FIGS. 67 and 68, FIG. 70 is a cross-sectional view along B-B' line in FIGS. 67 and 68, FIG. 71 is a cross-sectional view along C-C' line in FIGS. 67 and 68, FIG. 72 is a cross-sectional view along D-D' line in FIGS. 67 and 68, FIG. 73 is a cross-sectional view along E-E' line in FIGS. 67 and 68, and FIG. 74 is a cross-sectional view along F-F' line in FIGS. 67 and 68.

As shown in FIGS. 66 to 74, in the memory cell array 11, the bit lines BL0 to BL3 extending in the X-direction are arranged in parallel at the top portion in the Z-direction. Below the bit line BL0 to BL3, there are the selecting gate lines SG0 to SG3 extending in the Y-direction in parallel. The selecting gate lines SG0 to SG3 are insulated from the bit lines BL0 to BL3. Below the selecting gate lines SG0 to SG3, the word lines WL0 to WL15 are arranged in the X-Y plane, respectively. The word lines WL0 to WL15 are insulated from each other and from the selecting gate lines SG0 to SG3. Below the word line WL15, the reset word line RWL is arranged in the X-Y plane. The reset word line RWL is insulated from the word line WL15. Below the reset word line RWL, the source line SL is arranged in the X-Y plane. The source line SL is insulated from the reset word line RWL.

As shown in FIGS. 68 to 72, the cylindrical memory pillar MP extending in the Z-direction is arranged through openings formed in the selecting gate lines SG0 to SG3, the word lines WL0 to WL15, and the reset word line RWL. The cylindrical memory pillar MP includes the cylindrical hollow gate insulating film 44 and the semiconductor pillar 43 therein from the outside. The bottom of the memory pillar MP reaches to the source line SL and is electrically connected thereto.

In the part of the memory pillar MP surrounded by the word lines WL0 to WL15 and the insulating film in the vicinity of the word lines WL0 to WL15, the semiconductor pillar 43 has a cylindrical hollow shape. The portion of the memory pillar MP includes the cylindrical hollow variable resistance layer 45 and the cylindrical core member 46 inside the cylindrical hollow shape semiconductor pillar 43. The cylindrical hollow shaped variable resistance layer 45 covers the side (outer periphery) of the core member 46. The inside of the cylindrical hollow shape semiconductor pillar 43 is in contact with the core member 46. The bottom of the variable resistance layer 45 is located between the word line WL15 and the reset word line RWL, and the memory pillar MP surrounded by the reset word line RWL does not include the variable resistance layer 45.

The cylindrical hollow (cylindrical in the part surrounded by the selecting gate lines SG0 to SG3 and the reset word line RWL) semiconductor pillar 43 covers the side (outer periphery) of the variable resistance layer 45. The inside of the semiconductor pillar 43 is in contact with the variable resistance layer 45. The bottom of the semiconductor pillar 43 contacts the source line SL.

The RWL driving circuit for driving the reset word line RWL is arranged below the source line SL of the memory cell array 11. An p-type well Pwell is formed in the n-type region of the semiconductor substrate Sub (the semiconductor substrate Sub may be n-type, or may be an n-type region arranged in a part of the semiconductor substrate Sub). Two highly concentrated n-type regions N+ spaced apart from each other are formed in this p-type well Pwell. A gate electrode Poly-Si is formed through the insulating film on a channel region sandwiched by the n-type regions N+. In this manner, a planar transistor 47 is constructed by a pair of n-type region N+ and the gate electrode Poly-Si. This the planar transistor 47 constitutes all or part of the RWL driving circuit. Although the planar transistor 47 has been described on the assumption that an NMOS transistor, it can also be a PMOS transistor by inverting the p-type and n-type. Both the NMOS transistor and the PMOS transistor can be formed.

The reset word line RWL is connected to the planar transistor 47 via a reset word line (perpendicular) RWLV, a reset word line (interlayer) RWLM, and a contact CS. FIG. 73 is a plan view of X-Y plane direction along E-E' line in FIG. 67, showing the pattern of the conductive film constituting the source line SL. As shown in FIG. 73, openings are formed in a part of the conductive film constituting the source line SL. Then, the reset word line (vertical) RWLV extending in the Z-direction through the inside of the openings is formed. The reset word line (perpendicular) RWLV is a plug formed of a metal such as tungsten, for example. The source line SL and the reset word line (vertical) RWLV are insulated.

As shown in FIG. 67, the reset word line (intermediate layer) RWLM, a reset word line enable signal line RWLEN, and a ground power supply line VSS are formed between the plane transistor 47 and the source line SL. FIG. 74 is a plan view in the X-Y plane along F-F' line in FIG. 67 and shows a pattern of the conductive film constituting the reset word line (intermediate layer) RWLM, the reset word line enable signal line RWLEN, and the ground power supply line VSS extending in the Y-direction in parallel. These reset word lines (intermediate layer) RWLM, the reset word line enable signal line RWLEN and the ground power supply line VSS are formed of metal film such as copper, for example. These reset word line (interlayer) RWLM, the reset word line enable signal line RWLEN and the ground power supply line VSS are insulated from each other and connected to the planar transistor 47 via the contact CS.

In this manner, the planar transistor 47 can be arranged in the vicinity of the cell array. Then, the reset word line RWL by the planar transistor 47 is enabled to drive at high speed.

<2-3-3> Arrangement of the RWL Driving Circuit

Figure 75:
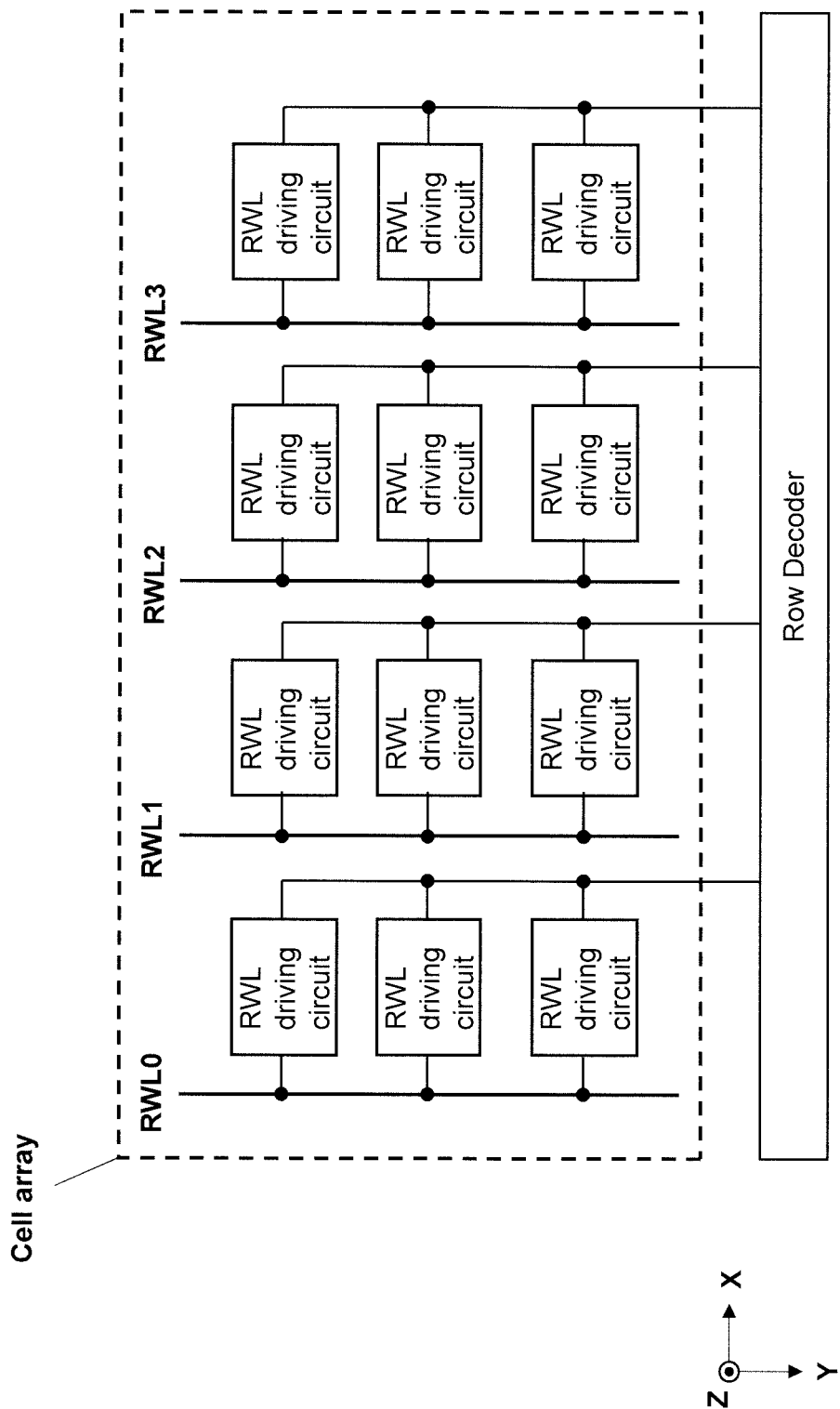
FIG. 75 is a diagram showing an example of a connection structure between a reset word line RWL and an RWL driving circuit.

FIG. 75 is a schematic diagram showing the arrangement of the RWL driving circuit and the connection structure between the RWL driving circuit and the respective reset word line RWL (RWL0, RWL1, RWL2 and RWL3). The RWL driving circuit is distributed in a matrix below the memory cell array 11, and the reset word line RWL (RWL0, RWL1, RWL2 and RWL3) are arranged in the column direction (Y-direction). A plurality of the RWL driving circuits aligned in the column direction (Y-direction) is driven by the same reset word line enable signal line RWLEN. The reset word line enable signal line RWLEN is selected and driven by the Row Decoder. In this manner, the distributed arrangement of the RWL circuit under the cell arrays allows the reset word line RWL to fall at high speeds.

Figure 76:
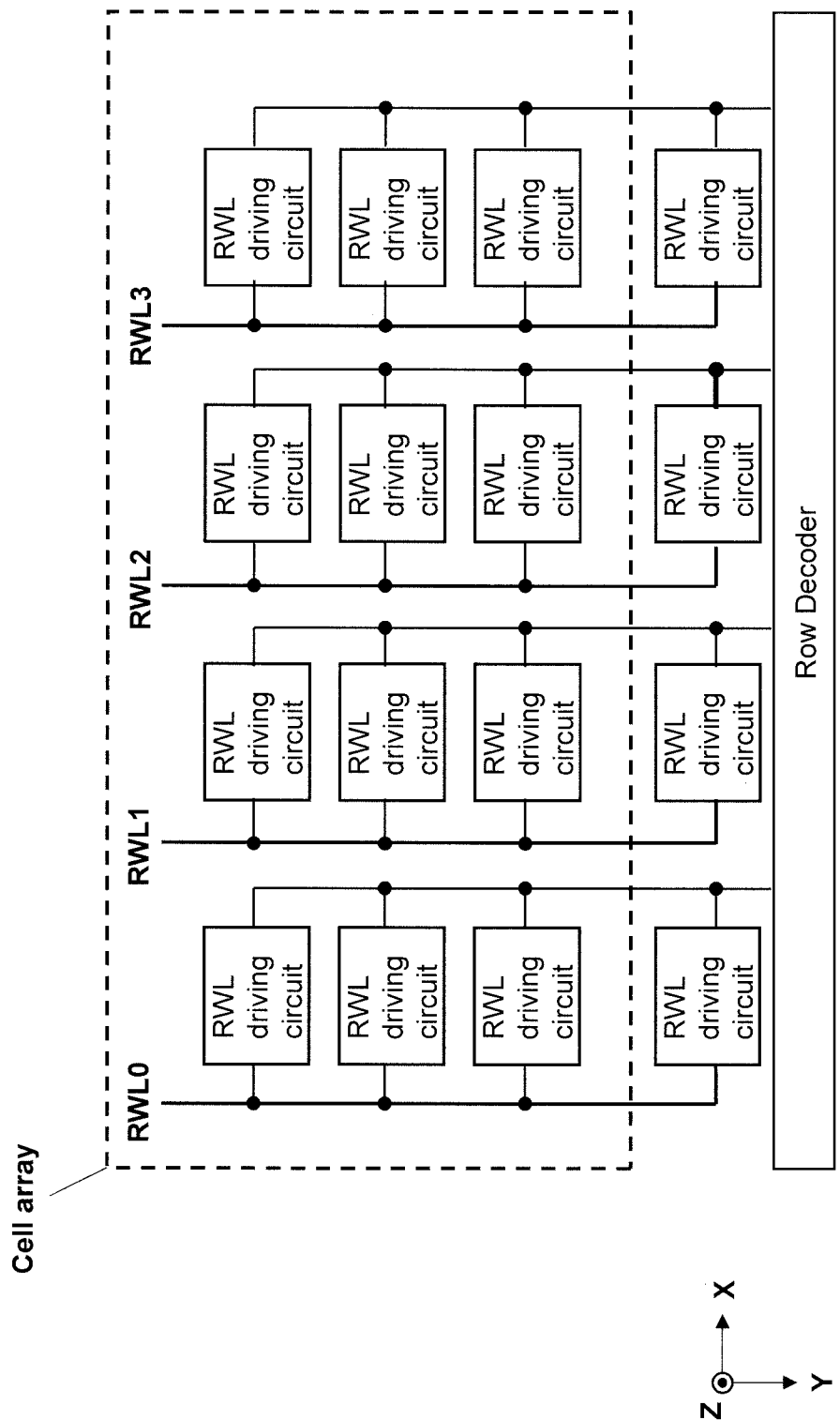
FIG. 76 is a diagram showing an another example of a connection structure between a reset word line RWL and an RWL driving circuit.

FIG. 76 shows a schematic diagram according to a modified example of the connection structure between the RWL driving circuit and the respective reset word line RWL (RWL0, RWL1, RWL2 and RWL3). Most of the RWL driving circuit are distributed in a matrix below the cell array, and the respective reset word lines RWL (RWL0, RWL1, RWL2 and RWL3) are arranged in the column direction (Y-direction). In addition, some of the RWL driving circuit are arranged in an off region of the cell array in a plan view rather than just below the cell array. The plurality of RWL driving circuit in the column direction (Y-direction) are driven by the same reset word line enable signal line RWLEN. The reset word line enable signal line RWLEN is selected and driven by the Row Decoder. In this manner, a large number of the RWL circuit are distributed under the cell array and outside the cell array to allow the reset word line RWL to fall at high speed.

Figure 77:
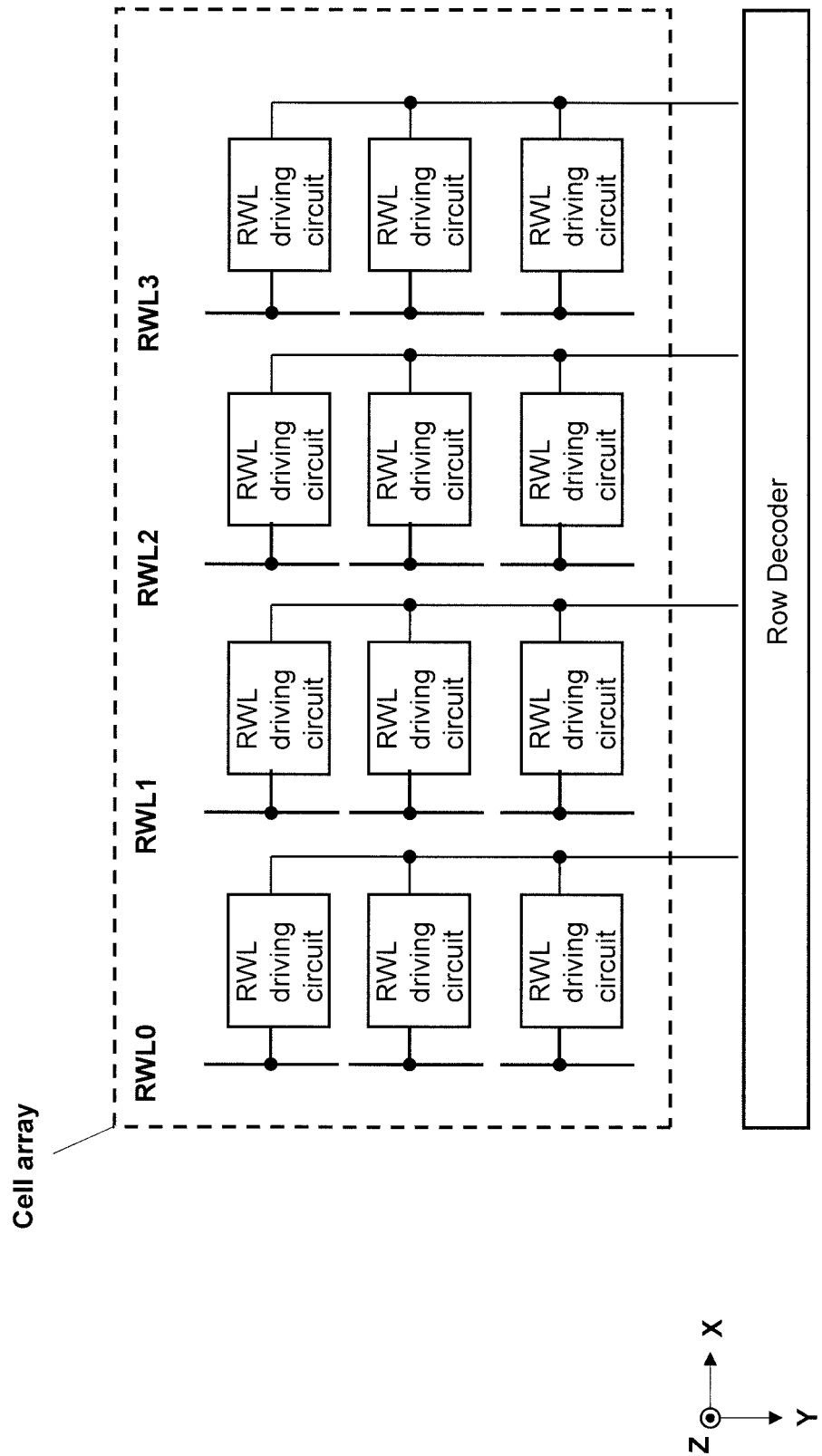
FIG. 77 is a diagram showing an another example of a connection structure between a reset word line RWL and an RWL driving circuit.

FIG. 77 shows a schematic diagram according to a modified example of the connection structure between the RWL driving circuit and the respective reset word line RWL (RWL0, RWL1, RWL2, and RWL3). Each reset word line RWL (RWL0, RWL1, RWL2, and RWL3) is divided into sections. The sections are driven independently by the corresponding RWL driving circuit. The sections and the RWL driving circuit may not correspond one-to-one and may be one-to-many. In this way, as compared with the case of driving one reset word line RWL at a plurality of locations as shown in FIG. 75, there is an advantage of eliminating the through current due to a shift in the operation timing between the driving circuits.

<2-3-4> Circuitry Configuration of RWL Driving Circuit

Figure 78:
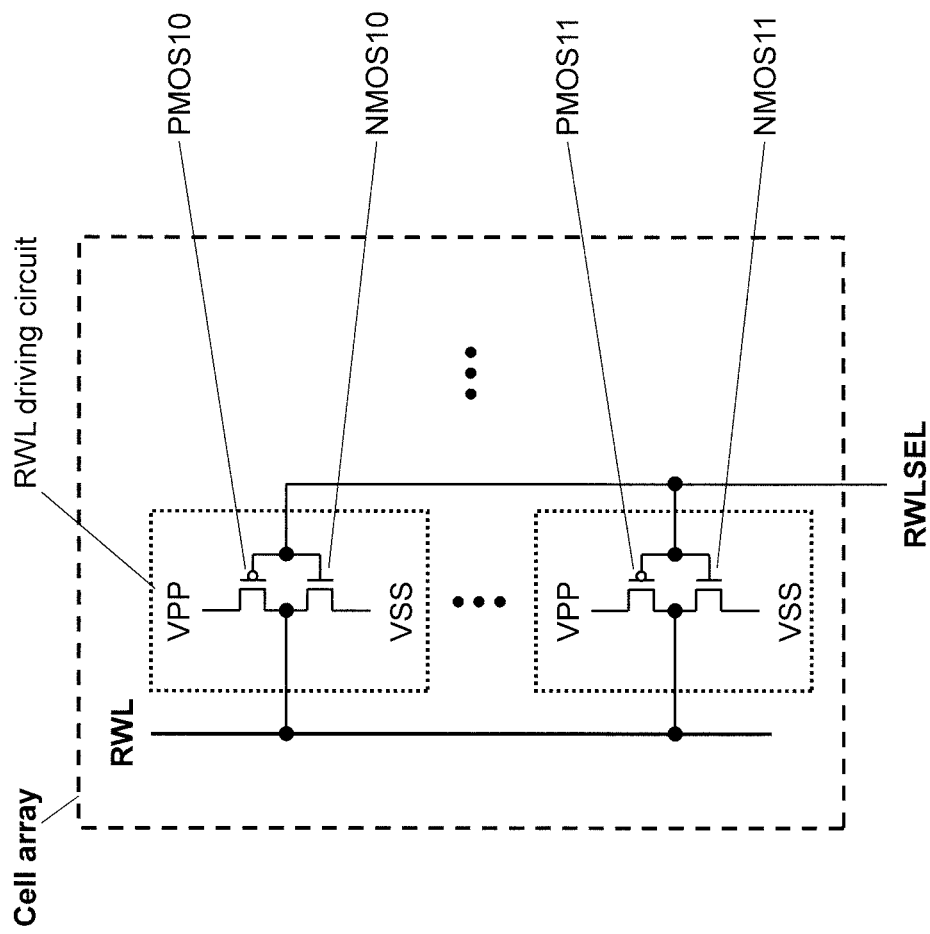
FIG. 78 is a diagram showing a circuit configuration of an RWL driving circuit.

FIG. 78 shows an example of a configuration of the RWL driving circuit. Each RWL driving circuit includes a CMOS inverter. Two RWL driving circuits are shown in FIG. 78. A PMOS10 and a NMOS10 constitute one CMOS inverter. The PMOS11 and the NMOS11 constitute another CMOS inverter. Each CMOS inverter is commonly controlled by the reset word line select signal line RWLSEL to drive the reset word line RWL commonly.

Figure 79:
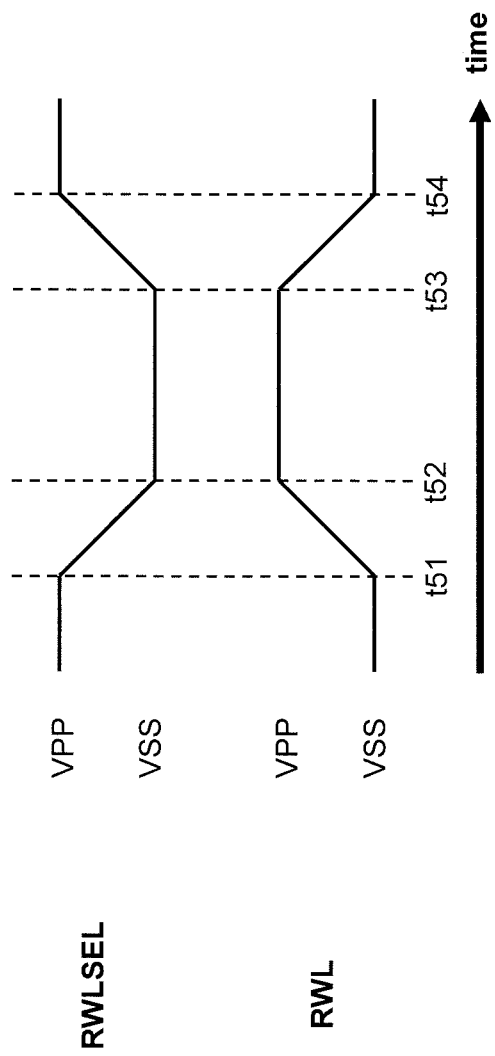
FIG. 79 is a waveform diagram showing voltages applied to a reset word line enable signal line RWLEL and a reset word line RWL.

FIG. 79 is a waveform diagram showing voltages applied to the reset word line select signal line RWLSEL and the reset word line RWL when driving the reset word line RWL. From time t51 to time t52, the reset word line select signal line RWLSEL falls from VPP to VSS. As a result, the reset word line RWL rises from VSS to VPP. From time t53 to time t54, the reset word line select signal line RWLSEL rises from VSS to VPP. As a result, the reset word line RWL falls from VPP to VSS. In this way, it is possible to drive the reset word line RWL.

Figure 80:
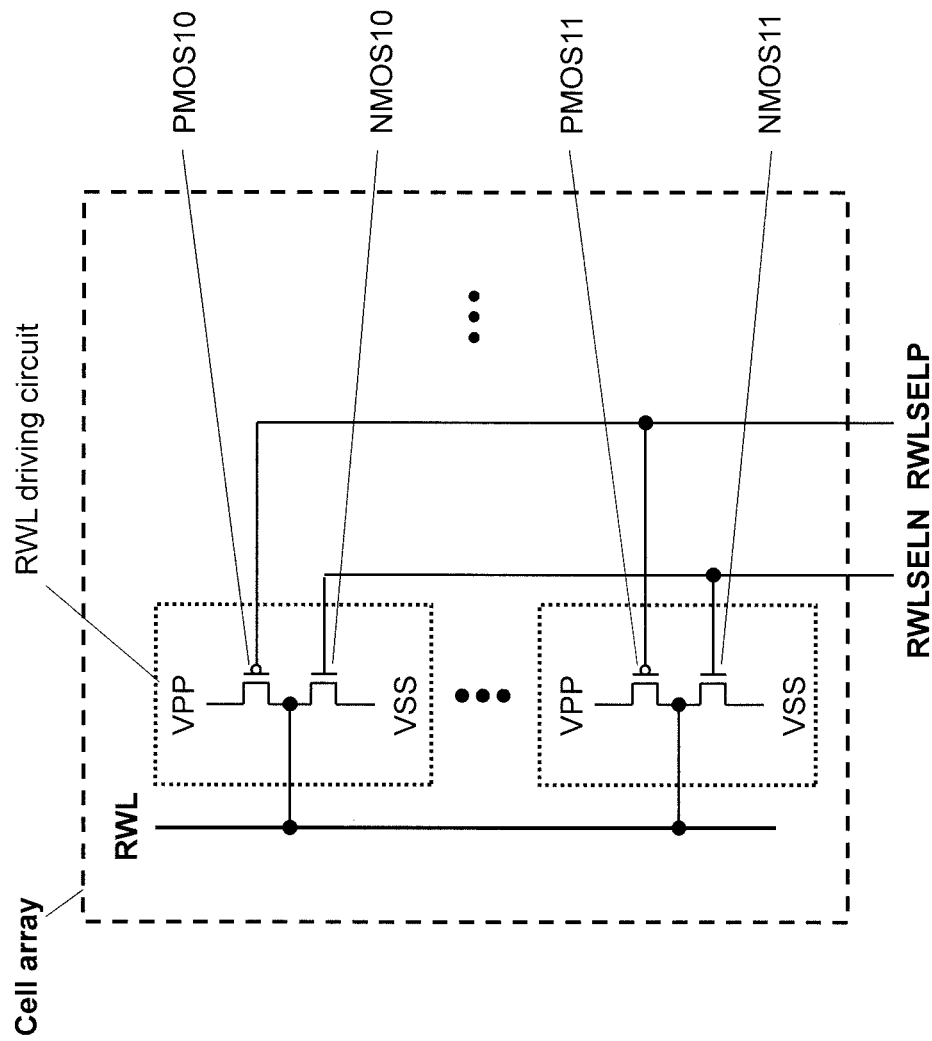
FIG. 80 is another diagram showing a circuit configuration of an RWL driving circuit.

FIG. 80 shows another example of a configuration of the RWL driving circuit. Each RWL driving circuit includes the PMOS and the NMOS which are individually controlled. Two RWL driving circuits are shown in FIG. 80. The PMOS10 and the NMOS10 constitute one RWL driving circuit. The PMOS11 and the NMOS11 constitute another RWL driving circuit. The PMOS of each of the RWL driving circuit is commonly controlled by a reset word line P selecting signal line RWLSELP, and the NMOS of each of the RWL driving circuit is commonly controlled by a reset word line N selecting signal line RWLSELN. These RWL driving circuits drive the resetting word lines RWL in common.

Figure 81:
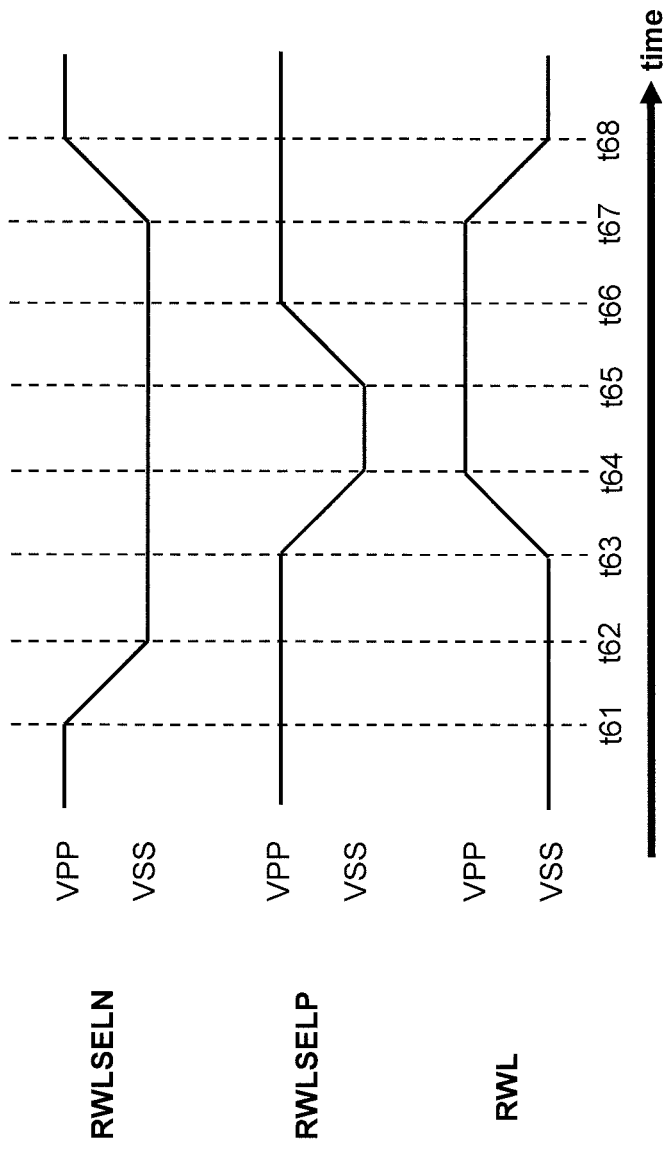
FIG. 81 is a waveform diagram showing voltages applied to a reset word line P select signal line RWLSELP, a reset word line N select signal line RWLSELN, and a reset word line RWL.

FIG. 81 is a waveform diagram showing the voltages applied to the reset word line P selecting signal line RWLSELP, the reset word line N selecting signal line RWLSELN, and the reset word line RWL when driving the reset word line RWL.

From time t61 to time t62, the reset word line N selecting signal line RWLSELN falls from VPP to VSS. As a result, the reset word line RWL is floating, and VSS, which is the voltage immediately before that, is maintained. Subsequently, from time t63 to time t64, the reset word line P selecting signal line RWLSELP falls from VPP to VSS. As a result, the reset word line RWL rises from VSS to VPP. Subsequently, from time t65 to time t66, the reset word line P selecting signal line RWLSELP rises from VSS to VPP. As a result, the reset word line RWL is floating, and VPP, which is the voltage immediately before that, is maintained. Subsequently, from time t67 to time t68, the reset word line N selecting signal line RWLSELN rises from VSS to VPP. As a result, the reset word line RWL falls from VPP to VSS.

Thus, the circuit of FIG. 81, although through the floating state during its operation, at the time of the rising or falling of the reset word line RWL, it is possible to eliminate the through current due to a shift in the operation timing between the driving circuits.

Figure 82:
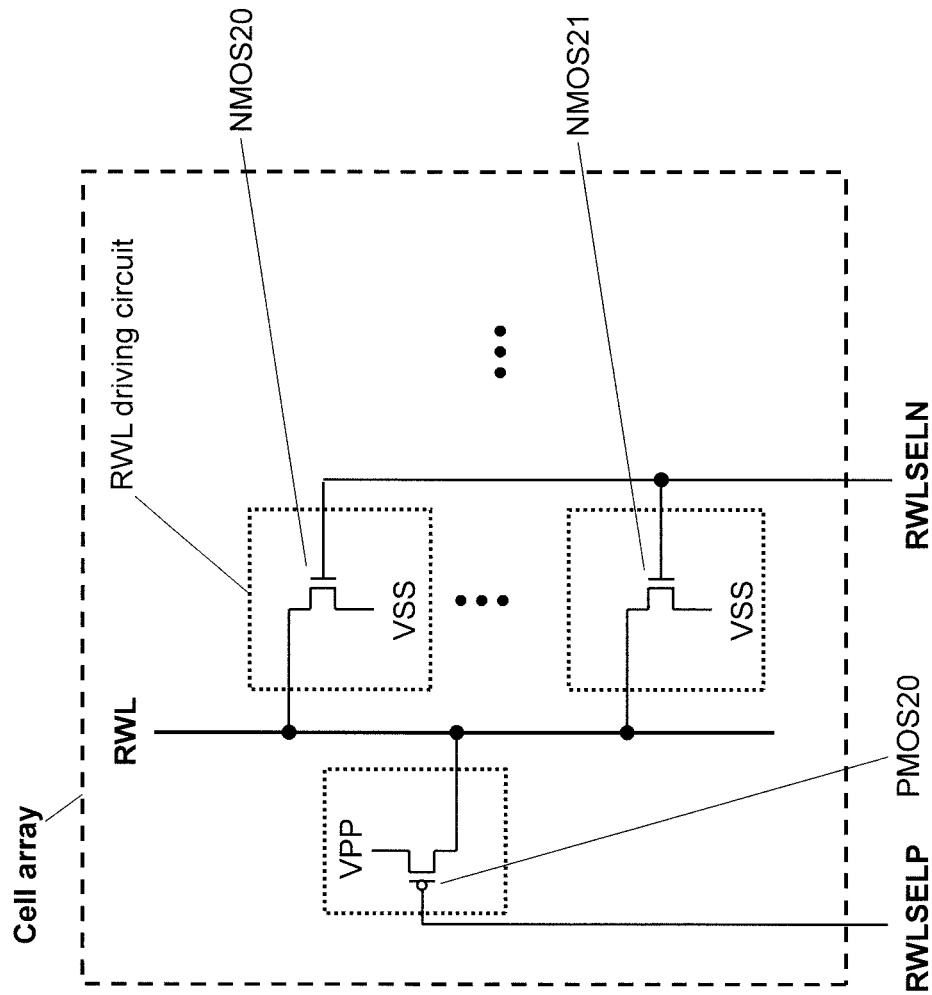
FIG. 82 is another diagram showing a circuit configuration of an RWL driving circuit.

FIG. 82 shows still another example of a configuration of the RWL driving circuit. Each of the RWL driving circuit includes a single NMOS (NMOS20, NMOS21 . . . ). In addition, a single PMOS (PMOS20) is commonly connected to the reset word line RWL. The PMOS20 is controlled by the reset word line P selecting signal line RWLSELP, and the NMOS20, NMOS21 or the like are commonly controlled by the reset word line N selecting signal line RWLSELN. These RWL driving circuits drive the reset word line RWL in common.

Figure 83:
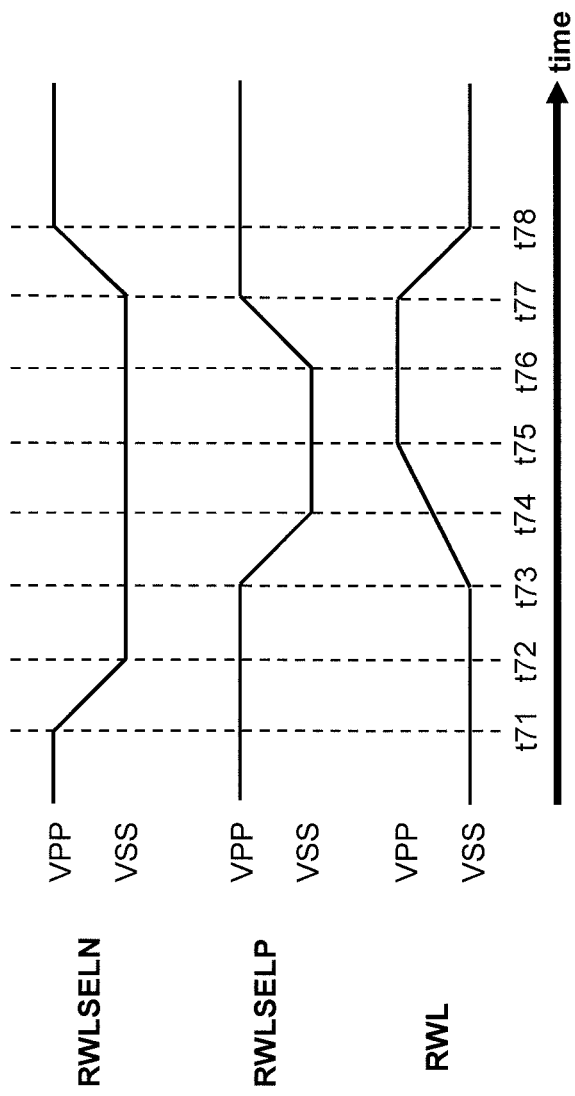
FIG. 83 is a waveform diagram showing voltages applied to a reset word line P select signal line RWLSELP, a reset word line N select signal line RWLSELN, and a reset word line RWL.

FIG. 83 is a waveform diagram showing the voltages applied to the reset word line P selecting signal line RWLSELP, the reset word line N selecting signal line RWLSELN, and the reset word line RWL when driving the reset word line RWL.

From time t71 to time t72, the reset word line N selecting signal line RWLSELN falls from VPP to VSS. As a result, the reset word line RWL is floating, and VSS, which is the voltage immediately before that, is maintained. Subsequently, from time t73 to time t74, the reset word line P selecting signal line RWLSELP falls from VPP to VSS. As a result, the reset word line RWL rises from VSS to VPP. Since the number of PMOS is small compared to NMOS and the driving capability is relatively small, the reset word line RWL does not rise so quickly from VSS to VPP. The reset word line RWL becomes VPP gradually at time t75. Subsequently, from time t76 to time t77, the reset word line P selecting signal line RWLSELP rises from VSS to VPP. As a result, the reset word line RWL is floating, and VPP, which is the voltage immediately before that, is maintained. Subsequently, at time t77 to time t78, the reset word line N selecting signal line RWLSELN rises from VSS to VPP. As a result, the reset word line RWL quickly falls from VPP to VSS.

Thus, the circuit of FIG. 82 is not so fast the rise of the reset word line RWL, but its fall is rapid. In order to improve the write characteristics of the memory cell, it is sufficient if the falling edge is fast. Since the number of PMOS is smaller than that of NMOS, a large number of NMOS can be arranged directly under the memory cell array 11 with high area efficiency.

<2-3-5> Modified Example with Source Side Selecting Gate Transistor ST2

The configuration of the modified example with a source side selecting gate transistor ST2 is shown using FIGS. 84 to 90. In this modified example, the selecting gate transistor ST may be referred to as a "drain side selecting gate transistor ST1" corresponding to the source side selecting gate transistor ST2. Corresponding to a source side selecting gate line SGS, the selecting gate line SG (SG0 to SG3) may be referred to as a "drain side selecting gate line SGD (SGD0 to SGD3)".

Figure 84:
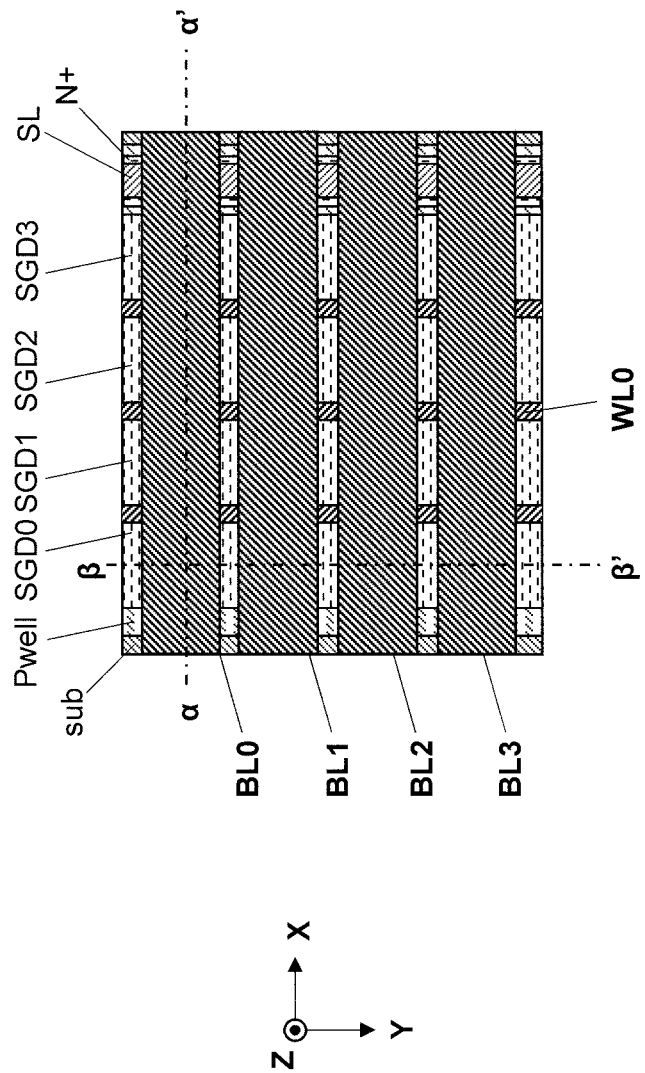
FIG. 84 is a plan view showing a modified example with a source side selecting gate transistor ST2.
Figure 85:
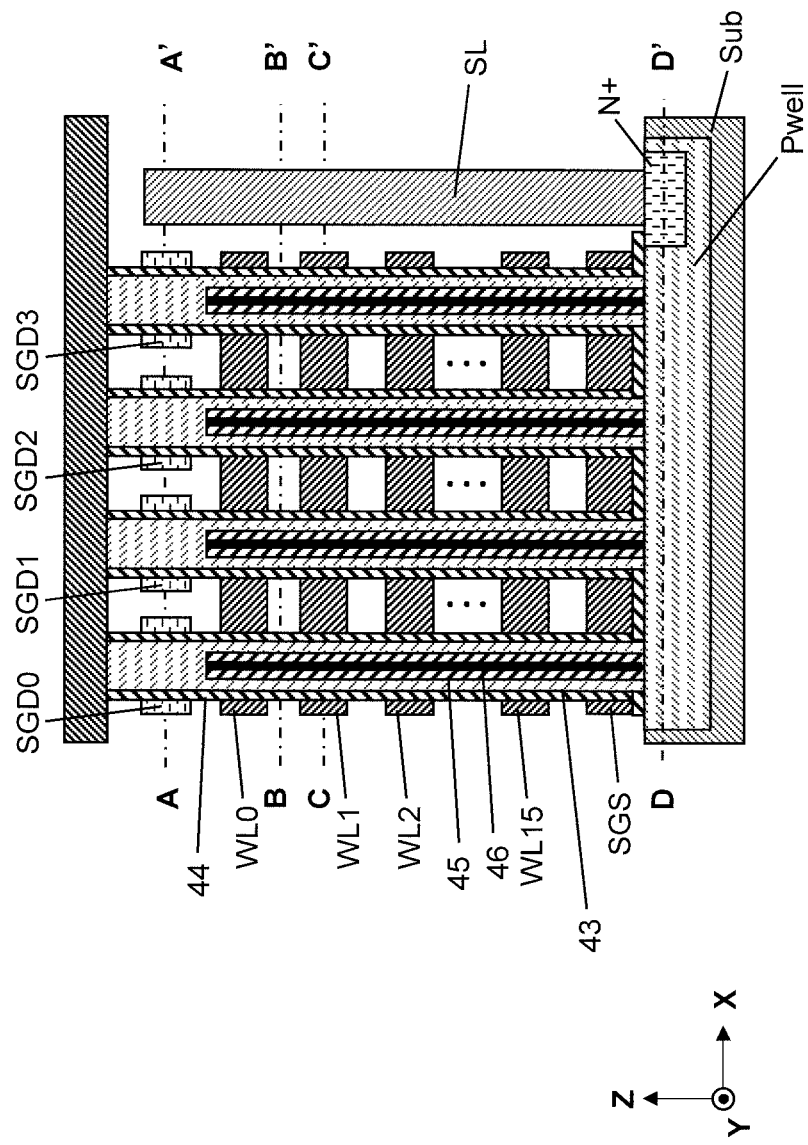
FIG. 85 is a cross-sectional view along α-α' line of FIG. 84.
Figure 86:
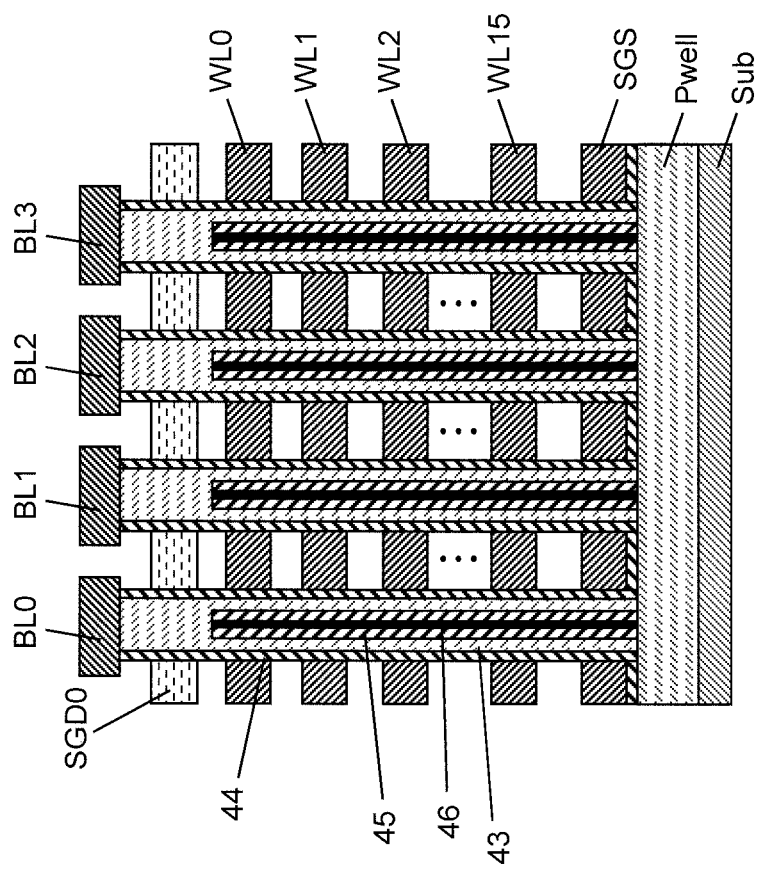
FIG. 86 is a cross-sectional view along β-β' line of FIG. 84.

The memory cell array 11 according to the present modified example includes the source side selecting gate line SGS connected in series with the memory string MS. The source side selecting gate transistor ST2 formed by the source side selecting gate line SGS is arranged below the memory string MS. FIG. 84 shows an example of a plan view seen from above in the Z-direction of the memory cell array 11 according to the modified example. FIG. 85 shows an example of a cross-sectional view (cross-sectional view along α-α' line in FIG. 84) seen from the Y-direction of the memory cell array 11. FIG. 86 shows an example of a cross-sectional view (cross-sectional view along β-β' line in FIG. 84) seen from the X-direction of the memory cell array 11.

Figure 87:
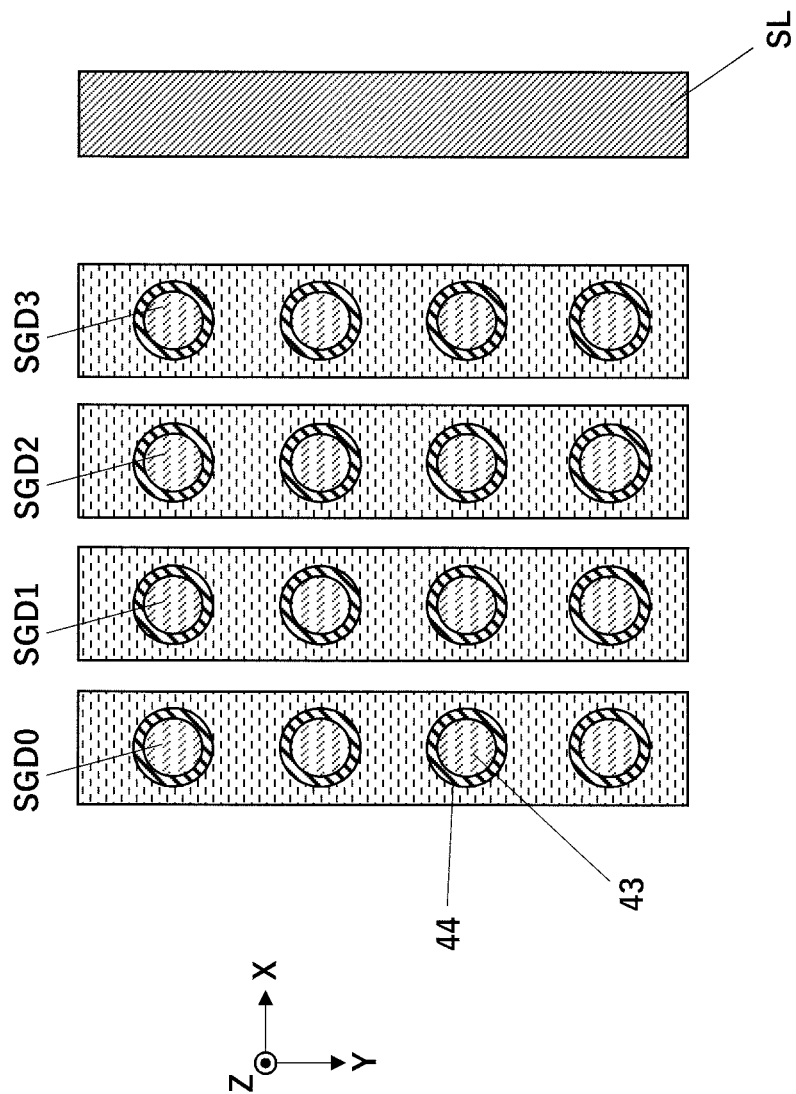
FIG. 87 is a cross-sectional view along A-A' of FIG. 85.
Figure 88:
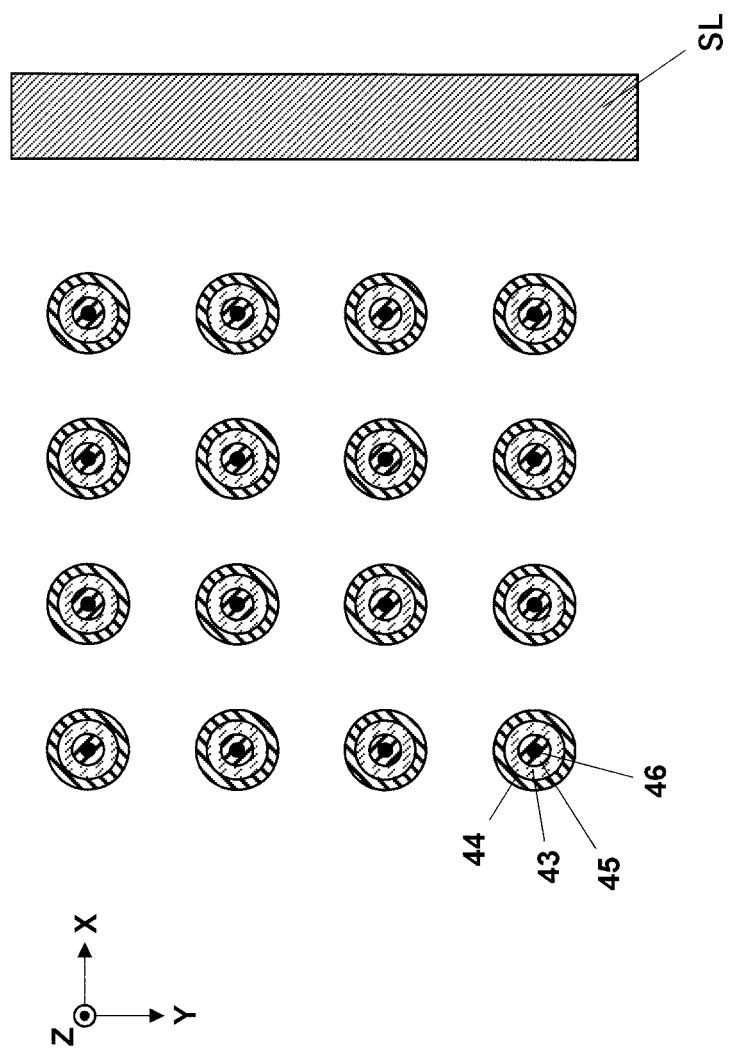
FIG. 88 is a cross-sectional view along B-B' line of FIG. 85.
Figure 89:
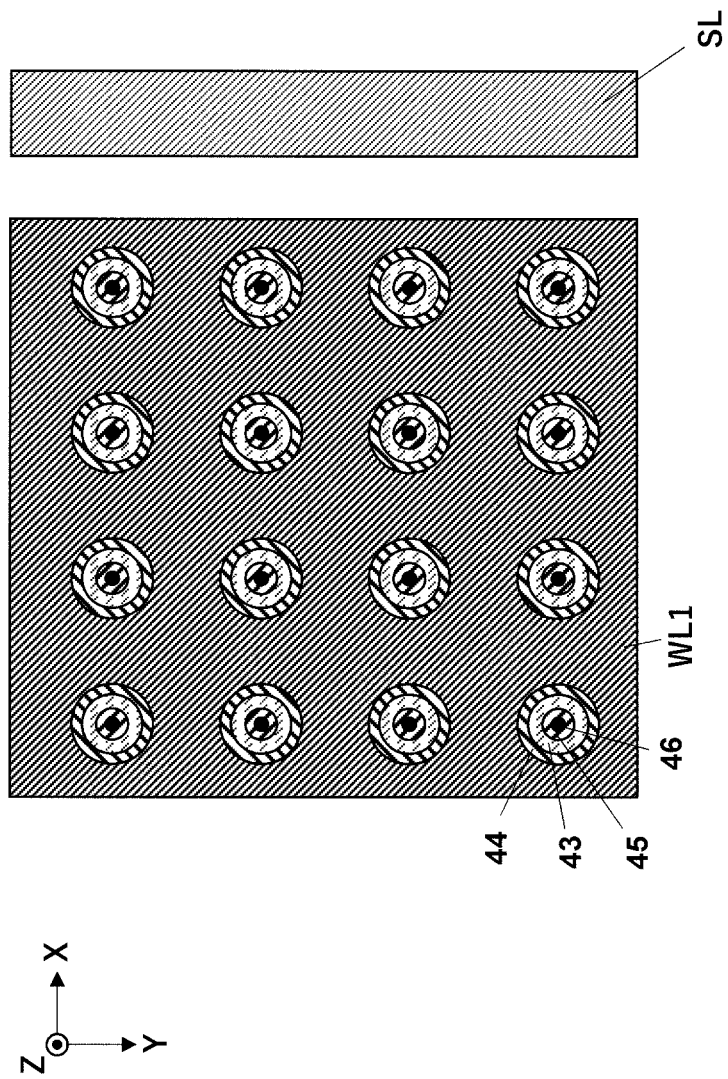
FIG. 89 is a cross-sectional view along C-C' of FIG. 85.
Figure 90:
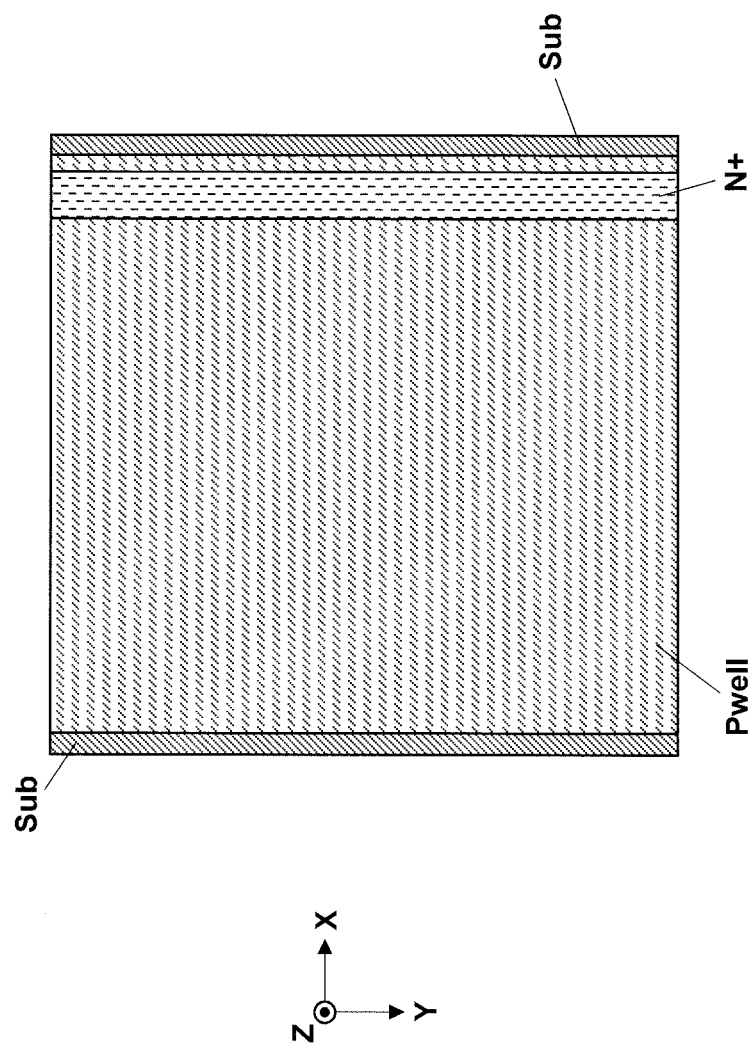
FIG. 90 is a cross-sectional view along D-D' line of FIG. 85.

FIGS. 87 to 90 show an example of a cross-sectional view in the X-Y plane seen from the Z-direction of the memory cell array 11. FIG. 87 is a cross-sectional view along A-A' in FIG. 85, FIG. 88 is a cross-sectional view along B-B' in FIG. 85, FIG. 89 is a cross-sectional view along C-C' in FIG. 85, FIG. 90 is a cross-sectional view along D-D' in FIG. 85.

As shown in FIGS. 84 to 90, in the memory cell array 11, the bit lines BL0 to BL3 extending in the X-direction are arranged in parallel at the top portion in the Z-direction. Below the bit lines BL0 to BL3, there are the drain side selecting gate lines SGD0 to SGD3 extending in the Y-direction in parallel. The drain side selecting gate lines SGD0 to SGD3 are insulated from the bit lines BL0 to BL3. Below the drain side selecting gate lines SGD0 to SGD3, the word lines WL0 to WL15 are arranged in the X-Y plane, respectively. The word lines WL0 to WL15 are insulated from each other and from the drain side selecting gate lines SGD0 to SGD3. Below the word line WL15, the source side selecting gate line SGS is arranged in the X-Y plane. The source side selecting gate line SGS is, for example, formed by a conductor such as tungsten. The source side selecting gate line SGS is insulated from the word line WL15. Below the source side selecting gate line SGS, the p-type well Pwell formed in the n-type region of the semiconductor substrate Sub (the semiconductor substrate Sub may be the n-type, or may be the n-type region arranged in a part of the semiconductor substrate Sub), is arranged. The gate insulating film 44 is arranged between the source side selecting gate line SGS and the p-type well Pwell. In this p-type well Pwell, the high concentration of n-type region N+ is formed which extends in the Y-direction. On the n-type region N+, the source line SL extending in the Y-Z plane are arranged and electrically connected. The source line SL is insulated from the source side selecting gate line SGS, the word lines WL0 to WL15, and the drain side selecting gate lines SGD0 to SGD3.

As shown in FIGS. 85 to 90, the cylindrical memory pillar MP extending in the Z-direction is arranged through openings formed in the drain side selecting gate lines SGD0 to SGD3, the word lines WL0 to WL15, and the source side selecting gate line SGS. The cylindrical memory pillar MP includes the cylindrical hollow gate insulating film 44 and the semiconductor pillar 43 therein from the outside. The bottom of the memory pillar MP reaches to the p-type well Pwell and is electrically connected thereto.

In the part of the memory pillar MP surrounded by the word lines WL0 to WL15, the source side selecting gate line SGS and the insulating film in the vicinity of the word lines WL0 to WL15 and the source side selecting gate line SGS is the cylindrical semiconductor pillar 43, the semiconductor pillar 43 has a cylindrical hollow shape. The portion of the memory pillar MP includes the cylindrical hollow variable resistance layer 45 and the cylindrical core member 46 inside the cylindrical hollow shape semiconductor pillar 43. The cylindrical hollow shaped variable resistance layer 45 covers the side (outer periphery) of the core member 46. The inside of the cylindrical hollow shape semiconductor pillar 43 is in contact with the core member 46. The bottom of the variable resistance layer 45 is in contact with the p-type well Pwell.

The cylindrical hollow (cylindrical shape in the portion surrounded by the drain side the selecting gate lines SG0 to SG3) semiconductor pillar 43 covers the side (outer periphery) of the variable resistance layer 45. The inside of the semiconductor pillar 43 is in contact with the variable resistance layer 45. The bottom of the semiconductor pillar 43 contacts the p-type well Pwell.

<2-3-6> Circuit Diagram of Memory Block

Figure 91:
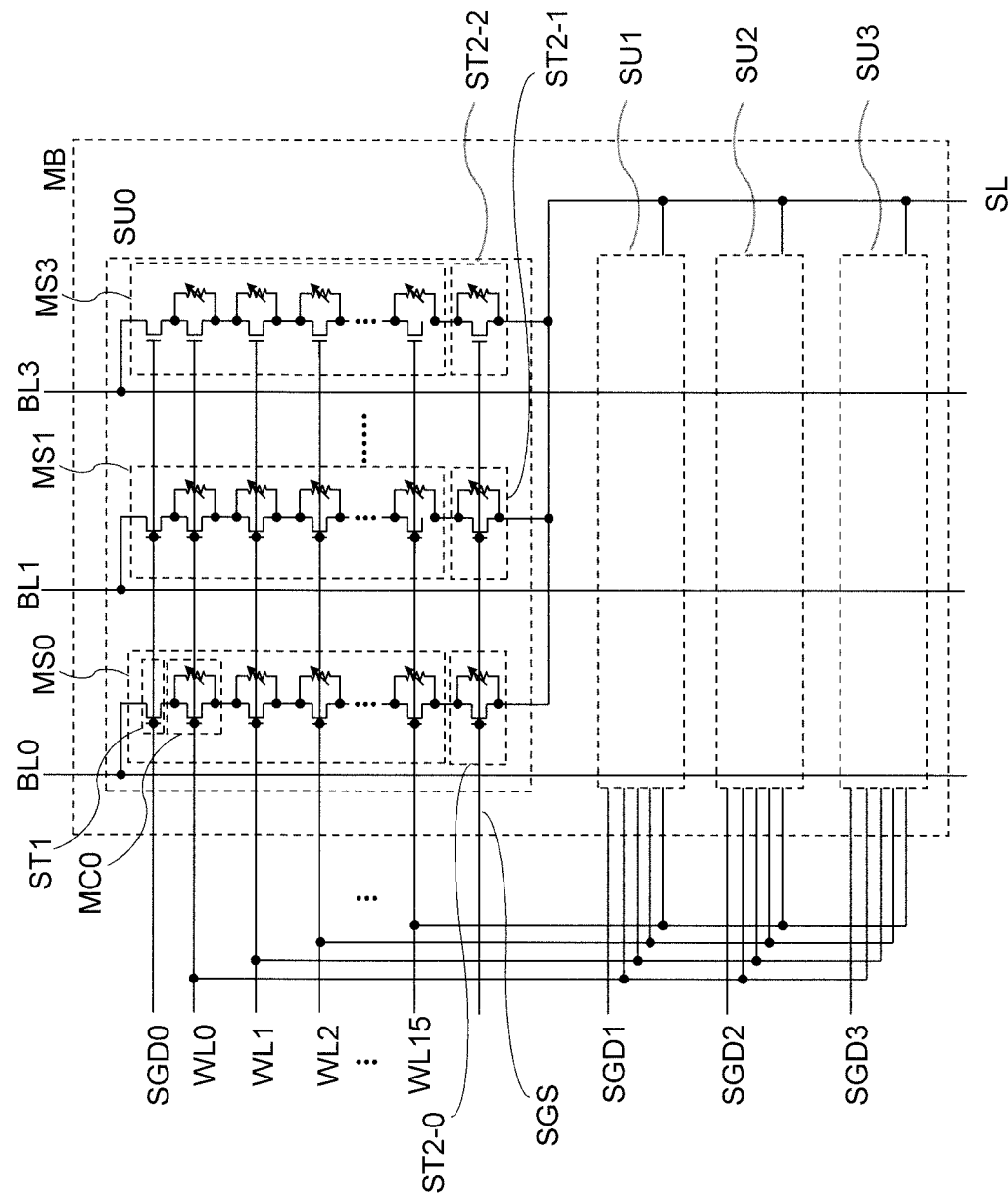
FIG. 91 is a circuit diagram of a memory block.

FIG. 91 is a circuit diagram of the memory block MB. The memory block MB includes the string unit SU0 to which the drain side selecting gate line SGD0 is connected, the string unit SU1 to which the drain side selecting gate line SGD1 is connected, the string unit SU2 to which the drain side selecting gate line SGD2 is connected, and the string unit SU3 to which the drain side selecting gate line SGD3 is connected.

Each of the string unit SU (SU0 to SU3) includes the memory string MS0 and a source side selecting gate transistor ST2_0 connected between the bit line BL0 and the source line SL, the memory string MS1 and a source side selecting gate transistor 2_1 connected between the bit line BL1 and the source line SL, and the memory string MS3 and a source side selecting gate transistor ST2_3 connected between the bit line BL3 and the source line SL.

In the memory string MS (MS0 to MS3), the drain side selecting gate transistor ST1, the memory cell MC0, the memory cell MC1, . . . the memory cell MC15 are connected in series from the side close to the bit line BL (BL0 to BL3). Note that the number of memory cell MC included in each of the memory cell string MS does not need to be 16, and may be 8, 32, 48, 64, 96, 128, or the like, and the number thereof is not limited.

In FIG. 85, the part of the first memory pillar (the gate insulating film 44, the semiconductor pillar 43, the variable resistance layer 45, and the core member 46) surrounded by the source side selecting gate line SGS corresponds to the source side selecting gate transistor ST2. The source side selecting gate transistor ST2 is driven by a voltage applied to the source side selecting gate line SGS. That is, in the source side selecting gate transistor ST2, the conductivity of the portion of the semiconductor pillar 43 is changed in accordance with the voltage applied to the source side selecting gate line SGS. The source side selecting gate transistor ST2 is capable of controlling the conductivity of the variable resistance layer 45. Resistance of the source side selecting gate transistor ST2 in Z-direction is a combined resistance in which the resistance of the semiconductor pillar 43 portion and the resistance of the variable resistance layer 45 portion are connected in parallel.

<2-3-7> Modified Example of a Method of Selecting the Memory Cell

Referring to FIGS. 92 to 95, a modified example of the method of selecting the memory cell including the source side selecting gate line SGS will be described. In this modified example, the OFF voltage is supplied to all the word line WL, the drain side selecting gate line SGD, and the source side selecting gate line SGS in the non-selected memory block MB.

Figure 92:
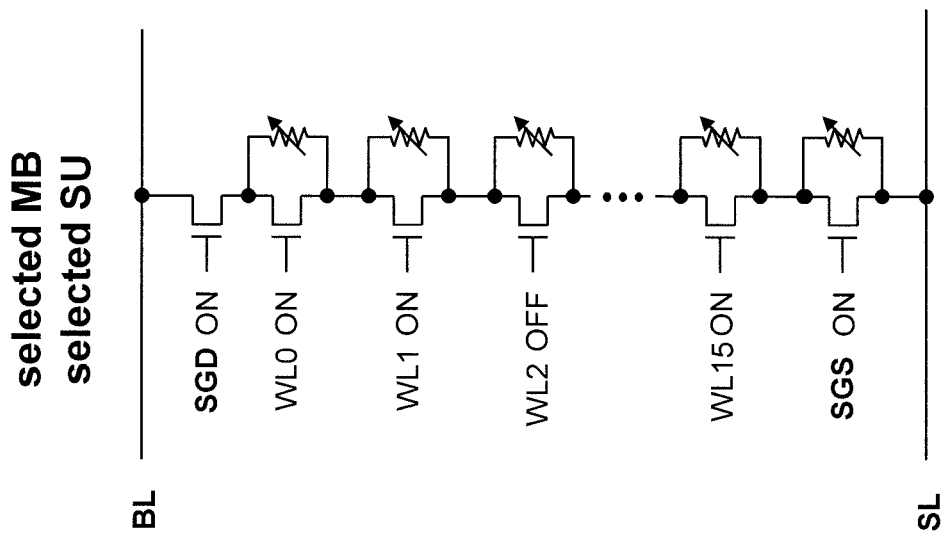
FIG. 92 is a diagram showing a modified example of selected state of a memory cell.

As shown in FIG. 92, in the selected string unit SU of the selected memory block MB, the drain side selecting gate line SGD is supplied with the ON voltage enough to conduct the selected gate transistor (sufficient carriers are induced in the region of the semiconductor pillar 43 to reduce the resistance). When selecting the memory cell MC connected to the word line WL2, the word line WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (the resistance becomes large without inducing sufficient carriers to the region of the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read. The source side selecting gate line SGS is supplied with the ON voltage enough to conduct the source side selecting gate transistor ST2 (sufficient carriers are induced in the region of the semiconductor pillar 43 to reduce the resistance).

Figure 93:
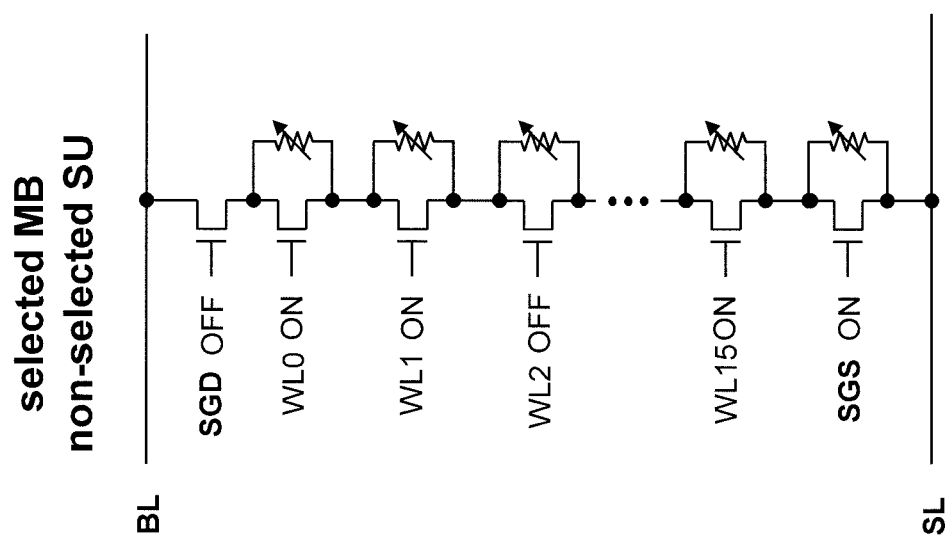
FIG. 93 is a diagram showing a modified example of non-selected state of a memory cell.

As shown in FIG. 93, in the non-selected string unit SU of the selected memory block MB, the drain side selecting gate line SGD is supplied with the OFF voltage that is insufficient to conduct the selecting gate transistor. As a result, no current flows through the string unit SU even if the ON voltage is supplied to the word lines WL0, WL1, WL3 to WL15, and the source side selecting gate line SGS.

Figure 94:
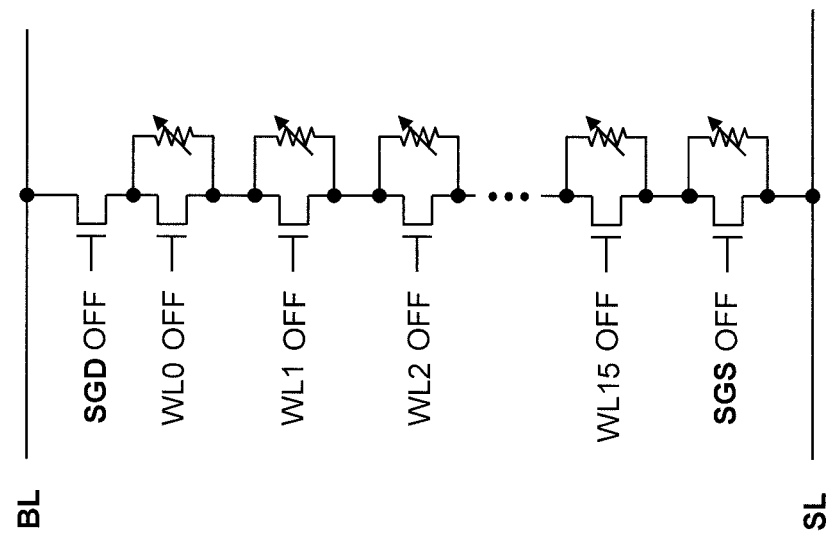
FIG. 94 is a diagram showing a modified example of non-selected state of a memory cell.

As shown in FIG. 94, in the non-selected memory block MB, the OFF voltage is supplied to the drain side selecting gate line SGD, the word lines WL0 to WL15, and the source side selecting gate line SGS. As a result, no current flows through the string unit SU.

<2-3-8> Modified Example of a Method of Selecting the Memory Cell

Figure 95:
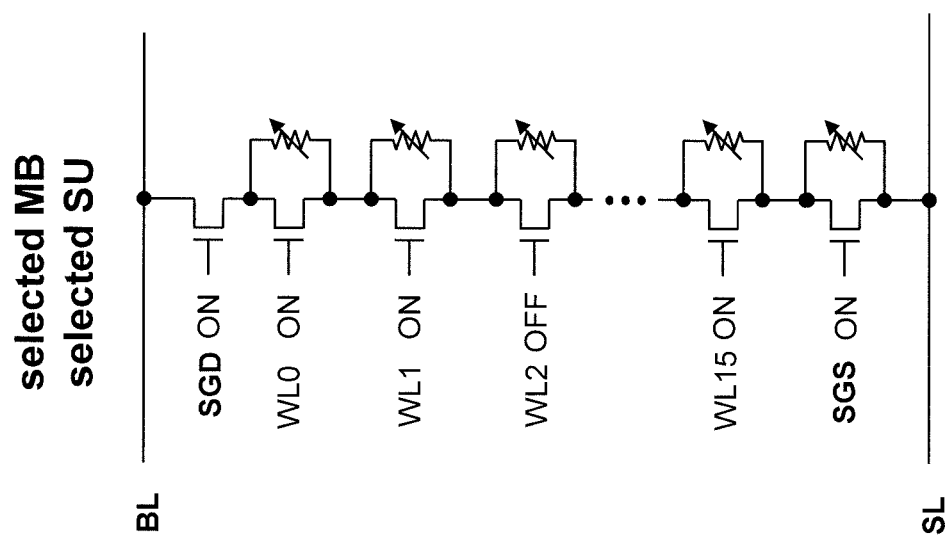
FIG. 95 is a diagram showing a modified example of selected state of a memory cell.
Figure 96:
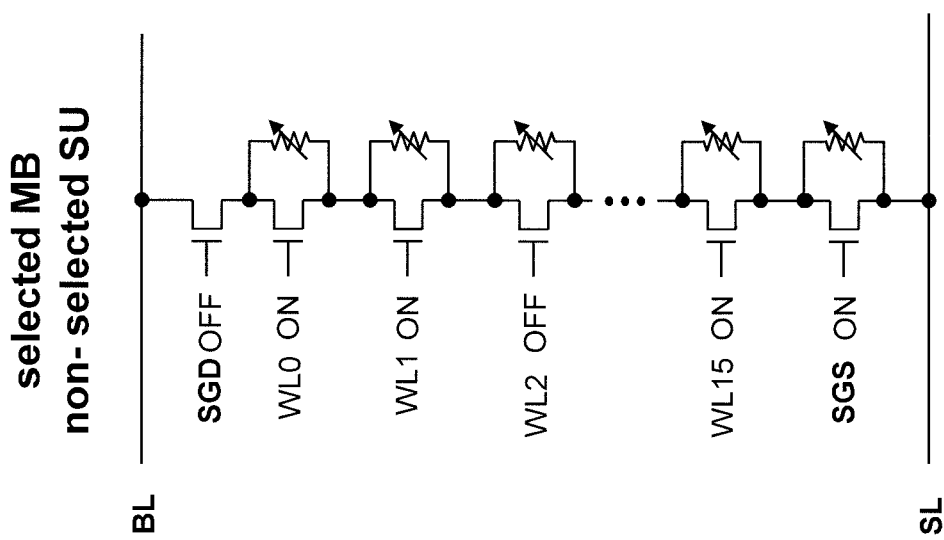
FIG. 96 is a diagram showing a modified example of non-selected state of a memory cell.
Figure 97:
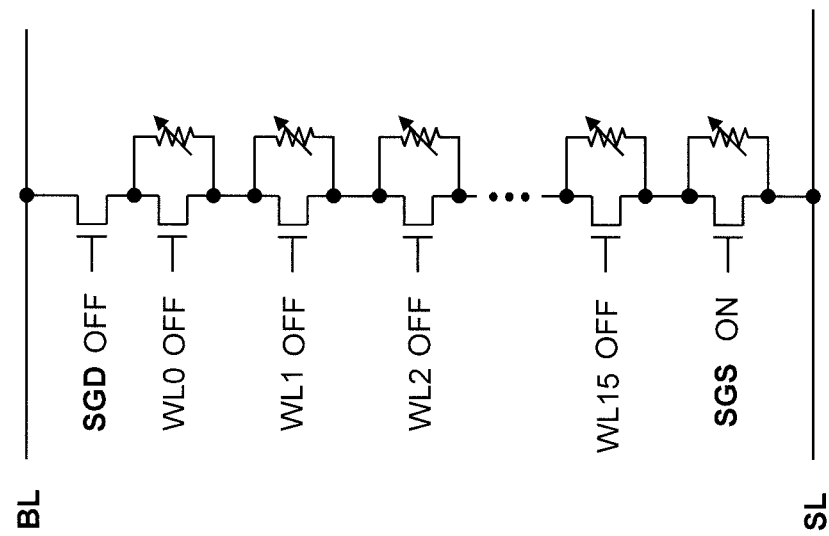
FIG. 97 is a diagram showing a modified example of non-selected state of a memory cell.

Referring to FIGS. 95 to 97, a modified example of the method of selecting the memory cell including the source side selecting gate line SGS will be described. In the present modified example, the source side selecting gate line SGS is supplied with the ON voltage at all times.

As shown in FIG. 95, in the selected string unit SU of the selected memory block MB, the drain side selecting gate line SGD is supplied with the ON voltage enough to conduct the selected gate transistor (sufficient carriers are induced in the region of the semiconductor pillar 43 to reduce the resistance). When selecting the memory cell MC connected to the word line WL2, the word line WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (the resistance becomes large without inducing sufficient carriers to the region of the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read. The source side selecting gate line SGS is supplied with the ON voltage enough to conduct the source side selecting gate transistor ST2 (sufficient carriers are induced in the region of the semiconductor pillar 43 to reduce the resistance).

As shown in FIG. 96, in the non-selected string unit SU of the selected memory block MB, the drain side selecting gate line SGD is supplied with the OFF voltage that is insufficient to conduct the selecting gate transistor. As a result, no current flows through the string unit SU even if the ON voltage is supplied to the word line WL0, WL1, WL3 to WL15 and the source side selecting gate line SGS.

As shown in FIG. 97, in the non-selected memory block MB, the OFF voltage is supplied to both the drain side selecting gate line SGD and the word lines WL0 to WL15. As a result, no current flows through this string unit SU even if the ON voltage is supplied to the source side selecting gate line SGS.

<2-3-9> Modified Example of a Method of Selecting the Memory Cell

Figure 98:
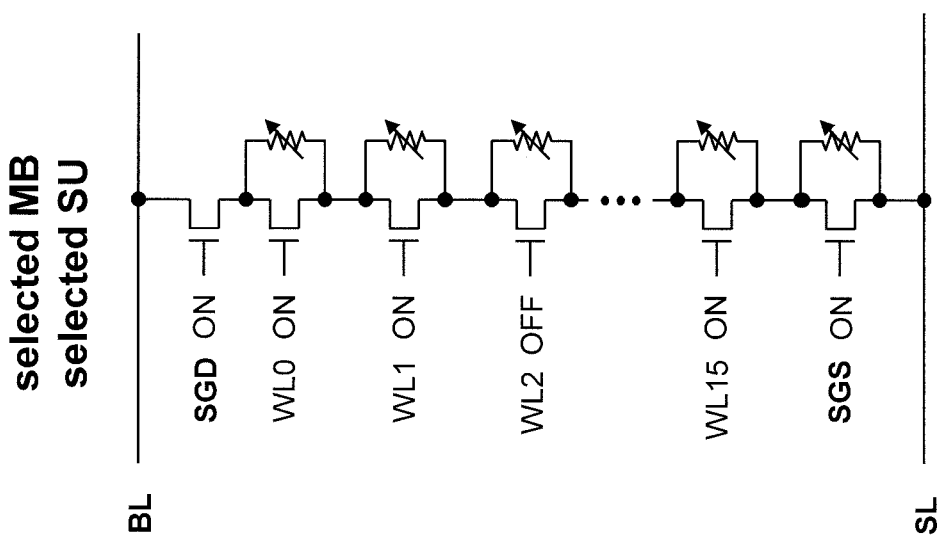
FIG. 98 is a diagram showing a modified example of selected state of a memory cell.
Figure 99:
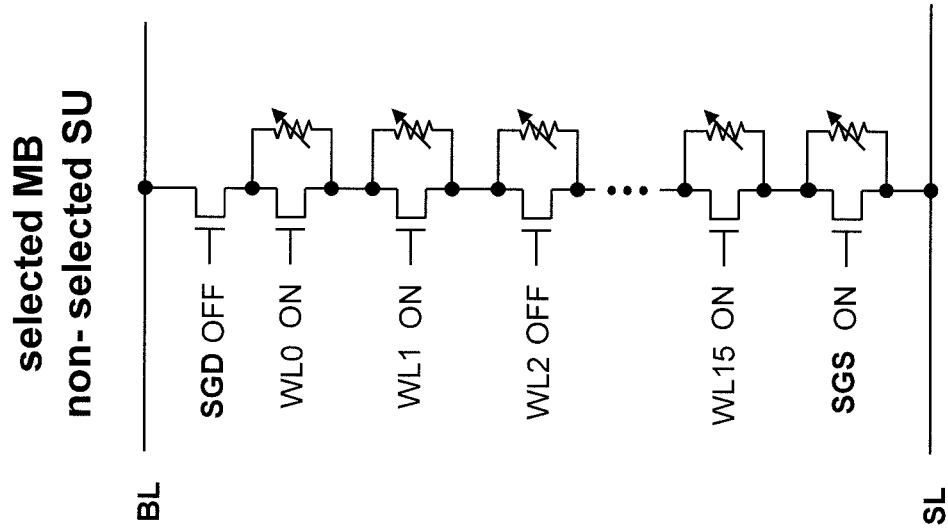
FIG. 99 is a diagram showing a modified example of non-selected state of a memory cell.
Figure 100:
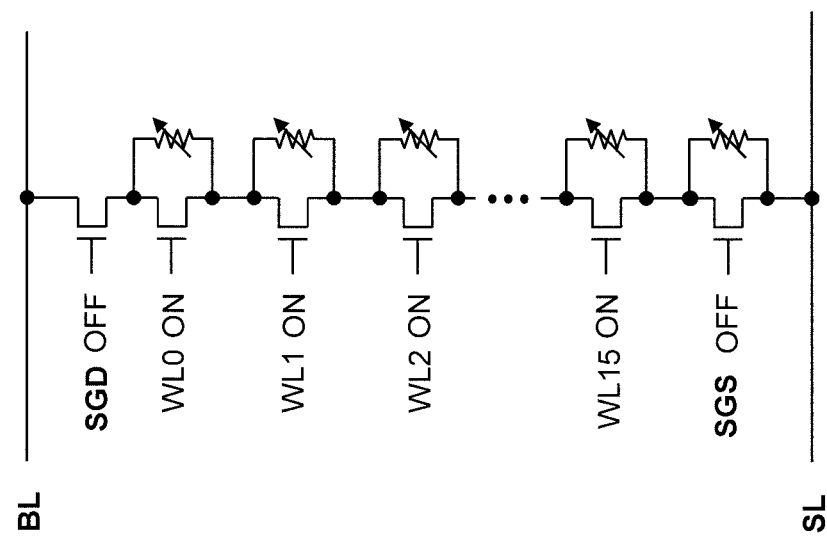
FIG. 100 is a diagram showing a modified example of non-selected state of a memory cell.

Referring to FIGS. 98 to 100, a modified example of the method of selecting the memory cell including the source side selecting gate line SGS will be described. In the present modified example, the unselected word line WL is supplied with the ON voltage at all times.

As shown in FIG. 98, in the selected string unit SU of the selected memory block MB, the selecting gate line SG is supplied with the ON voltage enough to conduct the selected gate transistor (sufficient carriers are induced in the region of the semiconductor pillar 43 to reduce the resistance). When selecting the memory cell MC connected to the word line WL2, the word lines WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (the resistance becomes large without inducing sufficient carriers to the region of the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read. The source side selecting gate line SGS is supplied with the ON voltage enough to conduct the source side selecting gate transistor ST2 (sufficient carriers are induced in region of the semiconductor pillar 43 to reduce the resistance).

As shown in FIG. 99, in the non-selected string unit SU of the selected memory block MB, the selecting gate line SG is supplied with the OFF voltage that is insufficient to conduct the selecting gate transistor. As a result, no current flows through the string unit SU even if the ON voltage is supplied to the word line WL0, WL1, WL3 to WL15 and the source side selecting gate line SGS.

As shown in FIG. 100, in the non-selected memory block MB, the drain side selecting gate line SGD is supplied with the OFF voltage. As a result, no current flows through the string unit SU even if the word lines WL0 to WL15 are supplied with the ON voltage.

<3> Other Modified Examples

Figure 101:
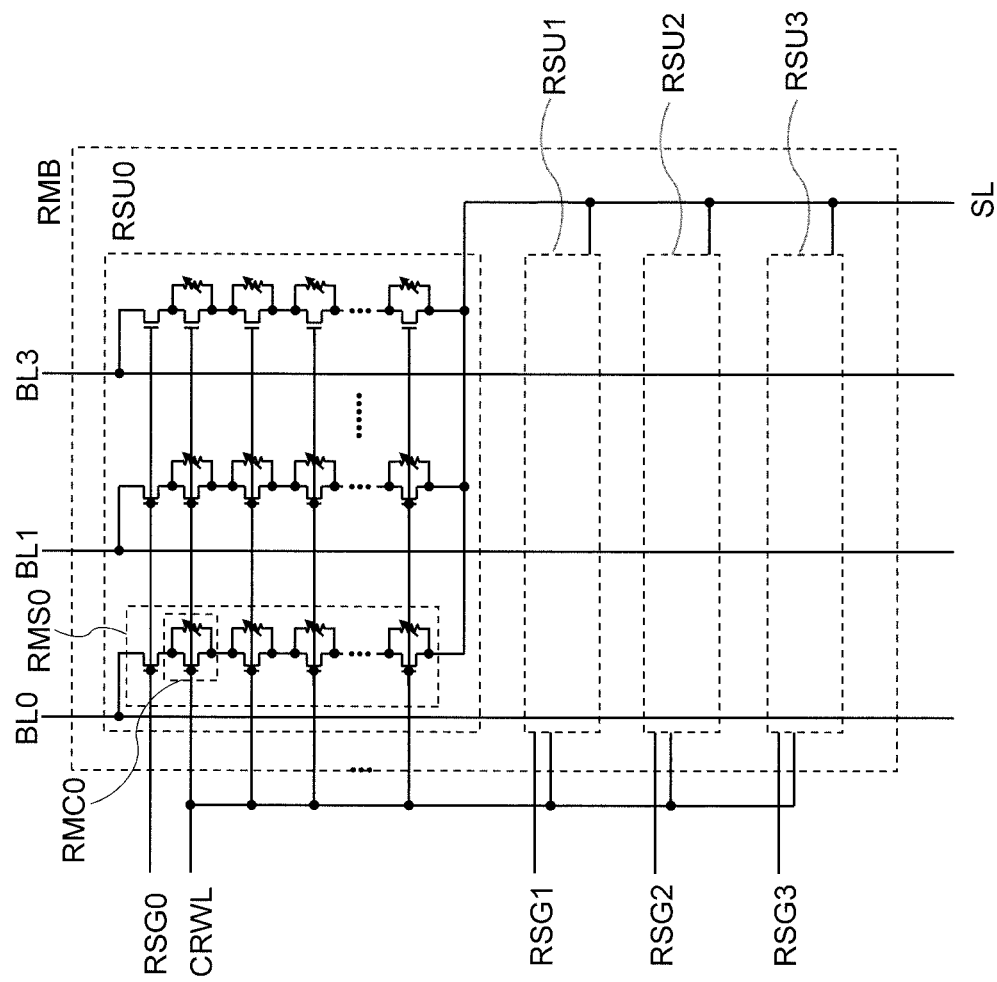
FIG. 101 is a circuit diagram of a modified example showing a connection structure between a reset word line RWL and a common reset word line CRWL.

<3-1> Modified Examples of the Connection Structure Between Each Reset Word Line RWL and Common Reset Word Line CRWL FIG. 101 is a circuit diagram showing a connection structure between each of the reset word line RWL (RWL0, RWL1, RWL2, and RWL3) and a common reset word line CRWL. In the first embodiment (FIG. 10), the reset word line RWL (RWL0 to RWL15) is electrically separated. That is, each of the reset word line RWL (RWL0 to RWL15) is connected to the corresponding reset word line RWL (upper layer) of the upper layer through the corresponding reset word line (vertical) RWL. In this modified example, the reset word line RWL (RWL0 to RWL15) is electrically connected to each other. That is, the reset word lines RWL (RWL0 to RWL15) are connected to the common reset word line (upper layer) CRWL of the upper layer through the reset word line (vertical) RWL. The common reset word line (upper layer) CRWL is connected to various driving circuit of the row system. The description of the configuration in the reset memory block RMB will be omitted because it is the same as the first embodiment (FIG. 10). Such connection structure can be also applied to each of the word line WL (WL0 to WL15) and the common word line CWL.

Figure 102:
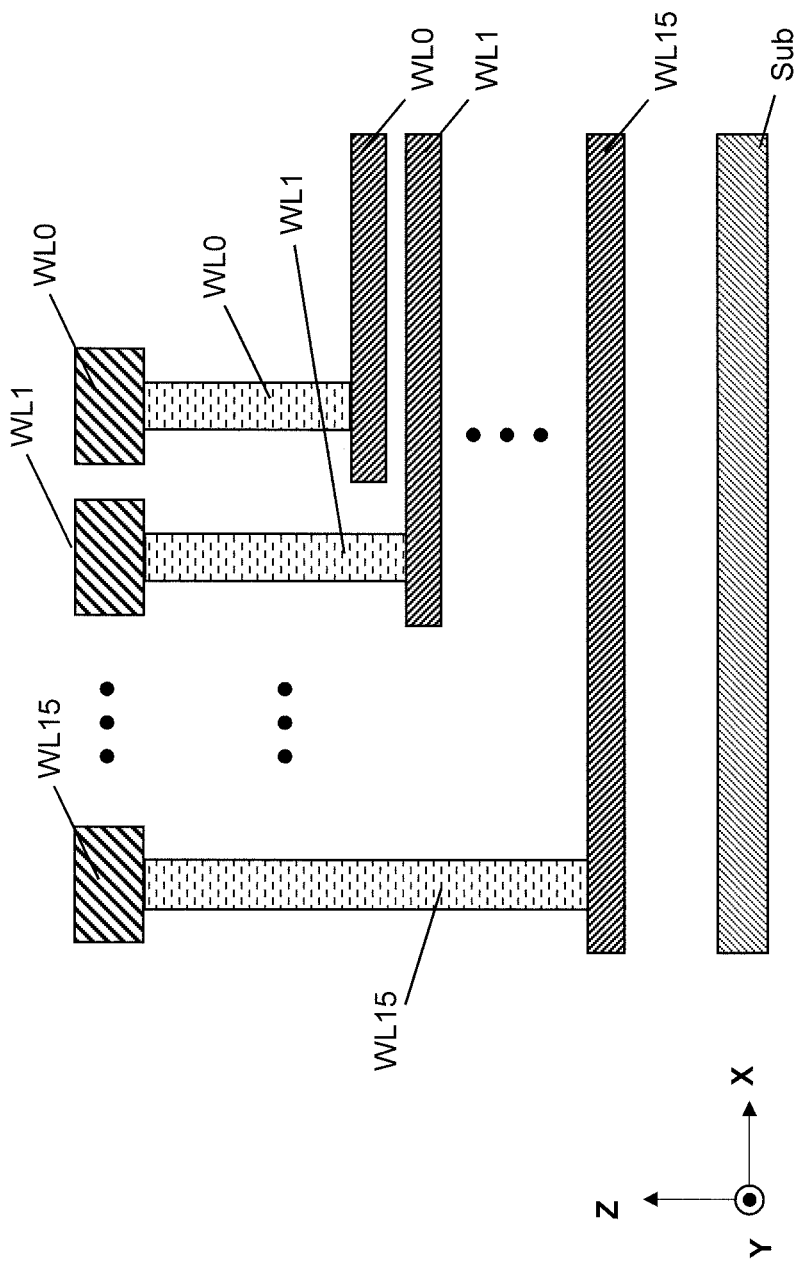
FIG. 102 is a diagram showing a connection structure between a respective word line WL and respective word line (upper layer) WL.
Figure 103:
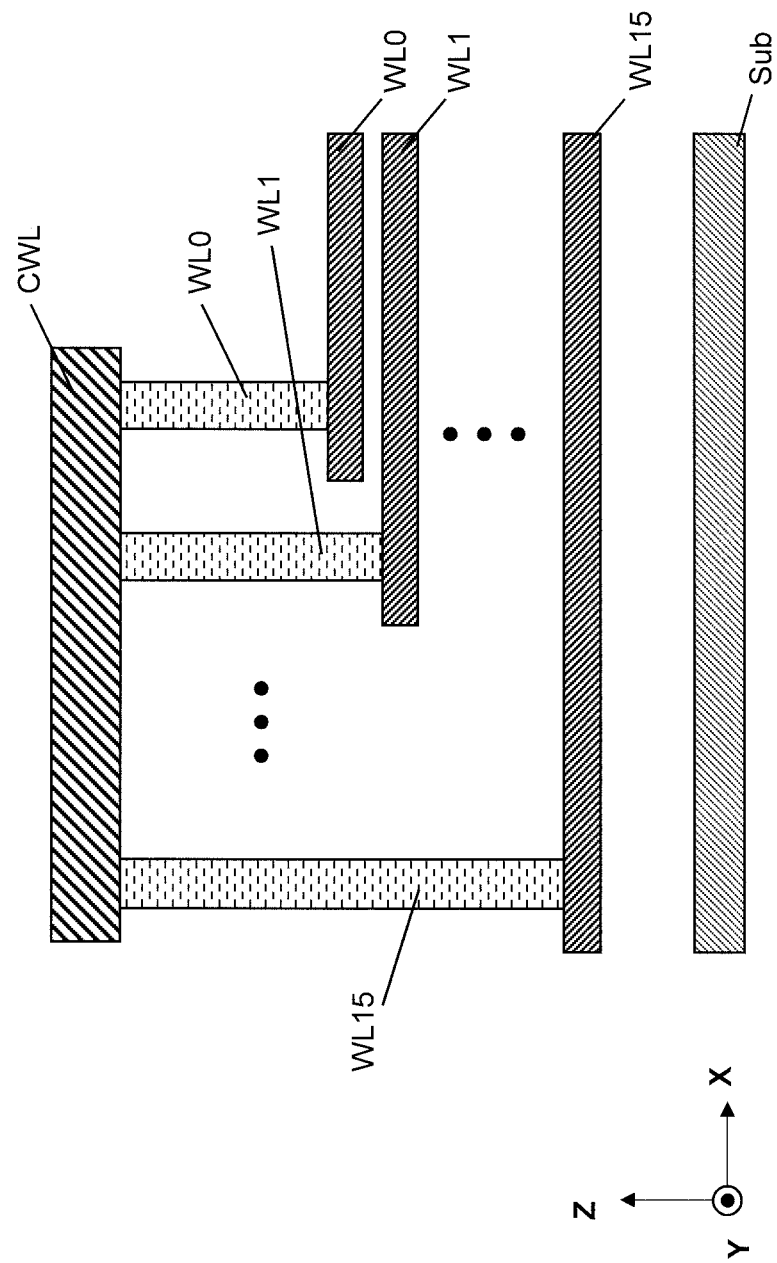
FIG. 103 is a diagram showing a connection structure between a respective word line WL and a common word line (upper layer) CWL.

An example in which each word line WL (WL0 to WL15) is connected from the memory cell array 11 to the upper wiring is shown. FIG. 102 is a diagram showing a connection structure between each of the word line WL (WL0, WL1, ... WL15) and each of the word line (upper layer) WL of the memory cell array 11. FIG. 103 is a diagram showing a connection structure between the word lines WL (WL0, WL1, ... WL15) and the common word line CWL (upper layer) of the memory cell array 11. The terminals of word lines WL (WL0 to WL15) are formed by drawing out in a stepwise manner. Each terminal is connected to each word line (vertical) WL (WL0 to WL15) that extends in the Z-direction via a contact hole that is formed in the insulating film. In FIG. 102, each word line (vertical) WL (WL0 to WL15) is connected to corresponding word line (upper) WL (WL0 to WL15) of the upper layer. In FIG. 103, the word lines (vertical) WL (WL0 to WL15) are connected to the upper common word line (upper layer) CWL. This structure can be applied, for example, when there is no need to apply a separate voltage to each wiring, such as the reset word line RWL.

Figure 104:
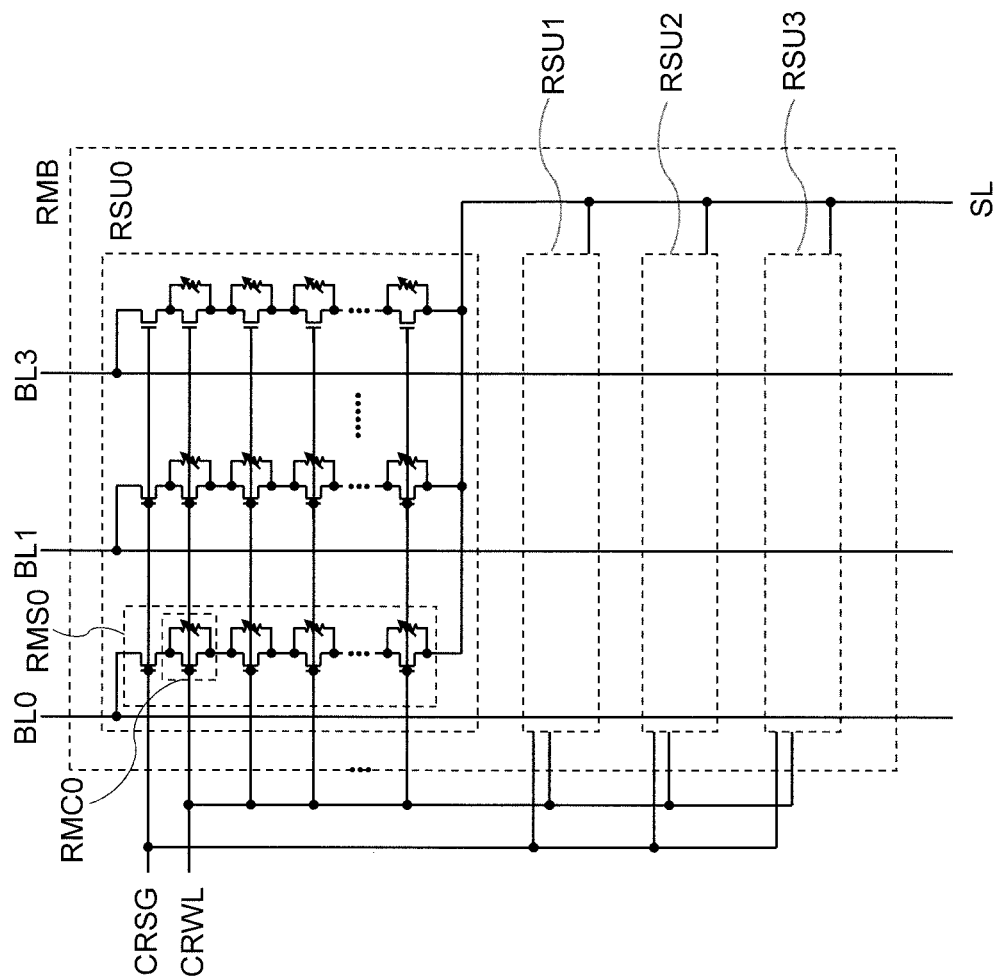
FIG. 104 is a circuit diagram of a modified example showing a connection structure between a respective reset selecting gate line RSG and a common reset selecting gate line CRSG.

<3-2> Modified Example of the Connection Structure Between Each Reset Selecting Gate Line RSG and Common Reset Selecting Gate Line CRSG FIG. 104 is a circuit diagram of a modified example showing a connection structure between the reset selecting gate lines RSG (RSG0 to RSG3) and the common reset selecting gate line CRSG. In the present modified example, the reset selecting gate lines RSG (RSG0 to RSG3) are electrically connected to each other. That is, each reset selecting gate line RSG (RSG0 to RSG3) is connected to the upper common reset selecting gate line (upper layer) CRSG via the reset selecting gate lines (vertical) RSG. The common reset selecting gate line (upper layer) CRSG is also connected to various driving circuit of the row system. Such connection structure can be also applied to the selecting gate line SG (SG0 to SG3) and the common selecting gate line CSG. Since the various control lines (the reset word line RWL and the reset selecting gate line RSG) of the row system are different, common wirings (the common reset word line (upper layer) CRWL and the common reset selecting gate line (upper layer) CRSG) are arranged for each memory block. If the potentials of the reset word line RWL and the reset selecting gate line RSG are the same, one common wiring can be used to connect them.

<3-3> Modified Example of Configuration of the Reset Selecting Gate Line RSG

Figure 105:
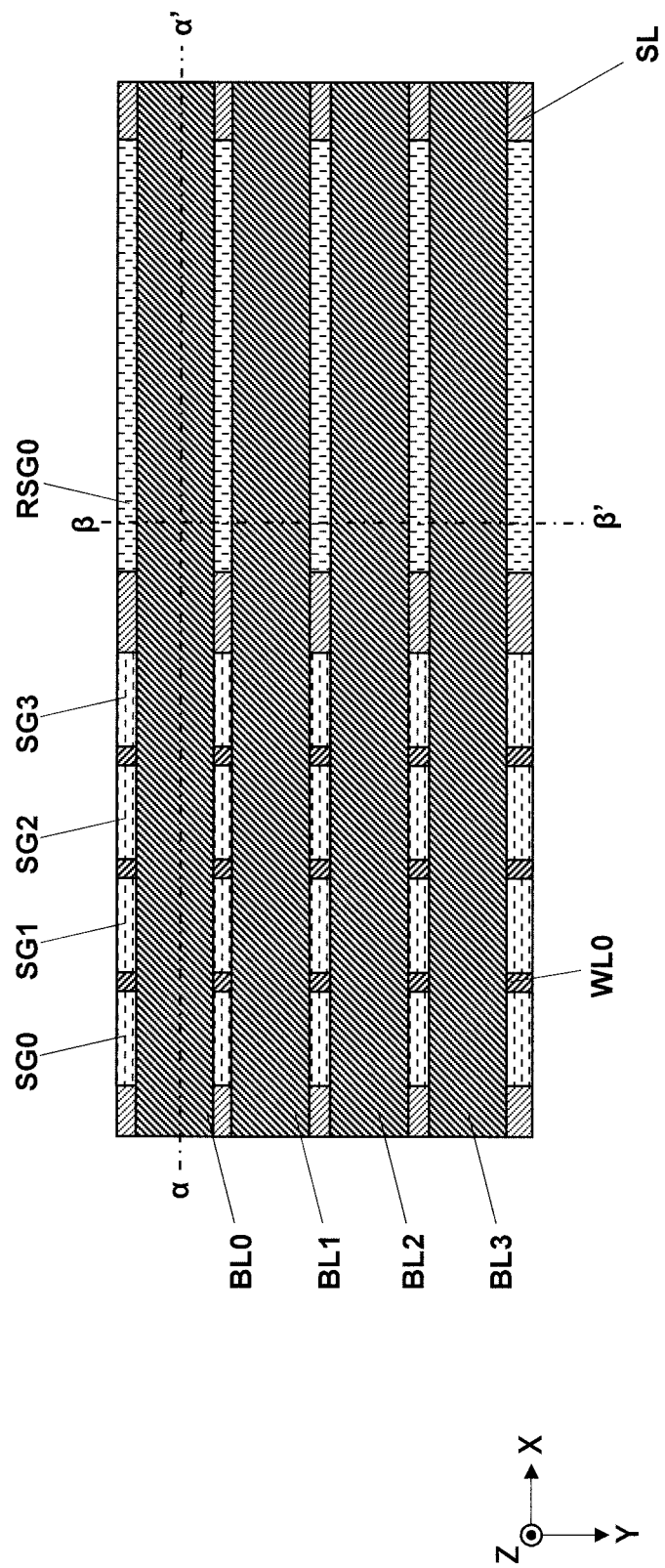
FIG. 105 is a plan view showing a modified example of a configuration of a reset selecting gate line RSG.
Figure 106:
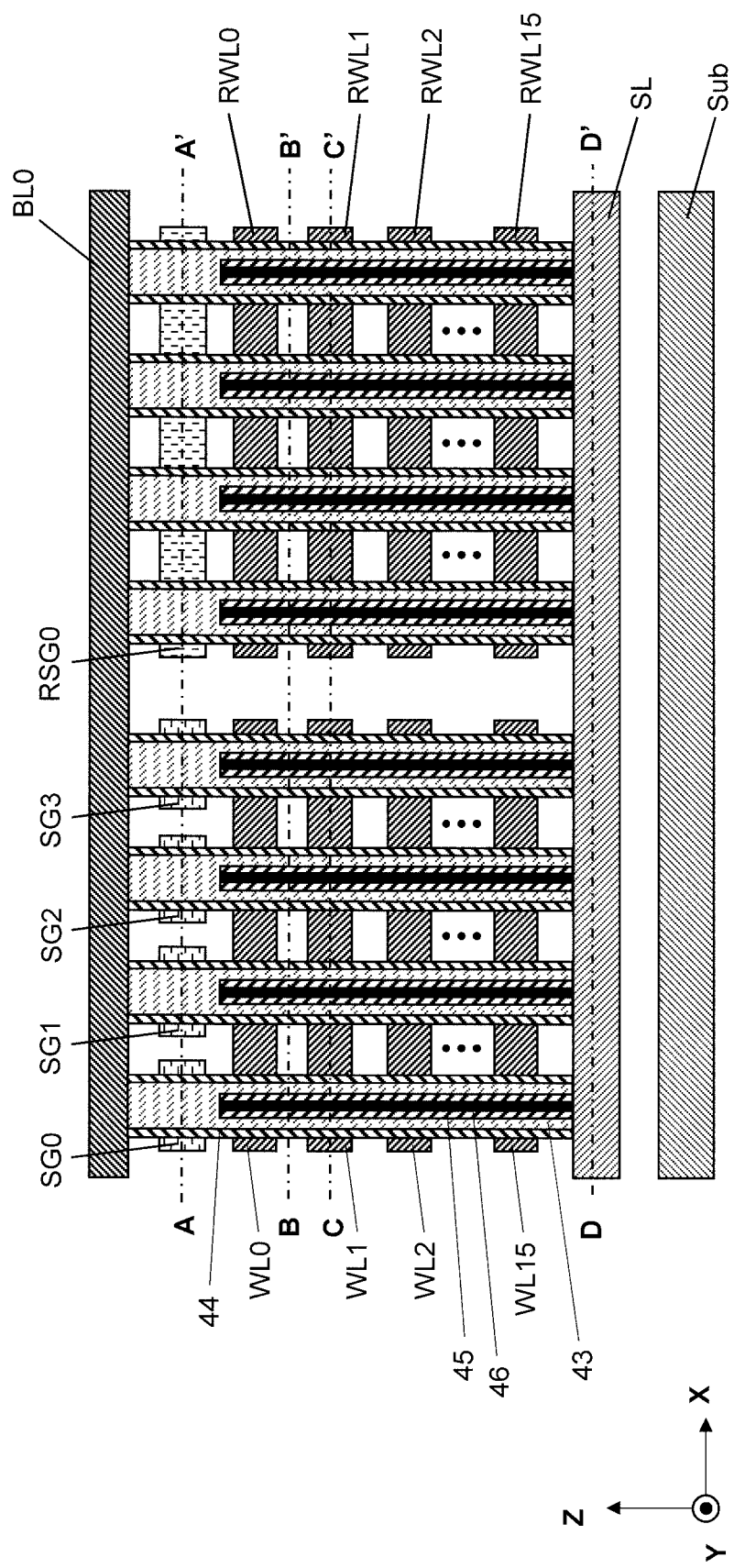
FIG. 106 is a cross-sectional view along α-α' line of FIG. 105.
Figure 107:
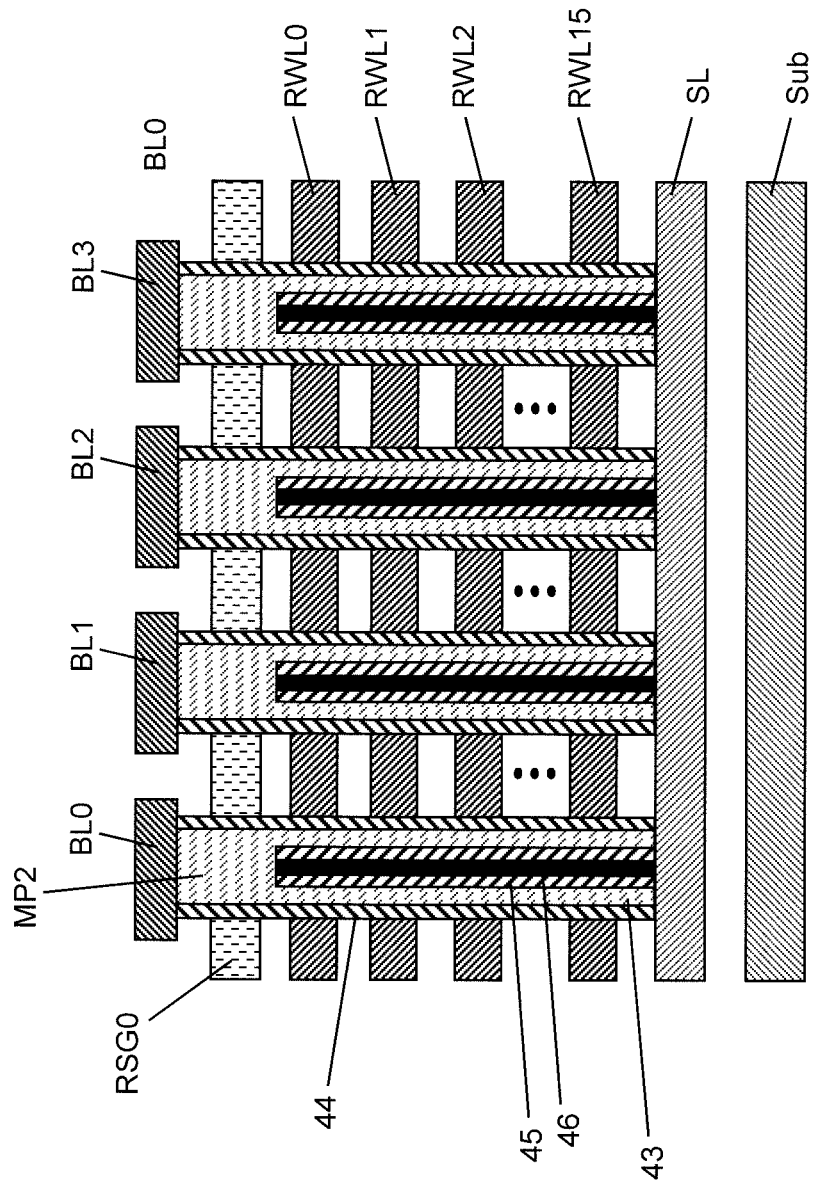
FIG. 107 is a cross-sectional view along β-β' line of FIG. 105.

A modified example in which the configuration of the reset selecting gate line RSG is different will be described with reference to FIGS. 105 to 111. In this modified example, the reset selecting gate lines RSG (RSG0 to RSG3) in the first embodiment are electrically connected to each other. FIG. 105 shows an example of a plan view seen from above in the Z-direction of the memory cell array 11 according to the modified example. FIG. 106 shows an example of a cross-sectional view (along α-α' line in FIG. 105) seen from the Y-direction of the memory cell array 11. FIG. 107 shows an example of a cross-sectional view (cross-sectional view along β-β' line in FIG. 105) seen from the X-direction of the memory cell array 11.

Figure 108:
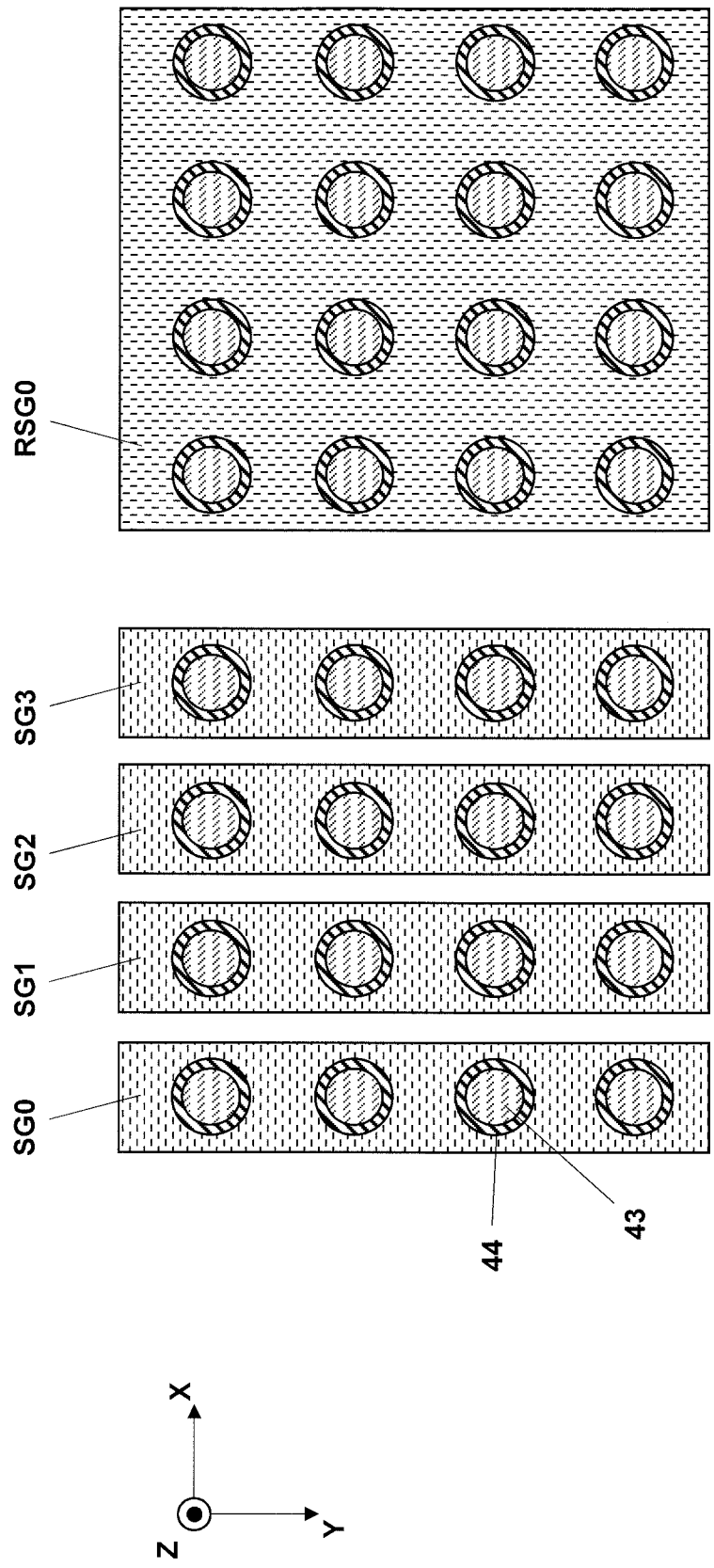
FIG. 108 is a cross-sectional view along A-A' line of FIG. 106.
Figure 109:
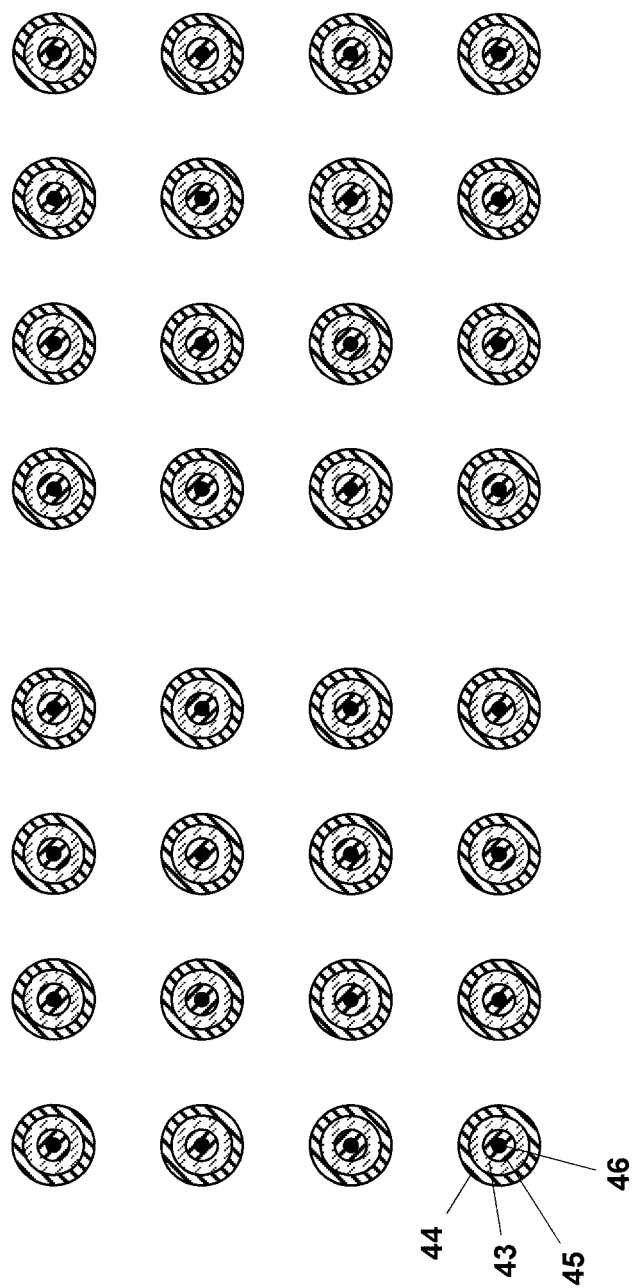
FIG. 109 is a cross-sectional view along B-B' line of FIG. 106.
Figure 110:
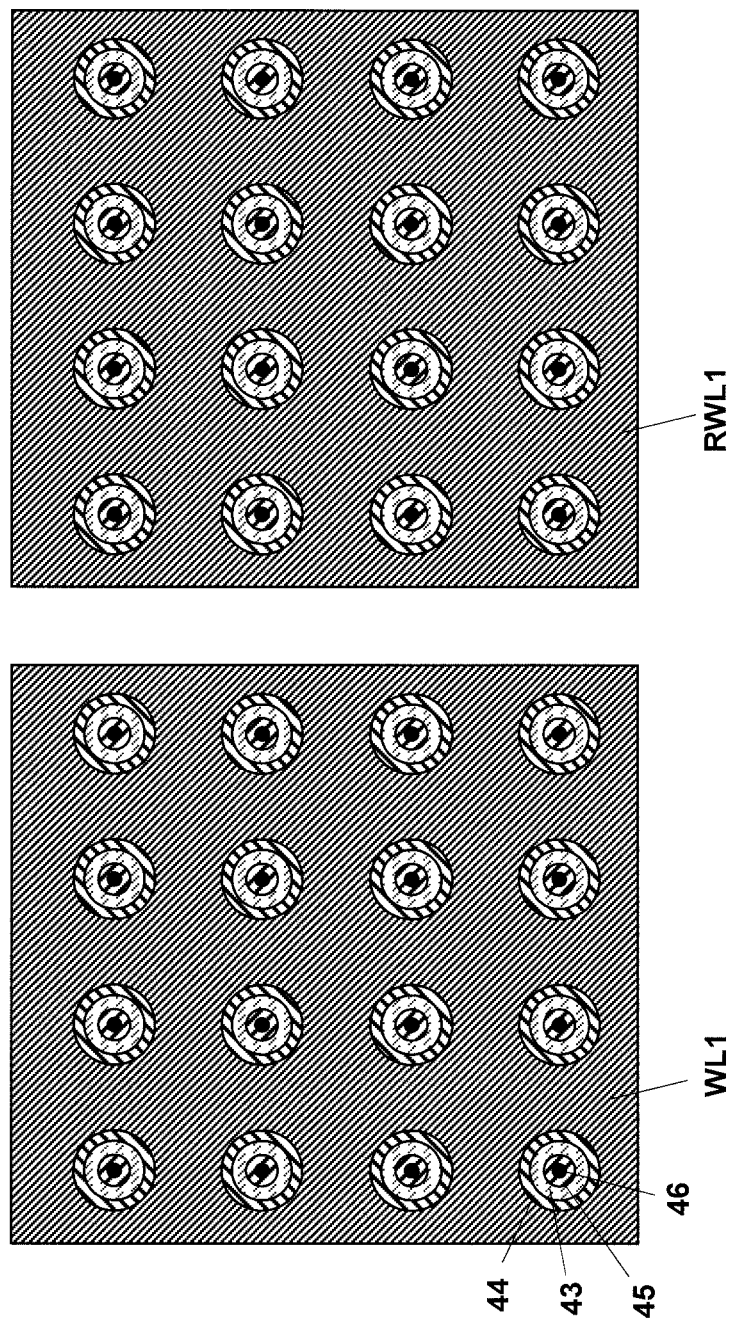
FIG. 110 is a cross-sectional view along C-C' line of FIG. 106.
Figure 111:
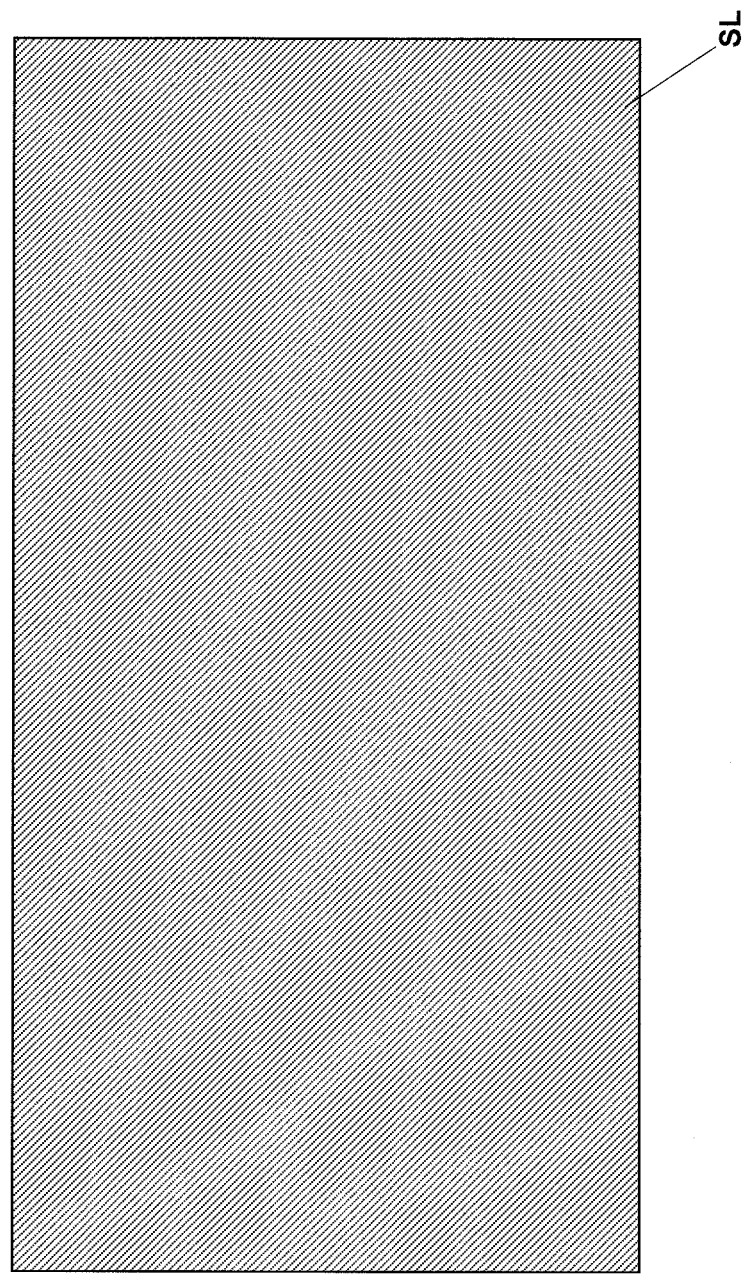
FIG. 111 is a cross-sectional view along D-D' line of FIG. 106.

FIGS. 108 to 111 shows an example of a cross-sectional view in the X-Y plane seen from the Z-direction of the memory cell array 11. FIG. 108 is a cross-sectional view along A-A' in FIG. 106, FIG. 109 is a cross-sectional view along B-B' in FIG. 106, FIG. 110 is across-sectional view along C-C' in FIG. 106, FIG. 111 is across-sectional view along D-D' in FIG. 106.

As shown in FIGS. 105 to 111, in the memory cell array 11, the bit lines BL0 to BL3 extending in the X-direction are arranged in parallel at the top portion in the Z-direction. Below the bit lines BL0 to BL3, there are the selecting gate lines SG0 to SG3 extending in the Y-direction in parallel and the reset selecting gate line RSG0 in the X-Y plane. The selecting gate lines SG0 to SG3 and the reset selecting gate line RSG0 are insulated from the bit lines BL0 to BL3. Below the selecting gate lines SG0 to SG3 and the reset selecting gate line RSG0, the word lines WL0 to WL15 and the reset word lines RWL0 to RWL15 are arranged in the X-Y plane, respectively. The word lines WL0 to WL15 and the reset word lines RWL0 to RWL15 are insulated from each other and also insulated from the selecting gate lines SG0 to SG3 and the reset selecting gate line RSG0. Below the word line WL 15 and the reset word line RWL15, the source line SL is arranged in the X-Y plane. The source line SL is insulated from the word line WL15 and the reset word line RWL15. Note that the description of the configuration of the memory pillar MP will be omitted here because it is the same as the first embodiment. In this way, the reset selecting gate line RSG0 can be configured according to the required operation units. By connecting the reset selecting gate lines RSG to one, the resistance can be reduced and the rising edge at the reset operation can be made steeper.

<3-4> Modified Example of Configuration of Reset Selecting Gate Line RSG

Figure 112:
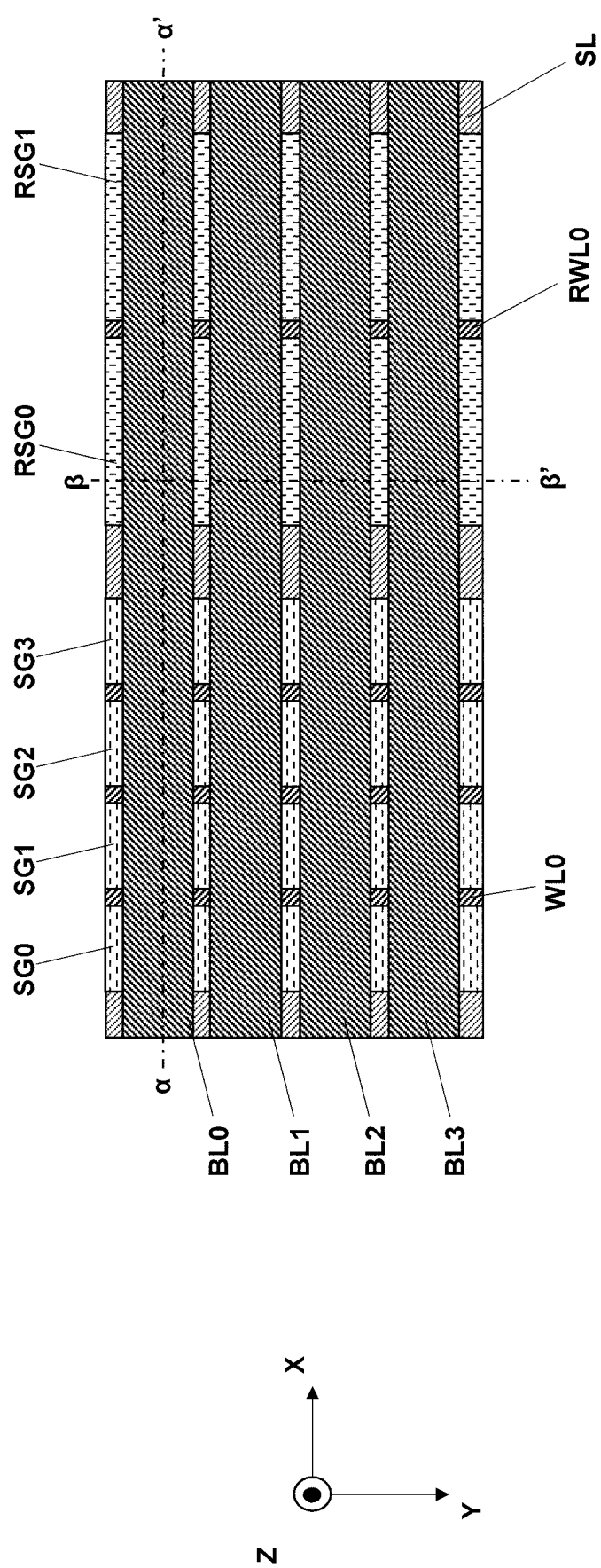
FIG. 112 is a plan view showing a modified example of a configuration of a reset selecting gate line RSG.
Figure 113:
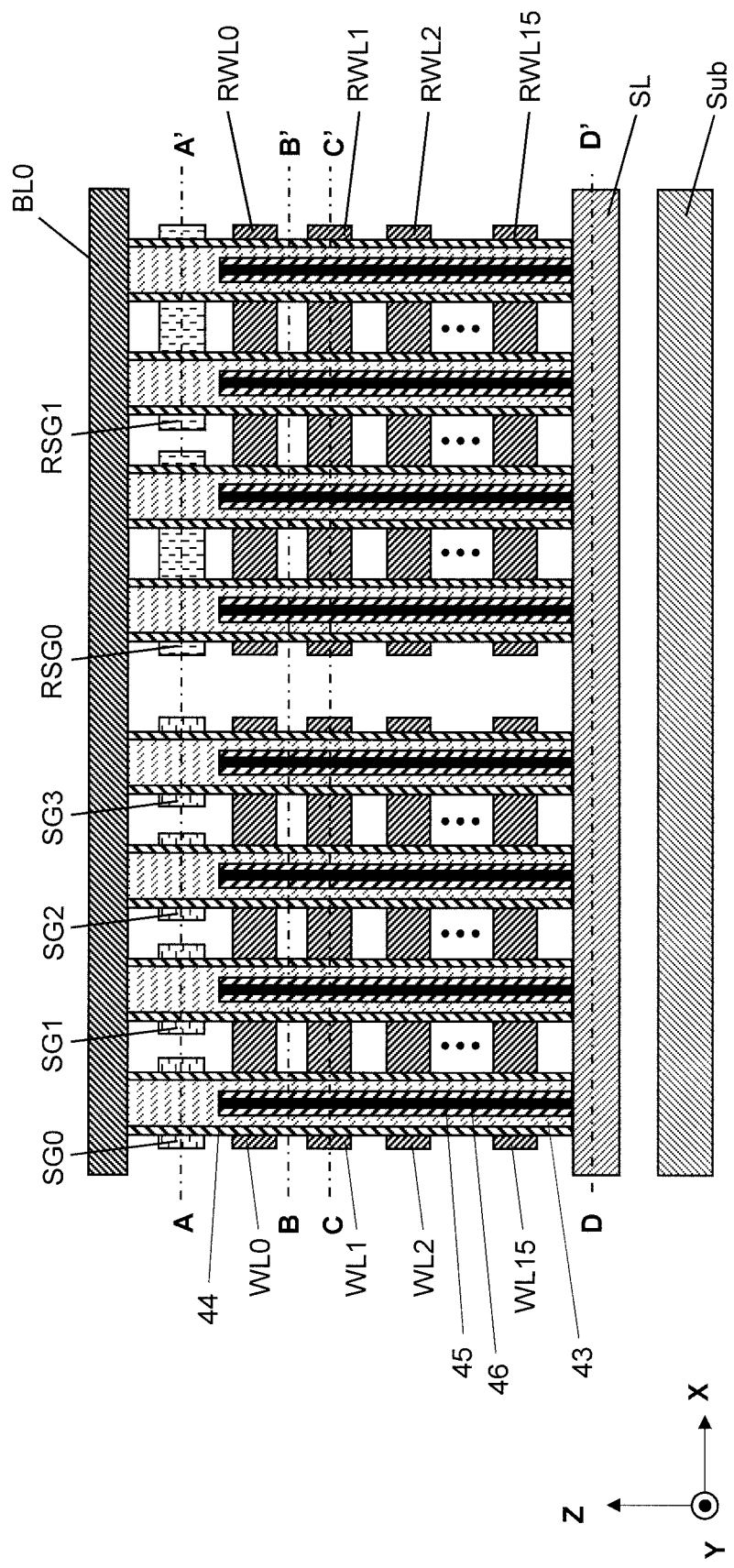
FIG. 113 is a cross-sectional view along α-α' line of FIG. 112.
Figure 114:
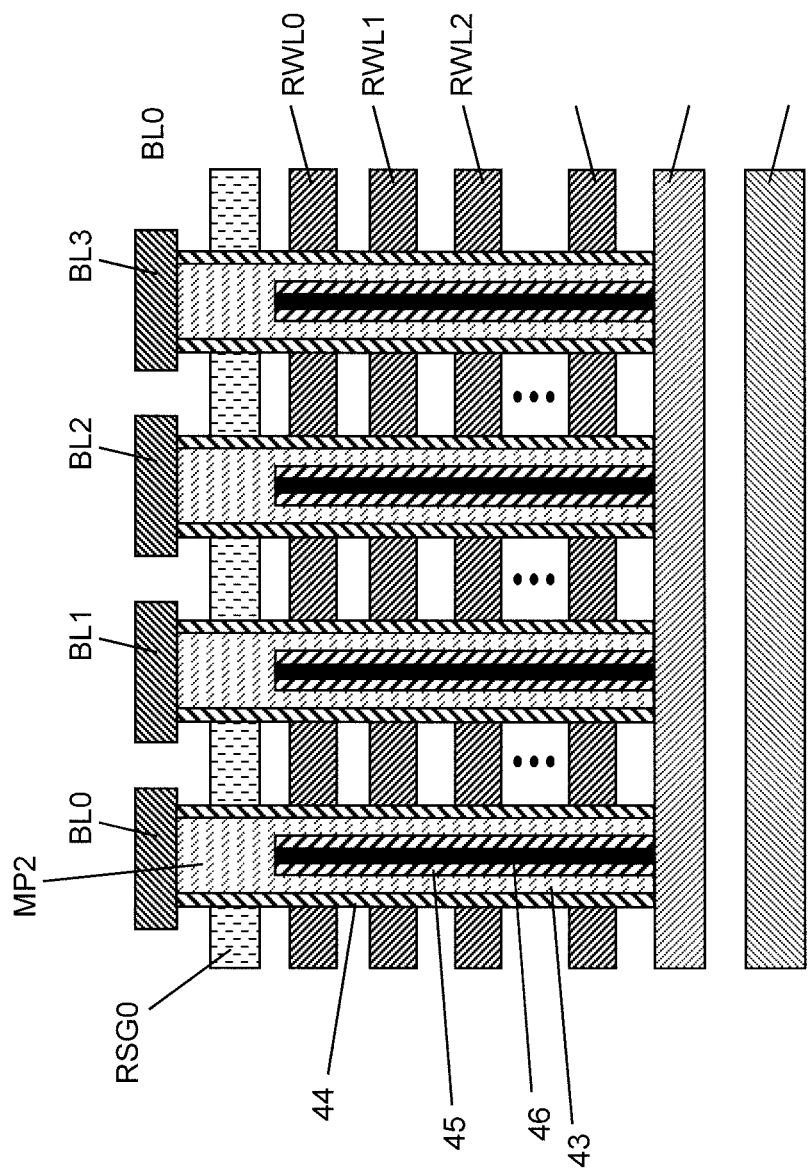
FIG. 114 is a cross-sectional view along β-β' line of FIG. 112.

A modified example in which the configuration of the reset selecting gate line RSG is different will be described with reference to FIGS. 112 to 118. In this modified example, some of the reset selecting gate lines RSG (RSG0, RSG1, RSG2, and RSG3) in the first embodiment are electrically connected to each other. FIG. 112 shows an example of a plan view seen from above in the Z-direction of the memory cell array 11 according to the modified example. FIG. 113 shows an example of a cross-sectional view (along α-α' line in FIG. 112) seen from the Y-direction of the memory cell array 11. FIG. 114 shows an example of a cross-sectional view (cross-sectional view along β-β' line in FIG. 112) seen from the X-direction of the memory cell array 11.

Figure 115:
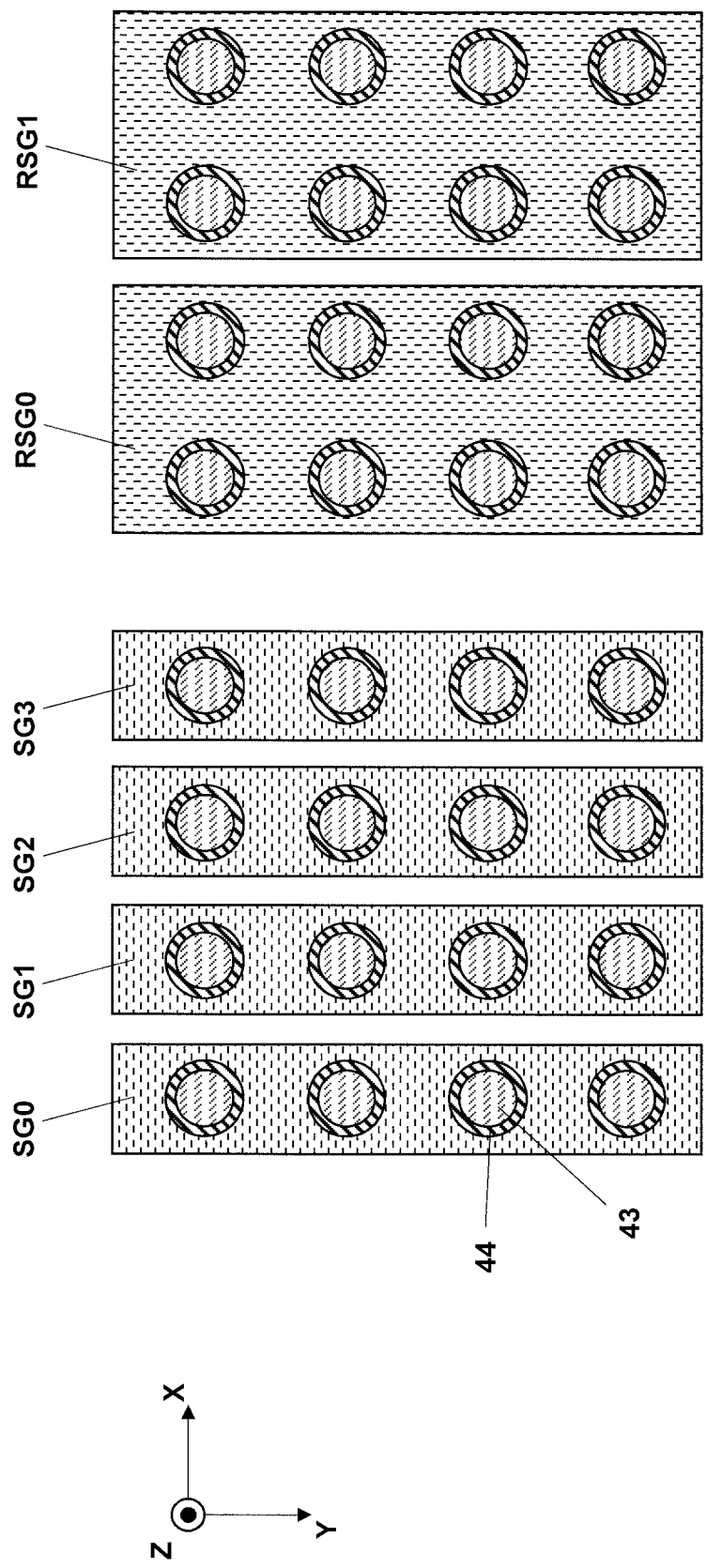
FIG. 115 is a cross-sectional view along A-A' line of FIG. 113.
Figure 116:
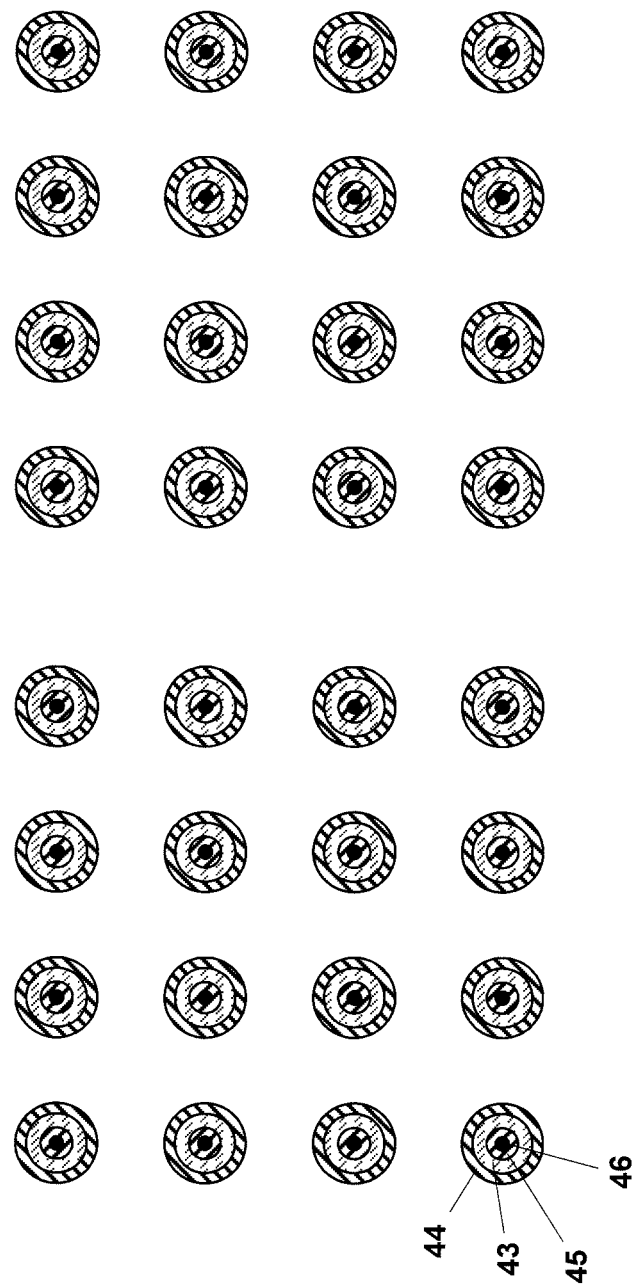
FIG. 116 is a cross-sectional view along B-B' line of FIG. 113.

FIGS. 115 to 118 show an example of a cross-sectional view in the X-Y plane seen from the Z-direction of the memory cell array 11. FIG. 115 is a cross-sectional view along A-A' in FIG. 113, FIG. 116 is a cross-sectional view along B-B' in FIG. 113, FIG. 117 is a cross-sectional view along C-C' in FIG. 113, FIG. 118 is a cross-sectional view along D-D' in FIG. 113.

As shown in FIGS. 112 to 118, in the memory cell array 11, the bit lines BL0 to BL3 extending in the X-direction are arranged in parallel at the top portion in the Z-direction. Below the bit lines BL0 to BL3, the selecting gate lines SG0 to SG3 extending in the Y-direction in parallel, and the reset selecting gate lines RSG0 and RSG1 extending in the Y-direction in parallel are arranged. The selecting gate lines SG0 to SG3 and the reset selecting gate lines RSG0, RSG1 are insulated from the bit lines BL0 to BL3. The word lines WL0 to WL15 and the reset word lines RWL0 to RWL15 are arranged in the X-Y plane below the selecting gate lines SG0 to SG3 and the reset selecting gate lines RSG0 and RSG1, respectively. The word lines WL0 to WL15 and the reset word lines RWL0 to RWL15 are insulated from each other and also insulated from the selecting gate lines SG0 to SG3 and the reset selecting gate lines RSG0, RSG1. Below the word line WL 15 and the reset word line RWL15, the source line SL is arranged in the X-Y plane. The source line SL is insulated from the word line WL15 and the reset word line RWL15. The configuration of the memory pillar MP is the same as that of the first embodiment, and will not be described here. In this manner, the reset selecting gate lines RSG0 and RSG1 can be configured according to the required operation units. When a part of the reset selecting gate lines RSG are connected, each of the reset selecting gate lines RSG0 and RSG1 can be driven separately, and the rising edge at the reset operation can be controlled at a high speed.

<3-5> Modified Example Including Source Side Selecting Gate Transistor ST2

Figure 119:
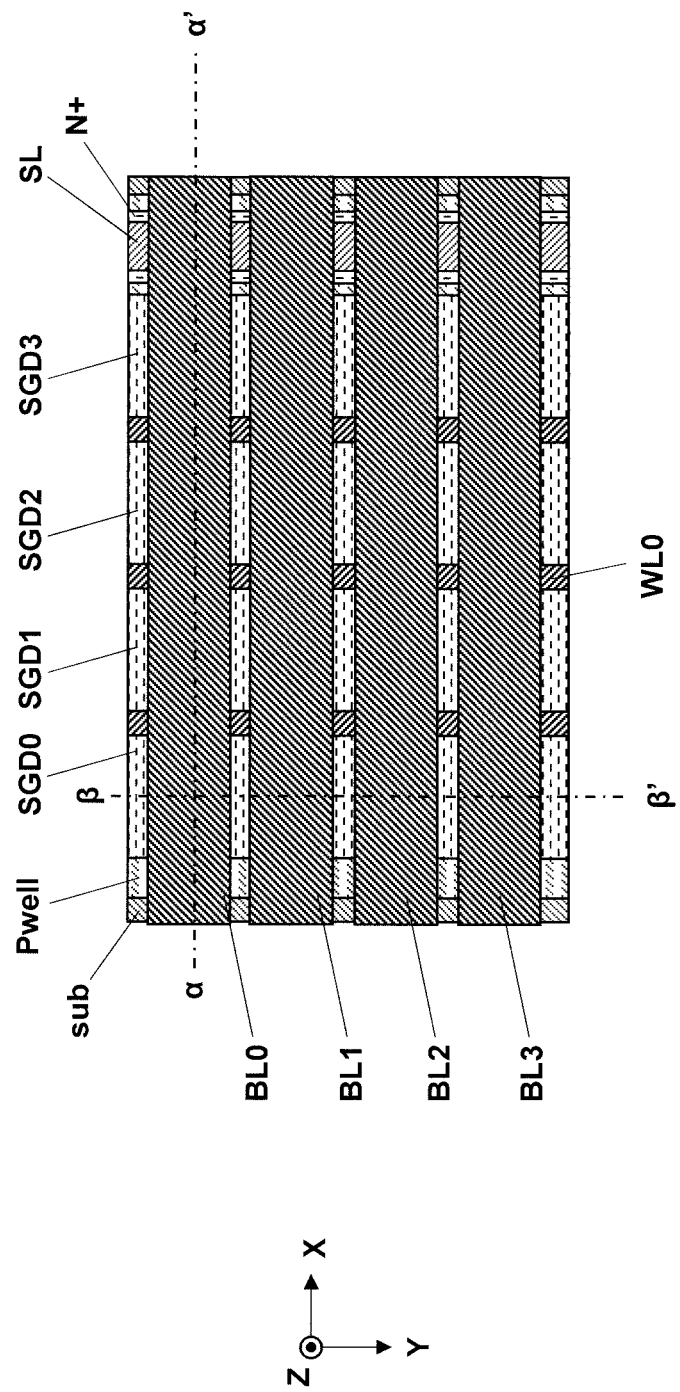
FIG. 119 is a plan view showing a modified example with a source side selecting gate transistor ST2.
Figure 120:
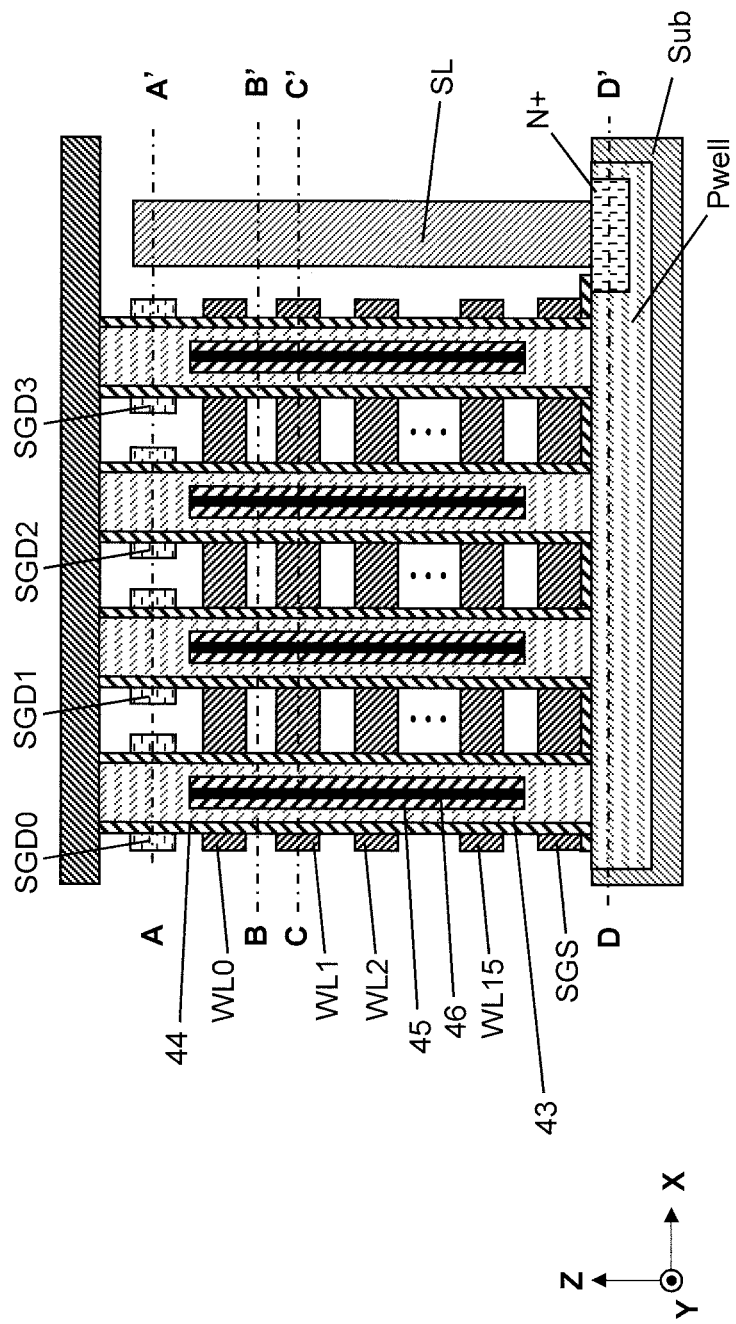
Figure 121:
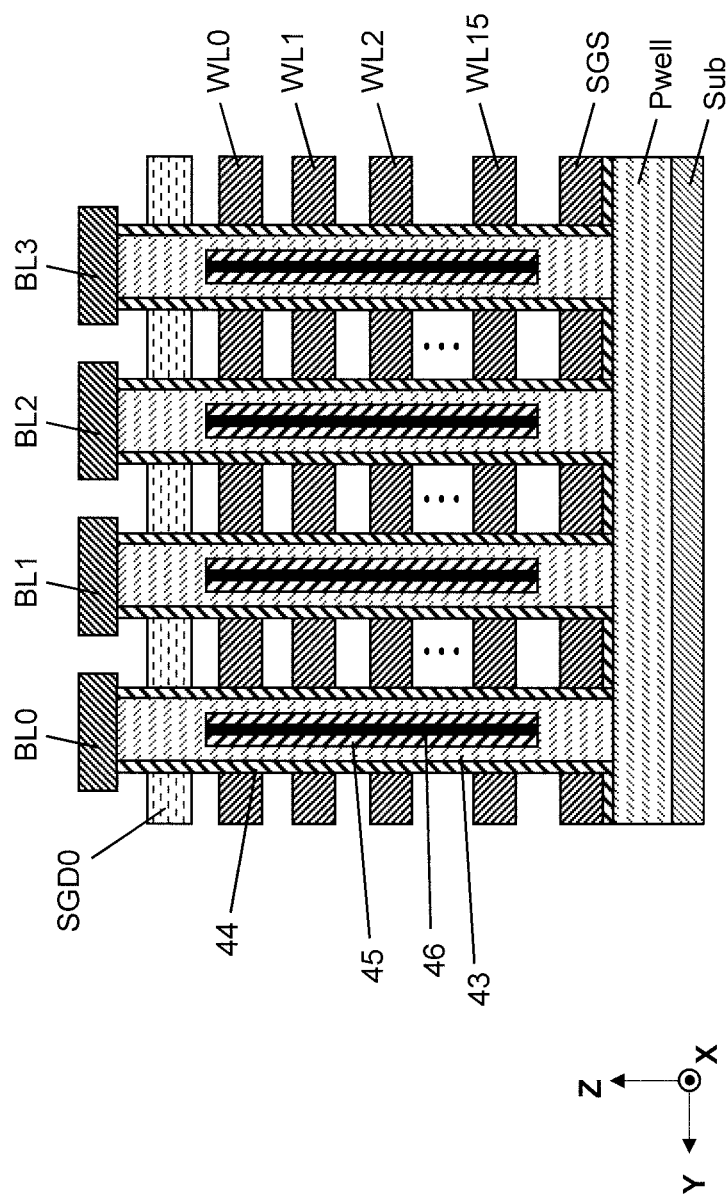

A modified example in which the configuration of the source side selecting gate transistor ST2 is shown using FIGS. 119 to 121. In this modified example, the selecting gate transistor ST may be referred to as the "drain side selecting gate transistor ST1" corresponding to the source side selecting gate transistor ST2. The selecting gate line SG (SG0 to SG3) may be referred to as "drain side selecting gate line SGD (SGD0 to SGD3)" corresponding to the source side selecting gate line SGS.

In the memory cell array 11 shown in the modified example of the second embodiment shown in FIGS. 84 to 90, the memory pillar MP surrounded by the source side selecting gate line SGS includes the variable resistance layer 45 and the core member 46 inside the semiconductor pillar 43. In the memory cell array 11 according to this modified example, the memory pillar MP surrounded by the source side selecting gate line SGS does not include the variable resistance layer 45 and the core member 46 inside the semiconductor pillar 43. The configuration other than the configuration of the memory pillar MP is the same as the configuration of the modified example of the second embodiment, and a repetitive description thereof may be omitted. FIG. 119 shows an example of a plan view seen from above in the Z-direction of the memory cell array 11 according to the modified example. FIG. 120 shows an example of a cross-sectional view (cross-sectional view along α-α' line in FIG. 119) seen from the Y-direction of the memory cell array 11. FIG. 121 shows an example of a cross-sectional view (cross-sectional view along β-β' line in FIG. 119) seen from the X-direction of the memory cell array 11.

As shown in FIGS. 119 to 121, the cylindrical memory pillar MP extending in the Z-direction is arranged through the openings formed in the drain side selecting gate lines SGD0 to SGD3, the word lines WL0 to WL15, and the source side selecting gate line SGS. The cylindrical memory pillar MP includes the cylindrical hollow gate insulating film 44 and the semiconductor pillar 43 therein from the outside. The bottom of the memory pillar MP reaches to the p-type well Pwell and is electrically connected thereto.

In the part of the memory pillar MP surrounded by the word lines WL0 to WL15 and the insulating film in the vicinity of the word lines WL0 to WL15, the semiconductor pillar 43 has a cylindrical hollow shape. The portion of the memory pillar MP includes the cylindrical variable resistance layer 45 and the cylindrical core member 46 inside the cylindrical hollow shape semiconductor pillar 43. The cylindrical hollow variable resistance layer 45 covers the side (outer periphery) of the core member 46. The inside of the cylindrical hollow shape semiconductor pillar 43 is in contact with the core member 46. The bottom of the variable resistance layer 45 is located between the word line WL15 and the source side selecting gate line SGS, and the memory pillar MP of the part surrounded by the source side selecting gate line SGS does not include the variable resistance layer 45. With this configuration, leakage to the p-type well Pwell and the source line SL through the variable resistance layer 45 can be suppressed. It can also be used as the reset word line RWL in the second embodiment.

<3-6> A Circuit Diagram of the Memory Block

Figure 122:
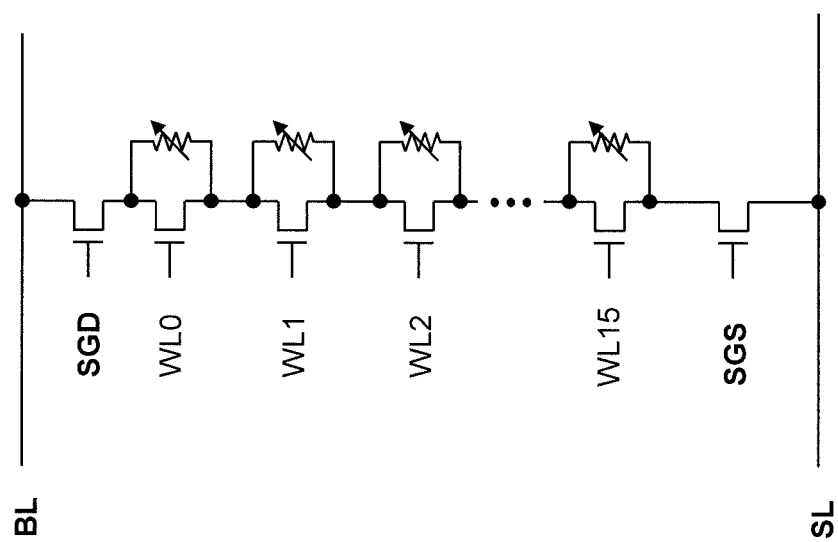
Figure 123:
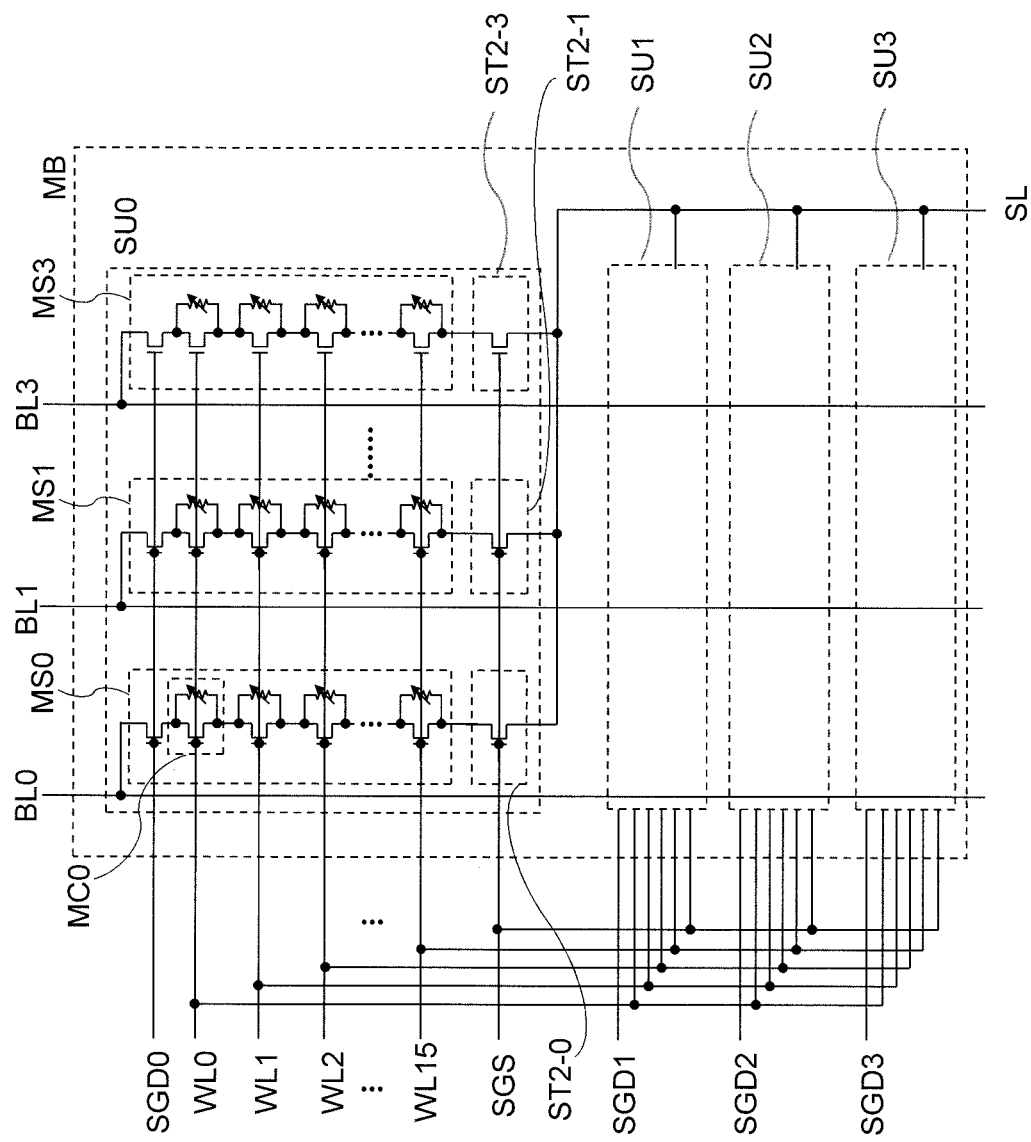

FIG. 122 is a circuit diagram from the bit line BL line to the source line SL including the source side selecting gate transistor ST2 without the variable resistance layer 45. The same method as that of the modified example of the second embodiment can be applied to the method of selecting the memory cell and the method of driving each line. FIG. 123 is a circuit diagram of a memory block. The memory block MB includes the string unit SU0 to which the drain side selecting gate line SGD0 is connected, the string unit SU1 to which the drain side selecting gate line SGD1 is connected, the string unit SU2 to which the drain side selecting gate line SGD2 is connected, and the string unit SU3 to which the drain side selecting gate line SGD3 is connected.

The string unit SU (SU0 to SU3) respectively includes the memory string MS0 and the source side selecting gate transistor ST2_0 connected between the bit line BL0 and the source line SL, the memory string MS1 and the source side selecting gate transistor 2_1 connected between the bit line BL1 and the source line SL, and the memory string MS3 and the source side selecting gate transistor ST2_3 connected between the bit line BL3 and the source line SL.

In the memory string MS (MS0 to MS3), the drain side selecting gate transistor ST1, the memory cell MC0, the memory cell MC1, . . . the memory cell MC15 are connected in series from a position close to the bit line BL (BL0 to BL3).

<3-7> Modified Example of the Method of Selecting the Memory Cell

A modified example of the method of selecting the memory cell is described with reference to FIGS. 124 to 127. In the present modified example, the memory cell is selected by both the memory block MB and the string unit SU.

Figure 124:
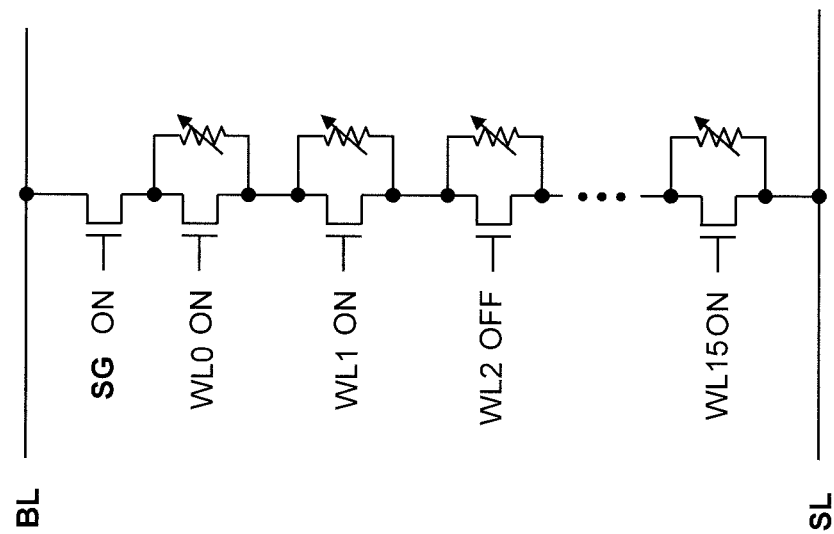

As shown in FIG. 124, in the selected string unit SU of the selected memory block MB, the selecting gate line SG is supplied with the ON voltage enough to conduct the selected gate transistor (sufficient carriers are induced in the region of the semiconductor pillar 43 to reduce the resistance). When selecting the memory cell MC connected to the word line WL2, the word lines WL0, WL1, WL3 to WL15 are supplied with the ON voltage enough to conduct the memory cell MC (sufficient carriers are induced in the region of the semiconductor pillar 43 to reduce the resistance). In addition, the word line WL2 is supplied with the OFF voltage that is insufficient to conduct the memory cell MC (resistance becomes large without inducing sufficient carriers to the region the semiconductor pillar 43). Since sufficient carriers are not induced in the region of the semiconductor pillar 43 of the memory cell MC connected to the word line WL2, the amount of current flowing is determined according to the resistance value of the variable resistance layer 45. That is, the data written in the selected memory cell MC can be read.

Figure 125:
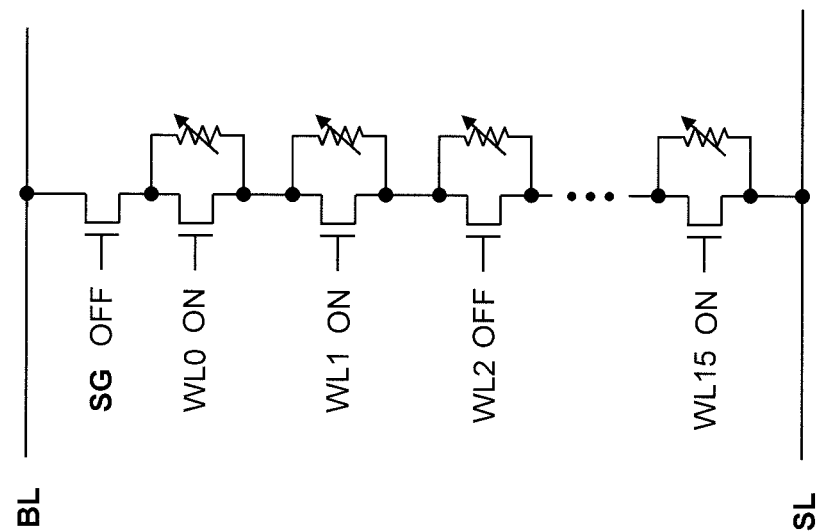

As shown in FIG. 125, in the non-selected string unit SU of the selected memory block MB, the selecting gate line SG is supplied with the OFF voltage that is insufficient to conduct the selecting gate transistor. As a result, no current flows through the string unit SU even if the ON voltage is supplied to the word lines WL0, WL1, WL3 to WL15.

Figure 126:
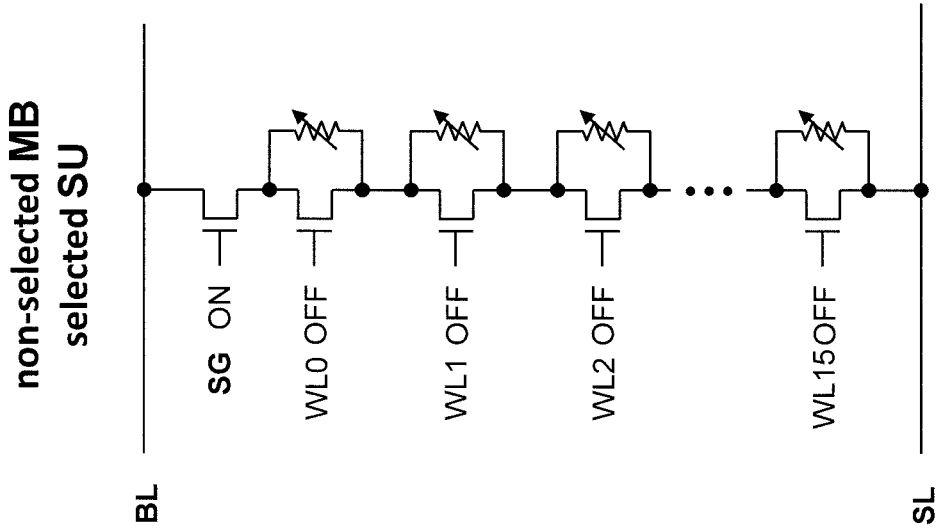

As shown in FIG. 126, in the selected string unit SU of the non-selected memory block MB, the word lines WL0, WL1, WL3 to WL15 are supplied with the OFF voltage that is insufficient to conduct the memory cells MC. As a result, no current flows through this string unit SU even if the ON voltage is supplied to the selecting gate line SG. With this configuration, it is possible to reduce the number of switches of the selecting circuit of the selecting gate line SG.

Figure 127:
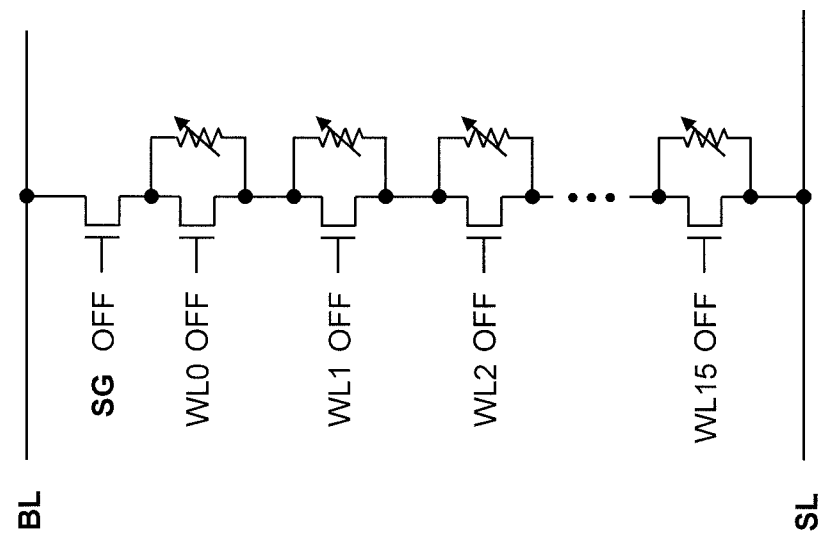

As shown in FIG. 127, in the non-selected memory block MB, the OFF voltage is supplied to both the selecting gate line SG and the word lines WL0 to WL15. As a result, no current flows through the string unit SU.

<3-8> Modified Examples of Set Operation in Reset Memory Block RMB

Figure 128:
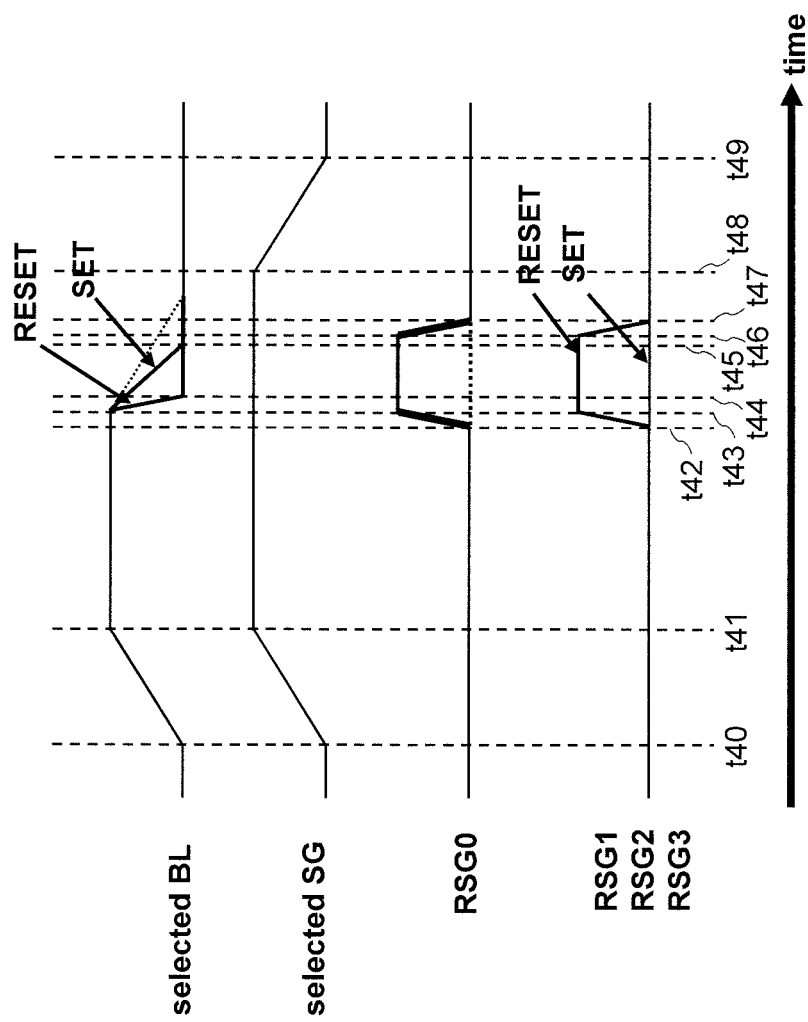

FIG. 128 is a waveform diagram showing a modified example of the voltages applied to the selecting gate line SG, the reset selecting gate line RSG, and the bit line BL when the set operation is performed by the reset memory block RMB in the first embodiment.

At time t40, the selected selecting gate line SG starts to rise from Low to High, and the selected bit line BL starts to rise from Low to High. By time t41, the selected selecting gate line SG reaches High and the selected bit line BL reaches High. Current flows from time t41 to time t44 when the reset operation is performed and current flows from time t41 to time t45 when the set operation is performed to the region of the semiconductor pillar 43 in the non-selected memory cell MC and the variable resistance layer 45 in the selected memory cell MC. The variable resistance layer 45 undergoes a phase change due to the heat generated by the current flowing therethrough.

When the reset operation is performed at time t42, the reset selecting gate lines RSG0, RSG1, RSG2, RSG3 are all raised to High. At time t43, the reset selecting gate lines RSG0, RSG1, RSG2, RSG3 all reach High. At time t43, the sense amplifier SA located outside the memory cell array 11 starts driving the bit line BL connected to the memory cell MC performing the reset operation from High to Low. At the same time, since current flows from the bit line BL to the source line SL in the reset memory strings RMS0, RMS1, RMS2, RMS3 of the reset memory block RMB, the voltage of the selected bit line BL steeply falls from High to Low. By time t44, the voltage of the bit line BL connected to the memory cell MC performing the reset operation reaches Low. In this way, the selected bit line BL falls steeply due to the presence of the reset memory block RMB. Due to this steep fall, the variable resistance layer of the memory cell MC connected to the selected word line WL is rapidly cooled to become an amorphous phase, resulting in a high resistance.

On the other hand, when the set operation is performed at time t42, the reset selecting gate lines RSG1, RSG2, and RSG3 are kept Low and the reset selecting gate lines RSG0 starts to raise from Low to High. The reset selecting gate line RSG0 reaches High at time t43. At time t43, the sense amplifier SA located outside the memory cell array 11 starts driving the bit line BL connected to the memory cell MC performing the set operation from High to Low. Current flows from the bit line BL to the source line SL in the reset memory string RMS0 of the reset memory block RMB. However, since no current flows in the reset memory strings RMS1, RMS2, RMS3, the voltage of the selected bit line BL gradually falls from High to Low. By time t45, the voltage of the bit line BL connected to the memory cell MC performing the set operation is Low. In this manner, the number of the reset memory string RMS selected by the reset selecting gate line RSG can be appropriately adjusted, and the time required for the falling edge of the selected bit line BL can be controlled. As a result, the variable resistance layer of the memory cell MC connected to the selected word line WL is gradually cooled to become a crystalline phase, resulting in a low resistance.

Next, at time t46, High one of the reset selecting gate lines RSG0, RSG1, RSG2, RSG3 starts to fall from High to Low, and by time t47, the reset selecting gate lines RSG0, RSG1, RSG2, RSG3 reach Low. Furthermore, the selecting gate line SG at time t48 starts to fall from High to Low, by time t49 selecting gate line SG reaches Low.

With such a configuration, in particular, when the delay time is large due to wiring capacitance, only a small number of the reset memory blocks RMB or the reset memory strings RMS are driven as compared with the reset operation, thereby reducing needlessness writing time while securing the time required for setting. It can also be applied to multi-valuation and Program/Verify by controlling the falling time by the number of the reset memory blocks RMB or the reset memory strings RMS.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:
   a semiconductor substrate having a main surface, the main surface extending in a first direction and a second direction intersecting the first direction;
   a first memory pillar including;
      a first variable resistance memory layer extending in a third direction intersecting the first direction and the second direction;
      a first semiconductor layer extending in the third direction, the first semiconductor layer contacting with the first variable resistance memory layer; and
      a first insulating layer extending in the third direction, the first insulating layer contacting with the first semiconductor layer;
   a second memory pillar including;
      a second variable resistance memory layer extending in the third direction;
      a second semiconductor layer extending in the third direction, the second semiconductor layer contacting with the second variable resistance memory layer; and
      a second insulating layer extending in the third direction, the second insulating layer contacting with the second semiconductor layer;
   a bit line extending in the first direction, the bit line connecting to one end of the first memory pillar and one end of the second memory pillar;
   a first selecting gate line extending in the second direction, the first selecting gate line forming a first selecting transistor by being opposite to the first semiconductor layer through the first insulating layer;
   a first word line extending in the second direction, the first word line forming a first memory cell by being opposite to the first variable resistance memory layer through the first semiconductor layer and the first insulating layer;
   a second selecting gate line arranged at a same position as the first selecting gate line in the third direction, the second selecting gate line extending in the second direction, the second selecting gate line forming a second selecting transistor by being opposite to the second semiconductor layer through the second insulating layer;
   a second word line arranged at a same position as the first word line in the third direction, the second word line extending in the second direction, the second word line forming a second memory cell by being opposite to the second variable resistance memory layer through the second semiconductor layer and the second insulating layer; and
   a driver configured to supply voltages to each of the bit line, the first selecting gate line, the second selecting gate line, and the second word line at a writing operation; wherein
   the driver sequentially supplies a first voltage, a second voltage higher than the first voltage, and the first voltage to the bit line, during the writing operation to the first memory cell;
   the driver supplies a third voltage to the second word line and a fourth voltage to the second selecting gate line while changing the voltage of the bit line from the second voltage to the first voltage if a data written in the first memory cell is a first data;
   the driver supplies a fifth voltage to the second word line and a sixth voltage to the second selecting gate line while changing the voltage of the bit line from the second voltage to the first voltage if the data written in the first memory cell is a second data different from the first data; and
   at least the sixth voltage is larger than the fourth voltage or the fifth voltage is larger than the third voltage.

2. The memory device according to claim 1, wherein the fifth voltage is a voltage configured to turn on the second memory cell, and the sixth voltage is a voltage configured to turn on the second selecting transistor.

3. The memory device according to claim 1, further comprising:
   a source line extending in the first direction, the source line connecting with another end of the first memory pillar and another end of the second memory pillar,
   wherein the bit line and the source line are conducted by the second memory pillar while changing the voltage of the bit line from the second voltage to the first voltage if the data written in the first memory cell is the second data.

4. The memory device according to claim 1, wherein
   the first semiconductor layer and the first insulating layer are arranged from another end to the one end of the first memory pillar;
   the first variable resistance memory layer is arranged from the other end to a first point of the first memory pillar; and
   a position of the first point in the third direction is lower than a position of the first selecting gate line in the third direction and higher than a position of the first word line in the third direction;
   the second semiconductor layer and the second insulating material layer are arranged from another end to the one end of the second memory pillar;
   the second variable resistance memory layer is arranged from the other end to a second point of the second memory pillar; and
   a position of the second point in the third direction is lower than a position of the second selecting gate line in the third direction and higher than a position of the second word line in the third direction.

5. The memory device according to claim 1, wherein the second selecting gate line is connected to a common second selecting gate line.

6. The memory device according to claim 5, wherein a resistance of the common second selecting gate line is lower than a resistance of the second selecting gate line.

7. The memory device according to claim 1, wherein a voltage of the bit line is controlled to gently fall while changing from the second voltage to the first voltage if the data written in the first memory cell is the first data.

8. A memory device comprising:

A semiconductor substrate having a main surface, the main surface extending in a first direction and a second direction intersecting the first direction;

a first memory pillar including:
- a first variable resistance memory layer extending in a third direction intersecting the first direction and the second direction;
- a first semiconductor layer extending in the third direction, the first semiconductor layer contacting with the first variable resistance memory layer; and
- a first insulating layer extending in the third direction, the first insulating layer contacting with the first semiconductor layer;

a bit line extending in the first direction, the bit line connecting to one end of the first memory pillar;

a first selecting gate line extending in the second direction, the first selecting gate line forming a first selecting transistor by being opposite to the first semiconductor layer through the first insulating layer;

a first word line extending in the second direction, the first word line forming a first memory cell by being opposite to the first variable resistance memory layer through the first semiconductor layer and the first insulating material layer;

a second selecting gate line arranged at a lower position than the first word line in the third direction, the second selecting gate line extending in the second direction, the second selecting gate line forming a second selecting transistor by being opposite to the first semiconductor layer through the first insulating layer; and a driver configured to supply voltages to each of the bit line, the second selecting gate line, and the first word line at a writing operation; wherein the driver sequentially supplies a first voltage, a second voltage higher than the first voltage, and the first voltage to the bit line, during the writing operation to the first memory cell;

the driver supplies a seventh voltage to the second selecting gate line while changing the voltage of the bit line from the second voltage to the first voltage if a data written in the first memory cell is a first data;

the driver supplies an eighth voltage to the second selecting gate line while changing the voltage of the bit line from the second voltage to the first voltage if a data written in the first memory cell is a second data different from the first data; and the seventh voltage is larger than the eighth voltage.

9. The memory device according to claim 8, wherein the eighth voltage is a voltage configured to turn off the second selecting transistor.

10. The memory device according to claim 8, further comprising:
- a source line extending in the first direction, the source line connecting with another end of the first memory pillar,
- wherein a potential difference between the bit line and the source line is eliminated by the first memory pillar while changing the voltage of the bit line from the second voltage to the first voltage if the data written in the first memory cell is the second data.

11. The memory device according to claim 8, wherein,
the first semiconductor layer and the first insulating layer are arranged from another end to the one end of the first memory pillar;
the first variable resistance memory layer is arranged from a third point to a fourth point of the first memory pillar; and
a position of the third point in the third direction is higher than a position of the second selecting gate line in the third direction and lower than a position of the first word line in the third direction.

12. The memory device according to claim 11, wherein a position of the fourth point in the third direction is lower than a position of the first selecting gate line in the third direction and higher than the position of the first word line in the third direction.

13. The memory device according to claim 8, wherein,
the first semiconductor layer and the first insulating layer are arranged from another end to the one end of the first memory pillar;
the first variable resistance memory layer is arranged from a third point to a fourth point of the first memory pillar; and
a position of the third point in the third direction is lower than a position of the second selecting gate line in the third direction.

14. The memory device according to claim 13, wherein a position of the fourth point in the third direction is lower than a position of the first selecting gate line in the third direction and higher than a position of the first word line in the third direction.

15. The memory device according to claim 8, wherein a voltage of the bit line is controlled to gently fall while changing from the second voltage to the first voltage if the data written in the first memory cell is the first data.

* * * * *